(12) United States Patent
Erchak et al.

(10) Patent No.: US 7,667,238 B2
(45) Date of Patent: Feb. 23, 2010

(54) LIGHT EMITTING DEVICES FOR LIQUID CRYSTAL DISPLAYS

(75) Inventors: Alexei A. Erchak, Cambridge, MA (US); Michael Lim, Cambridge, MA (US); Robert F. Karlicek, Jr., Chelmsford, MA (US); Michael Gregory Brown, Tyngsboro, MA (US); Jo A. Venezia, Boston, MA (US)

(73) Assignee: Luminus Devices, Inc., Billerica, MA (US)

( * ) Notice: Subject to any disclaimer, the term of this patent is extended or adjusted under 35 U.S.C. 154(b) by 295 days.

(21) Appl. No.: 11/210,261

(22) Filed: Aug. 23, 2005

(65) Prior Publication Data

US 2006/0043391 A1    Mar. 2, 2006

Related U.S. Application Data

(60) Provisional application No. 60/660,921, filed on Mar. 11, 2005, provisional application No. 60/605,733, filed on Aug. 31, 2004, provisional application No. 60/603,087, filed on Aug. 20, 2004, provisional application No. 60/659,861, filed on Mar. 8, 2005, provisional application No. 60/659,811, filed on Mar. 8, 2005, provisional application No. 60/659,810, filed on Mar. 8, 2005, provisional application No. 60/645,721, filed on Jan. 21, 2005, provisional application No. 60/645,720, filed on Jan. 21, 2005, provisional application No. 60/553,894, filed on Mar. 16, 2004, provisional application No. 60/514,764, filed on Oct. 27, 2003, provisional application No. 60/513,807, filed on Oct. 23, 2003, provisional application No. 60/503,672, filed on Sep. 17, 2003, provisional application No. 60/503,671, filed on Sep. 17, 2003, provisional application No. 60/503,661, filed on Sep. 17, 2003, provisional application No. 60/503,654, filed on Sep. 17, 2003, provisional application No. 60/503,653, filed on Sep. 17, 2003, provisional application No. 60/475,682, filed on Jun. 4, 2003, provisional application No. 60/474,199, filed on May 29, 2003, provisional application No. 60/462,889, filed on Apr. 15, 2003.

(51) Int. Cl.
    *H01L 33/00*    (2010.01)

(52) U.S. Cl. .............................. 257/98; 257/88; 257/92; 257/99; 257/918; 257/E33.001

(58) Field of Classification Search .................. 257/88, 257/92, 98, 99, 918, E33.001–E33.077
    See application file for complete search history.

(56) References Cited

U.S. PATENT DOCUMENTS 3,293,513 A    12/1966    Biard et al.

(Continued)

FOREIGN PATENT DOCUMENTS

WO        98/14986        4/1998

(Continued)

OTHER PUBLICATIONS

A. A. Erchak et al. "Enhanced coupling to vertical radiation using a two-dimensional photonic crystal in a semiconductor light-emitting diode", Appl. Phys. Lett. (78 (5), Jan. 29, 2001, pp. 563-565.

(Continued)

*Primary Examiner*—Wai-Sing Louie
(74) *Attorney, Agent, or Firm*—Wolf, Greenfield & Sacks, P.C.

(57) ABSTRACT

Light-emitting devices, and related components, processes, systems and methods are disclosed.

28 Claims, 79 Drawing Sheets

U.S. PATENT DOCUMENTS

| | | |
|---|---|---|
| 3,739,217 A | 6/1973 | Bergh |
| 3,922,706 A | 11/1975 | Kaiser |
| 4,864,370 A | 9/1989 | Gaw et al. |
| 5,126,231 A | 6/1992 | Levy |
| 5,132,751 A | 7/1992 | Shibata et al. |
| 5,162,878 A | 11/1992 | Sasagawa et al. |
| 5,359,345 A | 10/1994 | Hunter et al. |
| 5,363,009 A | 11/1994 | Monto |
| 5,376,580 A | 12/1994 | Kish |
| 5,426,657 A | 6/1995 | Vakhsoori |
| 5,491,350 A | 2/1996 | Unno et al. |
| 5,528,057 A | 6/1996 | Yanagase |
| 5,631,190 A | 5/1997 | Negley et al. |
| 5,633,527 A | 5/1997 | Lear |
| 5,724,062 A | 3/1998 | Hunter et al. |
| 5,745,519 A * | 4/1998 | Ruda et al. ............... 372/101 |
| 5,779,924 A | 7/1998 | Krames et al. |
| 5,814,839 A | 9/1998 | Hosoba |
| 5,834,331 A | 11/1998 | Razeghi |
| 5,955,749 A | 9/1999 | Joannopoulos et al. |
| 6,071,795 A | 6/2000 | Cheung et al. |
| 6,072,628 A | 6/2000 | Sarayeddine |
| 6,091,085 A | 7/2000 | Lester |
| 6,122,103 A | 9/2000 | Perkins et al. |
| 6,169,294 B1 | 1/2001 | Biing-Jye et al. ............. 257/79 |
| 6,222,207 B1 | 4/2001 | Carter-Coman et al. |
| 6,265,820 B1 | 7/2001 | Ghosh et al. |
| 6,287,882 B1 | 9/2001 | Chang et al. |
| 6,288,840 B1 | 9/2001 | Perkins et al. |
| 6,303,405 B1 | 10/2001 | Yoshida et al. |
| 6,335,548 B1 | 1/2002 | Roberts et al. |
| 6,340,824 B1 | 1/2002 | Komoto |
| 6,388,264 B1 | 5/2002 | Pace |
| 6,410,348 B1 | 6/2002 | Chen et al. |
| 6,410,942 B1 | 6/2002 | Thibeault et al. |
| 6,420,242 B1 | 7/2002 | Cheung et al. |
| 6,426,515 B2 | 7/2002 | Ishikawa |
| 6,465,808 B2 | 10/2002 | Lin |
| 6,468,824 B2 | 10/2002 | Chem |
| 6,469,324 B1 | 10/2002 | Wang |
| 6,504,180 B1 | 1/2003 | Heremans et al. |
| 6,522,063 B2 | 2/2003 | Chen et al. |
| 6,534,798 B1 | 3/2003 | Scherer et al. |
| 6,559,075 B1 | 5/2003 | Kelly et al. |
| 6,573,537 B1 | 6/2003 | Steigerwald et al. |
| 6,574,383 B1 | 6/2003 | Erchak et al. |
| 6,593,160 B2 | 7/2003 | Carter-Coman et al. |
| 6,614,056 B1 | 9/2003 | Tarsa et al. |
| 6,627,521 B2 | 9/2003 | Furukawa |
| 6,642,618 B2 | 11/2003 | Yagi |
| 6,649,437 B1 | 11/2003 | Yang et al. |
| 6,657,236 B1 | 12/2003 | Thibeault et al. |
| 6,661,028 B2 | 12/2003 | Chen |
| 6,690,268 B2 | 2/2004 | Schofield et al. |
| 6,697,130 B2 * | 2/2004 | Weindorf et al. ............. 349/65 |
| 6,740,906 B2 | 5/2004 | Slater, Jr. et al. |
| 6,742,907 B2 | 6/2004 | Funamoto et al. |
| 6,762,069 B2 | 7/2004 | Huang et al. |
| 6,778,746 B2 | 8/2004 | Charlton et al. |
| 6,784,027 B2 | 8/2004 | Streubel et al. |
| 6,784,463 B2 | 8/2004 | Camras et al. |
| 6,791,117 B2 | 9/2004 | Yoshitake |
| 6,791,119 B2 | 9/2004 | Slater, Jr. et al. |
| 6,791,259 B1 | 9/2004 | Stokes |
| 6,794,684 B2 | 9/2004 | Slater, Jr. et al. |
| 6,800,500 B2 | 10/2004 | Coman |
| 6,803,603 B1 | 10/2004 | Nitta et al. ............... 257/79 |
| 6,812,503 B2 | 11/2004 | Lin et al. |
| 6,818,531 B1 | 11/2004 | Yoo |
| 6,825,502 B2 | 11/2004 | Okazaki et al. |
| 6,828,597 B2 | 12/2004 | Weigleiter |
| 6,828,724 B2 | 12/2004 | Burroughes |
| 6,831,302 B2 | 12/2004 | Erchack et al. |
| 6,847,057 B1 | 1/2005 | Gardner et al. |
| 6,849,558 B2 | 2/2005 | Schaper |
| 6,878,969 B2 | 4/2005 | Tanaka |
| 6,891,203 B2 | 5/2005 | Kozawa |
| 6,900,587 B2 | 5/2005 | Seuhiro |
| 6,924,163 B2 | 8/2005 | Okazaki |
| 6,943,379 B2 | 9/2005 | Seuhiro |
| 6,946,683 B2 | 9/2005 | Sano et al. |
| 6,958,494 B2 | 10/2005 | Lin |
| 2002/0110172 A1 | 8/2002 | Hasnain et al. |
| 2003/0141507 A1 | 7/2003 | Krames et al. |
| 2003/0141563 A1 | 7/2003 | Wang |
| 2003/0143772 A1 | 7/2003 | Chen |
| 2003/0209704 A1 * | 11/2003 | Yamada ................ 257/14 |
| 2003/0209714 A1 | 11/2003 | Taskar et al. |
| 2003/0222263 A1 | 12/2003 | Choi |
| 2004/0027062 A1 | 2/2004 | Shiang et al. |
| 2004/0043524 A1 | 3/2004 | Huang et al. |
| 2004/0110856 A1 | 6/2004 | Young et al. |
| 2004/0130263 A1 | 7/2004 | Horng |
| 2004/0141104 A1 * | 7/2004 | Yu et al. ................ 349/65 |
| 2004/0144985 A1 | 7/2004 | Zhang et al. |
| 2004/0182914 A1 | 9/2004 | Venugopalan |
| 2004/0206962 A1 | 10/2004 | Erchak et al. |
| 2004/0206971 A1 | 10/2004 | Erchak et al. |
| 2004/0207310 A1 | 10/2004 | Erchak et al. |
| 2004/0207319 A1 | 10/2004 | Erchak et al. |
| 2004/0207320 A1 | 10/2004 | Erchak |
| 2004/0207323 A1 | 10/2004 | Erchak et al. |
| 2004/0259279 A1 | 12/2004 | Erchak et al. |
| 2004/0259285 A1 | 12/2004 | Erchak et al. |
| 2005/0019971 A1 | 1/2005 | Slater, Jr. |
| 2005/0040424 A1 | 2/2005 | Erchak et al. |
| 2005/0051785 A1 | 3/2005 | Erchak et al. |
| 2005/0051787 A1 | 3/2005 | Erchak et al. |
| 2005/0059178 A1 | 3/2005 | Erchak et al. |
| 2005/0059179 A1 | 3/2005 | Erchak et al. |
| 2005/0082545 A1 | 4/2005 | Wierer |
| 2005/0087754 A1 | 4/2005 | Erchak |
| 2005/0087757 A1 | 4/2005 | Erchak et al. |
| 2005/0112886 A1 | 5/2005 | Asakawa |
| 2005/0127375 A1 | 6/2005 | Erchak et al. |
| 2005/0205883 A1 | 9/2005 | Wierer |

FOREIGN PATENT DOCUMENTS

| | | |
|---|---|---|
| WO | 02/41406 | 5/2002 |
| WO | 02/089221 | 7/2002 |
| WO | 02/071450 | 9/2002 |
| WO | 2005/004231 | 1/2005 |

OTHER PUBLICATIONS

A. Köck et al., "Novel surface emitting GaAs/AlGaAs laser diodes based on surface mode emission," Appl. Phys. Lett. 63(9), Aug. 30, 1993, pp. 1164-1166.

A. Köck et al., "Strongly directional emission from AlGaAs/GaAs light-emitting diodes," Appl. Phys. Lett. 57 (22), Nov. 26, 1990, pp. 2327-2329.

Gourley et al. "Optical properties of two-dimensional photonic lattices fabricated as honeycomb nanostructures in compound semiconductors," Appl. Phys. Lett. 64 (6), Feb. 7, 1994, pp. 687-689.

I. Bulu et al. "Highly directive radiation from sources embedded inside photonic crystals", Appl. Phys. Lett. 83 (16), Oct. 20, 2003, pp. 3263-3265.

I. Schnitzer et al. "30% external quantum efficiency from surface textured, thin-film light-emitting diodes", Appl. Phys. Lett. 63 (18), Oct. 18, 1993, pp. 2174-2176.

J.R. Wendt et al. "Nanofabrication of photonic lattice structures in GaAs/AlGaAs", J.Vac. Sci. Technol. B 11(6), Nov./Dec. 1993, pp. 2637-2640.

K. Streubel et al.. "High Brightness AlGaInP Light-Emitting Diodes", IEEE Journal on selected topic in quantum electronics, vol. 8, No. 2, Mar./Apr. 2002, pp. 321-332.

L. Chen et al. "Fabrication of 50-100 nm Patterned InGaN Blue Light Emitting Heterostructures", Phys. Stat. Sol. (a), 188 (1), 2001, pp. 135-138.

M. Boroditsky et al. "Light extraction from optically pumped light-emitting diode by thin-slab photonic crystals", Appl. Phys. Lett. 75 (8), Aug. 23, 1999, pp. 1036-1038.

M. Krames et al "Introduction to the Issue on High-Efficiency Light-Emitting Diodes", IEEE Journal on selected topic in quantum electronics, vol. 8, No. 2 Mar./Apr. 2002, pp. 185-188.

M. Okai et al. "Novel method to fabricate corrugation for a $\lambda/4$-shifted distributed feedback laser using a granting photomask", Appl. Phys. Lett. 55(5), Jul. 31, 1989, pp. 415-417.

M. Rattier et al. "Omnidirectional and compact guided light extraction from Archimedean photonic lattices", Appl. Phys. Lett. 83 (7), Aug. 18, 2003, pp. 1283-1285.

M. Zelsmann et al. "Seventy-fold enhancement of light extraction from a defectless photonic crystal made on silicon-on-insulator", Appl. Phys. Lett. 83 (13), Sep. 29, 2003, pp. 2542-2544.

M.K. Kelly et al. "Optical patterning of GaN films", Appl. Phys. Lett 68 (12), Sep. 16, 1996, pp. 1749-1751.

M.K. Kelly et al. "Optical process for liftoff of Group III-nitride films", Physica Status Solidi; Rapid Research Note, Nov. 28, 1996, 2 pages.

P.L. Gourley et al. "Optical Bloch waves in a semiconductor photonic lattice", Appl. Phys. Lett. 60 (22), Jun. 1, 1992, pp. 2714-2716.

T. N. Oder et al. "III-nitride photonic crystals", Appl. Phys. Lett. 83 (6), Aug. 11, 2003, pp. 1231-1233.

T.L. Koch et al. "1.55-$\mu$ InGaAsP distributed feedback vapor phase transported buried heterostructure lasers", Appl. Phys. Lett. 47 (1), Jul. 1, 1985, pp. 12-14.

W.S. Wong et al. "Damage-free separation of GaN thin films from sapphire substrates", Appl. Phys. Lett. 72 (5), Feb. 2, 1998, pp. 599-601.

W.T. Tsang et al. "Semiconductor distributed feedback lasers with quantum well or superlattice grating for index or gain-coupled optical feedback", Appl. Phys. Lett. 60 (21), May 25, 1992, pp. 258-2582.

Y.-J. Lee et al. "A high-extraction-efficiency nanopatterned organic light-emitting diode", Appl. Phys. Lett. 82(21), May 26, 2003, pp. 3779-3781.

* cited by examiner

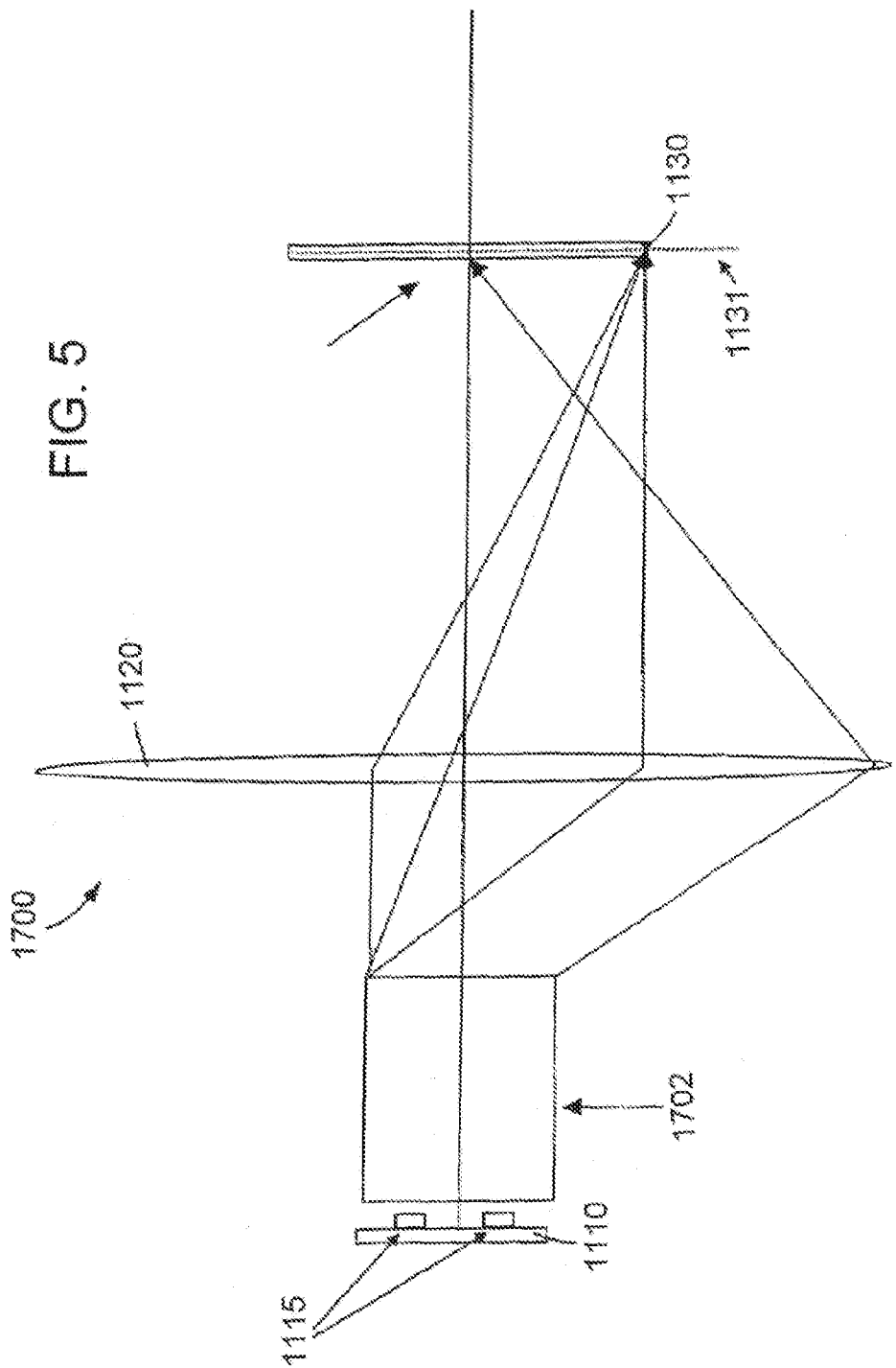

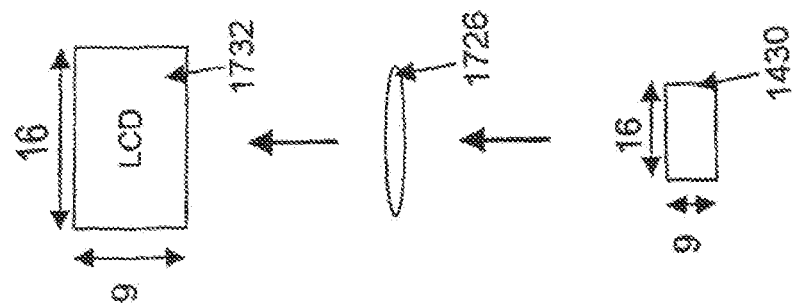
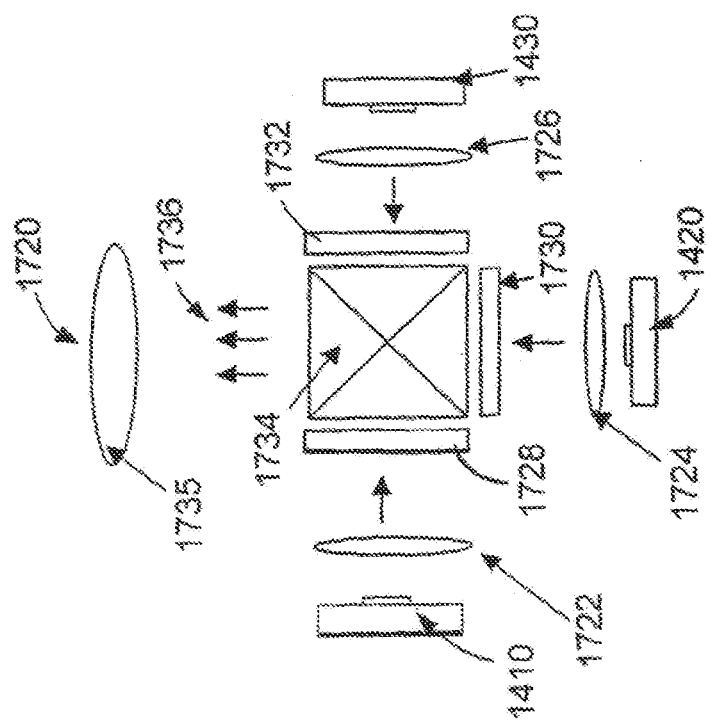

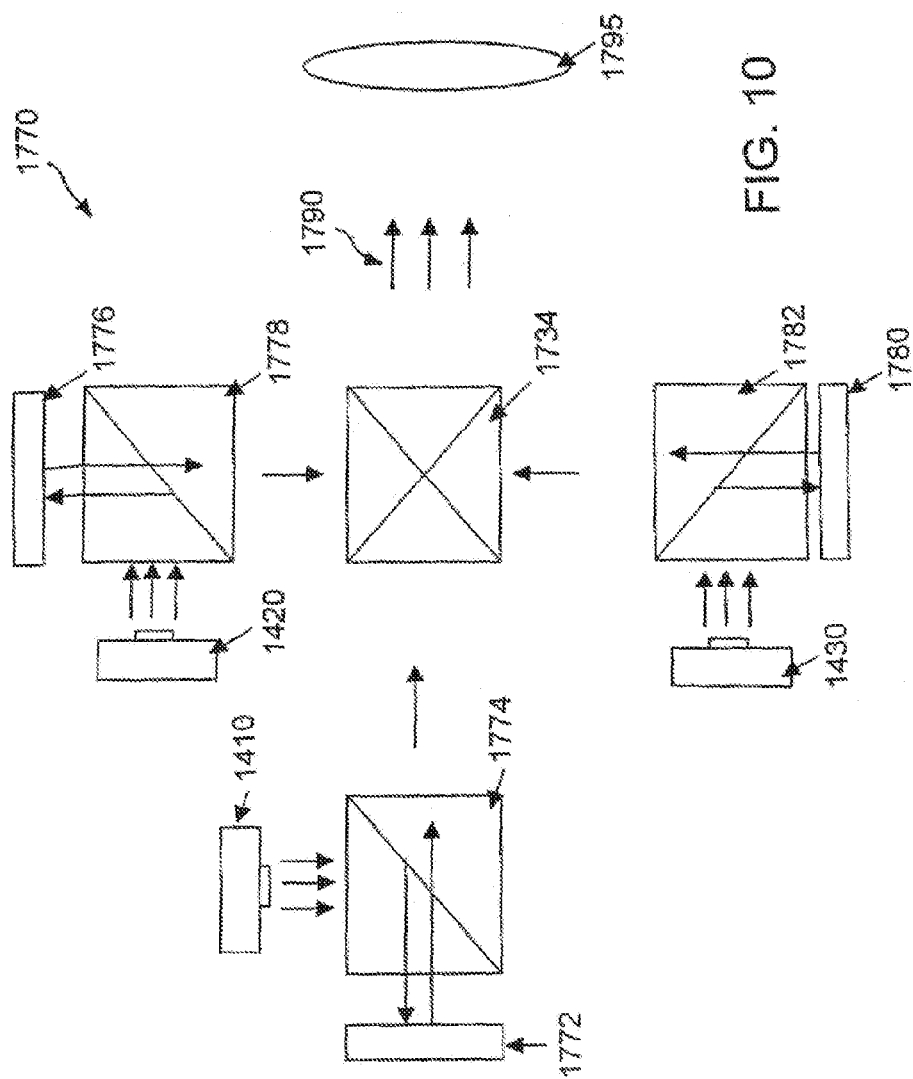

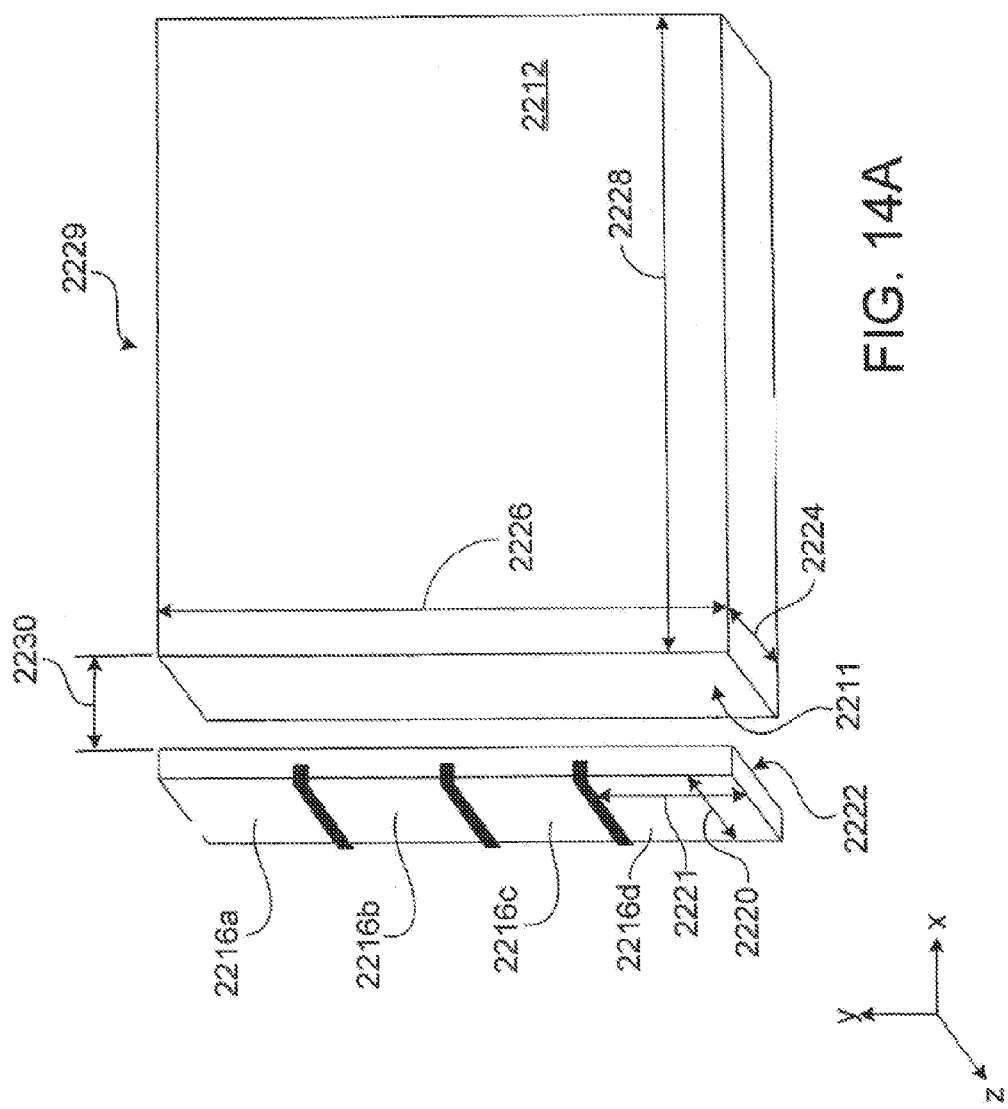

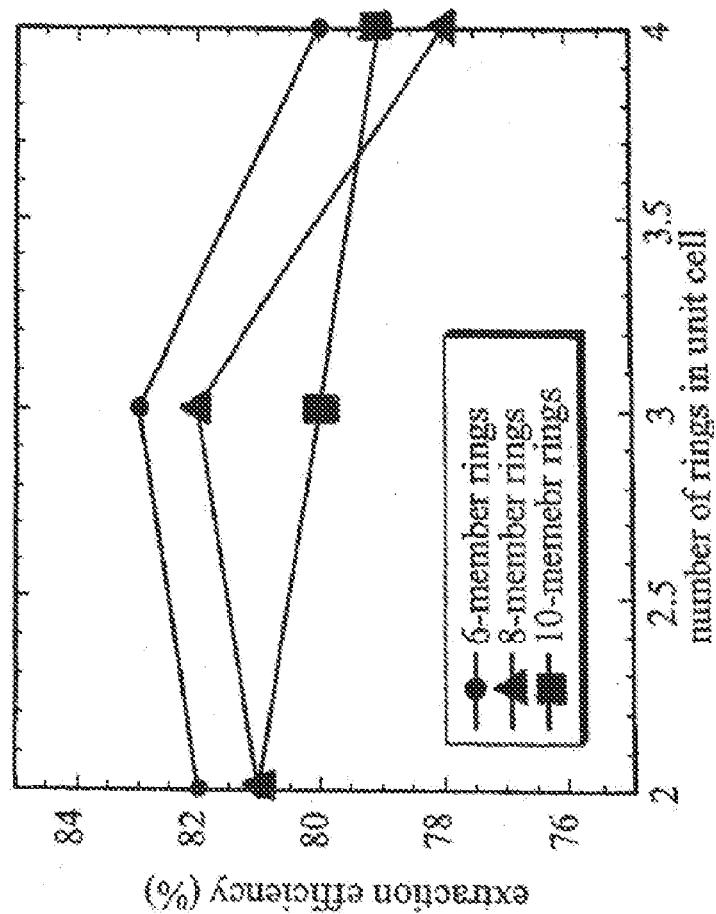
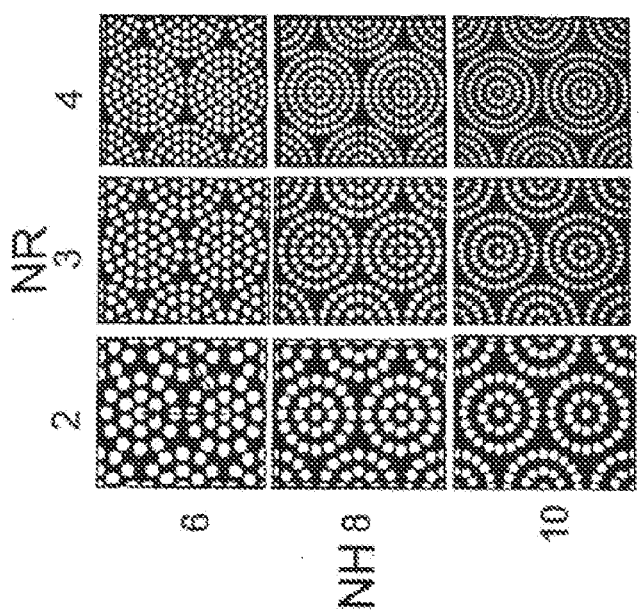
FIG. 40

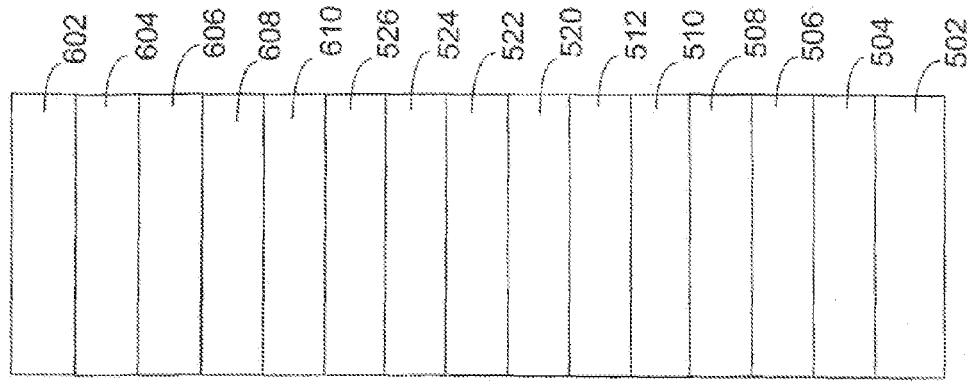
FIG. 49
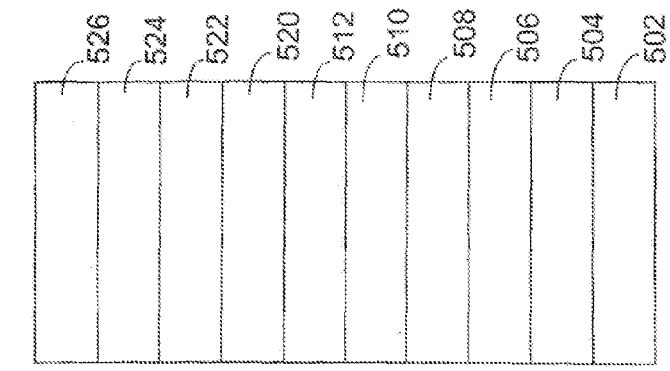
FIG. 47
FIG. 48
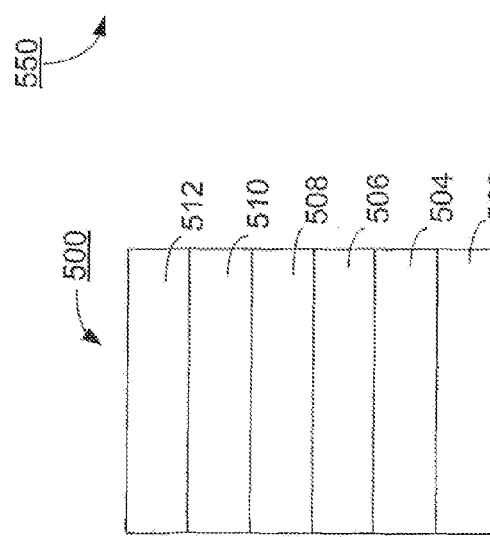
FIG. 46

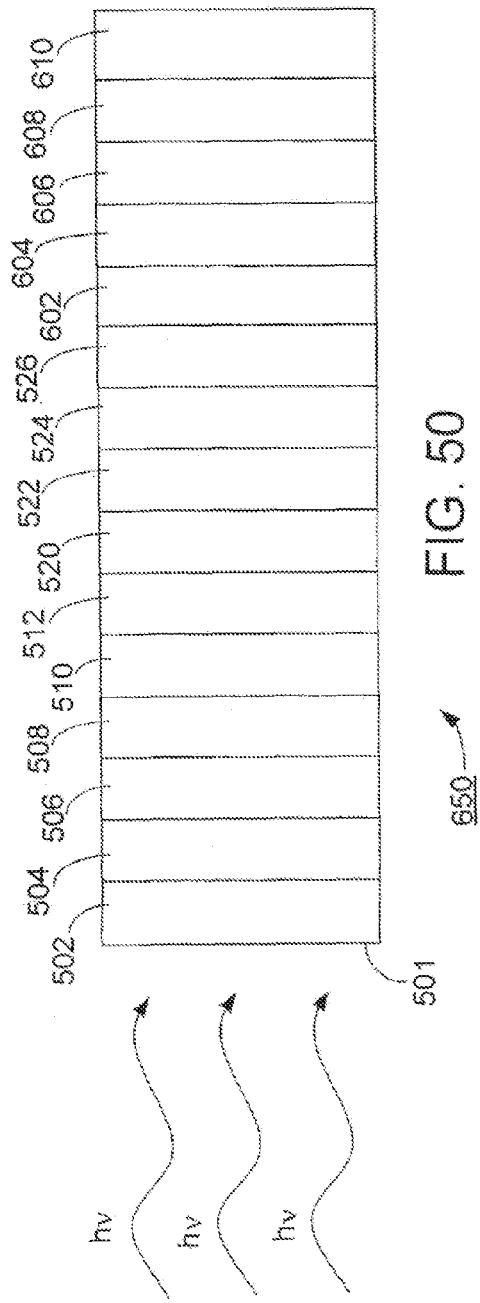
FIG. 50
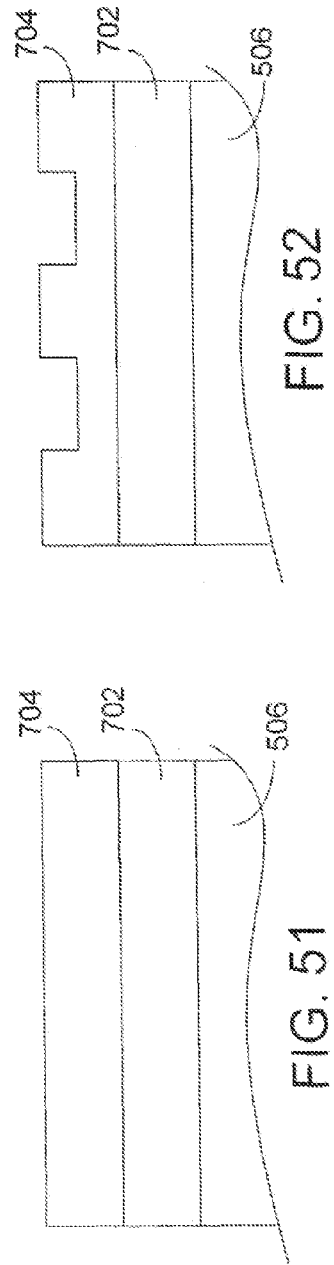
FIG. 51
FIG. 52

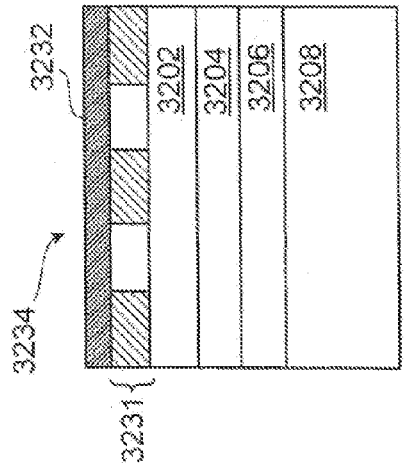
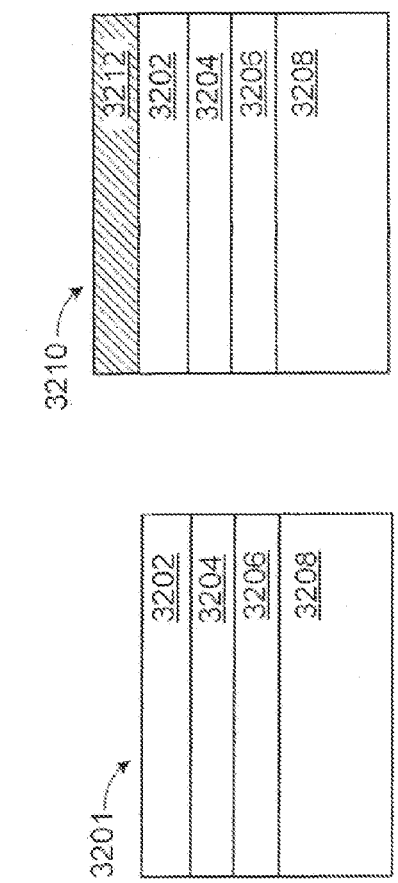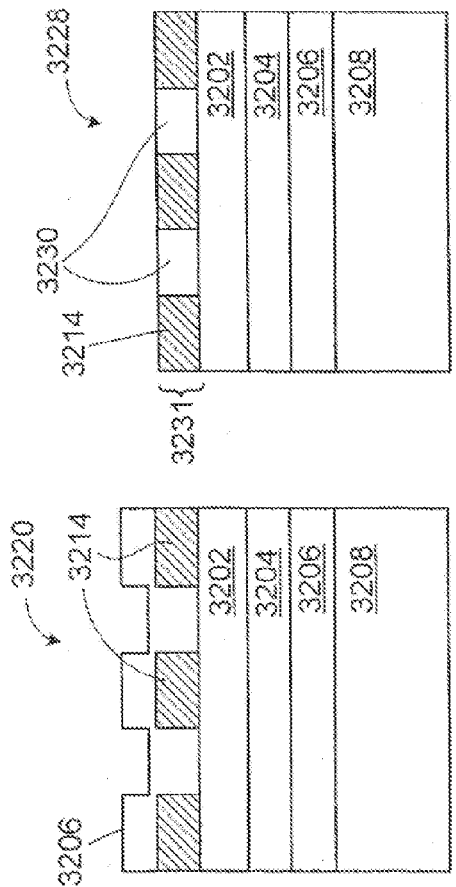

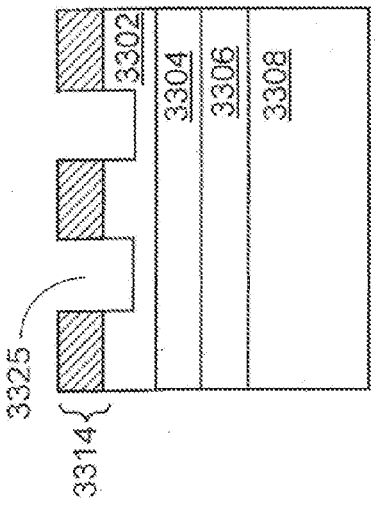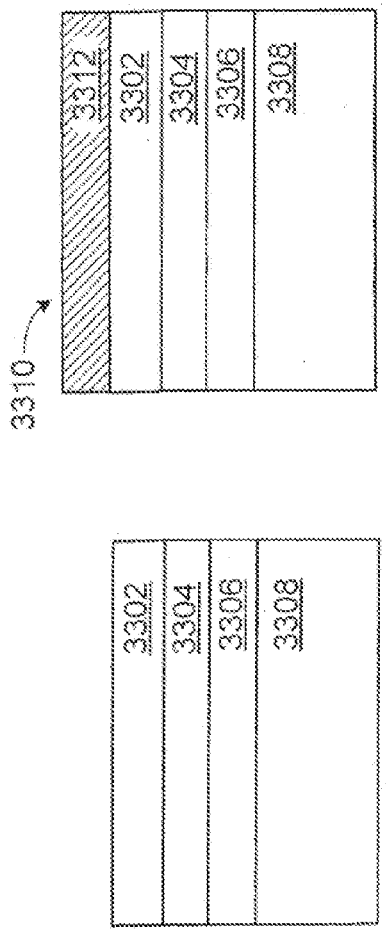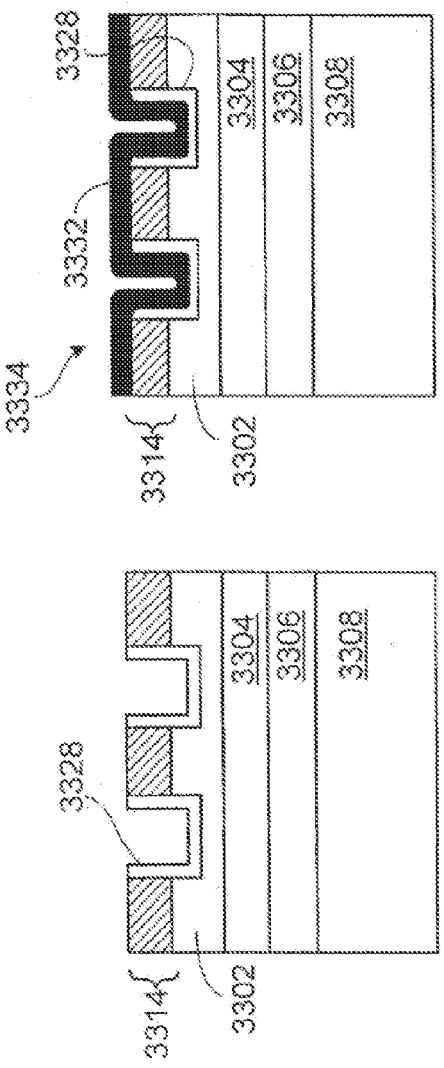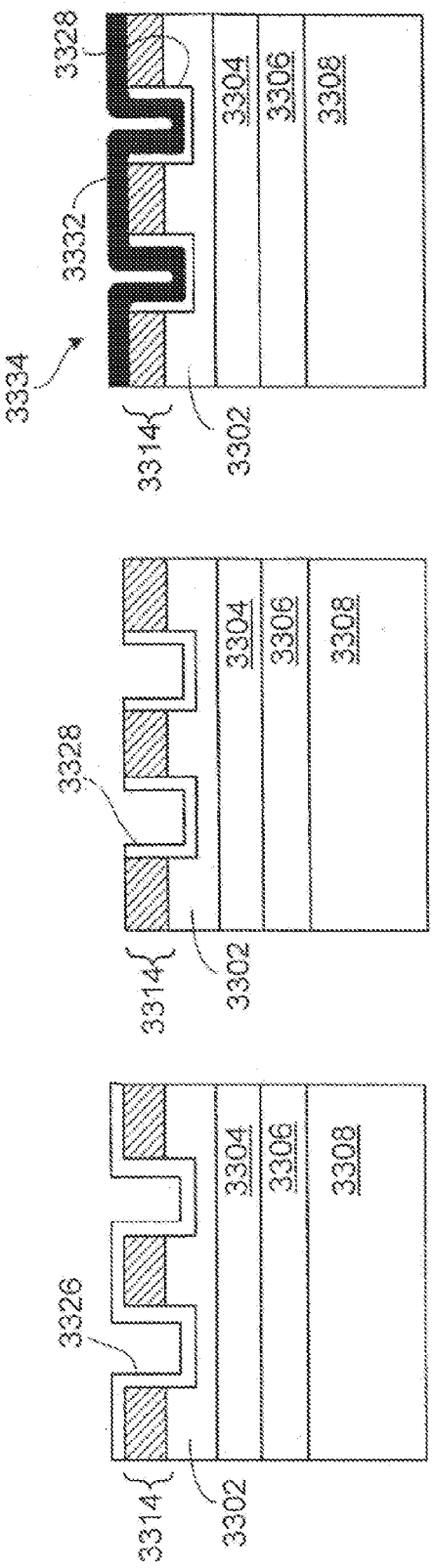

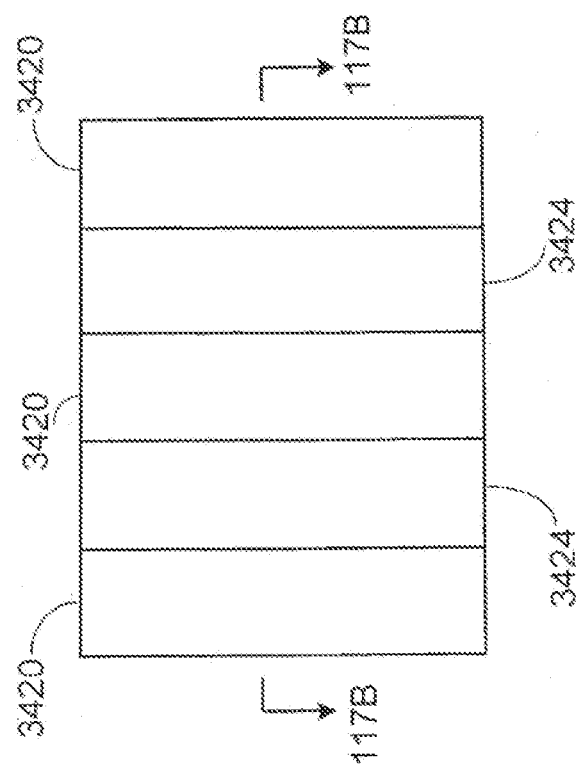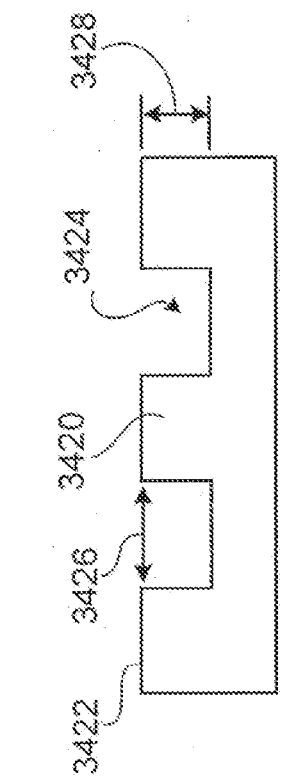

LIGHT EMITTING DEVICES FOR LIQUID CRYSTAL DISPLAYS

INCORPORATION BY REFERENCE

This application incorporates by reference the following U.S. Provisional Patent Applications: 60/462,889, filed Apr. 15, 2003; 60/474,199, filed May 29, 2003; 60/475,682, filed Jun. 4, 2003; 60/503,653, filed Sep. 17, 2003; 60/503,654 filed Sep. 17, 2003; 60/503,661, filed Sep. 17, 2003; 60/503, 671, filed Sep. 17, 2003; 60/503,672, filed Sep. 17, 2003; 60/513,807, filed Oct. 23, 2003; 60/514,764, filed Oct. 27, 2003, 60/553,894, filed Mar. 16, 2004; 60/603,087, filed Aug. 20, 2004, 60/605,733, filed Aug. 31, 2004; 60/645,720 filed Jan. 21, 2005; 60/645,721 filed Jan. 21, 2005; 60/659,861 filed Mar. 8, 2005; 60/660,921 filed Mar. 11, 2005; 60/659, 810 filed Mar. 8, 2005; and 60/659,811 filed Mar. 8, 2005. This application also incorporates by reference the following U.S. patent applications: U.S. Ser. No. 10/723,987 entitled "Light Emitting Devices," and filed Nov. 26, 2003; U.S. Ser. No. 10/724,004, entitled "Light Emitting Devices," and filed Nov. 26, 2003; U.S. Ser. No. 10/724,033, entitled "Light Emitting Devices," and filed Nov. 26, 2003; U.S. Ser. No. 10/724,006, entitled "Light Emitting Devices," and filed Nov. 26, 2003; U.S. Ser. No. 10/724,029, entitled "Light Emitting Devices," and filed Nov. 26, 2003; U.S. Ser. No. 10/724,015, entitled "Light Emitting Devices," and filed Nov. 26, 2003; U.S. Ser. No. 10/724,005, entitled "Light Emitting Devices," and filed Nov. 26, 2003; U.S. Ser. No. 10/735,498, entitled "Light Emitting Systems," and filed Dec. 12, 2003; U.S. Ser. No. 10/794,244, entitled "Light Emitting Device Methods" and filed Mar. 5, 2004; U.S. Ser. No. 10/794,452, entitled "Light Emitting Device Methods" and filed Mar. 5, 2004; U.S. Ser. No. 10/872,335, entitled "Optical Display Systems and Methods" and filed Jun. 18, 2004; U.S. Ser. No. 10/871, 877, entitled "Electronic Device Contact Structures" and filed Jun. 18, 2004; and U.S. Ser. No. 10/872,336, entitled "Light Emitting Diode Systems" and filed Jun. 18, 2004.

TECHNICAL FIELD

The invention relates to light-emitting devices, and related components, processes, systems and methods.

BACKGROUND

A light emitting diode (LED) often can provide light in a more efficient manner than an incandescent light source and/or a fluorescent light source. The relatively high power efficiency associated with LEDs has created an interest in using LEDs to displace conventional light sources in a variety of lighting applications. For example, in some instances LEDs are being used as traffic lights and to illuminate cell phone keypads and displays.

Typically, an LED is formed of multiple layers, with at least some of the layers being formed of different materials. In general, the materials and thicknesses selected for the layers determine the wavelength(s) of light emitted by the LED. In addition, the chemical composition of the layers can be selected to try to isolate injected electrical charge carriers into regions (commonly referred to as quantum wells) for relatively efficient conversion to optical power. Generally, the layers on one side of the junction where a quantum well is grown are doped with donor atoms that result in high electron concentration (such layers are commonly referred to as n-type layers), and the layers on the opposite side are doped with acceptor atoms that result in a relatively high hole concentration (such layers are commonly referred to as p-type layers).

A common approach to preparing an LED is as follows. The layers of material are prepared in the form of a wafer. Typically, the layers are formed using an epitaxial deposition technique, such as metal-organic chemical vapor deposition (MOCVD), with the initially deposited layer being formed on a growth substrate. The layers are then exposed to various etching and metallization techniques to form contacts for electrical current injection, and the wafer is subsequently sectioned into individual LED chips. Usually, the LED chips are packaged.

During use, electrical energy is usually injected into an LED and then converted into electromagnetic radiation (light), some of which is extracted from the LED.

SUMMARY

The invention relates to light-emitting devices, and related components, systems and methods.

In some embodiments, a system includes system, a panel having an edge, the edge having a thickness. The system also includes a light emitting device disposed such that light emitted from the light emitting device impinges on the edge of the panel, the light emitting device having a surface. A ratio of a width of the surface of the light emitting device to the thickness of the edge of the panel is from about 0.5 to about 1.1.

Embodiments can include one or more of the following.

The panel can be a liquid crystal display (LCD). A length of the surface of the light emitting device can be at least about 1 mm. A length of the surface of the light emitting device can be at least about 2 mm. A length of the surface of the light emitting device can be at least about 3 mm. A length of the surface of the light emitting device can be at least about 5 mm. A length of the surface of the light emitting device can be at least about 10 mm.

The ratio of the width of the surface of the light emitting device to the thickness of the edge of the panel can be from about 0.75 to about 1.05. The ratio of the width of the surface of the light emitting device to the thickness of the edge of the panel can be about 0.9 to about 1.

The system can also include at least one optical component disposed between the light emitting device and the panel. The at least one optical component can be a light homogenizer. The light emitting device can be a non-lambertian light emitting device. The light emitting device can be a photonic lattice light emitting device.

The light emitting device can include a multi-layer stack of materials including a light generating region, and a first layer supported by the light generating region, a surface of the first layer being configured so that the light generated by the light generating region can emerge from the light emitting device via the surface of the first layer. The surface of the first layer can have a dielectric function that varies spatially according to a pattern, and the pattern has an ideal lattice constant and a detuning parameter with a value greater than zero. The surface of the first layer can have a dielectric function that varies spatially according to a nonperiodic pattern. The surface of the first layer can have a dielectric function that varies spatially according to a complex periodic pattern. The surface of the first layer can have a dielectric function that varies spatially according to a periodic pattern. The light emitting device can include a light emitting diode. The light emitting device can be a single light emitting device.

The light emitting device can include a plurality of light emitting devices. The plurality of light emitting devices can be disposed in a serrated arrangement along the edge of the panel. The plurality of light emitting devices can be disposed in a plurality of columns. The plurality of columns can include at least a first column and a second column. The first column can include a plurality of light emitting devices configured to emit a first color of light and the second column can include a plurality of light emitting devices configured to emit a second color of light, the first and second colors of light being different. The system can also include a third column that includes a plurality of light emitting devices configured to emit a third color of light, the first, second and third colors of light being different. The first, second, and third colors can be selected from the group consisting of red, green, and blue. The edge can be a first edge and the panel can also include a second edge, edge having a thickness. The system can also include a light emitting device disposed such that light emitted from the light emitting device impinges on the second edge of the panel.

The system can also include a cooling system configured so that, during use, the cooling system regulates a temperature of the light emitting diode. The emitting device can be mounted on a heat sink device.

In some embodiments, a system includes a panel having an edge and an array of light emitting devices disposed such that light emitted from the array of light emitting device impinges on the panel. The array of light emitting devices includes a first column of light emitting devices, the first column having a first edge and a second edge about perpendicular to the first edge and a second column of light emitting devices, the second column of light emitting devices having a first edge, a second edge, and a third edge, the first and second edges of the second column being about parallel to the first edge of the first column, the second edge of the second column being about parallel to the second edge of the first column, and the second edge of the second column being offset by at least about 0.05 mm from the second edge of the first column in a direction about perpendicular to the second edge of the first column.

Embodiments can include one or more of the following.

The system can include a third column of light emitting devices, the third column of light emitting devices having a first edge and a second edge, the first edge of the third column being about parallel to the third edge of the second column, the second edge of the third column being about parallel to the second edge of the second column, and the second edge of the third column being offset by at least about 0.05 mm from the second edge of the second column in a direction about perpendicular to the second edge of the first column. The panel can include a liquid crystal display (LCD). The first column can include a plurality of light emitting devices configured to emit a first color of light, the second column can include a plurality of light emitting devices configured to emit a second color of light. The first and second colors of light can be different The third column can include a plurality of light emitting devices configured to emit a third color of light, and the first, second and third colors of light being different. The first, second, and third colors can be selected from the group consisting of red, green, and blue.

The first column can have a first width, the second column can have a second width, and the third column can have a third width. A ratio a sum of the first, second, and third widths to a thickness of the edge of the panel can be from about 0.5 to about 1.1. At least one of the light emitting devices in the array of light emitting devices can include a first layer supported by a light generating region, a surface of the first layer being configured so that light generated by the light generating region can emerge from the light emitting device via a surface of the first layer. The surface of the first layer can have a dielectric function that varies spatially according to a pattern, and the pattern has an ideal lattice constant and a detuning parameter with a value greater than zero. The surface of the first layer can have a dielectric function that varies spatially according to a nonperiodic pattern. The surface of the first layer can have a dielectric function that varies spatially according to a complex periodic pattern. The surface of the first layer can have a dielectric function that varies spatially according to a periodic pattern.

The second column can be offset from the first column and the third column by at least about 0.1 mm. The second column can be offset from the first column and the third column by at least about 0.2 mm. The second column can be offset from the first column and the third column by at least about 0.3 mm. The second column can be offset from the first column and the third column by at least about 0.5 mm. The second column can be offset from the first column and the third column by at least about 1 mm.

The system can also include at least one optical component disposed between the light emitting device and the panel. The at least one optical component can be a light homogenizer. The light emitting device can be a non-lambertian light emitting device. The light emitting device can be a photonic lattice light emitting device. The light emitting device can be a light emitting diode. The array of light emitting diodes can include at least one light emitting diode selected from the group consisting of red light emitting diodes, blue light emitting diodes, and green light emitting diodes. The array of light emitting diodes can include a red light emitting diode, a blue light emitting diode, and a green light emitting diode. The array of light emitting devices can be disposed in a serrated arrangement along the edge of the panel. The system can also include a cooling system configured so that, during use, the cooling system regulates a temperature of the array of light emitting diodes.

In an additional embodiment, a system includes a panel having an edge, a light emitting device having a surface, the surface having an area defined by a perimeter of the surface, and an optical component disposed in an optical path from the light emitting device to the edge of the panel, the optical component including an aperture having an area defined by a perimeter of the aperture; wherein a ratio of the area of the surface of the light emitting device to the area of the aperture is from about 0.5 to about 1.1.

Embodiments can include one or more of the following.

The panel can include a liquid crystal display (LCD). The perimeter of the aperture can be rectangular and the light emitting device can be rectangular. The perimeter of the aperture can be circular and the light emitting device can be circular. The perimeter of the aperture can be trapezoidal and the light emitting device can be trapezoidal. The perimeter of the aperture can be triangular and the light emitting device can be triangular. The perimeter of the aperture can be square, and the light emitting device can be square. The perimeter of the aperture can be polygonal and the light emitting device can be circular. The perimeter of the aperture can be polygonal and the light emitting device can be polygonal. The perimeter of the aperture can be hexagonal and the light emitting device can be hexagonal. The aperture can be octagonal and the light emitting device can be octagonal.

The light emitting device can be a non-lambertian light emitting device. The light emitting device can be a photonic lattice light emitting device. The light emitting device can include a multi-layer stack of materials including a light generating region, and a first layer supported by the light generating region, a surface of the first layer being configured so that the light generated by the light generating region can emerge from the light emitting device via the surface of the first layer. The surface of the first layer can have a dielectric function that varies spatially according to a pattern, and the pattern has an ideal lattice constant and a detuning parameter with a value greater than zero. The surface of the first layer can have a dielectric function that varies spatially according to a nonperiodic pattern. The surface of the first layer can have a dielectric function that varies spatially according to a complex periodic pattern. The surface of the first layer can have a dielectric function that varies spatially according to a periodic pattern. The light emitting device can be a light emitting diode. The optical component can be configured to homogenize light emitted from the LED.

The optical component can be configured to disperse light from the LED along the edge of the panel. The system can also include a cooling system configured so that, during use, the cooling system regulates a temperature of the light emitting device. The light emitting device can be mounted on a heat sink device.

In certain embodiments, a system includes a panel having an edge, an array of light emitting devices, the array of light emitting devices having a combined surface area defined by an outer perimeter of the array of light emitting devices, and an optical component disposed in an optical path from the light emitting device to the edge of the panel, the optical component including an aperture having an area defined by a perimeter of the aperture; wherein a ratio of the combined surface area of the light emitting devices to the area of the aperture is from about 0.5 to about 1.1.

Embodiments can include one or more of the following.

The panel can be liquid crystal display (LCD). The perimeter of the aperture can be rectangular and the perimeter of the array of light emitting devices can be rectangular. The perimeter of the aperture can be hexagonal and the perimeter of the array of light emitting devices can be hexagonal. The array of light emitting devices can include six light emitting devices and each light emitting device in the array of light emitting devices can have a perimeter defining a triangular shape. The perimeter of the aperture can be octagonal and the perimeter of the array of light emitting devices can be octagonal. The array of light emitting devices can include eight light emitting devices and each light emitting device in the array of light emitting devices can have a perimeter defining a triangular shape. The perimeter of the aperture can be circular, and the perimeter of the array of light emitting devices can be circular. The array of light emitting devices can include four light emitting devices and each light emitting device in the array of light emitting devices can have a perimeter defining a shape of about ¼ of a circle. The array of light emitting devices can include two light emitting devices and each light emitting device in the array of light emitting devices can have a perimeter defining a shape of about ½ of a circle. The array of light emitting devices can include six light emitting devices and each light emitting device in the array of light emitting devices can have a perimeter defining a shape of about ⅙ of a circle. The array of light emitting devices can include eight light emitting devices and each light emitting device in the array of light emitting devices can have a perimeter defining a shape of about ⅛ of a circle. The perimeter of the aperture can be trapezoidal and perimeter of the array of light emitting devices can be trapezoidal. The perimeter of the aperture can be triangular and the perimeter of the array of light emitting devices can be triangular. The perimeter of the aperture can be square and the perimeter of the array of light emitting devices can be square.

At least one light emitting device can be a non-lambertian light emitting device. At least one light emitting device can be a photonic lattice light emitting device. At least one of the light emitting devices in the array of light emitting devices can include a first layer supported by a light generating region, a surface of the first layer being configured so that light generated by the light generating region can emerge from the light emitting device via a surface of the first layer. The surface of the first layer can have a dielectric function that varies spatially according to a pattern, and the pattern has an ideal lattice constant and a detuning parameter with a value greater than zero. The surface of the first layer can have a dielectric function that varies spatially according to a nonperiodic pattern. The surface of the first layer can have a dielectric function that varies spatially according to a complex periodic pattern. The surface of the first layer can have a dielectric function that varies spatially according to a periodic pattern.

At least one light emitting device can be a light emitting diode. The array of light emitting diodes can include at least one light emitting diode selected from the group consisting of red light emitting diodes, blue light emitting diodes, and green light emitting diodes. The array of light emitting diodes can include at least one red light emitting diode, at least one blue light emitting diode, and at least one green light emitting diode. The optical component can be configured to homogenize light emitted from the LED. The optical component can be configured to disperse light from the LEDs along the edge of the panel.

The system can also include a cooling system configured so that, during use, the cooling system regulates a temperature of the light emitting diode. The array of light emitting devices can be mounted on a heat sink device.

Features and advantages of the invention are in the description, drawings and claims.

DESCRIPTION OF DRAWINGS

FIG. 5 is a schematic representation of an optical display system.

FIGS. 8A and 8B are schematic representations of an optical display system.

FIG. 10 is a schematic representation of an optical display system.

FIG. 14A is a schematic representation of an optical display system.
FIG. 40 is a graph of an extraction efficiency of LEDs with different surface patterns.
FIG. 46 is a cross-sectional view of a multi-layer stack.
FIG. 47 is a cross-sectional view of a multi-layer stack.
FIG. 48 is a cross-sectional view of a multi-layer stack.
FIG. 49 is a cross-sectional view of a multi-layer stack.
FIG. 50 depicts a side view of a substrate removal process.
FIG. 51 is a partial cross-sectional view of a multi-layer stack.
FIG. 52 is a partial cross-sectional view of a multi-layer stack.

FIG. 85 is a partial cross-sectional view of a multi-layer stack.
FIG. 86 is a partial cross-sectional view of a multi-layer stack.
FIG. 87 is a partial cross-sectional view of a multi-layer stack.
FIG. 88 is a partial cross-sectional view of a multi-layer stack.
FIG. 114 is a partial cross-sectional view of a multi-layer stack.
FIG. 115 is a partial cross-sectional view of a multi-layer stack.
FIG. 116 is a partial cross-sectional view of a multi-layer stack.
FIG. 117 is a partial cross-sectional view of a multi-layer stack.
FIG. 118 is a partial cross-sectional view of a multi-layer stack.
FIG. 119 is a partial cross-sectional view of a multi-layer stack.
FIG. 126 is a partial cross-sectional view of a multi-layer stack.
FIG. 127 is a partial cross-sectional view of a multi-layer stack.
FIG. 128 is a partial cross-sectional view of a multi-layer stack.
FIG. 129 is a partial cross-sectional view of a multi-layer stack.
FIG. 130 is a partial cross-sectional view of a multi-layer stack.
FIG. 131 is a partial cross-sectional view of a multi-layer stack.
FIG. 138A is a schematic representation of a reflective surface.
FIG. 138B is a schematic representation of a reflective surface.

Like reference symbols in the various drawings indicate like elements.

DETAILED DESCRIPTION

Figure 1:
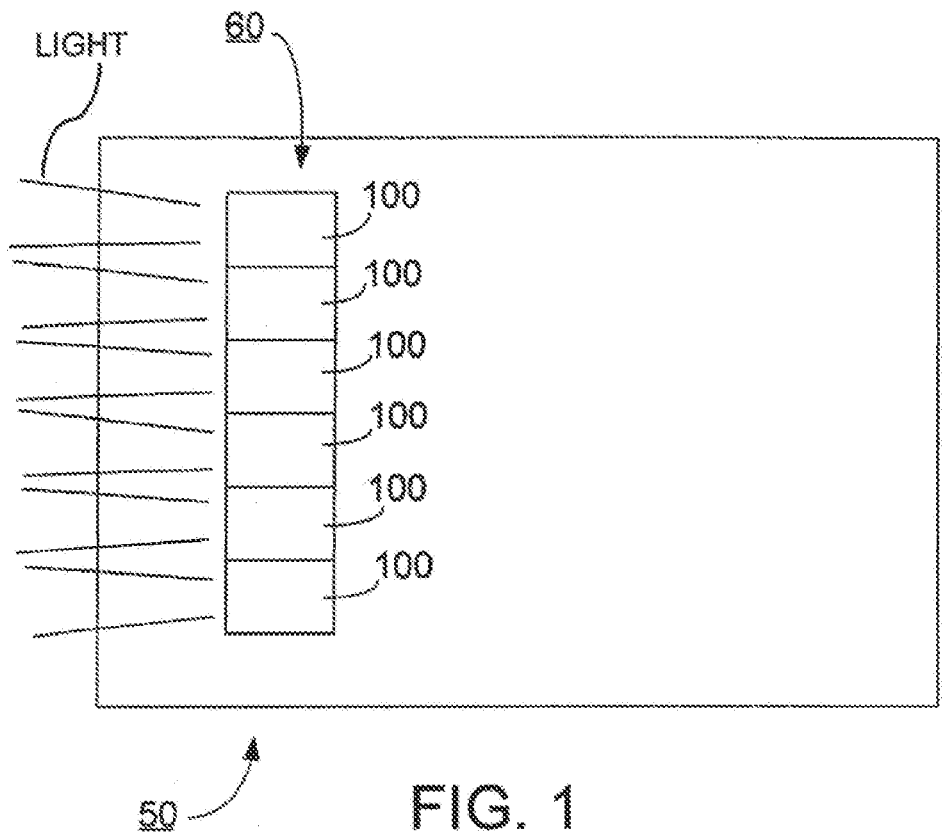
FIG. 1 is a schematic representation of a light emitting system.

FIG. 1 is a schematic representation of a light-emitting system 50 that has an array 60 of LEDs 100 incorporated therein. Array 60 is configured so that, during use, light that emerges from LEDs 100 (see discussion below) emerges from system 50 via surface 55.

Examples of light-emitting systems include projectors (e.g., rear projection projectors, front projection projectors), portable electronic devices (e.g., cell phones, personal digital assistants, laptop computers), computer monitors, large area signage (e.g., highway signage), vehicle interior lighting (e.g., dashboard lighting), vehicle exterior lighting (e.g., vehicle headlights, including color changeable headlights), general lighting (e.g., office overhead lighting), high brightness lighting (e.g., streetlights), camera flashes, medical devices (e.g., endoscopes), telecommunications (e.g. plastic fibers for short range data transfer), security sensing (e.g. biometrics), integrated optoelectronics (e.g., intrachip and interchip optical interconnects and optical clocking), military field communications (e.g., point to point communications), biosensing (e.g. photo-detection of organic or inorganic substances), photodynamic therapy (e.g. skin treatment), night-vision goggles, solar powered transit lighting, emergency lighting, airport runway lighting, airline lighting, surgical goggles, wearable light sources (e.g. life-vests). An example of a rear projection projector is a rear projector television. An example of a front projection projector is a projector for displaying on a surface, such as a screen or a wall. In some embodiments, a laptop computer can include a front projection projector.

Typically, surface 55 is formed of a material that transmits at least about 20% (e.g., at least about 30%, at least about 40%, at least about 50%, at least about 60%, at least about 70%, at least about 80%, at least about 90%, at least about 95%) of the light that emerges from LEDs 100 and impinges on surface 55. Examples of materials from which surface 55 can be formed include glass, silica, quartz, plastic, and polymers.

In some embodiments, it may be desirable for the light that emerges (e.g., total light intensity, light intensity as a function of wavelength, and/or peak emission wavelength) from each LED 100 to be substantially the same. An example is time-sequencing of substantially monochromatic sources (e.g. LEDs) in display applications (e.g., to achieve vibrant full-color displays). Another example is in telecommunications where it can be advantageous for an optical system to have a particular wavelength of light travel from the source to the light guide, and from the light guide to the detector. A further example is vehicle lighting where color indicates signaling. An additional example is in medical applications (e.g., photosensitive drug activation or biosensing applications, where wavelength or color response can be advantageous).

In certain embodiments, it may be desirable for the light that emerges (e.g., total light intensity, light intensity as a function of wavelength, and/or peak emission wavelength) from at least some of LEDs 100 to be different from the light that emerges (e.g., total light intensity, light intensity as a function of wavelength, and/or peak emission wavelength) from different LEDs 100. An example is in general lighting (e.g., where multiple wavelengths can improve the color rendering index (CRI)). CRI is a measurement of the amount of color shift that objects undergo when lighted by the light-emitting system as compared with the color of those same objects when seen under a reference lighting system (e.g., daylight) of comparable correlated temperature. Another example is in camera flashes (e.g., where substantially high CRI, such as substantially close to the CRI of noontime sunlight, is desirable for a realistic rendering of the object or subject being photographed). A further example is in medical devices (e.g., where substantially consistent CRI is advantageous for tissue, organ, fluid, etc. differentiation and/or identification). An additional example is in backlighting displays (e.g., where certain CRI white light is often more pleasing or natural to the human eye).

Although depicted in FIG. 1 as being in the form of an array, LEDs 100 can be configured differently. As an example, in some embodiments, system 50 includes a single LED 100. As another example, in certain embodiments, the array is curved to help angularly direct the light from various sources onto the same point (e.g., an optic such as a lens). As a further example, in some embodiments, the array of devices is hexagonally distributed to allow for close-packing and high effective surface brightness. As an additional example, in certain embodiments, the devices are distributed around a mirror (e.g., a dichroic mirror) that combines or reflects light from the LEDs in the array.

In FIG. 1 the light that emerges from LEDs 100 is shown as traveling directly from LEDs 100 to surface 55. However, in some embodiments, the light that emerges from LEDs 100 can travel an indirect path from LEDs 100 to surface 55. As an example, in some embodiments, system 50 includes a single LED 100. As another example, in certain embodiments, light from LEDs 100 is focused onto a microdisplay (e.g., onto a light valve such as a digital light processor (DLP) or a liquid crystal display (LCD)). As a further example, in some embodiments, light is directed through various optics, mirrors or polarizers (e.g., for an LCD). As an additional example, in certain embodiments, light is projected through primary or secondary optics, such as, for example, a lens or a set of lenses.

Figure 2A:
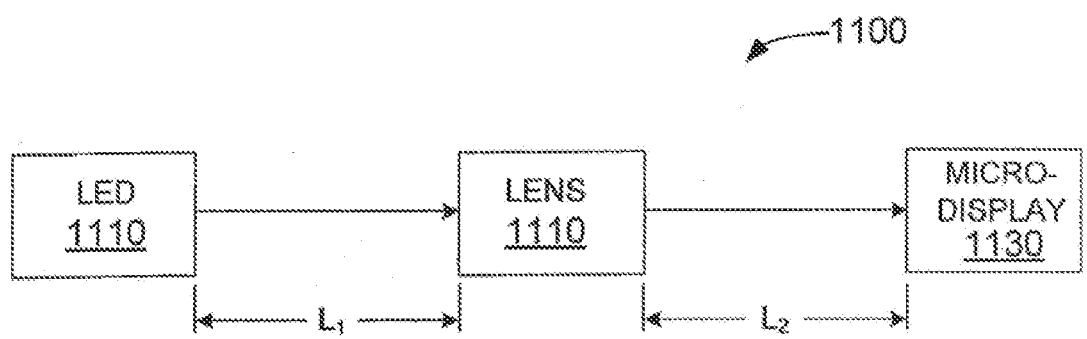
FIG. 2A-2D are schematic representations of optical display systems.

FIG. 2A shows an optical display system 1100 (see discussion above) including a non-Lambertian LED 1110 (see discussion below), a lens 1120 and a microdisplay 1130. LED 1110 is spaced a distance L1 from lens 1120, and microdisplay 1130 is spaced a distance L2 from lens 1120. Distances L1 and L2 are selected so that, for light emitted by LED 1110 that impinges on lens 1120, the image plane of lens 1120 coincides with the surface of microdisplay 1130 on which the light emitted by LED 1110 impinges.

With this arrangement, system 1100 can use the light emitted by LED 1110 to relatively efficiently illuminate the surface of microdisplay 1130 with the shape of the surface of LED 1110 that emits light being about the same as the shape of the surface of 1130 that is illuminated by the light emitted by LED 1110. For example, in some embodiments, the ratio the aspect ratio of LED 1110 to the aspect ratio of microdisplay 1130 can be from about 0.5 to about 2 (e.g., from about 9/16 to about 16/9, from about 3/4 to about 4/3, about 1). The aspect ratio of microdisplay 1130 can be, for example, 1920× 1080, 640×480, 800×600, 1024×700, 1024×768, 1024×720, 1280×720, 1280×768, 1280×960, or 1280×1064.

In general, the surface of microdisplay 1130 and/or the surface of LED 1110 can have any desired shape. Examples of such shapes include square, circular, rectangular, triangular, trapezoidal, and hexagonal.

Figure 2B:
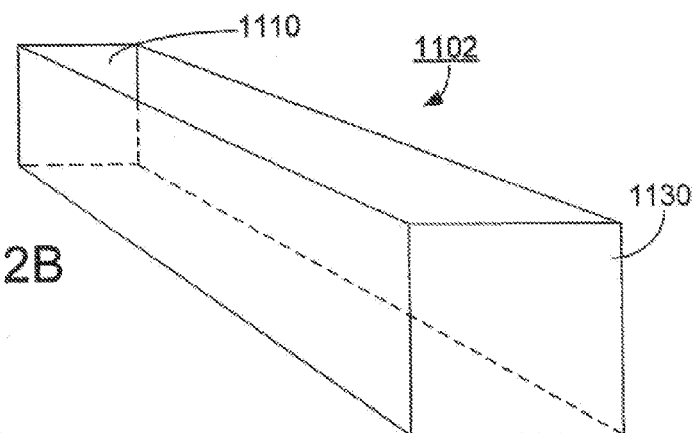
Figure 2C:
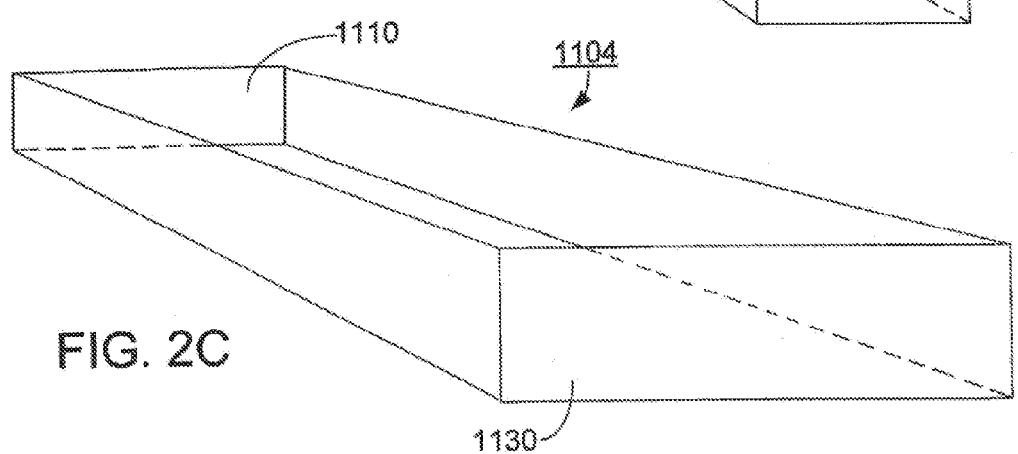

In some embodiments, an optical display system can relatively efficiently illuminate the surface of microdisplay 1130 without a lens between LED 1110 and microdisplay 1130 while still having the shape of the surface of LED 1110 that emits light being about the same as the shape of the surface of 1130 that is illuminated by the light emitted by LED 1110. For example, FIG. 2B shows a system 1102 in which a square LED 1110 is imaged onto a square microdisplay 1130 without having a lens between LED 1110 and microdisplay 1130. As another example, FIG. 2C shows an optical display system 1104 in which a rectangular LED 1110 can be imaged onto a rectangular microdisplay 1130 (with a similarly proportioned aspect ratio) without having a lens between LED 1110 and microdisplay 1130.

Figure 2D:
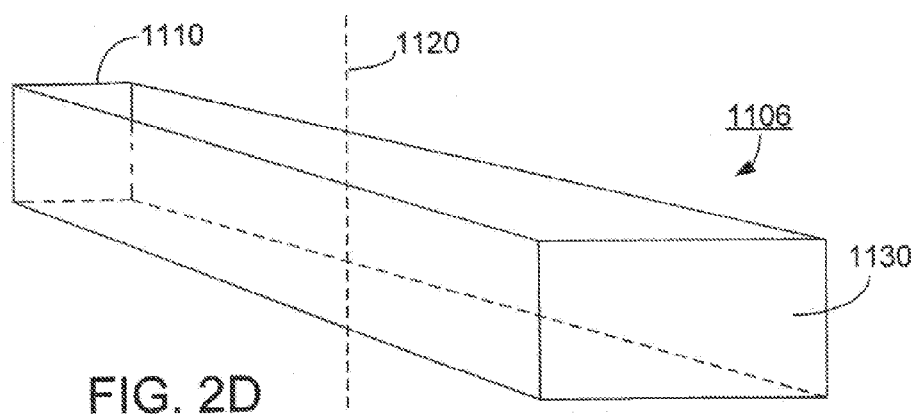

In certain embodiments, an anamorphic lens can be disposed between LED 1110 and microdisplay 1130. This can be desirable, for example, when the aspect ratio of LED 1110 is substantially different from the aspect ratio of microdisplay 1130. As an example, FIG. 2D shows a system 1106 that includes LED 1110 having a substantially square shaped surface, microdisplay 1130 having a substantially rectangular shaped surface (e.g., an aspect ratio of about 16:9 or about 4:3), and an anamorphic lens 1120 disposed between LED 1110 and microdisplay 1130. In this example, anamorphic lens 1120 can be used to convert the shape of the light emitted by LED 1110 to substantially match the shape of the surface of microdisplay 1130. This can enhance the efficiency of the system by increasing the amount of light emitted by the surface of LED 1110 that impinges upon the surface of microdisplay 1130.

Figure 3:
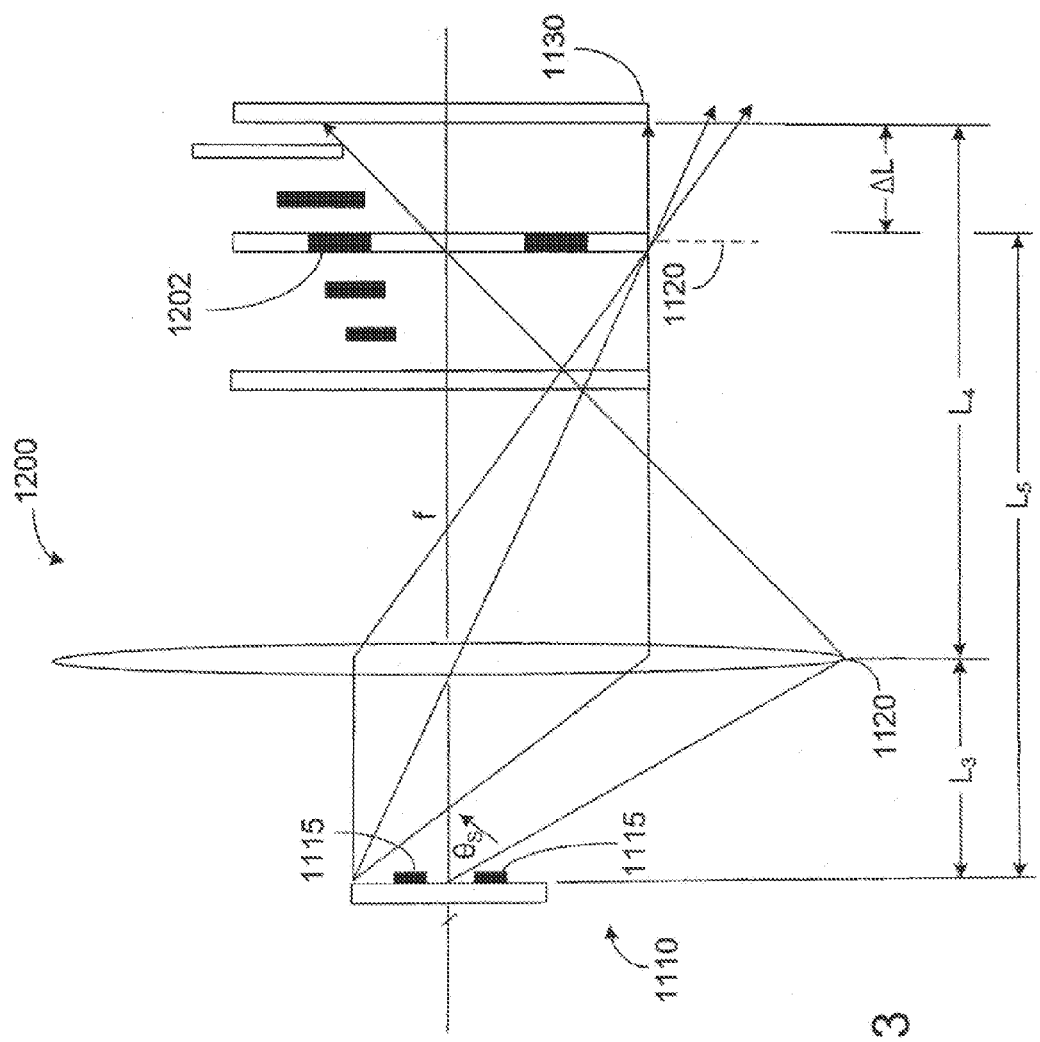
FIG. 3 is a schematic representation of an optical display system.

FIG. 3 shows an optical display system 1200 including LED 1110, lens 1120, and microdisplay 1130. The light emitting surface of LED 1110 has contact regions to which electrical leads 1115 are attached (see discussion below). LED 1110 is spaced a distance L3 from lens 1120, and microdisplay 1130 is spaced a distance L4 from lens 1120. Leads 1115 block light from being emitted from the contact regions of LED 1110. If the plane of the surface of microdisplay 1130 on which the light emitted by LED 1110 impinges coincides with the image plane of lens 1120, a set of dark spots 1202 corresponding to the contact region of the light emitting surface of LED 1110 can appear on this surface of microdisplay 1130. To reduce the area of this surface of microdisplay 1130 that is covered by the dark spots, distances L3 and L4 are selected so that, for light emitted by LED 1110 that impinges on lens 1120, the image plane of lens 1120 does not coincide with the plane of the surface of microdisplay 1130 on which the light emitted by LED 1110 impinges (i.e., there exists a distance, ΔL, between the image plane of lens 1120 and the plane of the surface of microdisplay 1130 on which the light emitted by LED 1110 impinges). With this arrangement, the light from LED 1110 is defocused in the plane of the surface of microdisplay 1130 on which the light emitted by LED 1110 impinges, and the resulting intensity of light is more uniform on this surface of microdisplay 1130 than in the image plane of lens 1120. The total distance between the LED and the microdisplay 1130 can be represented as the distance between the LED 1110 and the image plane 1120 (L5) plus the distance, ΔL. In general, as ΔL is increased by increasing the distance between the LED 1110 and the microdisplay 1130, the intensity of dark spots decreases but the intensity of light emitted by LED 1110 that impinges on the surface of microdisplay 1130 decreases. Alternately, when the microdisplay is translated such that the distance between the LED 1110 and the microdisplay 1130 is decreased, the intensity is greater than the intensity at the image plane, but the microdisplay may be only partially illuminated. In some embodiments, the absolute value of ΔL/L5 is from about 0.00001 to about 1 (e.g., from about 0.00001 to about 0.1, from about 0.00001 to about 0.01, from about 0.00001 to about 0.001), or from about 0.00001 to about 0.0001) In some embodiments, multiple LEDs may be used to illuminate a single microdisplay (e.g., a 3×3 matrix of LEDs). Such a system can be desirable because, when multiple LEDs are arranged to illuminate a single microdisplay, if one LEDs fails, the system would still be useable (however a dark spot may occur due to the absence of light from the particular LED). If multiple LEDs are used to illuminate a single microdisplay, the optical system can be configures so that dark spots do not appear on the surface of the microdisplay. For example, the microdisplay can be translated outside of the image plane such that the area between the LEDs does not result in a dark spot.

Figure 4A:
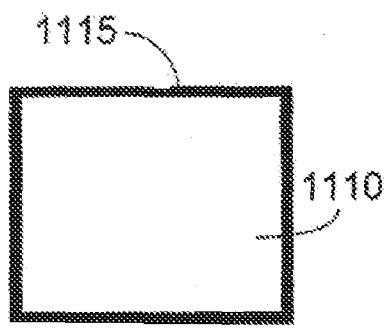
FIG. 4A is a schematic representation of a top view of an LED.

In some embodiments, the intensity of dark spots on the surface of microdisplay 1130 can be reduced by appropriately configuring the contact region of the surface of LED 1110. For example, FIG. 4A shows a top view of an LED 1110 with a contact region disposed around the perimeter of LED 110. With this arrangement, with or without the presence of a lens (with or without defocusing), the optical display system can be configured (e.g., by properly sizing the area of the surface of microdisplay 1130) so that the intensity of the dark spots created by the contact region of the surface of LED 1110 on surface 1130 is relatively small. This approach may be used with systems that include multiple LEDs (e.g., a 3×3 matrix of LEDs).

Figure 4B:
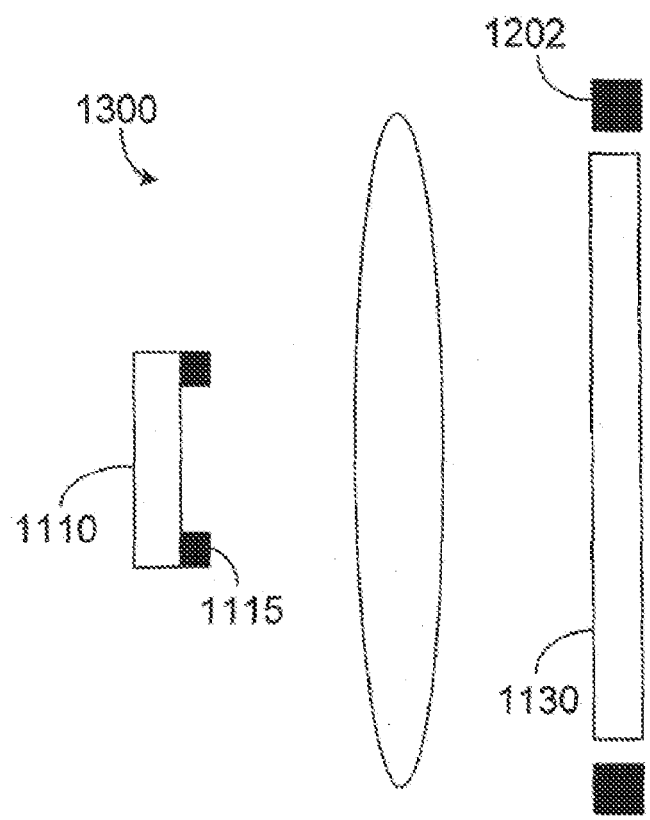
FIG. 4B is a schematic representation of an optical display system.

As another example, FIG. 4B shows an optical display system 300 that includes LED 1110 and microdisplay 1130. LED 1110 includes a contact region formed by leads 1115 that is selected so that dark spots 1202 appear at a region not imaged on the surface of microdisplay 1130. In this example, the surface of microdisplay 1130 can be located at the image plane of lens 1120 because the dark spots fall outside of the area imaged on the microdisplay at the image plane of lens 1120. If the shape of LED 1110 is matched to the shape of microdisplay 1130, leads 1115 can be disposed, for example, on the surface of LED 1110 around its perimeter. In this example, the area inside the contact region of surface 1110 matches (e.g., the aspect ratio is similar) to the surface of microdisplay 1130. This approach may be used with systems that include multiple LEDs (e.g., a 3×3 matrix of LEDs).

As a further example, FIG. 5 shows an optical display system 1700 that includes LED 1110 and microdisplay 1130. LED 1110 also includes a contact region formed by leads 1115 and a homogenizer 1702 (also referred to as a light tunnel or light pipe) that guides light emitted from LED 1110 to a lens 1120. Total internal reflection of the light emitted by LED 1110 off the inside surfaces of homogenizer 1702 can generate a substantially uniform output distribution of light and can reduce the appearance of dark spots caused by leads 1115 so that microdisplay 1130 is substantially uniformly illuminated by LED 1110 (e.g., an image generated in an image plane 1131 is substantially uniform).

Optionally, system 1700 can include one or more additional optical components. For example, in some embodiments, optical display system 1700 can also include a lens disposed in the path prior to the homogenizer to focus light into the homogenizer. In certain embodiments, the aspect ratio of the aperture of homogenizer 1702 matches that of LED 1110 such that when LED 1110 is mounted in close proximity to homogenizer 1702, additional lenses may not be necessary or such that more efficient coupling of light into homogenizer 1702 is possible with a lens prior to homogenizer 1702.

Figure 6:
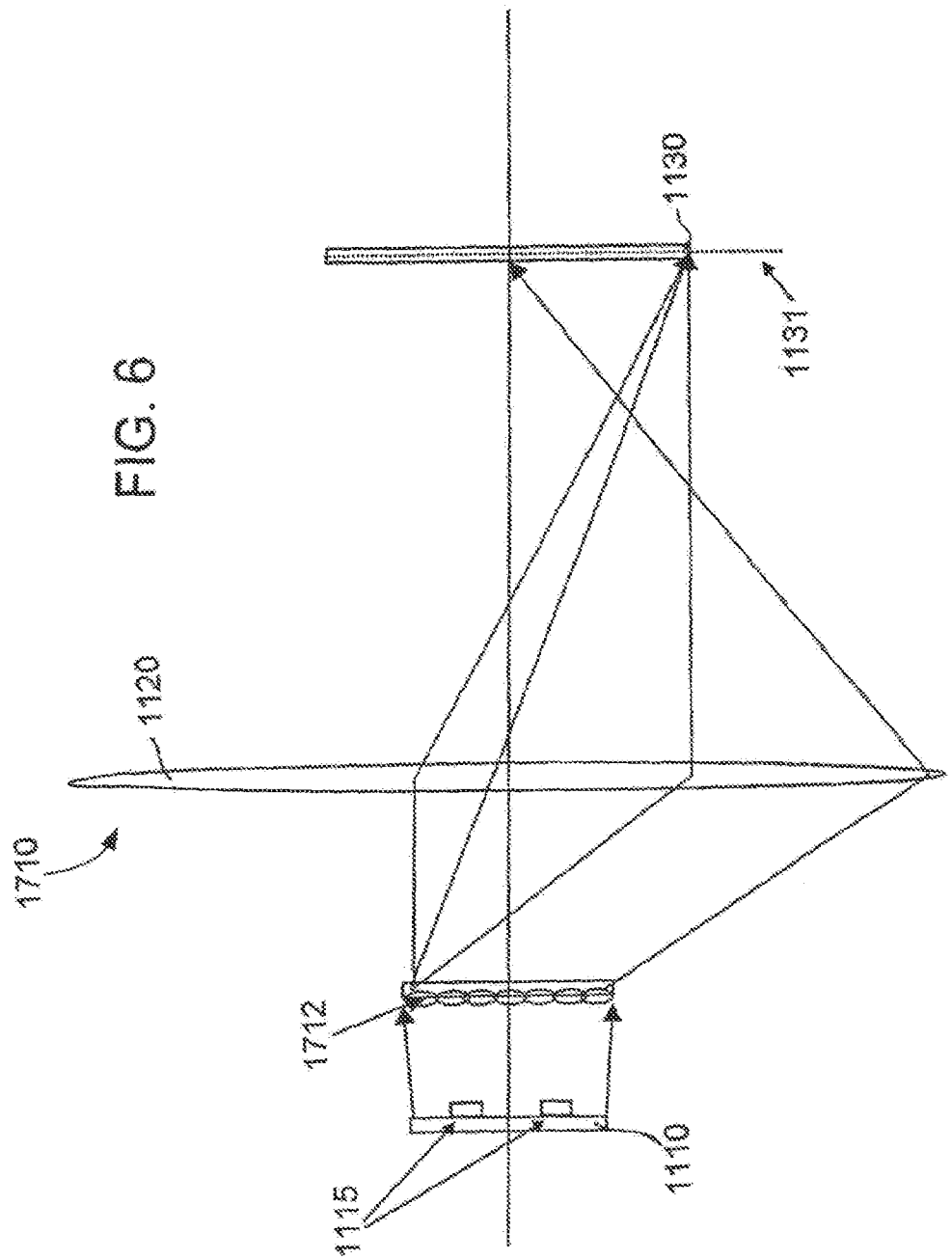
FIG. 6 is a schematic representation of an optical display system.

As an additional example, FIG. 6 shows an optical display system 1710 that includes LED 1110 and microdisplay 1130. LED 1110 also includes a contact region formed by leads 1115 and a set of multiple lenses 1712 that are disposed between LED 1110 and lens 1120. Lenses 1712 can vary in size, shape, and number. For example, the number and size of lenses 1712 can be proportional to the cross-sectional area of LED 1110. In some embodiments, lenses 1712 include a set of between about 1 and about 100 lenses with sizes varying of, for example, from about 1 mm to about 10 cm. The light emitted by LED 1110, enters lenses 1712 and is refracted. Since the surfaces of lenses 1712 are curved, the light refracts at different angles causing the beams emerging from lenses 1712 to overlap. The overlapping of the beams reduces the appearance of dark spots caused by leads 1115 so that microdisplay 1130 is substantially uniformly illuminated by LED 1110 (e.g., an image generated in an image plane 1131 is substantially uniform).

While optical display systems have been described as including a single lens, in some embodiments, multiple lenses can be used. Further, in certain embodiments, one or more optical components other than lens(es) can be used. Examples of such optical components include mirrors, reflectors, collimators, beam splitters, beam combiners, dichroic mirrors, filters, polarizers, polarizing beam splitters, prisms, total internal reflection prisms, optical fibers, light guides and beam homogenizers. The selection of appropriate optical components, as well as the corresponding arrangement of the components in the system, is known to those skilled in the art.

Figure 7:
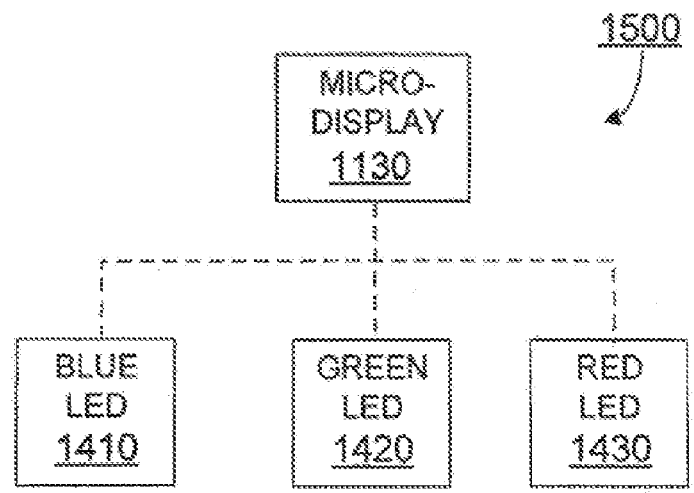
FIG. 7 is a schematic representation of an optical display system.

Moreover, although optical display systems have been described as including one non-Lambertian LED, in some embodiments, more than one non-Lambertian LED can be used to illuminate microdisplay 1130. For example, FIG. 7 shows a system 1500 that includes a blue LED 1410 (an LED with a dominant output wavelength from about 450 to about 480 nm), a green LED 1420 (an LED with a dominant output wavelength from about 500 to about 550 nm), and a red LED 1430 (an LED with a dominant output wavelength from about 610 to about 650 nm) which are in optical communication with the surface of microdisplay 1130. LEDS 1410, 1420, and 1430 can be arranged to be activated simultaneously, in sequence or both. In other embodiments, at least some of the LEDs may be in optical communication with separate microdisplay surfaces.

In some embodiments, LEDs 1410, 1420, and 1430 are activated in sequence. In such embodiments, a viewer's eye generally retains and combines the images produced by the multiple colors of LEDs. For example, if a particular pixel (or set of pixels) or microdisplay (or portion of a microdisplay) of a frame is intended to be purple in color, the surface of the microdisplay can be illuminated with red LED 1430 and blue LED 1410 during the appropriate portions of a refresh cycle. The eye of a viewer combines the red and the blue and "sees" a purple microdisplay. In order for a human not to notice the sequential illumination of the LEDs, a refresh cycle having an appropriate frequency (e.g., a refresh rate greater than 120 Hz) can be used.

LEDs 1410, 1420 and 1430 may have varying intensities and brightness. For example, green LED 1420 may have a lower efficiency than red LED 1430 or blue LED 1410. Due to a particular LED (e.g., green LED 1420) having a lower efficiency, it can be difficult to illuminate the surface of the microdisplay with a sufficiently high brightness of the color of light (e.g., green) emitted by the relatively low efficiency LED (e.g., LED 1420). To compensate for this disparity in efficiency (to produce an image that is not distorted due to the difference in light brightness), the activation cycles for the multiple LEDs can be adjusted. For example, the least efficient LED may be allocated a longer activation time (i.e., on for a longer period of time) than the more efficient LEDs. In a particular example, for a red/green/blue projection system instead of a 1/3:1/3:1/3 duty cycle allocation, the cycle may be in the ratio of 1/6:2/3:1/6 (red:green:blue). In another example, the cycle may be in the ratio of 0.25:0.45:0.30 (red:green:blue). In other examples, the duty cycle dedicated to the activation of the green LED may be further increased. For example, the duty cycle dedicated to imaging the green LED 1420 can be greater than about 40% (e.g., greater than about 45%, greater than about 50%, greater than about 60%, greater than about 70%, greater than about 80%, greater than about 90%). In some embodiments, the duty cycle for each LED is different. As an example, the duty cycle for red LED 1430 can be greater than the duty cycle for blue LED 1410. While systems have been described in which the activation cycle is selected based on the intensity and/or brightness of an LED, in some systems the activation time of an LED may be selected based on one or more other parameters. In some examples, the activation time of the least efficient light emitting device is at least about 1.25 times (e.g., at least about 1.5 times, at least about 2 times, at least about 3 times) the activation time of another light emitting device.

FIG. 8A shows an embodiment of a liquid crystal display (LCD) based optical display system 1720 including blue LED 1410, green LED 1420, and red LED 1430 (e.g., as described above) which are in optical communication with the surface of associated LCD panels 1728, 1730, and 1732. Optical display system 1720 also includes lenses 1722, 1724, and 1726 in a corresponding optical path between LEDs 1410, 1420, and 1430 and associated LCD panels 1728, 1730, and 1732. Lenses 1722, 1724, and 1726 focus the light onto associated LCD panels 1728, 1730, and 1732. Optical display system 1720 further includes a device 1734 (e.g., an x-cube) that combines multiple beams of light from LCD panels 1728, 1730, and 1732 into a single beam 1736 (indicated by arrows) that can be directed to a projection lens 1735 or other display Optionally, optical display system 1720 can include a polarizer that transmits a desired polarization (e.g. the 'p' polarization) while reflecting another polarization (e.g. the 's' polarization). The polarizer can be disposed in the path between LEDs 1410, 1420, and 1430 and associated lenses 1722, 1724, and 1726, between lenses 1722, 1724, and 1726 and the associated LCD panels 1728, 1730, and 1732, or in other locations along the optical path. As shown in FIG. 8B, in some embodiments the aspect ratio of an LED (e.g., LED 1430) can be matched to the aspect ratio of the microdisplay (e.g., microdisplay 1732) as described above.

Figure 9:
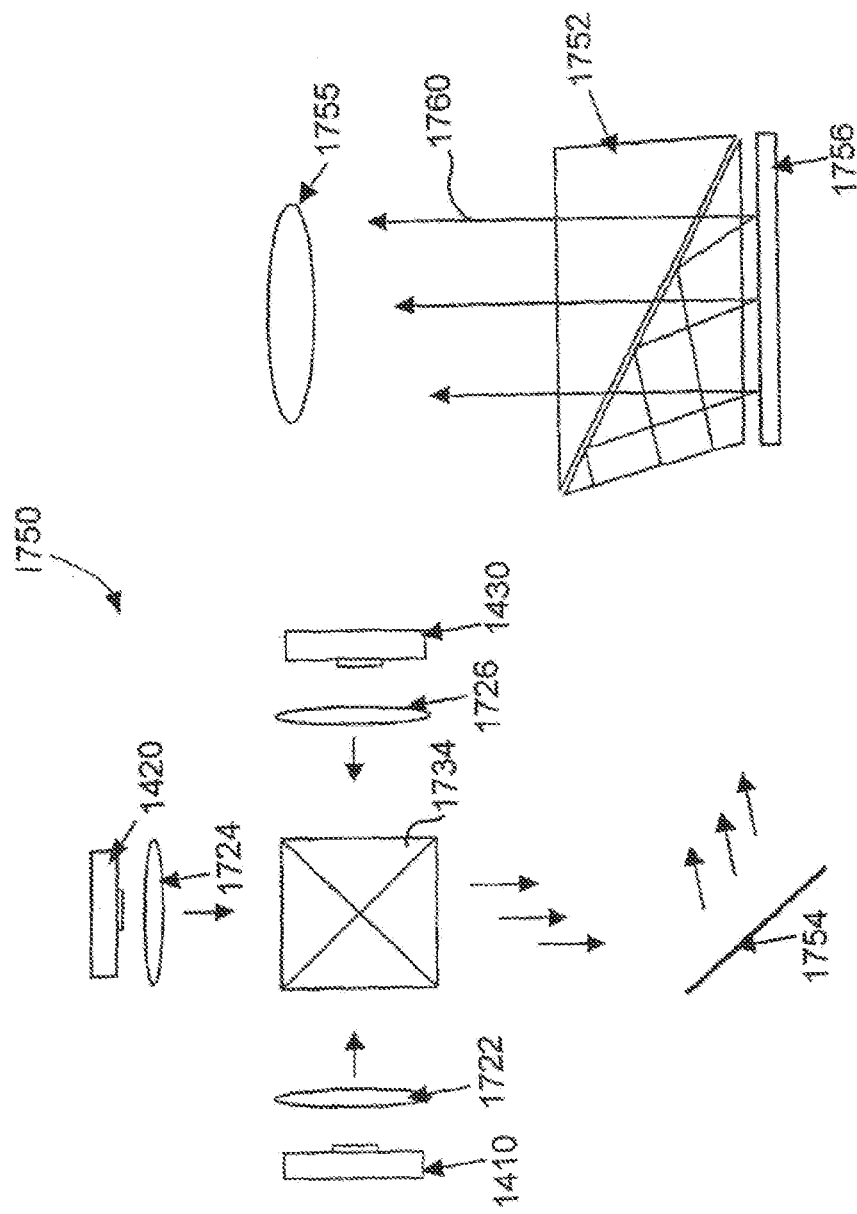
FIG. 9 is a schematic representation of an optical display system.

FIG. 9 shows an embodiment of a digital light processor (DLP) based optical display system 1750 including blue LED 1410, green LED 1420, and red LED 1430 (as described above) which are each in optical communication with associated lenses 1722, 1724, and 1726 (as described above). Light emitted from LEDs 1410, 1420, and 1430 passes through the associated lenses 1722, 1724, and 1726 and is collected by a device 1734 (e.g., an x-cube) that combines multiple beams of light emitted by LEDs 1410, 1420, and 1430 into a single beam that can be directed to a total internal reflection (TIR) prism 1752. For example, the light emerging from x-cube 1734 can be directed to TIR prism 1752 by a mirror 1754 or other device such as a light guide. TIR prism 1752 reflects light and directs the light to a DLP panel 1756. DLP panel 1756 includes a plurality of mirrors that can be actuated to generate a particular image. For example, a particular mirror can either reflect light 1760 (indicated by arrows) such that the light is directed to a projection 1755 or can cause the light to be reflected away from projection lens 1755. The combination of the LEDs 1410, 1420, and 1430 and DLP panel 1756 allow greater control of the signal. For example, the amount of data sent to DLP panel 1756 can be reduced (allowing greater switching frequency) by switching on and off LEDs 1410, 1420, and 1430 in addition to the mirrors in DLP panel 1756. For example, if no red is needed in a particular image, red LED 1430 can be switched off eliminating the need to send a signal to DLP 1752 to switch the associated mirror. The ability to modulate the LEDs can improve for example color quality, image quality, or contrast.

FIG. 10 shows a particular embodiment of a liquid crystal on silicon (LCOS) based optical display system 1770 including blue LED 1410, green LED 1420, and red LED 1430 (as described above) which are each in optical communication with an associated polarizing beam splitter 1774, 1778, and 1782. Light emitted from LEDs 1410, 1420, and 1430 passes through the associated polarizing beam splitters 1774, 1778, and 1782 and is projected onto an associated LCOS panel 1772, 1776, or 1780. Since LCOS panels 1772, 1776, and 1780 are not sensitive to all polarizations of light, the polarizing beam splitters 1774, 1778, and 1782 polarize the light to a particular polarization (e.g., by transmitting a desired polarization (e.g., the 'p' polarization) while reflecting another polarization (e.g., the 's' polarization) the polarization of some light and pass other polarizations) based on the sensitivity of LCOS panels 1772, 1776, and 1780. The light reflected from LCOS panels 1772, 1776, and 1780 is collected by a device 1734 (e.g., an x-cube) that combines the beams of light from the multiple LCOS panels 1772, 1776, and 1780 to generate a beam 1790 (indicated by arrows) that is directed to a projection lens 1795.

While in the above examples, the optical display system includes red, green, and blue light emitting devices, other colors and combinations are possible. For example, the system need not have only three colors. Additional colors such as yellow may be included and allocated a portion of the duty cycle. Alternately, multiple LEDs having different dominant wavelengths may be optically combined to produce a resulting color. For example, a blue-green LED (e.g., an LED with a dominant wavelength between the wavelength of blue and green) can be combined with a yellow LED to produce 'green' light. In general, the number of LEDs and the color of each LED can be selected as desired. Additional microdisplays can also be included.

In some embodiments, the duty cycle for the lesser efficient LED (e.g. green) can be increased by various data compression techniques and algorithms. For example, sending only the difference in image information from the previous image rather than the total information required to reconstruct each image allows an increase in the data rate. Using this method, less data needs to be sent allowing for higher data rates and reduced duty cycles for complementary colors for a given refresh cycle.

In embodiments in which multiple LEDs are used to illuminate a given microdisplay, optical componentry may or may not be present along the light path between one or more of the LEDs and the microdisplay. For example, an x-cube or a set of dichroic mirrors may be used to combine light from the multiple LEDs onto a single microdisplay. In embodiments in which optical componentry is present along the light path, different optical componentry can be used for each LED (e.g. if the surface of the LEDs are of different size or shape), or the same optical componentry can be used for more than one LED.

In some embodiments, differing brightness for a particular color based on the desired chromaticity of an image may be obtained by illuminating the display for a portion of the activation time allocated to the particular LED. For example, to obtain an intense blue, the blue LED can be activated for the entire activation time and for a less intense blue, the blue LED is activated for only a portion of the total allocated activation time. The portion of the activation time used to illuminate the display can be modulated, for example, by a set of mirrors that can be positioned to either pass light to the microdisplay or reflect the light away from the microdisplay.

In certain embodiments, an array of moveable microdisplays (e.g., a moveable mirror) is actuated to produce a desired intensity. For example, each micromirror can represent a pixel and the intensity of the pixel can be determined by the positioning of the microdisplay. For example, the micromirror can be in an on or an off state and the proportion of the time spent in the on state during the activation time of a particular color of LED determines the intensity of the image.

In general, in embodiments in which multiple LEDs are used, one or more of the LEDs (e.g., each LED) can have the aspect ratio relationship described above with respect to the aspect ratio of microdisplay 1130.

Figure 11:
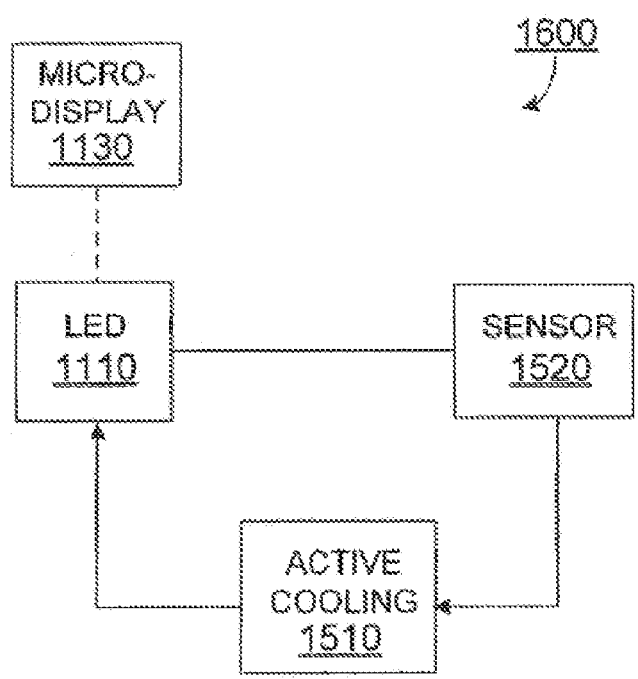
FIG. 11 is a schematic representation of an optical display system.

FIG. 11 shows an optical display system 1600 that includes LED 1110, microdisplay 1130, a cooling system 1510, and a sensor 1520 that is in thermal communication with LED 1110 and electrical communication with cooling system 1510 so that, during use of system 1600, sensor 1520 and cooling system 1510 can be used to regulate the temperature of LED 1110. This can be desirable, for example, when LED 1110 is a relatively large are LED (see discussion below) because such an LED can generate a significant amount of heat. With the arrangement shown in FIG. 11, the amount of power input to LED 1110 can be increased with (primarily, increased operational efficiency at higher drive currents) reduced risk of damaging LED 1110 via the use of sensor 1520 and cooling system 1510 to cool LED 1110. Examples of cooling systems include thermal electric coolers, fans, heat pipes, and liquid cooling systems. Sensor 1520 can be, for example, manually controlled or computer controlled. In some embodiments, the system may not include a sensor (e.g., cooling system 1510 can be permanently on, or can be manually controlled). The use of a cooling system can provide multiple advantages such as reducing the likelihood of damage to the LED resulting from an excess temperature and increasing the efficiency of the LED at higher drive currents. The cooling system may also reduce the shift in wavelength induced by temperature.

In some embodiments, using a non-lambertian LED results in non-uniform angular distribution of light. In such embodiments, the microdisplay can be translated away from the image plane to reduce the appearance of the angular non-uniformity. In certain embodiments, information flow to the microdisplay can be achieved using an electrical or optical connection. In some examples, the rate of information flow can be increased using an optical connection.

In some embodiments, the size of a PLLED or other non-lambertian source can be increased and the light can be collected at a smaller angle. This can increase the brightness of the image on a display.

Figure 12A:
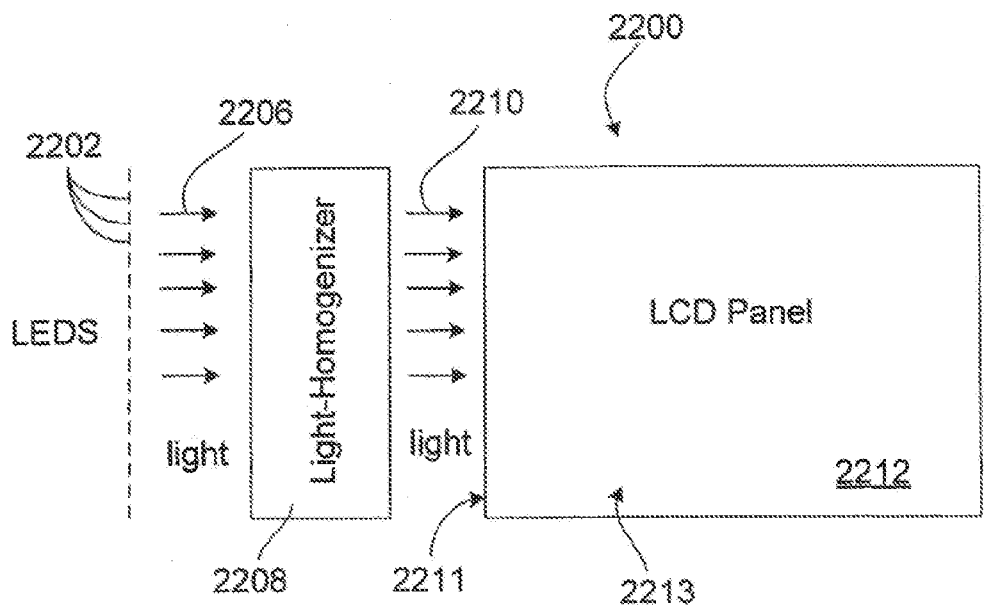
FIG. 12A is a schematic representation of an optical display system.
Figure 12B:
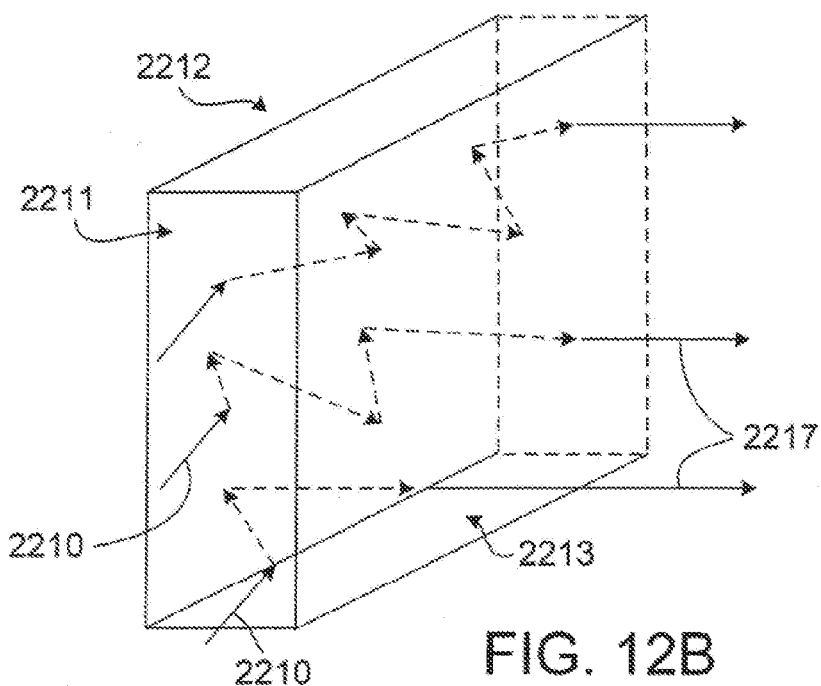
FIG. 12B is a schematic representation of an optical display system.

FIGS. 12A and 12B show an optical display system 2200 that includes multiple LEDs 2202, a light homogenizer 2208, and a liquid crystal display (LCD) panel 2212. LEDs 2202 are disposed along an edge 2211 of LCD panel 2212 and emit light (represented by arrows 2206) to illuminate LCD panel 2212, allowing LCD panel 2212 to display an image. The light 2206 emitted by LEDs 2202 impinges on light homogenizer 2208 (e.g., a light tunnel, a light pipe) that guides light 2206 to LCD panel 2212 (represented by arrows 2210). Total internal reflection of light 2206 off the inside surfaces of homogenizer 2208 generates a substantially uniform output distribution of light 2210 so that LCD panel 2212 is substantially uniformly illuminated by LEDs 2202 (e.g., a distribution of light entering edge 2211 of LCD panel 2212 is substantially uniform). For example, in some embodiments, a substantially uniform light distribution includes a light distribution having an intensity and/or color distribution of light entering edge 2211 that varies by at most about 20% (e.g., at most about 10%, at most about 5%, at most about 1%) at different locations on edge 2211. Subsequent to entering edge 2211 of LCD panel 2212, light 2210 reflects off internal surfaces and/or scattering centers in the LCD panel 2212 (represented by arrows 2215) and emerges from a front surface 2213 of LCD panel 2212 (represented by arrows 2217).

Figure 13:
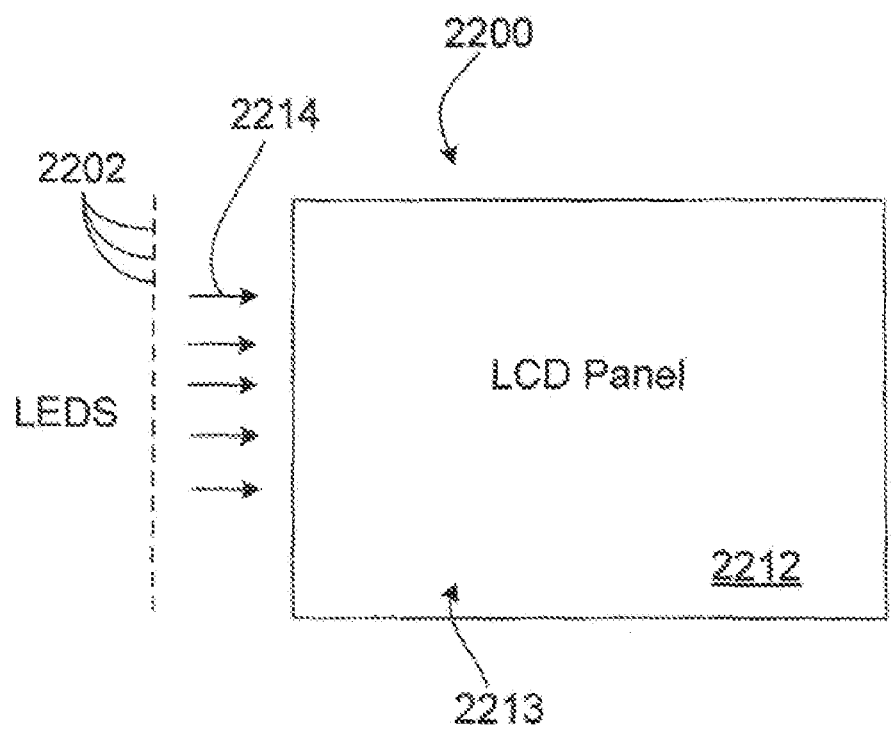
FIG. 13 is a schematic representation of an optical display system.

LEDs 2202 can include multiple devices that emit different wavelengths of light (e.g., red, green, blue, cyan, yellow, magenta) or that emit monochromatic light (e.g., substantially white). While in optical display system 2200 shown in FIGS. 12A and 12B, light 2206 emitted from LEDs 2202 passes through homogenizer 2208, as shown in FIG. 13, in some embodiments light emitted from LEDs 2202 (represented by arrows 2214) impinges on edge 2211 of LCD panel 2212 without passing through additional optical components. It is believed that, in some embodiments, a substantially uniform light distribution can be formed by mixing of the different wavelengths or colors of light emitted by LEDs 2202 within LCD panel 2212 as the light bounces off reflective surfaces, or scattering centers in the LCD panel 2212 (e.g., as shown in FIG. 12B).

Figure 14B:
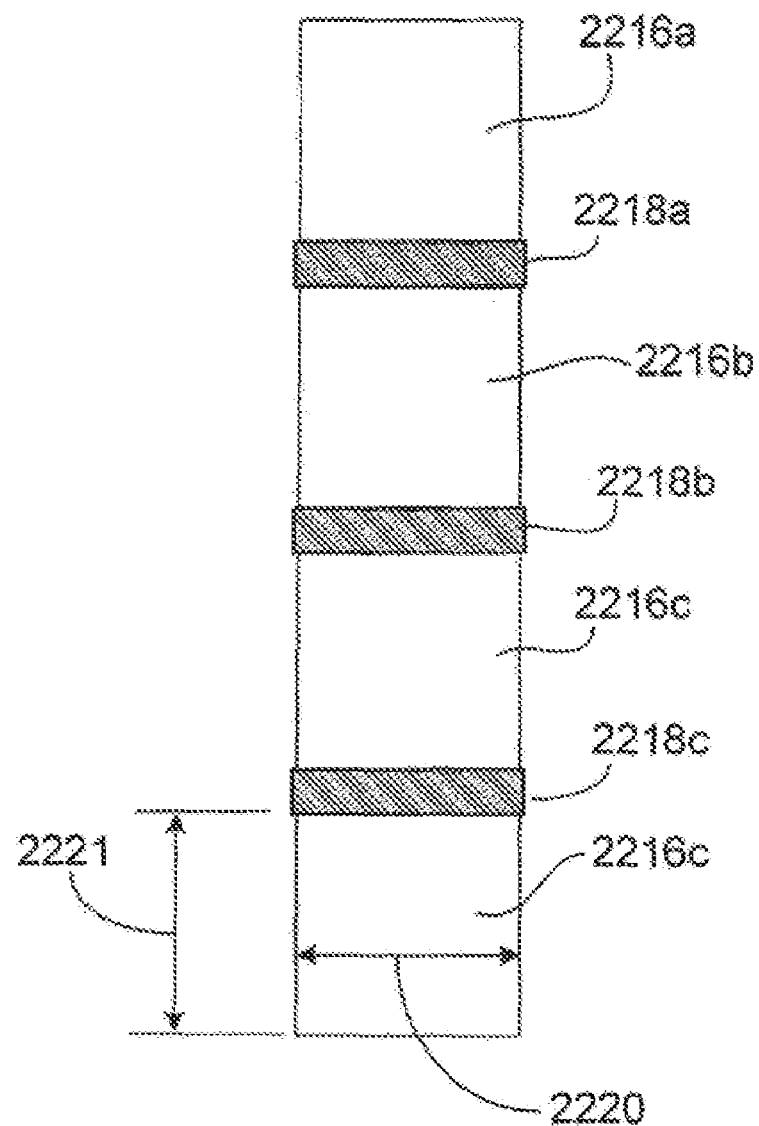
FIG. 14B is a top view of an array of LEDs.
Figure 15:
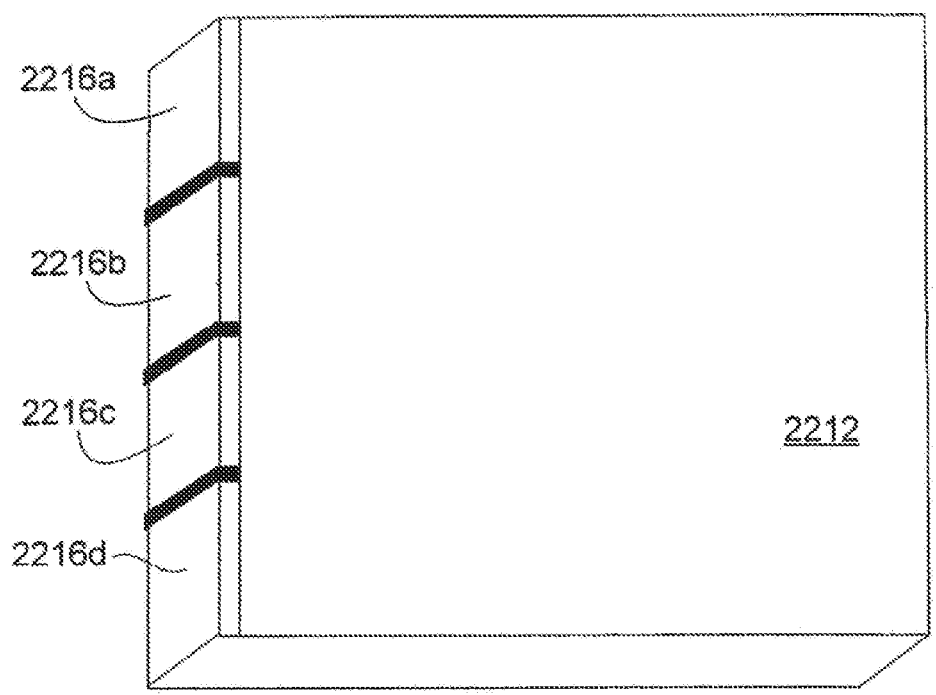
FIG. 15 is a schematic representation of an optical display system.

FIG. 14A shows an optical display system 2229 that includes multiple LEDs 2216a, 2216b, 2216c, and 2216d that provide illumination to LCD panel 2212. FIG. 14B shows a top view of a surface 2222 of LEDs 2216a, 2216b, 2216c, and 2216d through which light emerges. The shape and placement of LEDs 2216a, 2216b, 2216c, and 2216d along edge 2211 of panel 2212 can vary as desired. FIGS. 14A and 14B show an exemplary arrangement in which multiple rectangular die are arranged along edge 2211 of panel 2212. LEDs 2216a, 2216b, 2216c, and 2216d can be mounted at a distance 2230 from edge 2211. As an example, distance 2230 can be relatively small (e.g., about one millimeter or less, about two millimeters or less, about three millimeters or less, about five millimeters or less, or about 10 millimeters). Optionally, as shown in FIG. 15, LEDs 2216a, 2216b, 2216c, and 2216d can be attached and/or embedded directly on LCD panel 2212.

Optical display system 2229 can include LEDs that emit light of various colors. For example, optical display system 2229 can include blue LEDs (an LED with a dominant output wavelength from about 450 to about 480 nm), green LEDs (an LED with a dominant output wavelength from about 500 to about 550 nm), and red LEDs (an LED with a dominant output wavelength from about 610 to about 650 nm) which are in optical communication with edge 2211 of LCD panel 2212. Other colors and combinations are possible. For example, the system need not have all three colors or only three colors. Additional colors such as yellow (an LED with a dominant output wavelength from about 570 to about 600 nm) and/or cyan (an LED with a dominant output wavelength from about 480 to about 500 nm), may be included. In a 5 color LED system (red, green, blue, yellow, cyan), a dominate output wavelength for blue from about 430 to 480 may be desired.

As described above, various colors of LEDs may have varying intensities and/or brightness. For example, a green LED may have a lower efficiency than a red or a blue LED. Due to a particular LED having a lower efficiency, in some embodiments, it may be beneficial to increase the number or size of LEDs of a particular color to compensate for this disparity in efficiency. For example, the least efficient LED may be allocated a greater percentage of the emitting area (e.g., have a larger total surface area) than the more efficient LEDs. As an example, in optical display system 2229, LEDs 2216a, 2216b, 2216c, and 2216d may include one red LED, one blue LED, and two green LEDs. The number and combination of colors can vary as desired.

In some embodiments, optical display system 2229 can include one or more die (e.g., one or more of LEDs 2216a, 2216b, 2216c, and 2216d) having a width 2220 configured to match a thickness 2224 of LCD panel 2212. For example, a ratio of width 2220 to thickness 2224 can be from about 0.5 to about 1.3 (e.g., about 0.5, about 0.6, about 07, about 0.8, about 0.9, about 1, about 1.1, about 1.2, about 1.3).

The width of the LED can be selected so that increased light coupling into the LCD panel can occur with respect to illumination profile of the LED. In some embodiments, it can be desirable for LEDs 2216a, 2216b, 2216c, and 2216d to have a width 2220 that is less than thickness 2224 of LCD panel 2212 such that light emitted from the LEDs is substantially coupled into the LCD. For example, width 2220 can be less than thickness 2224 by at least about 0.5 millimeter (e.g., at least about one millimeter, at least about two millimeters, at least about three millimeters, at least about four millimeters, by at least about 5 millimeters). In some embodiments, it can be desirable for LEDs 2216a, 2216b, 2216c, and 2216d to have a width 2220 that is greater than thickness 2224 of LCD panel 2212 such that light emitted from the LEDs impinges on a substantial portion or the entire edge 2211 of LCD panel 2212. For example, width 2220 can be at least about one millimeter (e.g., at least about 1.5 millimeters, at least about two millimeters, at least about 2.5 millimeters, at least about three millimeters, at least about five millimeters, at least about ten millimeters) greater than thickness 2224 of LCD panel 2212. Length 2221 of the LEDs can vary depending on various factors such as a total length 2226 or width 2228 of LCD panel 2212 and the number of LEDs disposed along edge 2211.

In some embodiments, it is believed an LED with a surface having a pattern can increase extraction of the light out of the LED (as described below). Increased light extraction can provide better illumination of the LCD panel.

While optical display system 2229 shown in FIGS. 14A and 14B includes multiple LEDs 2216a, 2216b, 2216c, and 2216d having a width 2220 approximately equal to thickness 2224 of LCD panel 2212, other die shapes and array placements are possible.

Figure 16:
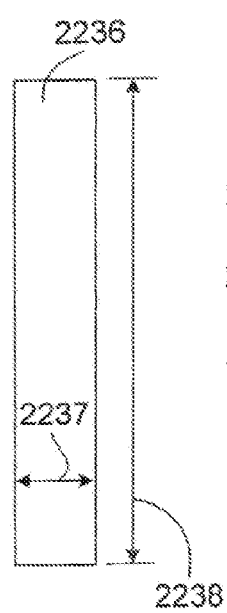
FIG. 16 is a top view of an array of LEDs.

In some embodiments, the dimensions of edge 2211 of LCD 2212 can be sufficiently small such that is can be desirable and/or possible to illuminate LCD 2212 using a single LED. Examples of such sufficiently small LCD panels can include hand held displays, clocks, watches, mobile phones, hand held games, and personal digital assistants. For example, FIG. 16 shows a top view a surface of an LED 2236 through which light emerges from LED 2236. LED 2236 can be disposed along edge 2211 of LCD panel 2212 and provide the illumination for LCD panel 2212. LED 2236 has a width 2220 that is approximately the same as the thickness 2224 of LCD panel 2212. For example, a ratio of a width 2237 of LED 2236 to a thickness 2224 of LCD panel 2212 can be from about 0.5 to about 1.3 (e.g., about 0.5, about 0.6, about 0.7, about 0.8, about 0.9, about 1, about 1.1, about 1.2, about 1.3). LED 2236 has a length 2238 that is approximately the same as length 2226 of LCD panel 2212. For example, a ratio of length 2238 of LED 2236 to a length 2226 of LCD panel 2212 can be from about 0.1 to about 1.2 (e.g., about 0.1, about 0.2, about 0.3, about 0.4, about 0.5, about 0.6, about 0.7, about 0.8, about 0.9, about 1, about 1.1 about 1.2). LED 2236 can emit different wavelengths of light (e.g., red, green, blue, cyan, yellow, magenta) or that emit monochromatic light (e.g., substantially white).

Figure 17:
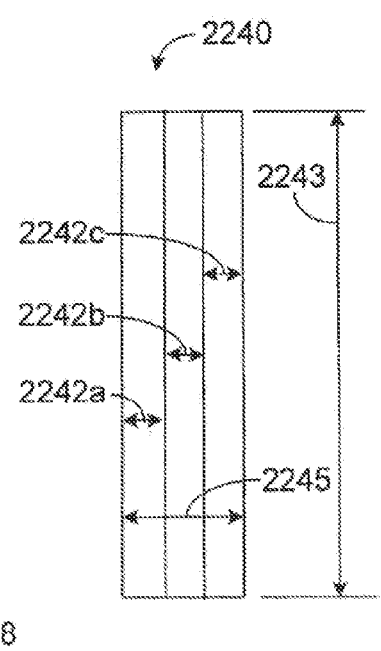
FIG. 17 is a top view of an array of LEDs.
Figure 18:
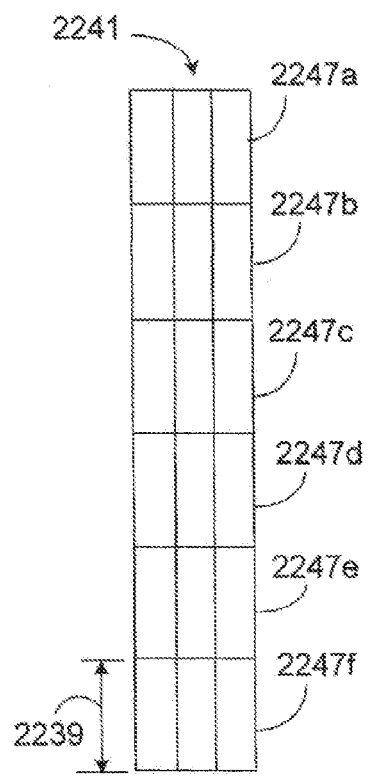
FIG. 18 is a top view of an array of LEDs.

In another example, FIG. 17 shows a top view of a surface of an array 2240 of long, thin LEDs 2242a, 2242b, and 2242c each having associated widths 2244a, 2244b, and 2244c respectively. Array 2240 can be positioned along LCD edge 2211 and a total width 2245 of the array 2240 (e.g., a sum of width 2244a, width 2244b, width 2244c, and any spacing disposed between LEDs 2242a, 2242b, and 2242c) is approximately the same as thickness 2224 of LCD panel 2212. For example, a ratio of total width 2245 to thickness 2224 of LCD panel 2212 can be from about 0.5 to about 1.3 (e.g., about 0.5, about 0.6, about 0.7, about 0.8, about 0.9, about 1, about 1.1, about 1.2, about 1.3). LEDs 2242a, 2242b, and 2242c can have an associated length 2243 that is approximately the same as length 2226 of LCD panel 2212. For example, a ratio of length 2243 of LEDs 2242a, 2242b, and 2242c to a length 2226 of LCD panel 2212 can be about from about 0.1 to about 1.2 (e.g., about 0.1, about 0.2, about 0.3, about 0.4, about 0.5, about 0.6, about 0.7, about 0.8, about 0.9, about 1, about 1.1, about 1.2). Alternatively or additionally, as shown in FIG. 18, in some embodiments, LEDs 2242a, 2242b, and 2242c can have a length 2239 that is less than length 2226 of LCD panel 2212 and multiple arrays 2247a, 2247b, 2247c, 2247d, 2247e, and 2247f of LEDs can be disposed along edge 2211 of LCD panel 2212.

The LEDs in arrays 2240 and 2241 can include multiple LEDs that emit different wavelengths of light (e.g., red, green, blue, cyan, yellow, magenta) or that emit monochromatic light (e.g., substantially white). The LEDs in a particular column can emit the same wavelength or emit different wavelengths and the columns can include LEDs that emit the same wavelength or emit different wavelengths compared to the LEDs in other columns.

Figures 19, 20:
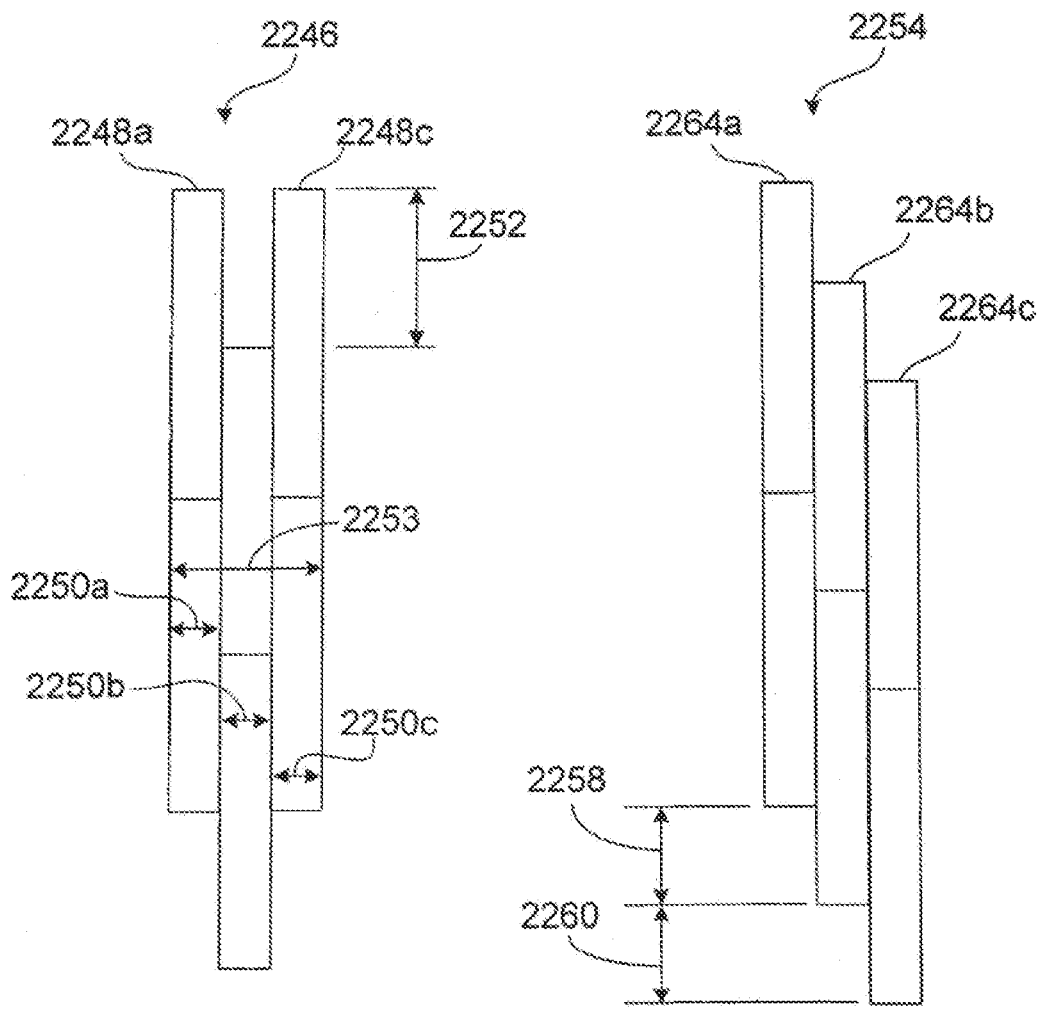
FIG. 19 is a top view of an array of LEDs.
FIG. 20 is a top view of an array of LEDs.

In some embodiments, as shown in FIGS. 19 and 20, it can be desirable to offset one or more of the columns in an array of LEDs having multiple columns. For example, offsetting one or more of the columns can allow for better emission overlap and light uniformity.

In some embodiments, as shown in FIG. 19, an array 2246 of LEDs can be disposed in an offset arrangement. Array 2246 includes multiple LEDs arranged in three columns 2248a, 2248b, and 2248c. At least one of columns 2248a, 2248b, and 2248c is offset from a different one of columns 2248a, 2248b, and 2248c by a distance 2252 (e.g., offset by about 0.1 mm, about 0.5 mm, about 1 mm, about 2 mm, about 3 mm). In the exemplary embodiment shown in FIG. 19, the LEDs in column 2248b are offset by a length 2252 from the LEDs in columns 2248a and 2248c.

The LEDs in columns 2248a, 2248b, and 2248c have associated widths 2250a, 2250b, and 2250c respectively. A sum of widths 2250a, 2250b, and 2250c, and any spacing disposed between the LEDs is approximately the same as the thickness 2224 of LCD panel 2212. For example, a ratio of a sum of widths 2250a, 2250b, and 2250c, and any spacing disposed between the LEDs (represented by arrow 2253) to a thickness 2224 of LCD panel 2212 can be from about 0.5 to about 1.3 (e.g., about 0.5, about 0.6, about 0.7, about 0.8, about 0.9, about 1, about 1.1, about 1.2, about 1.3).

The LEDs in array 2246 can include multiple LEDs that emit different wavelengths of light (e.g., red, green, blue, cyan, yellow, magenta) or that emit monochromatic light (e.g., substantially white). The LEDs in a particular column can emit the same wavelength or emit different wavelengths and/or the columns can include LEDs that emit the same wavelength or emit different wavelengths compared to the LEDs in other columns.

In another example, FIG. 20 shows a top view of a surface of an array 2254 of LEDs disposed in an offset arrangement. Array 2254 includes multiple LEDs arranged in three columns (e.g., columns 2264a, 2264b, and 2264c). Column 2264b is offset from column 2264a by a length 2258 (e.g., offset by about 0.1 mm, about 0.5 mm, about 1 mm, about 2 mm, about 3 mm). Column 2264c is offset from column 2264b by a length 2260 (e.g., offset by about 0.1 mm, about 0.5 mm, about 1 mm, about 2 mm, about 3 mm) and offset from column 2264a by the sum of lengths 2258 and 2260. The LEDs in array 2254 can include multiple LEDs that emit different wavelengths of light (e.g., red, green, blue, cyan, yellow, magenta) or that emit monochromatic light (e.g., substantially white). The LEDs in a particular column can emit the same wavelength or emit different wavelengths and/or the columns can include LEDs that emit the same wavelength or emit different wavelengths compared to the LEDs in other columns.

While FIGS. 17, 18, 19, and 20 show three columns of LEDs having widths that sum to approximately thickness 2224 of LCD panel 2212, an array of LED could include a lesser or greater number of columns (e.g., two columns of LEDs, four columns of LEDs, five columns of LEDs, six columns of LEDs, seven columns of LEDs, ten columns of LEDs).

Figure 21:
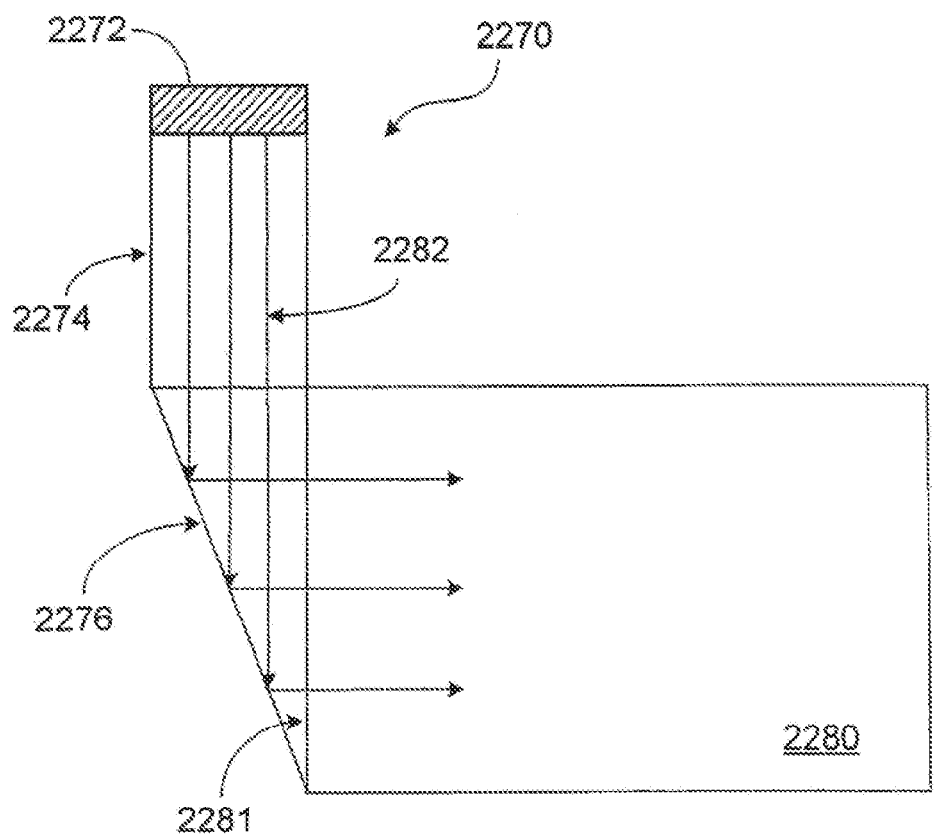
FIG. 21 is a schematic representation of an optical display system.
Figure 22C:
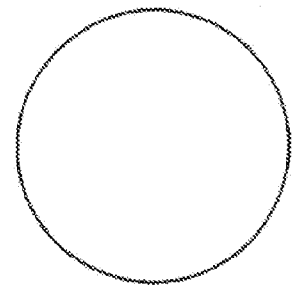
FIG. 22C is a cross sectional view of the optical component of FIG. 22A
Figure 23C:
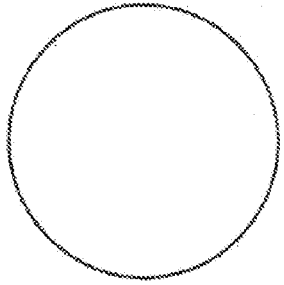
FIG. 23C is a cross sectional view of the optical component of FIG. 23A.
Figure 22B:
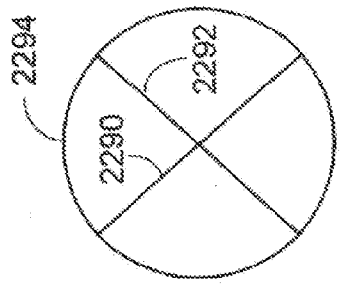
FIG. 22B is a cross sectional view of the array of LEDs of FIG. 22A
Figure 23B:
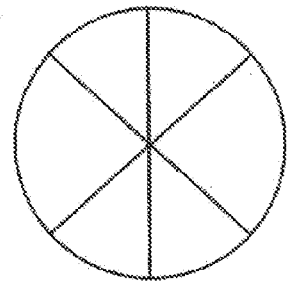
FIG. 23B is a cross sectional view of the array of LEDs of FIG. 23A.
Figure 22A:
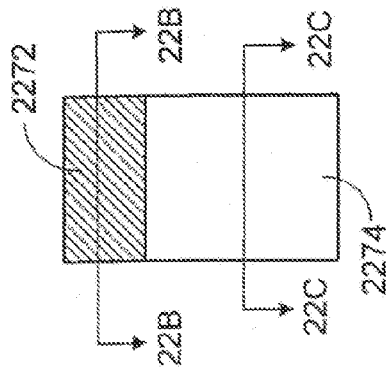
FIG. 22A is a schematic representation of an optical component and an array of LEDs.
Figure 23A:
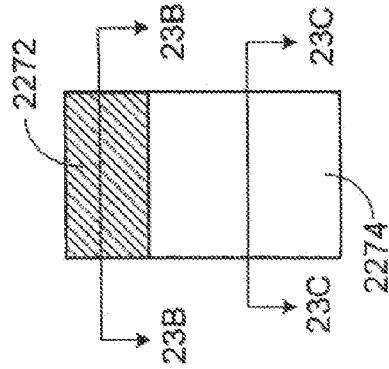
FIG. 23A is a schematic representation of an optical component and an array of LEDs.
Figure 24C:
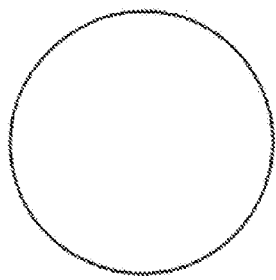
FIG. 24C is a cross sectional view of the optical component of FIG. 24A.
Figure 25C:
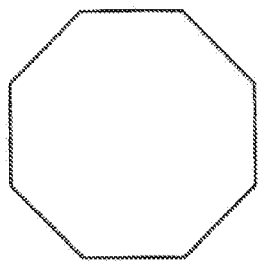
FIG. 25C is a cross sectional view of the optical component of FIG. 25A.
Figure 24B:
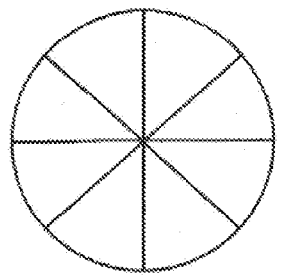
FIG. 24B is a cross sectional view of the array of LEDs of FIG. 24A.
Figure 25B:
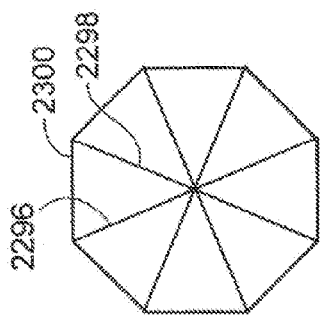
FIG. 25B is a cross sectional view of the array of LEDs of FIG. 25A.
Figure 24A:
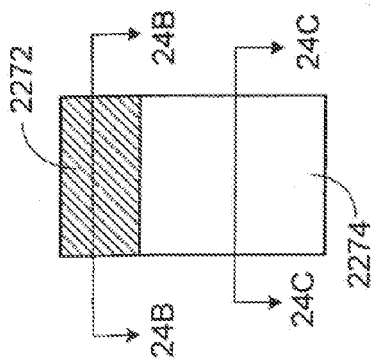
FIG. 24A is a schematic representation of an optical component and an array of LEDs.
Figure 25A:
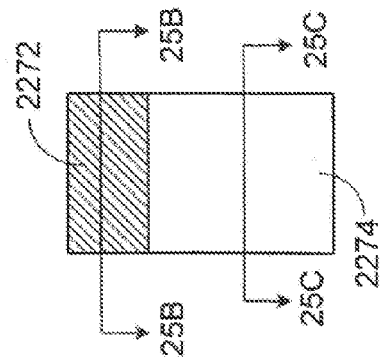
FIG. 25A is a schematic representation of an optical component and an array of LEDs.
Figure 26C:
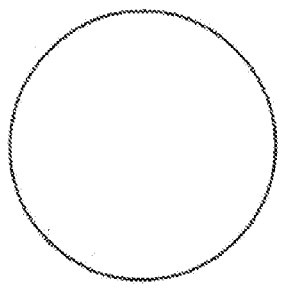
FIG. 26C is a cross sectional view of the optical component of FIG. 26A.

FIG. 21 shows a system 2270 that includes an LED 2272 (in some embodiments, system 2270 includes an array of LEDs as opposed to a single LED 2272), a color mixer 2274, a wedge-shaped optic 2276, and an LCD panel 2280. During use, light generated by LED 2272 (represented by arrows 2282) passes through color mixer 2274 and into wedged-shaped optic 2276. Wedged-shaped optic 2276 guides light 2282 into an edge 2281 of LCD panel 2280. The use of wedge-shaped optic 2276 to guide the light into LCD panel 2280 allows LED 2272 to be offset from edge 2281 of LCD panel 2280. In some embodiments, a color mixer can be included within the wedge shaped optic 2276.

Custom shaped LEDs could be used to reduce the spacing adjacent between die, and increase the amount of light emitted from the LEDs that is collected by color mixer 2274. For example, LEDs can be shaped by cleaving along crystallographic directions and/or dicing using a diamond saw or a laser dicing system. FIGS. 22B, 23B, 24B, 25B, 26B, 27B, 28B, and 29B show top views of surfaces of various packing arrangements and LED die. FIGS. 22C, 23C, 24C, 25C, 26C, 27C, 28C, and 29C show cross-sectional views of an aperture of the color mixer 2274 used to collect the light emitted from the LEDs. In some embodiments, the array of LEDs can be shaped such that the perimeter of the LED array matches a perimeter of the aperture. For example, a ratio of the cross-sectional area of the LED array to a cross-sectional area of the aperture can be from about 0.5 to about 1.3 (e.g., about 0.5, about 0.7, about 0.9, about 1, about 1.1, about 1.3). The perimeter of the aperture could be of various shapes such as rectangular, hexagonal, triangular, octagonal, circular, trapezoidal, and square and the shape of an LED or a perimeter of an array of LEDs can match the shape of the aperture.

For example, as shown in FIGS. 22A-22C, 23A-23C, and 24A-24C, the perimeter of the aperture could be circular and the perimeter of the array of LEDs could be circular. In a circular array, each LED in the array of LEDs could have a pie shape defined by two straight edges (e.g., edges 2290 and 2292) and one rounded edge (e.g., edge 2294).

Figure 27C:
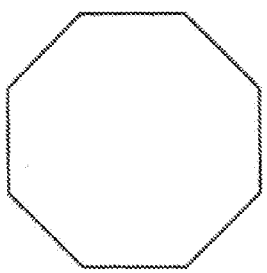
FIG. 27C is a cross sectional view of the optical component of FIG. 27A.
Figure 26B:
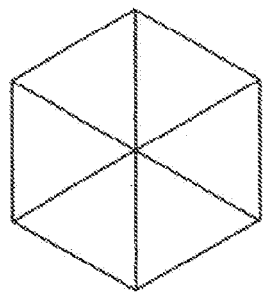
FIG. 26B is a cross sectional view of the array of LEDs of FIG. 26A.
Figure 27B:
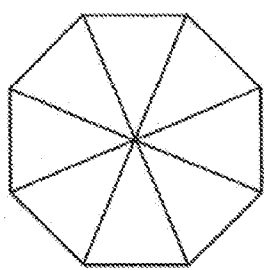
FIG. 27B is a cross sectional view of the array of LEDs of FIG. 27A.
Figure 26A:
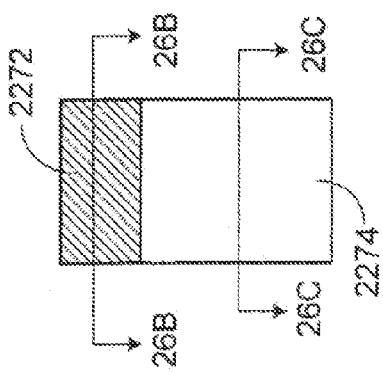
FIG. 26A is a schematic representation of an optical component and an array of LEDs.
Figure 27A:
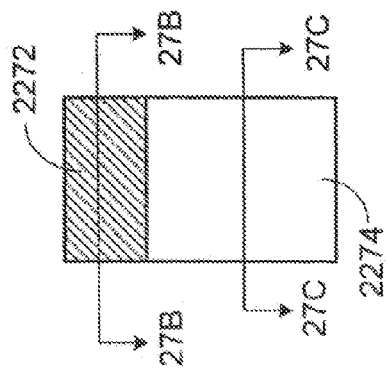
FIG. 27A is a schematic representation of an optical component and an array of LEDs.
Figure 28C:
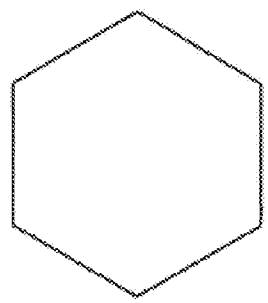
FIG. 28C is a cross sectional view of the optical component of FIG. 28A.

In certain embodiments, as shown in FIGS. 25A-25C and 26A-26C, the aperture could have a circular shape and a pentagonal, hexagonal (FIG. 26B) heptagonal, octagonal (FIG. 25B), nonagon, or decagonal, shaped array of LEDs could be matched to the circular aperture. It is believed that the use of a polygonal array can provide various advantages for fabrication. For example a polygonal array is formed of multiple triangular shaped LED die. The triangular shaped die may be easier to fabricate than the pie shaped die because the triangular shape requires only straight edges (e.g., edges 2296, 2298, and 2300) and does not require the formation of a curved edge. In certain embodiments, as shown in FIGS. 27C and 28C the aperture could be hexagonal or octagonal to match a hexagonal (FIG. 27B) or an octagonal (FIG. 28B) array.

Figure 29C:
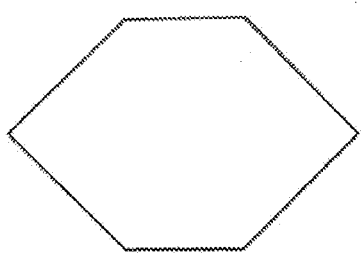
FIG. 29C is a cross sectional view of the optical component of FIG. 29A.
Figure 28B:
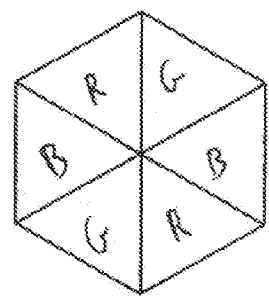
FIG. 28B is a cross sectional view of the array of LEDs of FIG. 28A.
Figure 29B:
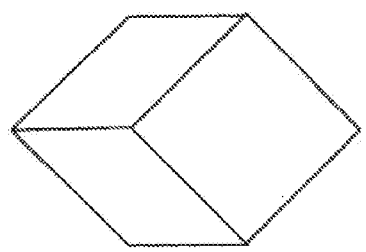
FIG. 29B is a cross sectional view of the array of LEDs of FIG. 29A.
Figure 28A:
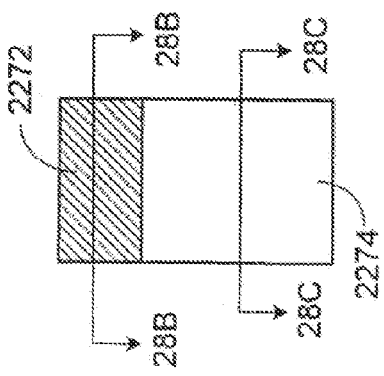
FIG. 28A is a schematic representation of an optical component and an array of LEDs.
Figure 29A:
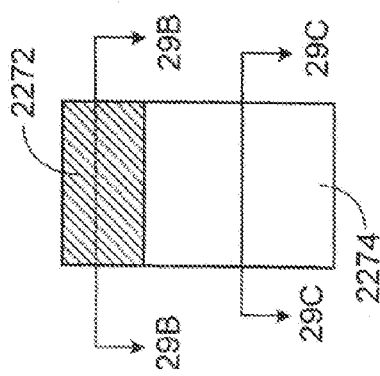
FIG. 29A is a schematic representation of an optical component and an array of LEDs.

In certain embodiments, as shown in FIGS. 29A-29C, an array could include multiple LEDs arranged in a prism shape (FIG. 29B) to match a prism shaped aperture (FIG. 29C).

In the embodiments described above, the LED die can be packaged separately or multiple LED die can be included in a single package. Arrays could contain die of the same or different colors. In some embodiments, emission wavelengths for larger die and/or multiple die can be chosen to balance the spectral output of the complete array.

Figure 30:
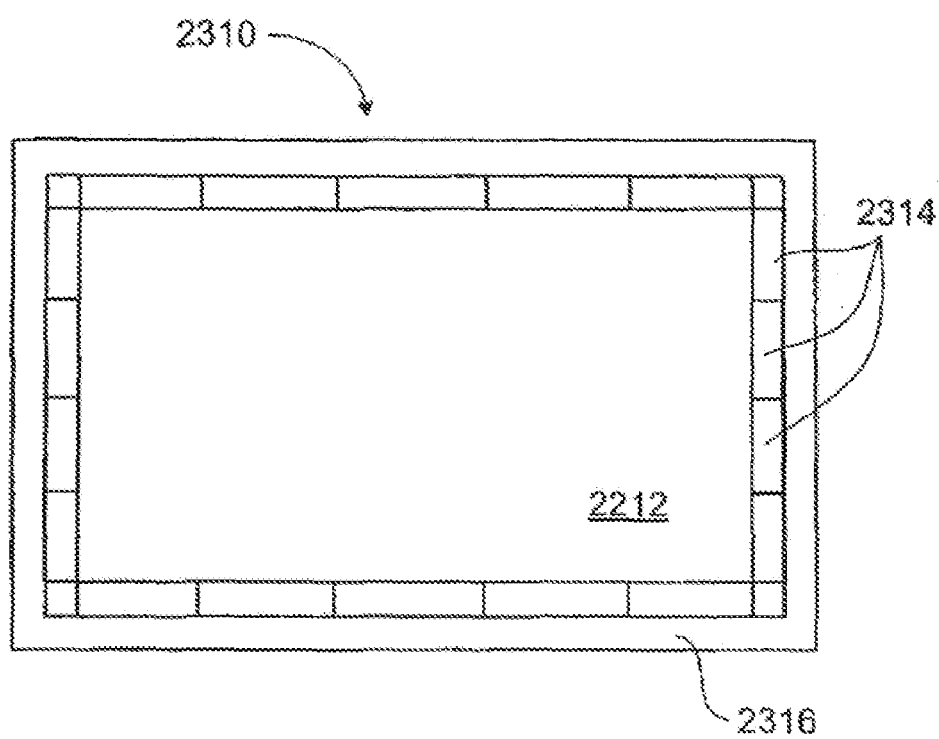
FIG. 30 is a schematic representation of an optical display system.

FIG. 30 shows an optical display system 2310 that includes LEDs 2314, LCD panel 2212 1130, and a cooling system 2316. LEDs 2314 are in thermal communication with cooling system 2316 such during use of system 2310 cooling system 2316 can be used to regulate the temperature of LEDs 2314. Examples of cooling systems include thermal electric coolers, fans, heat pipes, and liquid cooling systems. In some embodiments, cooling unit 2314 could include one or more cooling tubes around the perimeter of the panel (fluid or gas flow). In some embodiments, cooling unit 2314 could include a single loop system where a continuous tube is disposed around LCD panel 2312 or a multiple loop system where multiple tubes are disposed around LCD panel 2312 (e.g., one loop disposed on each side of LCD panel 2212). In some embodiments, cooling unit 2316 could include finned heat sinks. It is believed that the use of a cooling system can provide multiple advantages such as reducing the likelihood of damage to LEDs 2314 resulting from an excess temperature and increasing the efficiency of LEDs 2314 at higher drive currents. The cooling system may also reduce the shift in wavelength induced by temperature.

While the LEDs in optical display system 2310 are disposed along all four edges of LCD panel 2212, the LEDs can be disposed along a single edge or multiple edges (e.g., one edge, two edges, three edges, four edges, all edges) of the LCD panel with a cooling unit employed surrounding the edges of the LCD.

Figure 31:
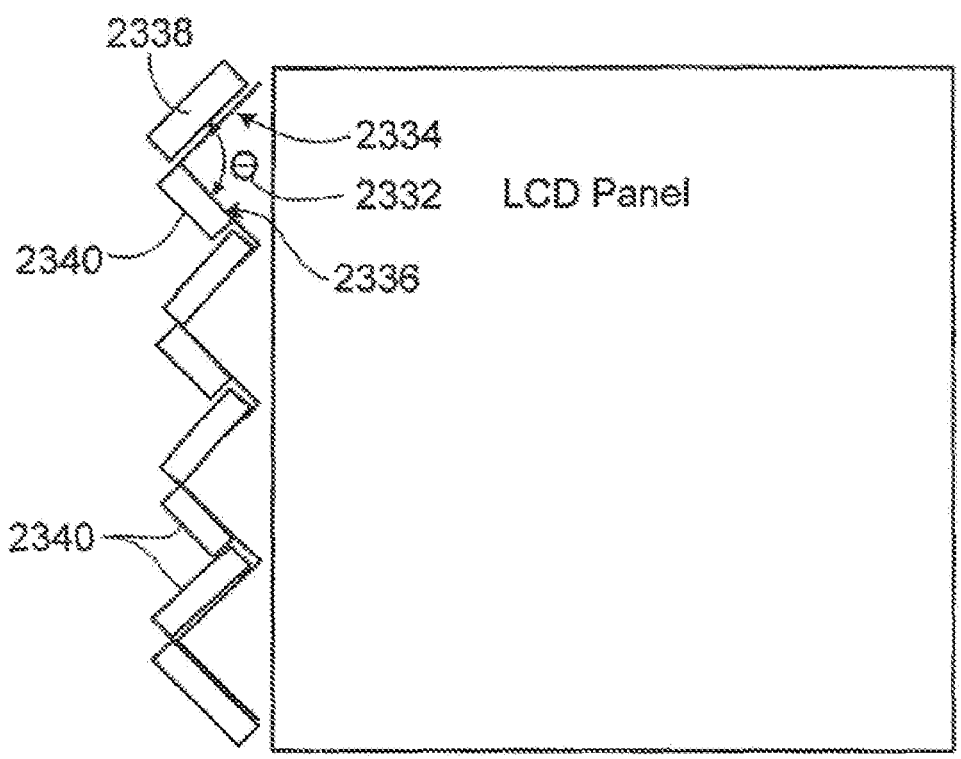
FIG. 31 is a schematic representation of an optical display system.

While in the embodiments shown in FIGS. 14A and 15, the LEDs multiple rectangular die are arranged along edge 2211 of panel 2212 such that a surface 2222 of the LEDs is about parallel to a surface 2211 of the edge of panel 2212, other arrangements are possible. For example, as shown in FIG. 31, multiple LEDs 2330 can be arranged along edge 2211 of panel 2212 in a serrated arrangement. LEDs 2330 can be arranged such that a surface 2334 of a first LED 2338 lies in a first plane and a surface 2336 of a second LED 2340 lies in a second plane and the planes intersect at an angle 2332. Arranging the LEDs in such a serrated arrangement can allow more and/or larger LEDs to be placed along edge 2211 of LCD panel 2212. While a serrated arrangement is shown in FIG. 21, other shaped protrusions are possible that can increase the surface area of the LEDs 2330 disposed along an edge of LCD panel 2212. In some embodiments, multiple LEDs can be disposed on each of the serrated edges alone LED the panel.

Figure 32:
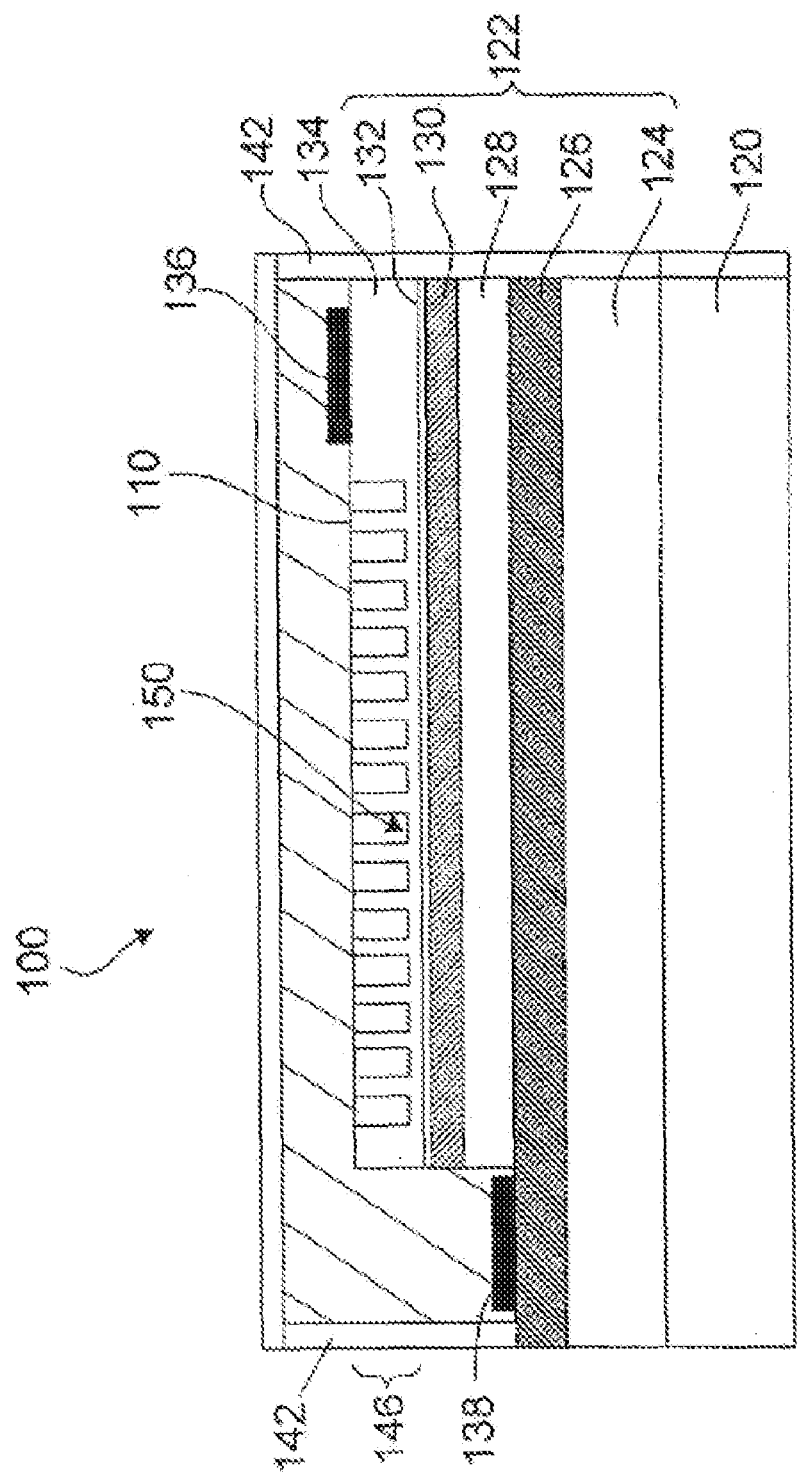
FIG. 32 is a cross-sectional view of an LED with a patterned surface.

FIG. 32 shows a side view of an LED 100 in the form of a packaged die. LED 100 includes a multi-layer stack 122 disposed on a submount 120. Multi-layer stack 122 includes a 320 nm thick silicon doped (n-doped) GaN layer 134 having a pattern of openings 150 in its upper surface 110. Multi-layer stack 122 also includes a bonding layer 124, a 100 nm thick silver layer 126, a 40 nm thick magnesium doped (p-doped) GaN layer 128, a 120 m thick light-generating region 130 formed of multiple InGaN/GaN quantum wells, and a AlGaN layer 132. An n-side contact pad 136 is disposed on layer 134, and a p-side contact pad 138 is disposed on layer 126. An encapsulant material (epoxy having an index of refraction of 1.5) 144 is present between layer 134 and a cover slip 140 and supports 142. Layer 144 does not extend into openings 150.

Light is generated by LED 100 as follows. P-side contact pad 138 is held at a positive potential relative to n-side contact pad 136, which causes electrical current to be injected into LED 100. As the electrical current passes through light-generating region 130, electrons from n-doped layer 134 combine in region 130 with holes from p-doped layer 128, which causes region 130 to generate light. Light-generating region 130 contains a multitude of point dipole radiation sources that emit light (e.g., isotropically) within the region 130 with a spectrum of wavelengths characteristic of the material from which light-generating region 130 is formed. For InGaN/GaN quantum wells, the spectrum of wavelengths of light generated by region 130 can have a peak wavelength of about 445 nanometers (nm) and a full width at half maximum (FWHM) of about 30 nm.

It is to be noted that the charge carriers in p-doped layer 126 have relatively low mobility compared to the charge carriers in the n-doped semiconductor layer 134. As a result, placing silver layer 126 (which is conductive) along the surface of p-doped layer 128 can enhance the uniformity of charge injection from contact pad 138 into p-doped layer 128 and light-generating region 130. This can also reduce the electrical resistance of device 100 and/or increase the injection efficiency of device 100. Because of the relatively high charge carrier mobility of the n-doped layer 134, electrons can spread relatively quickly from n-side contact pad 136 throughout layers 132 and 134, so that the current density within the light-generating region 130 is substantially uniform across the region 130. It is also to be noted that silver layer 126 has relatively high thermal conductivity, allowing layer 126 to act as a heat sink for LED 100 (to transfer heat vertically from the multi-layer stack 122 to submount 120).

At least some of the light that is generated by region 130 is directed toward silver layer 126. This light can be reflected by layer 126 and emerge from LED 100 via surface 110, or can be reflected by layer 126 and then absorbed within the semiconductor material in LED 100 to produce an electron-hole pair that can combine in region 130, causing region 130 to generate light. Similarly, at least some of the light that is generated by region 130 is directed toward pad 136. The underside of pad 136 is formed of a material (e.g., a Ti/Al/Ni/Au alloy) that can reflect at least some of the light generated by light-generating region 130. Accordingly, the light that is directed to pad 136 can be reflected by pad 136 and subsequently emerge from LED 100 via surface 110 (e.g., by being reflected from silver layer 126), or the light that is directed to pad 136 can be reflected by pad 136 and then absorbed within the semiconductor material in LED 100 to produce an electron-hole pair that can combine in region 130, causing region 130 to generate light (e.g., with or without being reflected by silver layer 126).

Figure 33:
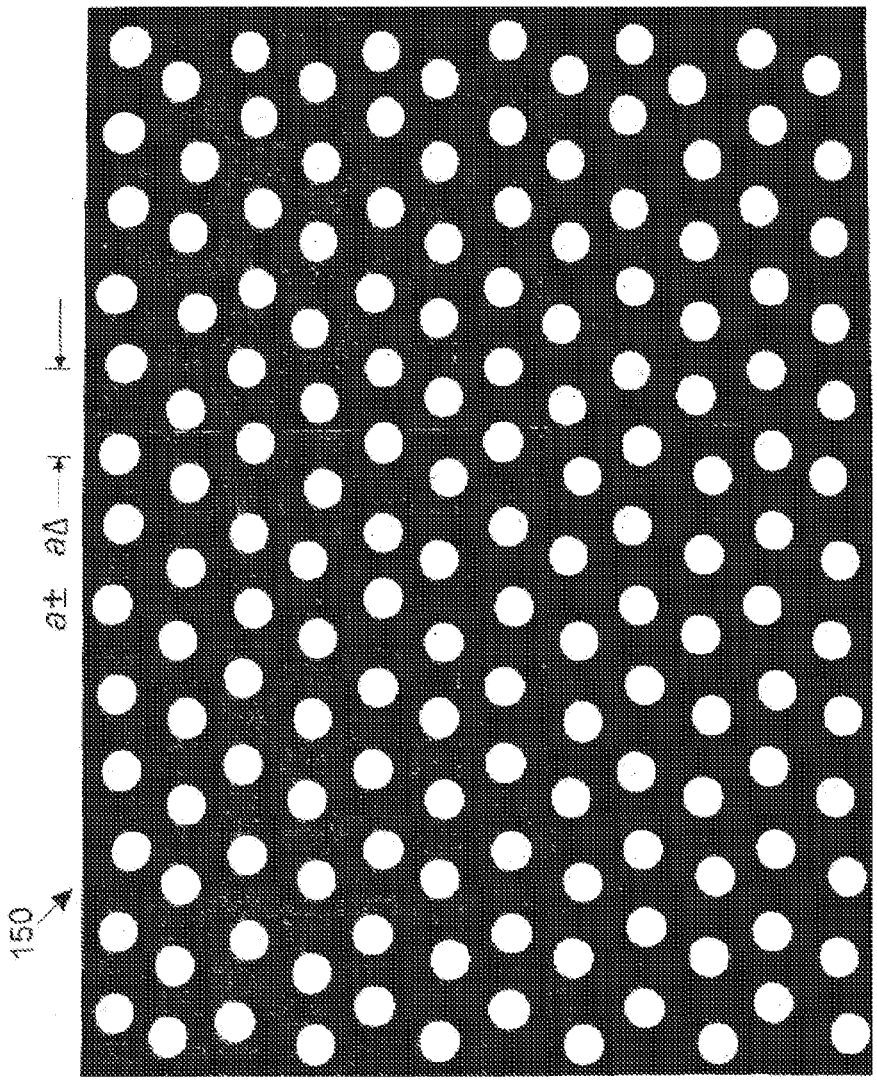
FIG. 33 is a top view the patterned surface of the LED of FIG. 12.

As shown in FIGS. 32 and 33, surface 110 of LED 100 is not flat but consists of a modified triangular pattern of openings 150. In general, various values can be selected for the depth of openings 150, the diameter of openings 150 and the spacing between nearest neighbors in openings 150 can vary. Unless otherwise noted, for purposes of the figures below showing the results of numerical calculations, openings 150 have a depth 146 equal to about 280 nm, a non-zero diameter of about 160 nm, a spacing between nearest neighbors or about 220 nm, and an index of refraction equal to 1.0. The triangular pattern is detuned so that the nearest neighbors in pattern 150 have a center-to-center distance with a value between (a−Δa) and (a+Δa), where "a" is the lattice constant for an ideal triangular pattern and "Δa" is a detuning parameter with dimensions of length and where the detuning can occur in random directions. To enhance light extraction from LED 100 (see discussion below), detuning parameter, Δa, is generally at least about one percent (e.g., at least about two percent, at least about three percent, at least about four percent, at least about five percent) of ideal lattice constant, a, and/or at most about 25% (e.g., at most about 20%, at most about 15%, at most about 10%) of ideal lattice constant, a. In some embodiments, the nearest neighbor spacings vary substantially randomly between (a−Δa) and (a+Δa), such that pattern 150 is substantially randomly detuned.

For the modified triangular pattern of openings 150, it has been found that a non-zero detuning parameter enhances the extraction efficiency of an LED 100. For LED 100 described above, as the detuning parameter Δa increases from zero to about 0.15a, numerical modeling (described below) of the electromagnetic fields in the LED 100 has shown that the extraction efficiency of the device increases from about 0.60 to about 0.70, as shown in FIG. 34.

Figure 34:
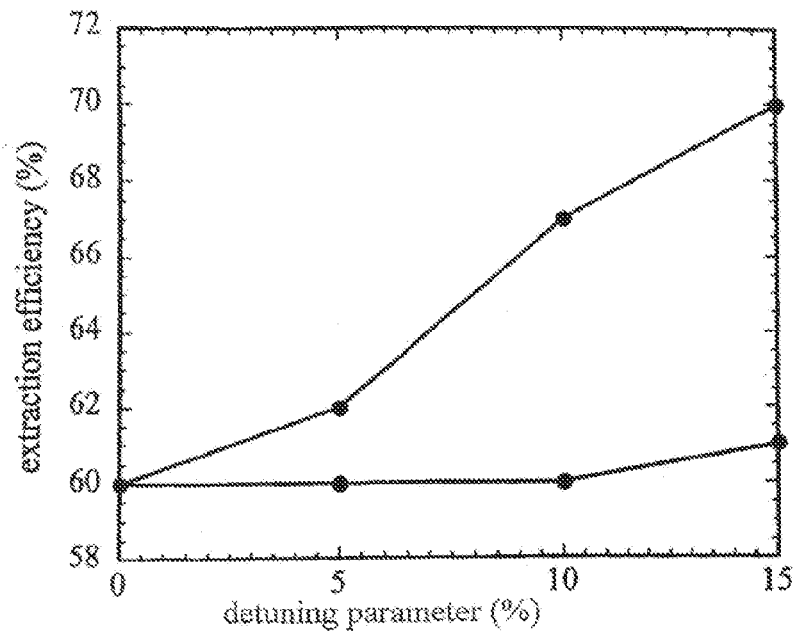
FIG. 34 is a graph of an extraction efficiency of an LED with a patterned surface as function of a detuning parameter.

The extraction efficiency data shown in FIG. 34 are calculated by using a three-dimensional finite-difference time-domain (FDTD) method to approximate solutions to Maxwell's equations for the light within and outside of LED 100. See, for example, K. S. Kunz and R. J. Luebbers, *The Finite-Difference Time-Domain Methods* (CRC, Boca Raton, Fla., 1993); A. Taflove, *Computational Electrodynamics: The Finite-Difference Time-Domain Method* (Artech House, London, 1995), both of which are hereby incorporated by reference. To represent the optical behavior of LED 100 with a particular pattern 150, input parameters in a FDTD calculation include the center frequency and bandwidth of the light emitted by the point dipole radiation sources in light-generating region 130, the dimensions and dielectric properties of the layers within multilayer stack 122, and the diameters, depths, and nearest neighbor distances (NND) between openings in pattern 150.

In certain embodiments, extraction efficiency data for LED 100 are calculated using an FDTD method as follows. The FDTD method is used to solve the full-vector time-dependent Maxwell's equations:

$$\vec{\nabla} \times \vec{E} = -\mu \frac{\partial \vec{H}}{\partial t}, \vec{\nabla} \times \vec{H} = \varepsilon_\infty \frac{\partial \vec{E}}{\partial t} + \frac{\partial \vec{P}}{\partial t},$$

where the polarizability $\vec{P} = \vec{P}_1 + \vec{P}_2 + \ldots + \vec{P}_m$ captures the frequency-dependent response of the quantum well light-generating region 130, the p-contact layer 126 and other layers within LED 100. The individual $\vec{P}_m$ terms are empirically derived values of different contributions to the overall polarizability of a material (e.g., the polarization response for bound electron oscillations, the polarization response for free electron oscillations). In particular, $$\frac{d^2 \vec{P}_m}{dt^2} + \gamma_m \frac{d \vec{P}_m}{dt} + \omega_m^2 \vec{P}_m = \varepsilon(\omega) \vec{E},$$

where the polarization corresponds to a dielectric constant $$\varepsilon(\omega) = \varepsilon_\infty + \sum_m \frac{s_m}{\omega_m^2 - \omega^2 - i\gamma_m \omega}.$$

For purposes of the numerical calculations, the only layers that are considered are encapsulant 144, silver layer 126 and layers between encapsulant 144 and silver layer 126. This approximation is based on the assumption that encapsulant 144 and layer 126 are thick enough so that surrounding layers do not influence the optical performance of LED 100. The relevant structures within LED 100 that are assumed to have a frequency dependent dielectric constant are silver layer 126 and light-generating region 130. The other relevant layers within LED 100 are assumed to not have frequency dependent dielectric constants. It is to be noted that in embodiments in which LED 100 includes additional metal layers between encapsulant 144 and silver layer 126, each of the additional metal layers will have a corresponding frequency dependent dielectric constant. It is also to be noted that silver layer 126 (and any other metal layer in LED 100) has a frequency dependent term for both bound electrons and free electrons, whereas light-generating region 130 has a frequency dependent term for bound electrons but does not have a frequency dependent term for free electrons. In certain embodiments, other terms can be included when modeling the frequency dependence of the dielectric constant. Such terms may include, for example, electron-phonon interactions, atomic polarizations, ionic polarizations and/or molecular polarizations.

The emission of light from the quantum well region of light-generating region 130 is modeled by incorporating a number of randomly-placed, constant-current dipole sources within the light-generating region 130, each emitting short Gaussian pulses of spectral width equal to that of the actual quantum well, each with random initial phase and start-time.

To cope with the pattern of openings 150 in surface 110 of the LED 100, a large supercell in the lateral direction is used, along with periodic boundary conditions. This can assist in simulating relatively large (e.g., greater than 0.01 mm on edge) device sizes. The full evolution equations are solved in time, long after all dipole sources have emitted their energy, until no energy remains in the system. During the simulation, the total energy emitted, the energy flux extracted through top surface 110, and the energy absorbed by the quantum wells and the n-doped layer is monitored. Through Fourier transforms both in time and space, frequency and angle resolved data of the extracted flux are obtained, and therefore an angle- and frequency-resolved extraction efficiency can be calculated. By matching the total energy emitted with the experimentally known luminescence of light-generating region 130, absolute angle-resolved extraction in lumens/per solid angle/per chip area for given electrical input is obtained.

Without wishing to be bound by theory, it is believed that the detuned pattern 150 can enhance the efficiency with which light generated in region 130 emerges from LED 100 via surface 110 because openings 150 create a dielectric function that varies spatially in layer 134 according to pattern 150. It is believed that this alters the density of radiation modes (i.e., light modes that emerge from surface 110) and guided modes (i.e., light modes that are confined within multi-layer stack 122) within LED 100, and that this alteration to the density of radiation modes and guided modes within LED 100 results in some light that would otherwise be emitted into guided modes in the absence of pattern 150 being scattered (e.g., Bragg scattered) into modes that can leak into radiation modes. In certain embodiments, it is believed that pattern 150 (e.g., the pattern discussed above, or one of the patterns discussed below) can eliminate all of the guided modes within LED 100.

It is believed that the effect of detuning of the lattice can be understood by considering Bragg scattering off of a crystal having point scattering sites. For a perfect lattice arranged in lattice planes separated by a distance d, monochromatic light of wavelength λ is scattered through an angle θ according to the Bragg condition, nλ=2d sin θ, where n is an integer that gives the order of the scattering. However, it is believed that for a light source having a spectral bandwidth Δλ/λ and emitting into a solid angle ΔΘ, the Bragg condition can be relaxed by detuning the spacing of between lattice sites by a detuning parameter Δa. It is believed that detuning the lattice increases the scattering effectiveness and angular acceptance of the pattern over the spectral bandwidth and spatial emission profile of the source.

While a modified triangular pattern 150 having a non-zero detuning parameter Δa has been described that can enhance light extraction from LED 100, other patterns can also be used to enhance light extraction from LED 100. When determining whether a given pattern enhances light extraction from LED 100 and/or what pattern of openings may be used to enhance light extraction from LED 100, physical insight may first be used to approximate a basic pattern that can enhance light extraction before conducting such numerical calculations.

Figure 35:
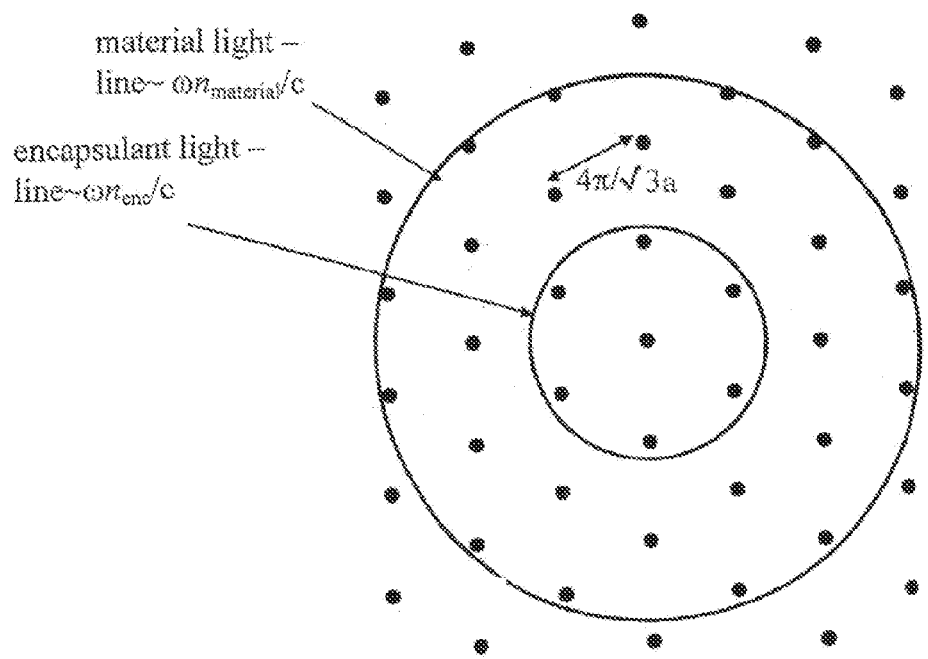
FIG. 35 is a schematic representation of the Fourier transformation of a patterned surface of an LED.

The extraction efficiency of LED 100 can be further understood (e.g., in the weak scattering regime) by considering the Fourier transform of the dielectric function that varies spatially according to pattern 150. FIG. 35 depicts the Fourier transform for an ideal triangular lattice. Extraction of light into a particular direction with in-plane wavevector k is related to the source emission $S_{k'}$ into all those modes with in-plane wavevector k' (i.e. parallel to pattern 150) that are compatible to k by the addition or subtraction of a reciprocal lattice vector G, i.e k=k'±G. The extraction efficiency is proportional to the magnitude of the corresponding Fourier component ($F_k$) of the dielectric function $\in_G$ given by $$F_{\vec{k}} = c_{\vec{k}} \sum_{\vec{G}} \varepsilon_{\vec{G}} S_{\vec{k}-\vec{G}}, \varepsilon_{\vec{G}} = \int \varepsilon(\vec{r}) e^{-i\vec{G}\vec{r}} d\vec{r}$$

Since light propagating in the material generally satisfies the equation $k^2(\text{in-plane})+k^2(\text{normal})=\in(\omega/c)^2$, the maximum G to be considered is fixed by the frequency (ω) emitted by the light-generating region and the dielectric constant of the light-generating region. As shown in FIG. 35, this defines a ring in reciprocal space which is often called the light line.

The light line will be an annulus due to the finite bandwidth of the light-generating region but for sake of clarity we illustrate the light line of a monochromatic source. Similarly, light propagating within the encapsulant is bounded by a light line (the inner circle in FIG. 35).

Therefore, the extraction efficiency is improved by increasing $F_k$ for all directions k that lie within the encapsulant light-line which amounts to increasing the number of G points within the encapsulant light line and increasing the scattering strength $\in_G$ for G points which lie within the material light line. This physical insight can be used when selecting patterns that can improve extraction efficiency.

Figure 36:
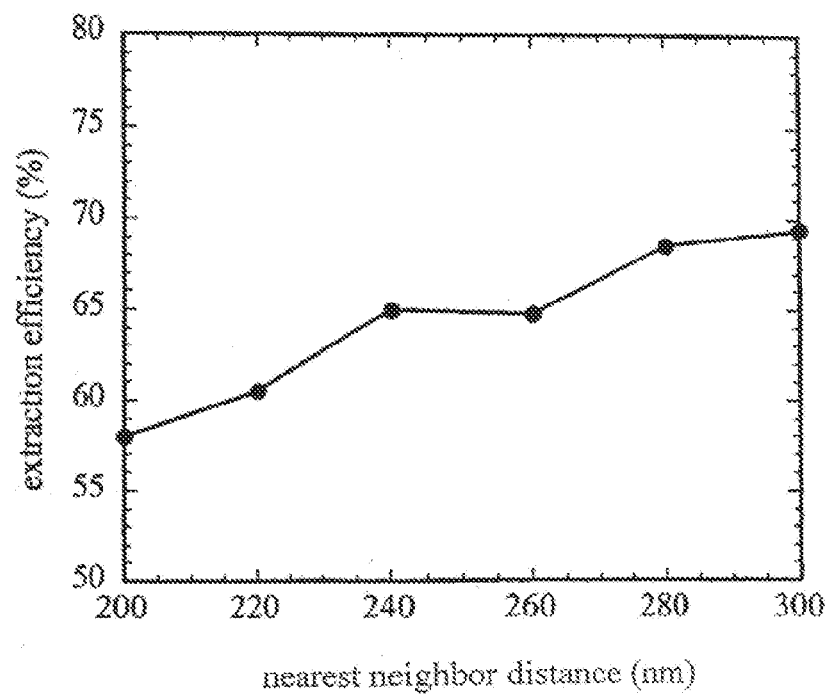
FIG. 36 is a graph of an extraction efficiency of an LED with a patterned surface as function of nearest neighbor distance.

As an example, FIG. 36 shows the effect of increasing lattice constant for an ideal triangular pattern. The data shown in FIG. 36 are calculated using the parameters given for LED 100 shown in FIG. 32, except that the emitted light has a peak wavelength of 450 nm, and the depth of the holes, the diameter of the holes, and the thickness of the n-doped layer 134 scale with the nearest neighbor distance, a, as 1.27a, 0.72a, and 1.27a+40 nm, respectively. Increasing the lattice constant, increases the density of G points within the light-line of the encapsulant. A clear trend in extraction efficiency with NND is observed. It is believed that the maximum extraction efficiency occurs for NND approximately equal to the wavelength of light in vacuum. The reason a maximum is achieved, is that as the NND becomes much larger than the wavelength of light, the scattering effect is reduced because the material becomes more uniform.

Figure 37:
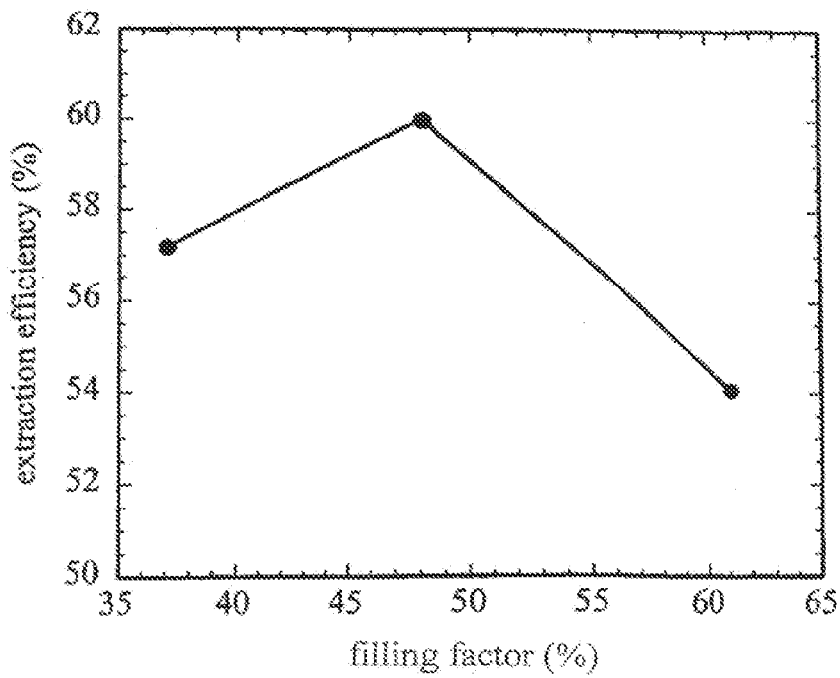
FIG. 37 is a graph of an extraction efficiency of an LED with a patterned surface as function of a filling factor.

As another example, FIG. 37 shows the effect of increasing hole size or filling factor. The filling factor for a triangular pattern is given by $(2\pi/\sqrt{3})*(r/a)^2$, where r is the radius of a hole. The data shown in FIG. 37 are calculated using the parameters given for the LED 100 shown in FIG. 32, except that the diameter of the openings is changed according to the filling factor value given on the x-axis of the graph. The extraction efficiency increases with filling factor as the scattering strengths ($\in_G$) increase. A maximum is observed for this particular system at a filling factor of ~48%. In certain embodiments, LED 100 has a filling factor of at least about 10% (e.g., at least about 15%, at least about 20%) and/or at most about 90% (e.g., at most about 80%, at most about 70%, at most about 60%).

Figure 38:
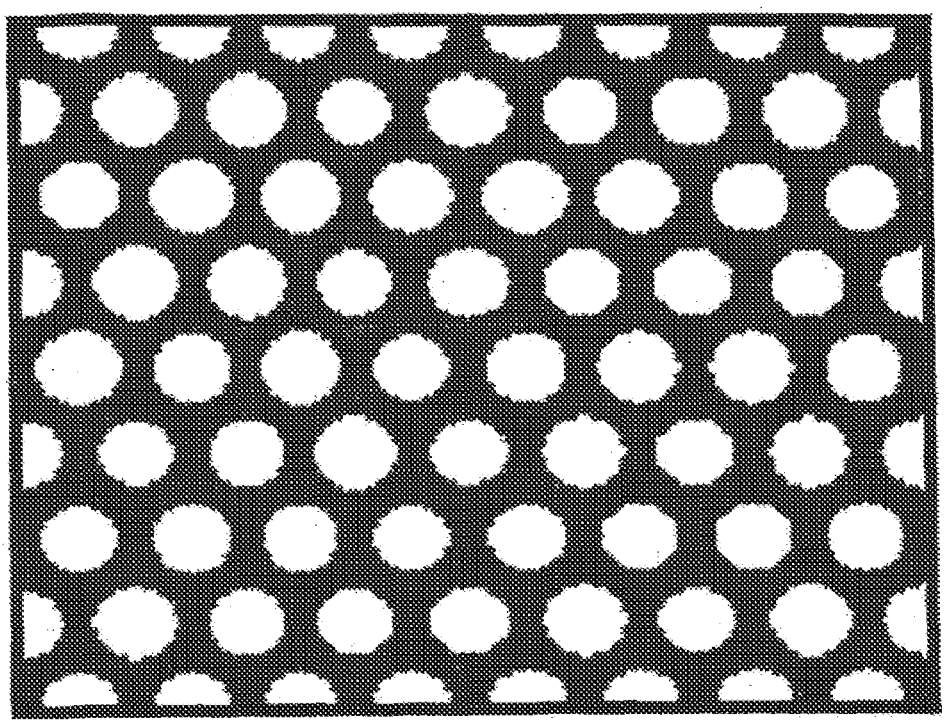
FIG. 38 is a top view a patterned surface of an LED.

While a modified triangular pattern has been described in which a detuning parameter relates to positioning of openings in the pattern from the positions in an ideal triangular lattice, a modified (detuned) triangular pattern may also be achieved by modifying the holes in an ideal triangular pattern while keeping the centers at the positions for an ideal triangular pattern. FIG. 38 shows an embodiment of such a pattern. The enhancement in light extraction, the methodology for conducting the corresponding numerical calculation, and the physical explanation of the enhanced light extraction for a light-emitting device having the pattern shown in FIG. 38 is generally the same as described above. In some embodiments, a modified (detuned) pattern can have openings that are displaced from the ideal locations and openings at the ideal locations but with varying diameters.

In other embodiments, enhanced light extraction from a light-emitting device can be achieved by using different types of patterns, including, for example, complex periodic patterns and nonperiodic patterns. As referred to herein, a complex periodic pattern is a pattern that has more than one feature in each unit cell that repeats in a periodic fashion. Examples of complex periodic patterns include honeycomb patterns, honeycomb base patterns, (2×2) base patterns, ring patterns, and Archimidean patterns. As discussed below, in some embodiments, a complex periodic pattern can have certain openings with one diameter and other openings with a smaller diameter. As referred to herein, a nonperiodic pattern is a pattern that has no translational symmetry over a unit cell that has a length that is at least 50 times the peak wavelength of light generated by region 130. Examples of nonperiodic patterns include aperiodic patterns, quasicrystalline patterns, Robinson patterns, and Amman patterns.

Figure 39:
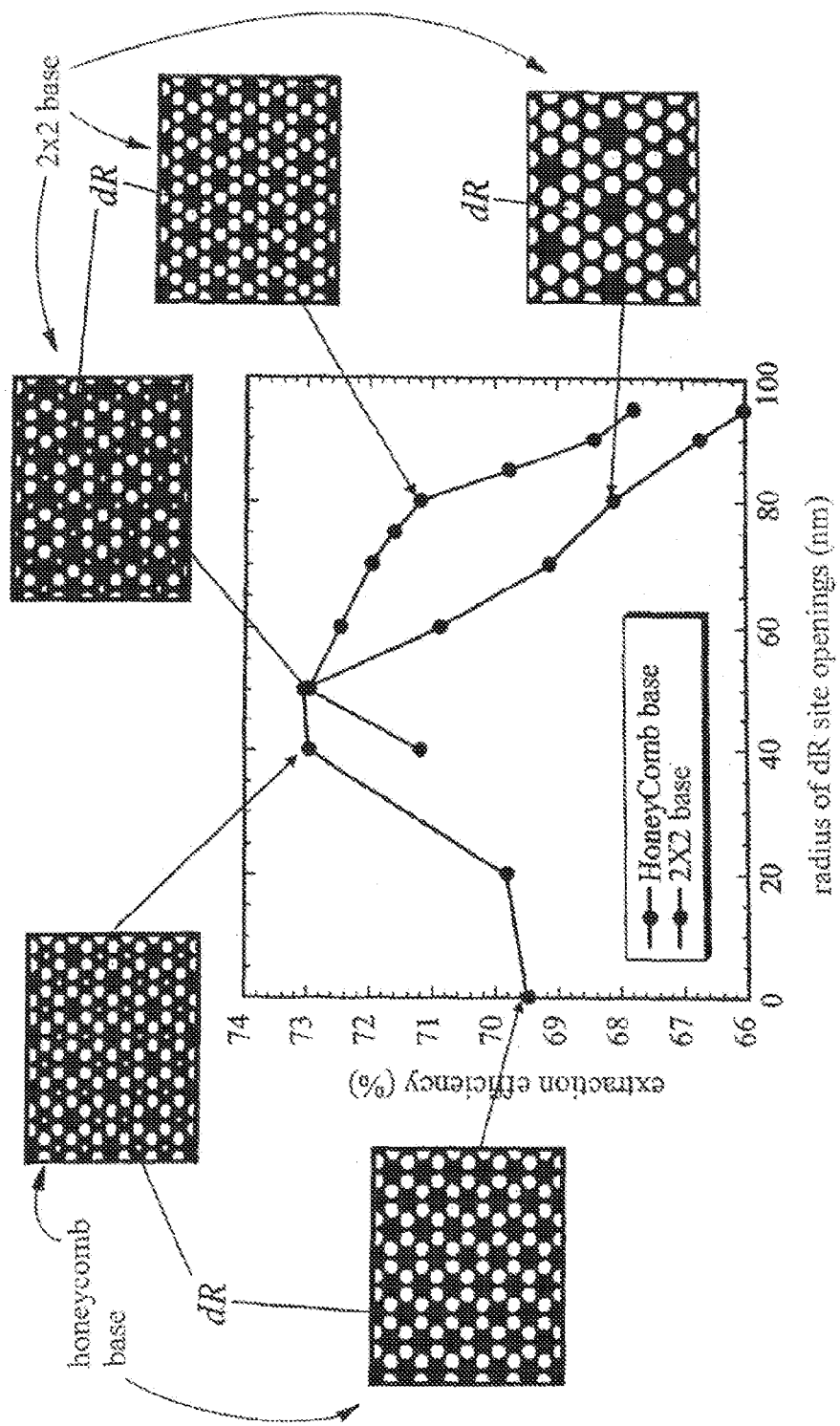
FIG. 39 is a graph of an extraction efficiency of LEDs with different surface patterns.

FIG. 39 shows numerical calculations for LED 100 for two different complex periodic patterns in which certain openings in the patterns have a particular diameter, and other openings in the patterns have smaller diameters. The numerical calculations represented in FIG. 39 show the behavior of the extraction efficiency (larger holes with a diameter of 80 nm) as the diameter of the smaller holes (dR) is varied from zero nm to 95 nm. The data shown in FIG. 37 are calculated using the parameters given for the LED 100 shown in FIG. 32 except that the diameter of the openings is changed according the filling factor value given on the x-axis of the graph. Without wishing to be bound by theory, multiple hole sizes allow scattering from multiple periodicities within the pattern, therefore increasing the angular acceptance and spectral effectiveness of the pattern. The enhancement in light extraction, the methodology for conducting the corresponding numerical calculation, and the physical explanation of the enhanced light extraction for a light-emitting device having the pattern shown in FIG. 39 is generally the same as described above.

FIG. 40 shows numerical calculations for LED 100 having different ring patterns (complex periodic patterns). The number of holes in the first ring surrounding the central hole is different (six, eight or 10) for the different ring patterns. The data shown in FIG. 40 are calculated using the parameters given for the LED 100 shown in FIG. 32, except that the emitted light has a peak wavelength of 450 nm. The numerical calculations represented in FIG. 40 show the extraction efficiency of LED 100 as the number of ring patterns per unit cell that is repeated across a unit cell is varied from two to four. The enhancement in light extraction, the methodology for conducting the corresponding numerical calculation, and the physical explanation of the enhanced light extraction for a light-emitting device having the pattern shown in FIG. 40 is generally the same as described above.

Figure 41:
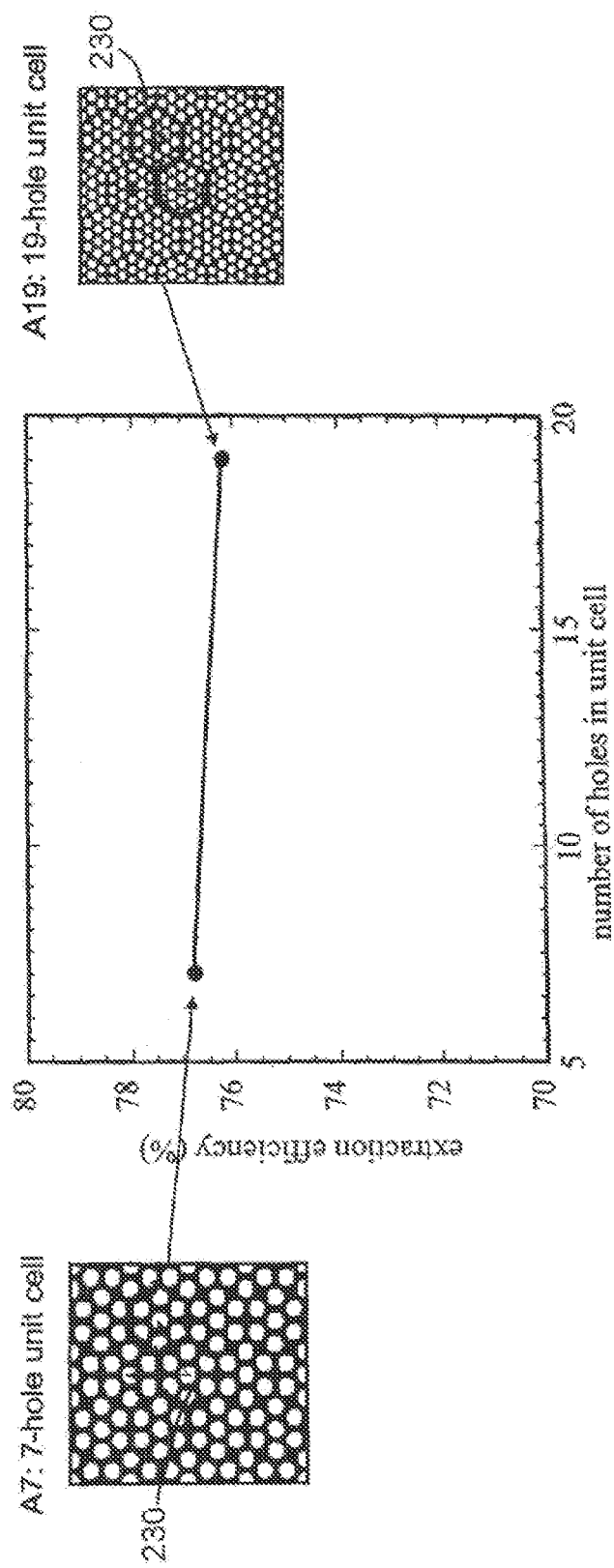
FIG. 41 is a graph of an extraction efficiency of LEDs with different surface patterns.

FIG. 41 shows numerical calculations for LED 100 having an Archimidean pattern. The Archimedean pattern A7 consists of hexagonal unit cells 230 of 7 equally-spaced holes with a nearest neighbor distance of a. Within a unit cell 230, six holes are arranged in the shape of a regular hexagon and the seventh hole is located at the center of the hexagon. The hexagonal unit cells 230 then fit together along their edges with a center-to-center spacing between the unit cells of $a'=a^*(1+\sqrt{3})$ to pattern the entire surface of the LED. This is known as an A7 tiling, because 7 holes make up the unit cell. Similarly, the Archimidean tiling A19 consists of 19 equally-spaced holes with a NND of a. The holes are arranged in the form of an inner hexagon of seven holes, and outer hexagon of 12 holes, and a central hole within the inner hexagon. The hexagonal unit cells 230 then fit together along their edges with a center-to-center spacing between the unit cells of $a'=a^*(3+\sqrt{3})$ to pattern the entire surface of the LED. The enhancement in light extraction, the methodology for conducting the corresponding numerical calculation, and the physical explanation of the enhanced light extraction for a light-emitting device having the pattern shown in FIG. 41 is generally the same as described above. As shown in FIG. 41 the extraction efficiency for A7 and A19 is about 77%. The data shown in FIG. 41 are calculated using the parameters given for the LED 100 shown in FIG. 32, except that the emitted light has a peak wavelength of 450 and except that the NND is defined as the distance between openings within an individual cell.

Figure 42:
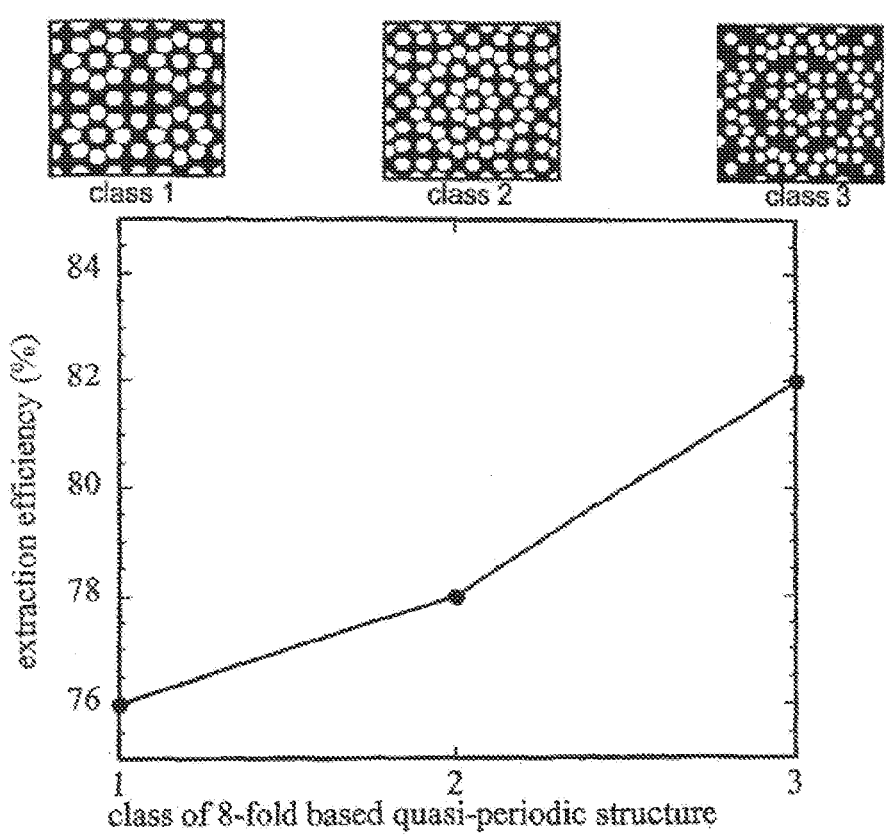
FIG. 42 is a graph of an extraction efficiency of LEDs with different surface patterns.

FIG. 42 shows numerical calculation data for LED 100 having a quasicrystalline pattern. Quasicrystalline patterns are described, for example, in M. Senechal, *Quasicrystals and Geometry* (Cambridge University Press, Cambridge, England 1996), which is hereby incorporated by reference. The numerical calculations show the behavior of the extraction efficiency as the class of 8-fold based quasi-periodic structure is varied. It is believed that quasicrystalline patterns exhibit high extraction efficiency due to high degree of in-plane rotational symmetries allowed by such structures. The enhancement in light extraction, the methodology for conducting the corresponding numerical calculation, and the physical explanation of the enhanced light extraction for a light-emitting device having the pattern shown in FIG. 42 is generally the same as described above. Results from FDTD calculations shown in FIG. 22 indicate that the extraction efficiency of quasicrystalline structures reaches about 82%. The data shown in FIG. 42 are calculated using the parameters given for the LED 100 shown in FIG. 32, except that the emitted light has a peak wavelength of 450 and except that the NND is defined as the distance between openings within an individual cell.

While certain examples of patterns have been described herein, it is believed that other patterns can also enhance the light extraction from LED 100 if the patterns satisfy the basic principles discussed above. For example, it is believed that adding detuning to quasicrystalline or complex periodic structures can increase extraction efficiency.

In some embodiments, at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110.

In certain embodiments, the cross-sectional area of LED 100 can be relatively large, while still exhibiting efficient light extraction from LED 100. For example, one or more edges of LED 100 can be at least about one millimeter (e.g., at least about 1.5 millimeters, at least about two millimeters, at least about 2.5 millimeters, at least about three millimeters), and at least about 45% (e.g., at least about 50%, at least about 55%, at least about 60%, at least about 70%, at least about 80%, at least about 90%, at least about 95%) of the total amount of light generated by light-generating region 130 that emerges from LED 100 emerges via surface 110. This can allow for an LED to have a relatively large cross-section (e.g., at least about one millimeter by at least about one millimeter) while exhibiting good power conversion efficiency.

In some embodiments, the extraction efficiency of an LED having the design of LED 100 is substantially independent of the length of the edge of the LED. For example, the difference between the extraction efficiency of an LED having the design of LED 100 and one or more edges having a length of about 0.25 millimeter and the extraction efficiency of LED having the design of LED 100 and one or more edges having a length of one millimeter can vary by less than about 10% (e.g., less than about 8%, less than about 5%, less than about 3%). As referred to herein, the extraction efficiency of an LED is the ratio of the light emitted by the LED to the amount of light generated by the device (which can be measured in terms of energy or photons). This can allow for an LED to have a relatively large cross-section (e.g., at least about one millimeter by at least about one millimeter) while exhibiting good power conversion efficiency.

In certain embodiments, the quantum efficiency of an LED having the design of LED 100 is substantially independent of the length of the edge of the LED. For example, the difference between the quantum efficiency of an LED having the design of LED 100 and one or more edges having a length of about 0.25 millimeter and the quantum efficiency of LED having the design of LED 100 and one or more edges having a length of one millimeter can vary by less than about 10% (e.g., less than about 8%, less than about 5%, less than about 3%). As referred to herein, the quantum efficiency of an LED is the ratio of the number of photons generated by the LED to the number of electron-hole recombinations that occur in the LED. This can allow for an LED to have a relatively large cross-section (e.g., at least about one millimeter by at least about one millimeter) while exhibiting good performance.

In some embodiments, the wall plug efficiency of an LED having the design of LED 100 is substantially independent of the length of the edge of the LED. For example, the difference between the wall plug efficiency of an LED having the design of LED 100 and one or more edges having a length of about 0.25 millimeter and the wall plug efficiency of LED having the design of LED 100 and one or more edges having a length of one millimeter can vary by less than about 10% (e.g., less than about 8%, less than about 5%, less than about 3%). As referred to herein, the wall plug efficiency of an LED is the product of the injection efficiency of the LED (the ratio of the numbers of carriers injected into the device to the number of carriers that recombine in the light-generating region of the device), the radiative efficiency of the LED (the ratio of electron-hole recombinations that result in a radiative event to the total number of electron-hole recombinations), and the extraction efficiency of the LED (the ratio of photons that are extracted from the LED to the total number of photons created). This can allow for an LED to have a relatively large cross-section (e.g., at least about one millimeter by at least about one millimeter) while exhibiting good performance.

Figure 43:
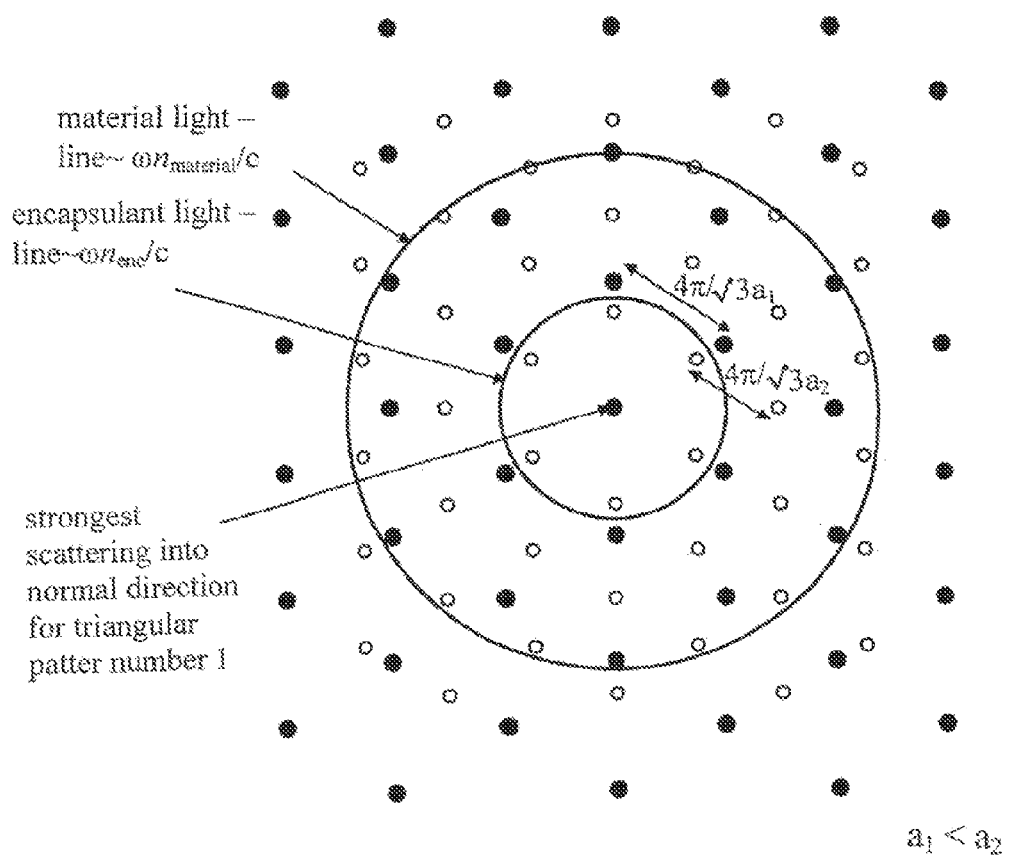
FIG. 43 is a schematic representation of the Fourier transformation two LEDs having different patterned surfaces compared with the radiation emission spectrum of the LEDs.
Figure 44:
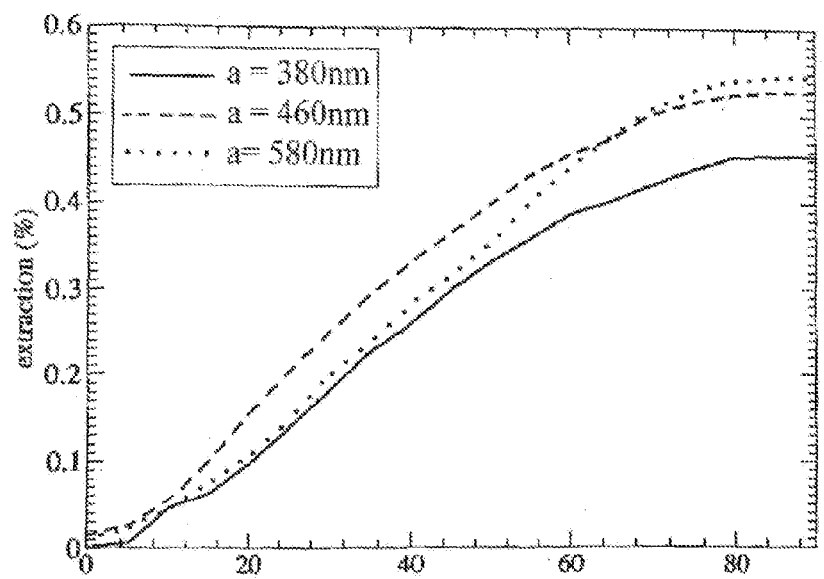
FIG. 44 is a graph of an extraction efficiency of LEDs having different surface patterns as a function of angle.

In some embodiments, it may be desirable to manipulate the angular distribution of light that emerges from LED 100 via surface 110. To increase extraction efficiency into a given solid angle (e.g., into a solid angle around the direction normal to surface 110) we examine the Fourier transform of the dielectric function that varies spatially according to pattern 150 (as described earlier). FIG. 43 shows the Fourier transform construction for two ideal triangular lattices of different lattice constant. To increase the extraction efficiency, we seek to increase the number of G points within the encapsulant light line and scattering strengths of G points ($\in_G$) within the material light line. This would imply increasing the NND so as to achieve the effect depicted in FIG. 36. However, here we are concerned with increasing the extraction efficiency into a solid angle centered around the normal direction. Therefore, we would also like to limit the introduction of higher order G points by reducing the radius of the encapsulant light line, such that the magnitude of $G>(\omega(n_e))/c$. We can see that by decreasing the index of refraction of the encapsulant (the bare minimum of which is removing the encapsulant all together) we allow larger NND and therefore increase the number of G points within the material light line that are available to contribute to extraction in the normal direction ($F_{k=0}$) while simultaneously avoiding diffraction into higher order (oblique angles) in the encapsulant. The above described trends are depicted in FIG. 44 which shows extraction efficiency into a solid angle (given by the collection half-angle in the diagram). The data shown in FIG. 44 are calculated using the parameters given for the LED 100 shown in FIG. 32, except that the emitted light has a peak wavelength of 530 nm and a bandwidth of 34 nm, the index of refraction of the encapsulant was 1.0, the thickness of the p-doped layer was 160 nm, the light generating layer was 30 nm thick, the NND (a) for the three curves is shown on FIG. 44, and the depth, hole diameter, and n-doped layer thickness scaled with a, as 1.27a, 0.72a, and 1.27a+40 nm, respectively. As the lattice constant is increased, the extraction efficiency at narrow angles increases as well as the overall extraction efficiency into all angles. However, for even larger lattice constant, diffraction into higher order modes in the encapsulant limits the extraction efficiency at narrow angles even though the overall extraction efficiency increases into all angles. For a lattice constant of 460 nm, we calculate greater than 25% extraction efficiency into a collection half-angle of 30°. That is, about half of the extracted light is collected within only about 13.4% of the upper hemisphere of solid angle demonstrating the collimation effect of the pattern. It is believed that any pattern that increases the number of G points within the material light line while limiting the number of G points within the encapsulant light line to only the G points at k=0 can improve the extraction efficiency into a solid angle centered around the normal direction.

The approach is especially applicable for reducing the source etendue which is believed to often be proportional to $n^2$, where n is the index of refraction of the surrounding material (e.g., the encapsulant). It is therefore believed that reducing the index of refraction of the encapsulating layer for LED 100 can lead to more collimated emission, a lower source etendue, and therefore to a higher surface brightness (here defined as the total lumens extracted into the etendue of the source). In some embodiments then, using an encapsulant of air will reduce the source etendue while increasing extraction efficiency into a given collection angle centered around the normal direction.

In certain embodiments, when light generated by region 130 emerges from LED 100 via surface 110, the distribution of light is more collimated than a lambertian distribution. For example, in some embodiments, when light generated by region 130 emerges from LED 100 via surface 110, at least about 40% (e.g., at least about 50%, at least about 70%, at least about 90%) of the light emerging via the surface of the dielectric layer emerges within at most about 30° (e.g., at most about 25°, at most about 20°, at most about 15°) of an angle normal to surface 110.

The ability to extract a relatively high percentage of light from a desired angle alone or coupled with a relatively high light extraction can allow for a relatively high density of LEDs to be prepared on a given wafer. For example, in some embodiments, a wafer has at least about five LEDs (e.g., at least about 25 LEDs, at least about 50 LEDs) per square centimeter.

Figure 45:
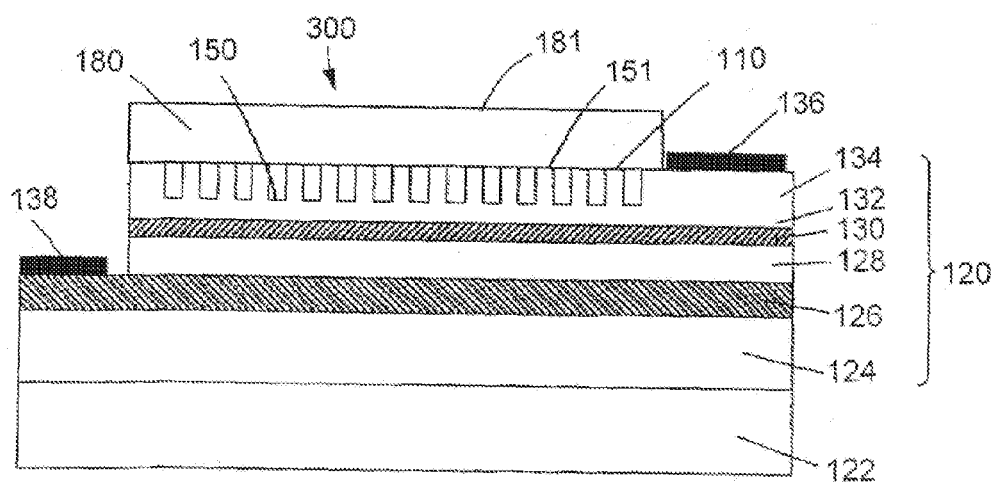
FIG. 45 is a side view of an LED with a patterned surface and a phosphor layer on the patterned surface.

In some embodiments, it may be desirable to modify the wavelength(s) of light that emerge(s) from a packaged LED 100 relative to the wavelength(s) of light generated by light-generating region 130. For example, as shown in FIG. 45, an LED 300 having a layer containing a phosphor material 180 can be disposed on surface 110. The phosphor material can interact with light at the wavelength(s) generated by region 130 to provide light at desired wavelength(s). In some embodiments, it may be desirable for the light that emerges from packaged LED 100 to be substantially white light. In such embodiments, the phosphor material in layer 180 can be formed of, for example, a (Y,Gd)(Al,Ga)G:Ce$^{3+}$ or "YAG" (yttrium, aluminum, garnet) phosphor. When pumped by blue light emitted from the light-generating region 130, the phosphor material in layer 180 can be activated and emit light (e.g., isotropically) with a broad spectrum centered around yellow wavelengths. A viewer of the total light spectrum emerging from packaged LED 100 sees the yellow phosphor broad emission spectrum and the blue InGaN narrow emission spectrum and typically mixes the two spectra to perceive white.

In certain embodiments, layer 180 can be substantially uniformly disposed on surface 110. For example, the distance between the top 151 of pattern 150 and the top 181 of layer 180 can vary by less than about 20% (e.g., less than about 10%, less than about 5%, less than about 2%) across surface 110.

In general, the thickness of layer 180 is small compared to the cross-sectional dimensions of surface 130 of LED 100, which are typically about one millimeter (mm) by one mm. Because layer 180 is substantially uniformly deposited on surface 110, the phosphor material in layer 180 can be substantially uniformly pumped by light emerging via surface 110. The phosphor layer 180 is relatively thin compared to the dimensions of the surface 110 of the LED 100, such that light emitted by the light-generating region 130 is converted into lower wavelength light within the phosphor layer 180 approximately uniformly over the entire surface 110 of LED 100. Thus, the relatively thin, uniform phosphor layer 180 produces a uniform spectrum of white light emitted from the LED 100 as a function of position on surface 110.

In general, LED 100 can be fabricated as desired. Typically, fabrication of LED 100 involves various deposition, laser processing, lithography, and etching steps.

For example, FIG. 46 shows a LED wafer 500 containing an LED layer stack of material deposited on a substrate (e.g., sapphire, compound semiconductor, zinc oxide, silicon carbide, silicon) 502. Such wafers are commercially available. Exemplary commercial suppliers include Epistar Corporation, Arima Optoelectronics Corporation and South Epitaxy Corporation. On substrate 502 are disposed, consecutively, a buffer layer 504 (e.g., a nitride-containing layer, such as a GaN layer, an AlN layer, an AlGaN layer), an n-doped semiconductor layer (e.g., an n-doped Si:GaN) layer 506, a current spreading layer 508 (e.g., an AlGaN/GaN heterojunction or superlattice), a light-emitting region 510 (e.g., an InGaN/GaN multi-quantum well region), and a semiconductor layer 512 (e.g., a p-doped Mg:GaN layer). Wafer 500 generally has a diameter of at least about two inches (e.g., from about two inches to about 12 inches, from about two inches to about six inches, from about two inches to about four inches, from about two inches to about three inches).

FIG. 47 shows a multi-layer stack 550 including layers 502, 504, 506, 508, 510 and 512, as well as layers 520, 522, 524 and 526, which are generally formed of materials capable of being pressure and/or heat bonded as described below. For example, layer 520 can be a nickel layer (e.g., electron-beam evaporated), layer 522 can be a silver layer (e.g., electron-beam evaporated), layer 524 can be a nickel layer (e.g., electron-beam evaporated), and layer 526 can be a gold layer (e.g., electron-beam evaporated). In some embodiments, layer 520 can be a relatively thin layer, and layer 524 can be a relatively thick layer. Layer 524 can act, for example, as diffusion barrier to reduce the diffusion of contaminants (e.g., gold) into layers 520, 522 and/or 524 itself. After deposition of layers 520, 522, 524 and 526, multi-layer stack 550 can be treated to achieve an ohmic contact. For example, stack 550 can be annealed (e.g., at a temperature of from about 400° C. to about 600° C.) for a period of time (e.g., from about 30 seconds to about 300 seconds) in an appropriate gas environment (e.g., nitrogen, oxygen, air, forming gas).

FIG. 48 shows a multi-layer stack 600 that includes a submount (e.g., germanium (such as polycrystalline germanium), silicon (such as polycrystalline silicon), silicon-carbide, copper, copper-tungsten, diamond, nickel-cobalt) 602 having layers 604, 606, 608 and 610 deposited thereon. Submount 602 can be formed, for example, by sputtering or electroforming. Layer 604 is a contact layer and can be formed, for example, from aluminum (e.g., electron evaporated). Layer 606 is a diffusion barrier and can be formed, for example, from Ni (e.g. electron evaporated). Layer 608 can be a gold layer (e.g., electron-beam evaporated), and layer 610 can be a AuSn bonding layer (e.g., thermal evaporated, sputtered) onto layer 608. After deposition of layers 604, 606, 608 and 610, multi-layer stack 600 can be treated to achieve an ohmic contact. For example, stack 600 can be annealed (e.g., at a temperature of from about 350° C. to about 500° C.) for a period of time (e.g., from about 30 seconds to about 300 seconds) in an appropriate gas environment (e.g., nitrogen, oxygen, air, forming gas).

FIG. 49 shows a multi-layer stack 650 formed by bonding together layers 526 and 610 (e.g., using a solder bond, using a eutectic bond, using a peritectic bond). Layers 526 and 610 can be bonded, for example, using thermal-mechanical pressing. As an example, after contacting layers 526 and 610, multi-layer stack 650 can be put in a press and pressurized (e.g., using a pressure of up to about 5 MPa, up to about 2 MPa) heated (e.g., to a temperature of from about 200° C. to about 400° C.). Stack 650 can then be cooled (e.g., to room temperature) and removed from the press.

Substrate 502 and buffer layer 504 are then at least partially removed from stack 650. In general, this can be achieved using any desired methods. For example, as shown in FIG. 50, in some embodiments, substrate 502 is removed by exposing stack 650 (e.g., through surface 501 of substrate 502) to electromagnetic radiation at an appropriate wavelength to partially decompose layer 504. It is believed that this results in local heating of layer 504, resulting in the partial decomposition of the material of layer 504 adjacent the interface of layer 504 and substrate 502, thereby allowing for the removal of substrate 502 from stack 650 (see discussion below). For example, in embodiments in which layer 504 is formed of gallium nitride, it is believed that constituents including gallium and gaseous nitrogen are formed. In some embodiments, stack 650 can be heated during exposure of surface 501 to the electromagnetic radiation (e.g., to reduce strain within stack 650). Stack 650 can be heated, for example, by placing stack 650 on a hot plate and/or by exposing stack 650 to an additional laser source (e.g. a $CO_2$ laser). Heating stack 650 during exposure of surface 501 to electromagnetic radiation can, for example, reduce (e.g., prevent) liquid gallium from re-solidifying. This can reduce the build up of strain within stack 650 which can occur upon the re-solidification of the gallium.

In certain embodiments, after exposure to the electromagnetic radiation, residual gallium is present and keeps substrate 502 bonded in stack 650. In such embodiments, stack 650 can be heated to above the melting temperature of gallium to allow substrate 502 to be removed from the stack. In certain embodiments, stack 650 may be exposed to an etchant (e.g., a chemical etchant, such as HCl) to etch the residual gallium and remove substrate 502. Other methods of removing the residual gallium (e.g., physical methods) may also be used.

As an example, in certain embodiments, surface 501 is exposed to laser radiation including the absorption wavelength of layer 504 (e.g., about 248 nanometers, about 355 nanometers). Laser radiation processes are disclosed, for example, in U.S. Pat. Nos. 6,420,242 and 6,071,795, which are hereby incorporated by reference. The multi-layer stack is then heated to above the melting point of gallium, at which point substrate 502 and buffer layer 504 are removed from the stack by applying a lateral force to substrate 502 (e.g., using a cotton swab).

In some embodiments, multiple portions of surface 501 are simultaneously exposed to the electromagnetic radiation. In certain embodiments, multiple portions of surface 501 are sequentially exposed to electromagnetic radiation. Combinations of simultaneous and sequential exposure can be used. Further, the electromagnetic radiation can be exposed on surface 501 in the form of a pattern (e.g., a serpentine pattern, a circular pattern, a spiral pattern, a grid, a grating, a triangular pattern, an elementary pattern, a random pattern, a complex pattern, a periodic pattern, a nonperiodic pattern). In some embodiments, the electromagnetic radiation can be rastered across one or more portions of surface 501. In certain embodiments, surface 501 is exposed to overlapping fields of electromagnetic radiation.

In some embodiments, the electromagnetic radiation passes through a mask before reaching surface 501. As an example, the electromagnetic radiation can pass through an optical system that includes a mask (e.g., a high thermal conductivity mask, such as a molybdenum mask, a copper-beryllium mask) before reaching surface 501. In some embodiments, the mask is an aperture (e.g., for truncating or shaping the beam). The optical system can include, for example, at least two lenses having the mask disposed there between. As another example, the mask can be formed as a pattern of material on surface 501, with the mask leaving certain portions of surface 501 exposed and some portions of surface 501 unexposed. Such a mask can be formed, for example, via a lithography process. In some embodiments, the electromagnetic radiation can be rastered across one or more portions of the mask.

Without wishing to be bound by theory, it is believed that reducing at least one dimension of the region on surface 501 exposed to electromagnetic radiation within a given area of surface 501 can limit undesired crack propagation, such as crack propagation into layer 504, layer 506 or other layers of stack 650 during removal of substrate 502, while still allowing for crack propagation at the interface between substrate 502 and buffer layer 504. It is believed that, if the size of the feature of the electromagnetic radiation on surface 501 is too large, then a gaseous bubble (e.g., a nitrogen bubble) may form that can create a localized pressure that can cause undesired cracking. For example, in embodiments in which surface 501 is exposed to laser radiation that forms a spot or a line on surface 501, at least one dimension of the spot or line can be a maximum of at most about one millimeter (e.g., at most about 500 microns, at most about 100 microns, at most about 25 microns, at most about 10 microns). In some embodiments, the spot size is from about five microns to about one millimeter (e.g., from about five microns to about 100 microns, from about five microns to about 25 microns, from about five microns to about 10 microns).

In certain embodiments, stack 650 is vibrated while surface 501 is exposed to the electromagnetic radiation. Without wishing to be bound by theory, it is believed that vibrating stack 650 while exposing stack 650 to the electromagnetic radiation can enhance crack propagation along the interface between layer 504 and substrate 502. Generally, the conditions are selected to limit the propagation of cracks into layer 504 (e.g., so that substantially no cracks propagate into layer 504, 506, and the rest of stack 650).

After removal of substrate 502, a portion of buffer layer 504 typically remains on at least a portion of the surface of layer 506. A residue of material from substrate 502 (e.g., containing aluminum and/or oxygen) can also be present on the remaining portion of buffer layer 504 and/or on the surface of layer 506. It is generally desirable to remove the remaining portions of buffer layer 504 and any residue from substrate 502, to expose the surface of layer 506, and to clean the exposed surface of layer 506 because layer 506 (which is typically formed of an n-doped semiconductor material) can exhibit good electrical properties (e.g., desirable contact resistance) for subsequent formation of an electrical contact. One or more process steps are usually used to remove any residue and/or remaining portion of buffer layer 504 present, and to clean the surface of layer 506 (e.g., to remove impurities, such as organics and/or particles). The process(es) can be performed using a variety of techniques and/or combinations of techniques. Examples include chemical-mechanical polishing, mechanical polishing, reactive ion etching (e.g., with a substantially chemically etching component), physical etching, and wet etching. Such methods are disclosed, for example, in Ghandhi, S., *VLSI Fabrication Principles: Silicon & Gallium Arsenide* (1994), which is hereby incorporated by reference. In certain embodiments, buffer layer 504 is not completely removed. Instead, in such embodiments, these processes can be used to remove only on portions of buffer layer 504 that correspond to locations where electrical leads will subsequently be disposed (e.g., by using a self-aligned process).

Often, when substrate 502 is removed, the amount of strain in stack 650 (e.g., due to the lattice mismatch and/or thermal mismatch between the layers in stack 650) can change. For example, if the amount of strain in stack 650 is decreased, the peak output wavelength of region 510 can change (e.g., increase). As another example, if the amount of strain in stack 650 is increased, the peak output wavelength of region 510 can change (e.g., decrease).

To limit undesired cracking during removal of substrate 502, in some embodiments, consideration is given to the coefficient of thermal expansion of both substrate 502, the coefficient of thermal expansion of submount 602, the combined thickness of layers 504, 506, 508, 510, and 512, and/or the coefficient of thermal expansion of one or more of layers 504, 506, 508, 510, and 512. As an example, in some embodiments, substrate 502 and submount 602 are selected so that the coefficient of thermal expansion of submount 602 differs from a coefficient of thermal expansion of substrate 502 by less than about 15% (e.g., less than about 10%, less than about 5%). As another example, in certain embodiments, substrate 502 and submount 602 are selected so that the thickness of submount 602 is substantially greater than the thickness of substrate 502. As an additional example, in some embodiments, semiconductor layers 504, 506, 508, 510, 512 and submount 602 are selected so that the coefficient of thermal expansion of submount 602 differs from a coefficient of thermal expansion of one or more of layers 504, 506, 608, 510, and 512 by less than about 15% (e.g., less than about 10%, less than about 5%).

In general, substrate 502 and submount 602 can have any desired thickness. In some embodiments, substrate 502 is at most about five millimeters (e.g., at most about three millimeters, at most about one millimeter, about 0.5 millimeter) thick. In certain embodiments, submount 602 is at most about 10 millimeters (e.g., at most about five millimeters, at most about one millimeter, about 0.5 millimeter) thick. In some embodiments, submount 602 is thicker than substrate 502, and, in certain embodiments, substrate 502 is thicker than submount 602.

After removal of buffer layer 504 and exposing/cleaning the surface of layer 506, the thickness of layer 506 can be reduced to a desired final thickness for use in the light-emitting device. This can be achieved, for example, using a mechanical etching process, alone or in combination with an etching process. In some embodiments, after etching/cleaning the exposed surface of layer 506, the surface of layer 506 has a relatively high degree of flatness (e.g., a relatively high degree of flatness on the scale of the lithography reticle to be used). As an example, in some embodiments, after etching/cleaning the exposed surface of layer 506, the surface of layer 506 has a flatness of at most about 10 microns per 6.25 square centimeters (e.g., at most about five microns per 6.25 square centimeters, at most about one micron per 6.25 square centimeters). As another example, in certain embodiments, after etching/cleaning the exposed surface of layer 506, the surface of layer 506 has a flatness of at most about 10 microns per square centimeter (e.g., at most about five microns per square centimeter, at most about one microns per square centimeter). In certain embodiments, after etching/cleaning the exposed surface of layer 506, the surface of layer 506 has an RMS roughness of at most about 50 nanometers (e.g., at most about 25 nanometers, at most about 10 nanometers, at most about five nanometers, at most about one nanometer).

In some embodiments, prior to forming the dielectric function that varies spatially according to a pattern in the surface of layer 506, the exposed surface of layer 506 may be too rough and/or insufficiently flat to use nanolithography to form the pattern with sufficient accuracy and/or reproducibility. To enhance the ability to accurately and/or reproducibly form the pattern in the surface of layer 506, the nanolithography process may include depositing a planarization layer on the surface of layer 506 and a lithography layer on the surface of the planarization layer. For example, FIG. 51 shows an embodiment in which a planarization layer 702 is disposed on the surface of layer 506, and a lithography layer 704 is disposed on the surface of layer 702, an exposed surface 505 of layer 506 may be relatively rough (e.g., RMS roughness of about 10 nanometers or more) after cleaning/etching layer 506. In some embodiments, planarization layer 702 is formed of multiple layers (e.g., of the same material) that are sequentially deposited.

Examples of materials from which planarization layer 702 can be selected include polymers (e.g., DUV-30J from Brewer Sciences, anti-reflection coatings, high viscosity formable polymers), and examples of materials from which lithography layer 704 can be selected include UV-curable polymers (e.g., low viscosity MonoMat™ available from Molecular Imprints, Inc.). Layers 702 and 704 can be formed using any desired technique, such as, for example, spin coating, vapor deposition, and the like.

Layer 702 can be, for example, at least about 100 nanometers thick (e.g., at least about 500 nanometers thick) and/or at most about five microns thick (e.g., at most about one micron thick). Layer 704 can be, for example, at least about one nanometer thick (e.g., at least about 10 nanometers thick) and/or at most about one micron thick (e.g., at most about 0.5 micron thick).

Figure 53:
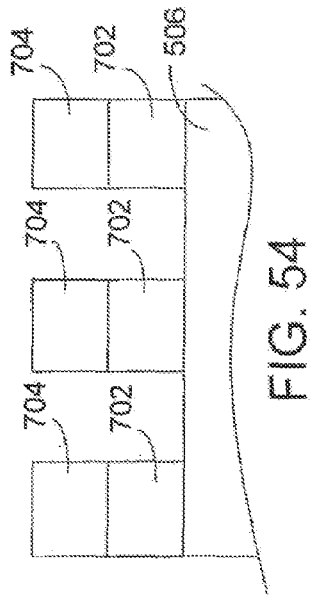
FIG. 53 is a partial cross-sectional view of a multi-layer stack.

A mold that defines a portion of the desired pattern is then pressed into lithography layer and (typically with heating or UV-curing of the mold and/or layer 704), and stepped across the surface of layer 704 in a portion-by-portion manner to form indentions in layer 704 (FIG. 52) that correspond to the desired pattern in the surface of layer 506. In some embodiments, a single step covers the entire wafer (e.g., full wafer nanolithography techniques). Layer 704 is then etched (e.g., using reactive ion etching, wet etching) to expose portions of the surface of layer 702 corresponding to what were the indented portions of layer 704 (FIG. 53). Examples of such imprint/etch processes are disclosed, for example, in U.S. Pat. No. 5,722,905, and Zhang et al., *Applied Physics Letters*, Vol. 83, No. 8, pp. 1632-34, both of which are hereby incorporated by reference. Typically, the pattern in layer 704 also leaves regions for depositing n-contacts later on in the process flow. In alternate embodiments, other techniques (e.g., x-ray lithography, deep ultraviolet lithography, extreme ultraviolet lithography, immersion lithography, interference lithography, electron beam lithography, photolithography, microcontact printing, self-assembly techniques) may be used to create the pattern in layer 704.

Figure 54:
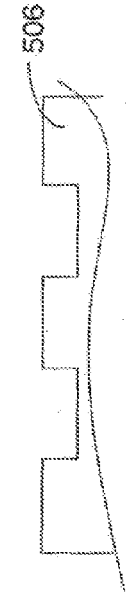
FIG. 54 is a partial cross-sectional view of a multi-layer stack.
Figure 56:
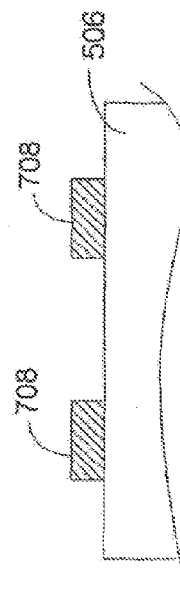
FIG. 56 is a partial cross-sectional view of a multi-layer stack.
Figure 55:
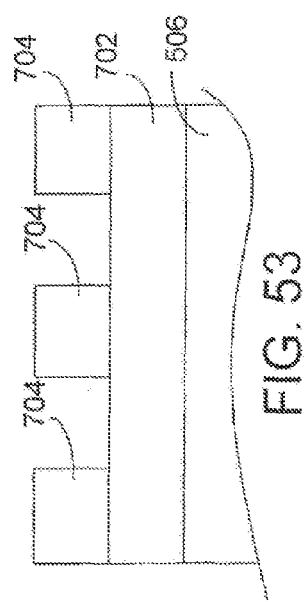
FIG. 55 is a partial cross-sectional view of a multi-layer stack.

As shown in FIG. 54, patterned layer 704 is used as a mask to transfer the pattern into the planarization layer 702 (e.g., dry etching, wet etching). An example of a dry etching method is reactive ion etching. Referring to FIG. 55, layers 702 and 704 are subsequently used as a mask to transfer the pattern into the surface of layer 506 (e.g., using dry etching, wet etching). As shown in FIG. 56, following etching of layer 506, the layers 702 and 704 are removed (e.g., using an oxygen-based reactive ion etch, a wet solvent etch).

Figure 57:
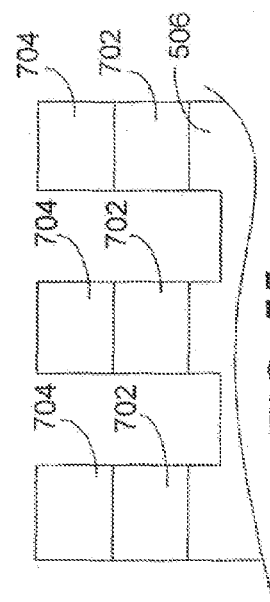
FIG. 57 is a partial cross-sectional view of a multi-layer stack.
Figure 58:
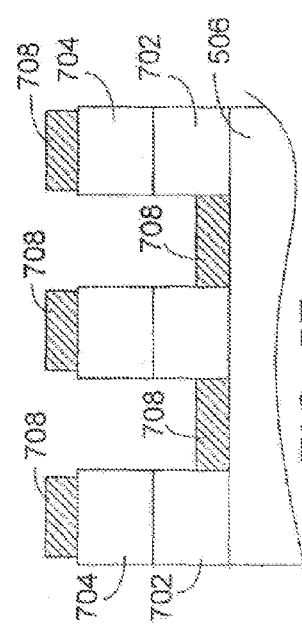
FIG. 58 is a partial cross-sectional view of a multi-layer stack.
Figure 59:
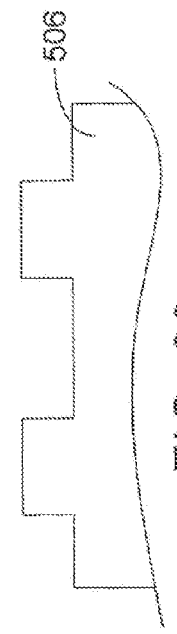
FIG. 59 is a partial cross-sectional view of a multi-layer stack.
Figure 60:
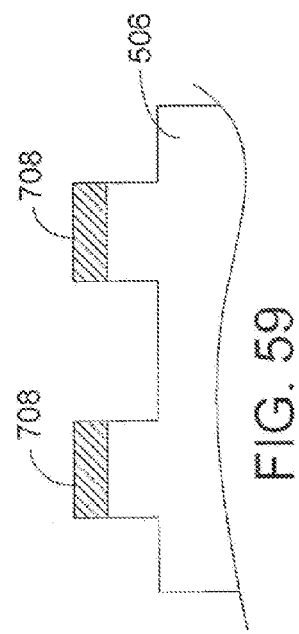
FIG. 60 is a partial cross-sectional view of a multi-layer stack.

Referring to FIG. 57, in some embodiments, the process can include, disposing a material 708 (e.g., a metal, such as aluminum, nickel, titanium, tungsten) in the etched portions of layers 702 and 704 (e.g., by evaporation) and on the surface of layer 704. As shown in FIG. 58, layers 702 and 704 are then etched (e.g., using reactive ion etching, wet etching), leaving behind etch-resistant material 708 on the surface of layer 506, which can serve as a mask for etching the pattern into the surface of layer 506 (FIG. 59). Referring to FIG. 60, etch resistant material 708 can then be removed (e.g., using dry etching, wet etching).

Figure 61:
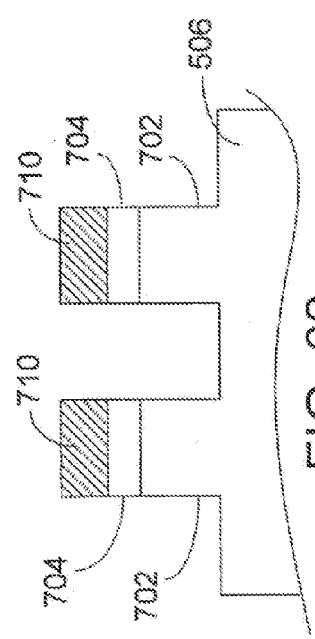
FIG. 61 is a partial cross-sectional view of a multi-layer stack.
Figure 62:
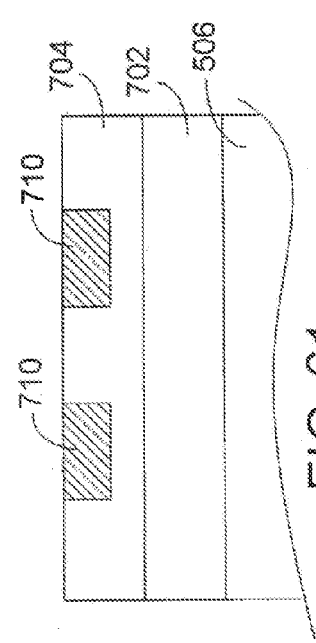
FIG. 62 is a partial cross-sectional view of a multi-layer stack.
Figure 63:
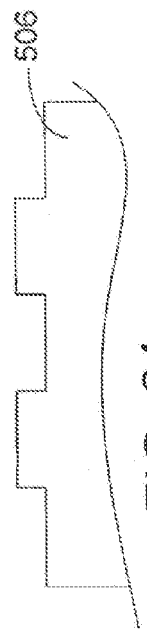
FIG. 63 is a partial cross-sectional view of a multi-layer stack.
Figure 64:
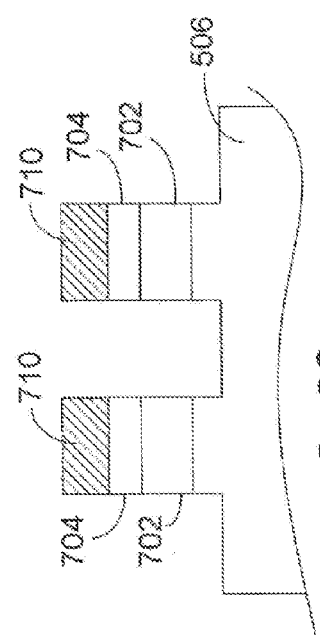
FIG. 64 is a partial cross-sectional view of a multi-layer stack.

In some embodiments, the process can include, after forming the indents in layer 704, disposing (e.g., spin coating) an etch resistant material (e.g., a Si-doped polymer) 710 on the surface of layer 704 and in the indents in layer 704, and material 710 is then etched back (e.g., using dry etching) so that to expose the surface of layer 704 while maintaining the etch-resistant material in the indents in layer 704 (FIG. 61). As shown in FIG. 62, portions of layers 702 and 704 are then etched (e.g., using reactive ion etching, dry etching, wet etching), leaving behind etch-resistant material 710 and the portions of layers 702 and 704 under material 710, which serve as a mask for etching the pattern into the surface of layer 506 (FIG. 63). Referring to FIG. 64, the remaining portions of layers 702 and 704, as well as etch resistant material 710, can then be removed (e.g., using reactive ion etching, dry etching, wet etching). In some embodiments, removing layer 708 can involve the use of a plasma process (e.g., a fluorine plasma process).

After the pattern has been transferred to n-doped layer 506, a layer of phosphor material can optionally be disposed (e.g., spin-coated) onto the patterned surface of n-doped layer 506. In some embodiments, the phosphor can conformally coat the patterned surface (coat with substantially no voids present along the bottoms and sidewalls of the openings in the patterned surface). Alternatively, a layer of encapsulant material can be disposed on the surface of patterned n-doped layer 506 (e.g. by CVD, sputtering, suspension by liquid binder that is subsequently evaporated). In some embodiments, the encapsulant can contain one or more phosphor materials. In some embodiments, the phosphor can be compressed to achieve thickness uniformity less than about 20%, less than about 15%, less than about 10%, less than about 5%, or less than about 2% of the average thickness of the phosphor. In some embodiments, the phosphor-containing encapsulant can conformally coat the patterned surface.

After the dielectric function pattern has been created in the n-doped layer 506, individual LED dice can be cut from the wafer. Once wafer processing and wafer testing is complete, individual LED dice are separated and prepared for packaging and testing. A sidewall passivation step and/or a pre-separation deep mesa etching step may be used to reduce potential damage to the electrical and/or optical properties of the patterned LED incurred during wafer cutting. The individual LEDs can be any size up to the size of the wafer itself, but individual LEDs are typically square or rectangular, with sides having a length between about 0.5 mm to 5 mm. To create the dice, standard photolithography is used to define the location of contact pads on the wafer for energizing the device, and ohmic contacts are evaporated (e.g. using electron beam evaporation) onto the desired locations.

While certain embodiments of fabricating LED 100 have been described, other fabrication methods may also be used. For example, in some embodiments LED 100 can be formed on a single mesa (e.g., separated from other mesas that contain other LEDs or other devices).

Figure 65:
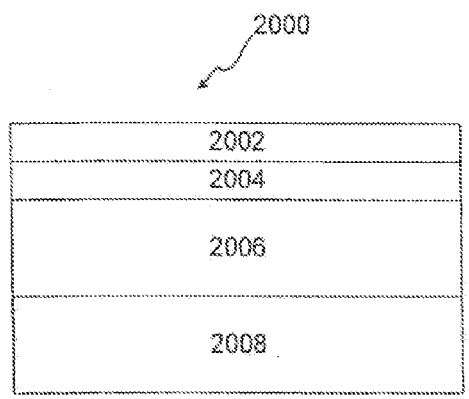
FIG. 65 is a partial cross-sectional view of a multi-layer stack.

FIG. 65 shows an LED wafer 2000 containing a multilayer stack including a substrate 2008, a layer 2006, a layer 2004, and a layer 2002. Substrate 2008 can be generally as described above regarding substrate 500, and layers 2006, 2004 and 2002 can be generally as described above with respect to layers 506, 510 and 512, respectively.

Figure 66:
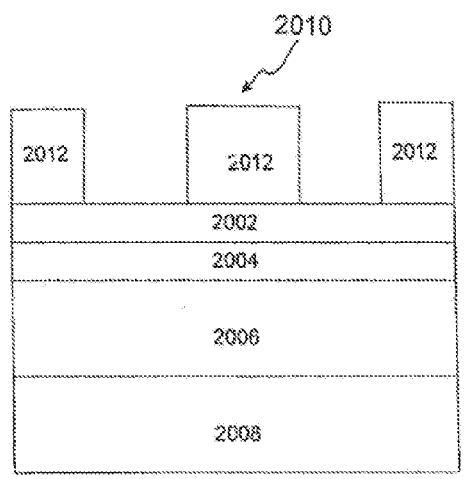
FIG. 66 is a partial cross-sectional view of a multi-layer stack.

FIG. 66 shows a multilayer stack 2010 including layers 2002, 2004, 2006, and substrate 2008 as described above. Multilayer stack 2010 also includes a patterned resist layer 2012. Patterned resist layer 2012 provides a mask for selective material deposition (e.g., metal deposition). Patterned resist layer 2012 can form a repeated pattern (e.g., a square, a rectangle, a circle, a hexagon, or another defined shape) that determines the resulting cross-sectional shape of the LED formed from the mesa.

Figure 67:
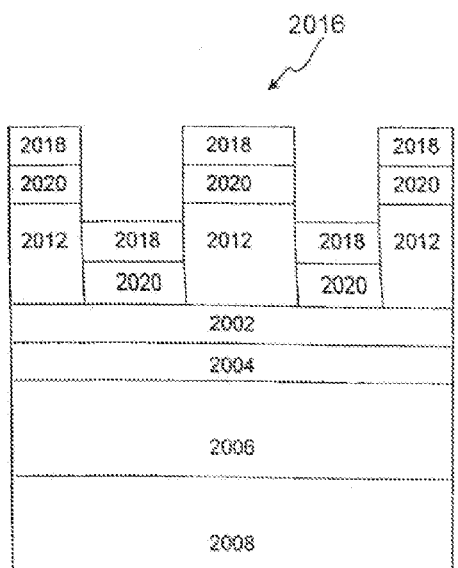
FIG. 67 is a partial cross-sectional view of a multi-layer stack.

FIG. 67 shows a multilayer stack 2016 including multilayer stack 2010, and layers 2018 and 2020. For example, layers 2018 and 2020 can be metal layers deposited onto a top surface of multilayer stack 2010. Layers 2018 and 2020 are generally selected to be capable of forming a contact to p-doped GaN layer 2002 and to be capable of bonding. For example, layer 2020 can be selected to form a contact and include a p-contact metal layer (e.g., a layer composed of Ni, Indium-Tin-Oxide (ITO), Ag, Al, Ti, Cu, Rh, Pt or alloys of these) and a mirror layer (e.g., a layer composed of Ag, Al, ITO, Cu, W, Pt, TiN, or alloys of these). In addition, a diffusion layer (e.g. Pt or Ti—N) can also be included to prevent or limit diffusion or chemical reactions between any of the metals in the layered stack. For example, the diffusion layer can prevent the relatively fast diffusion of Sn from the bonding layer. In addition, various adhesion layers (e.g. Ti) can be deposited to assist with sticking between different layers of the multilayer stack. Layer 2018 can be generally selected based on the bonding properties and function as a bonding interface layer. For example, layer 2018 can include Au, Ag, AgSn, Au—Sn, Pb—Sn, Pd—In, or Au—Ge. Layers 2018 and 2020 can be deposited using various metal deposition processes (e.g., e-beam, sputtering, thermal/resistance evaporation, or electroplating). In some embodiments, layer 2018 is deposited using a sputtering technique and layer 2020 is deposited using an e-beam process. In addition, a diffusion layer (e.g. Pt or Ti—N) can be included. The diffusion layer can prevent or limit diffusion or chemical reactions between any of the metals in the layered stack. In addition, various adhesion layers (e.g. Ti) can be deposited to assist with sticking between different layers of the multilayer stack.

Figure 68:
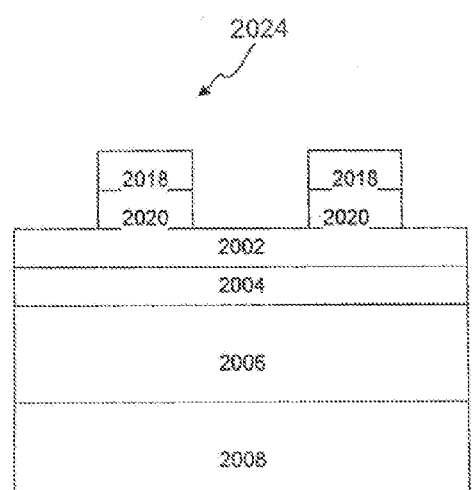
FIG. 68 is a partial cross-sectional view of a multi-layer stack.

FIG. 68 shows a multilayer stack 2024 formed by performing a liftoff process on multilayer stack 2016 to remove patterned resist layer 2012 and regions in which layers 2018 and 2020 were supported by patterned resist layer 2012 (e.g., regions where a layer of resist is disposed between layer 2020 and layer 2002). Metal layers 2018 and 2020 deposited in regions not having a resist layer such that the metal is deposited onto layer 2002 (e.g., regions where the resist was patterned and removed prior to deposition of layers 2018 and 2020) remain. Thus, metal layers 2018 and 2020 form a negative image of the resist pattern on the surface of multilayer stack 2024.

Figure 69:
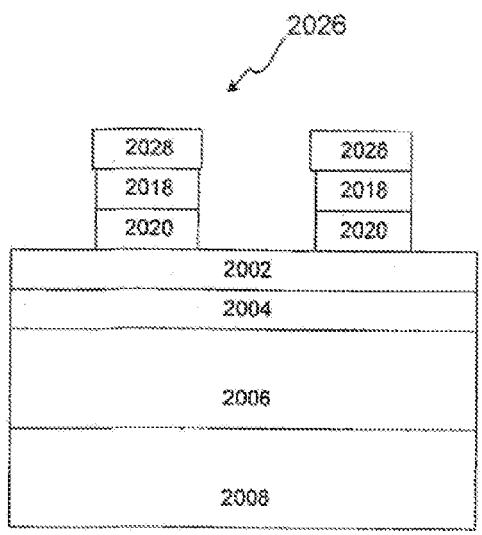
FIG. 69 is a partial cross-sectional view of a multi-layer stack.

FIG. 69 shows a multilayer stack 2026 formed by depositing a resist layer 2028 over regions of multilayer stack 2024.

Resist layer 2028 may extend past the edges of metal layers 2018 and 2020 and masks metal layers 2018 and 2020 during subsequent etching.

Figure 70:
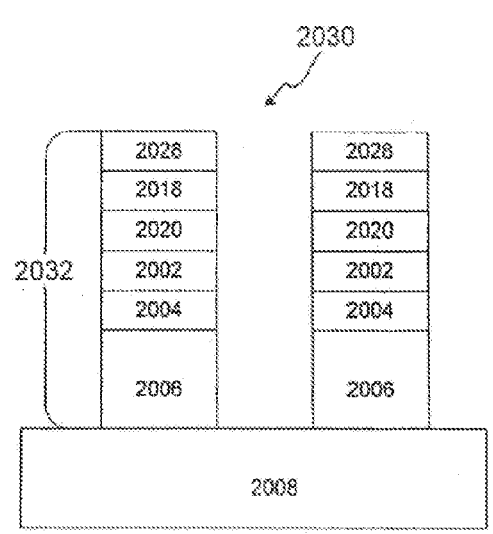
FIG. 70 is a partial cross-sectional view of a multi-layer stack.

FIG. 70 shows a multilayer stack 2030 including mesas 2032 supported by substrate 2008. Mesas 2032 can be formed, for example, by etching layers 2002, 2004, and 2006 of multilayer stack 2026 to transfer the pattern of metal layers 2018 and 2020 into multilayer stack 2026. For example, mesas 2032 can be etched using a chlorine based etch including Cl2, Ar, BCl3, or SiCl4. The height of mesas 2032 is determined by the thickness of initial multilayer stack 2000 and deposited layers 2018 and 2020. For example, mesas 2032 can be at least about 1 mm in height (e.g., at least about 2 mm in height, at least about 3 mm in height, at least about 4 mm in height, at least about 5 mm in height, at least about 6 mm in height, at least about 7 mm in height, at least about 8 mm in height, at least about 9 mm in height, at least about 10 mm in height). The etching of layers 2002, 2004, and 2006 to form mesas 2032 can increase the flexibility of the wafer that includes multilayer stack 2030 and mesas 2032. Increasing the flexibility of the wafer can provide advantages in bonding the multilayer stack 2030 to a submount as discussed below. The etching of layers 2002, 2004, and 2006 to form mesas 2032 can form a connected network of the channels in the wafer that includes multilayer stack 2030 and mesas 2032. The connected network of channels in the wafer can also provide advantages in bonding the multilayer stack 2030 to a submount as discussed below.

Figure 71:
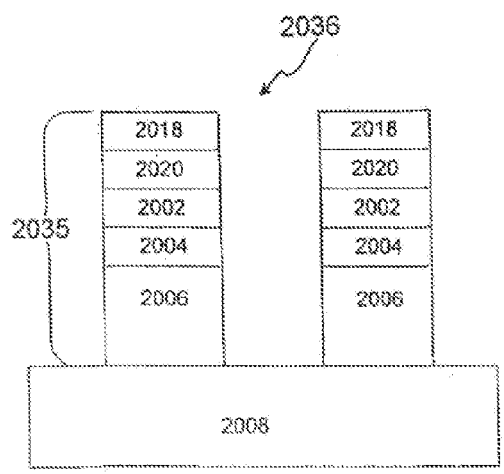
FIG. 71 is a partial cross-sectional view of a multi-layer stack.

FIG. 71 shows a multilayer stack 2036 including mesas 2035 supported by substrate 2008. Mesas 2035 are formed by removing resist layer 2028 from mesas 2032. A top surface of layer 2018 can be subjected to a bonding preparation process. For example, the surface of layer 2018 can be chemically cleaned, mechanically cleaned, or treated with a plasma, chemical, or gas to prepare the layer for bonding.

Figure 72:
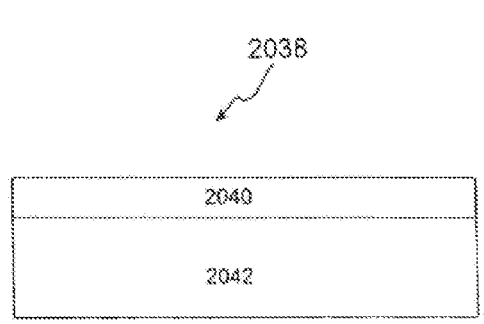
FIG. 72 is a partial cross-sectional view of a multi-layer stack.

FIG. 72 shows a multilayer stack 2038 including a submount 2042 with a deposited bonding layer 2040. Multilayer stack 2038 can include layers similar to the layers in multilayer stack 600 shown in FIG. 48 and can be formed using similar processes to those described above. In some embodiments, the submount can include solder (e.g., AgSn solder, Au—Sn solder, Pb—Sn solder, Pd—In solder, or Au—Ge solder).

Figures 73, 74:
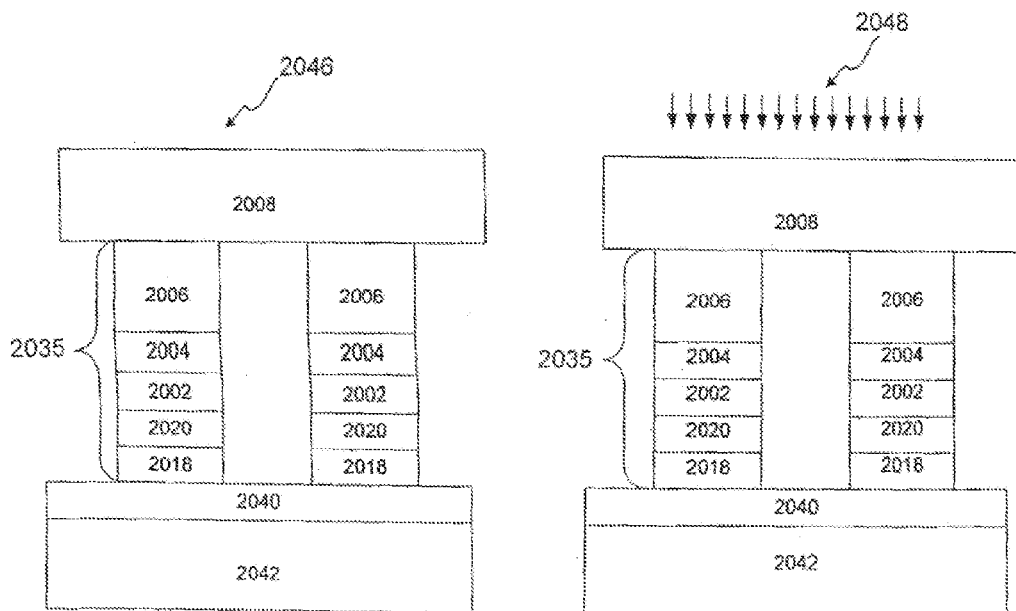
FIG. 73 is a partial cross-sectional view of a multi-layer stack.
FIG. 74 is a partial cross-sectional view of a multi-layer stack.

FIG. 73 shows a multilayer stack 2046 formed by bonding layer 2018 of multilayer stack 2036 to layer 2040 of multilayer stack 2038. Layers 2018 and 2036 can be bonded, for example, using a thermal mechanical pressing process. Various temperatures and pressures can be selected as described above with respect to the process shown in FIG. 49. The increased flexibility of the wafer due to the mesas 2035 allows a greater degree of tolerance in the wafer bow and planarity of the wafers that are bonded. The spaces between mesas 2035 can allow gas trapped at the bonding interface to diffuse into the etched channels between mesas 2035, thus, potentially reducing void formation in the bonding layer due to trapped gas at the bonding interface. Without wishing to be bound by theory, it is believed that the void formation can reduce the thermal conductivity of the bonding layer and reduce the efficiency of the light-emitting device.

Figures 75, 76:
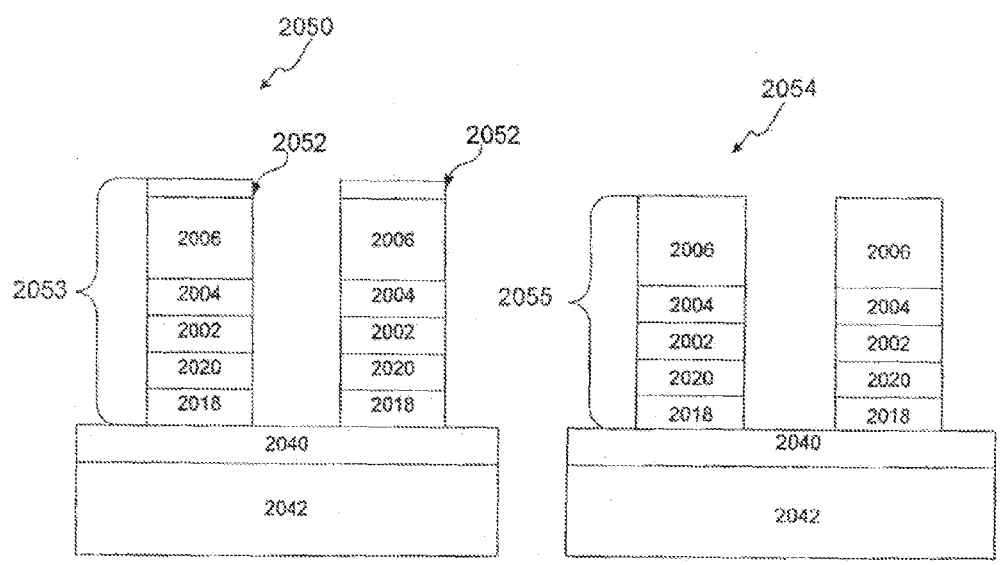
FIG. 75 is a partial cross-sectional view of a multi-layer stack.
FIG. 76 is a partial cross-sectional view of a multi-layer stack.

FIGS. 74 and 75 show the exposure of bonded multilayer stack 2046 to electromagnetic radiation (represented by arrows 2048) and the removal of substrate 2008. The exposure to electromagnetic radiation 2048 and the removal of substrate 2008 is similar to the process described above. Although not shown in FIGS. 65-64, in some embodiments a semiconductor layer (e.g., like that described above with respect to layer 504) can be disposed between substrate 2008 and layer 2006. In such embodiments, the exposure to electromagnetic radiation 2048 at least partially decomposes the semiconductor layer between substrate 2008 and layer 2006 such that substrate 2008 can be removed. In certain embodiments, a semiconductor layer is not present between layer 2006 and substrate 2008 and a portion of layer 2006 is decomposed by the radiation 2048.

The decomposition of semiconductor material during exposure to the electromagnetic radiation can produce strain in the multilayer stack. In addition, gas (e.g., nitrogen) can be formed as a product of the decomposition. This gas, especially if trapped in the decomposed layer, can produce strain and, if the strain is great enough, cracking or other undesirable results can occur. The presence of regions between mesas 2035 allows gas to diffuse from mesas 2035 and accumulate in the etched channels or spaces between mesas 2035 (also referred to as gas accumulation regions). The diffusion and escape of gas that would have otherwise been trapped can reduce the stress in multilayer stack during decomposition of the semiconductor layer. In some embodiments, the channels between mesas 2035 form a network of channels across the wafer, allowing gas to escape from the channels via openings that extend to the edge of the wafer.

Figures 77, 78:
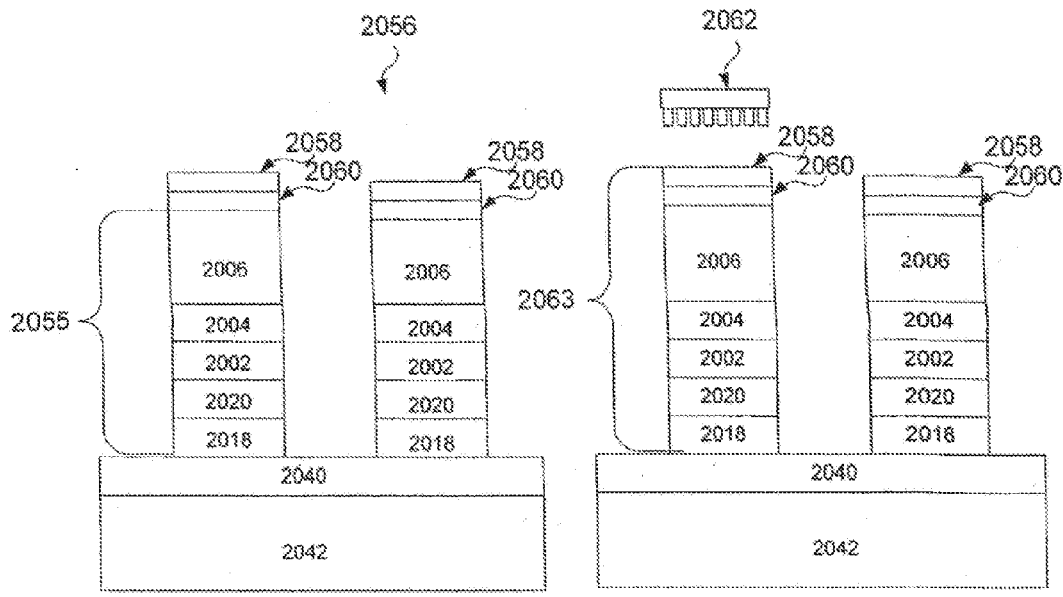
FIG. 77 is a partial cross-sectional view of a multi-layer stack.
FIG. 78 is a partial cross-sectional view of a multi-layer stack.

After the decomposition of the semiconductor layer, substrate 2008 is removed forming a multilayer stack 2050 that includes submount 2042 supporting the transferred mesas 2053 (FIG. 75). After transfer of mesas 2053 to submount 2040 from substrate 2008, the n-doped region included in layer 2006 is located near the top of mesa 2053. After the removal of substrate 2008 or a portion of substrate 2008, residue 2052 may remain on mesas 2053 (see discussion above regarding FIGS. 51 and 52). As shown in FIG. 76, one or more steps can be used to remove layer 2052 and to clean the surface of layer 2006, resulting in mesas 2055. Methods of removing residue 2052 are described with respect to FIGS. 61 and 32. Subsequently, an upper surface of layer 2006 of mesas 2055 can be patterned to form LEDs from at least about 10 percent (e.g., at least about 20 percent, at least about 30 percent, at least about 40 percent, at least about 50 percent, at least about 60 percent, at least about 70 percent, at least about 80 percent, at least about 90 percent) of the total number of mesas 2055. Alternatively, all mesas 2055 on the wafer can be patterned. In some embodiments, the LED formation process is similar to the process described above and can include variations in processing as described above. In general, at least one hardmask layer 2060 (e.g., low temperature oxide (LTO), SiO2, oxides, SiNx, Ni, chrome) is deposited or grown on mesas 2055. A resist layer 2058 is deposited onto the at least one hardmask layer 2060 to form a multilayer stack 2056 as shown in FIG. 77. A pattern is imprinted into resist layer 2058 using an imprint process as described above. The imprint process may be a mesa-by-mesa process (e.g., the pattern is imprinted into one mesa and then the mold 2062 is moved to a different mesa and the pattern is imprinted into the different mesa). If a mesa-by-mesa process is used, mold 2062 may be registered or aligned to mesas 2063 to determine an orientation and height of mesa 2063 prior to imprint. Alternately, other lithographic techniques can be used to pattern the surface.

While embodiments have been described in which a rigid mold 2062 is used, alternatively a flexible mask or mold that conforms to the mesa features during patterning can be used. The conformal mask can include a layer such as a membrane or other material that is flexible. For example, a Ni layer with a thickness between about 0.5 mm and 100 mm can be used. During the patterning of layer 2058 using the flexible mold, the mold conforms to the surface of the mesas and transfers a pattern into the surface of layer 2058 of one or more mesas. For example, the flexible mold can be larger than the wafer and all mesas can be patterned in a single step. Due to the flexibility of the mold, the differences in mesa heights across the wafer can be accommodated without requiring the mask to be aligned to the individual mesas. In addition, the submount 2042 can be composed of a flexible material such as a metal (e.g., CuW) allowing both the submount 2042 including the mesas 2055 and the mold to flex and conform during imprint.

Figures 79, 80:
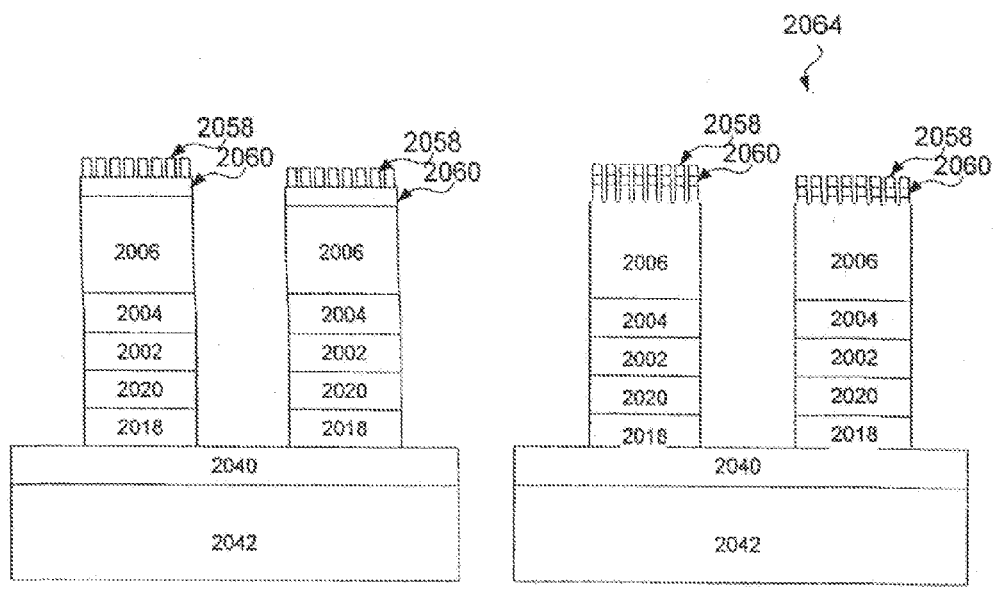
FIG. 79 is a partial cross-sectional view of a multi-layer stack.
FIG. 80 is a partial cross-sectional view of a multi-layer stack.

The pattern in resist layer 2058 (shown in FIG. 79) is transferred into the at least one hardmask layer 2060 and into a portion of layer 2006 using, for example, the methods described above (FIG. 80). Various patterns as described above can be used to pattern layer 2006.

Figures 81, 82:
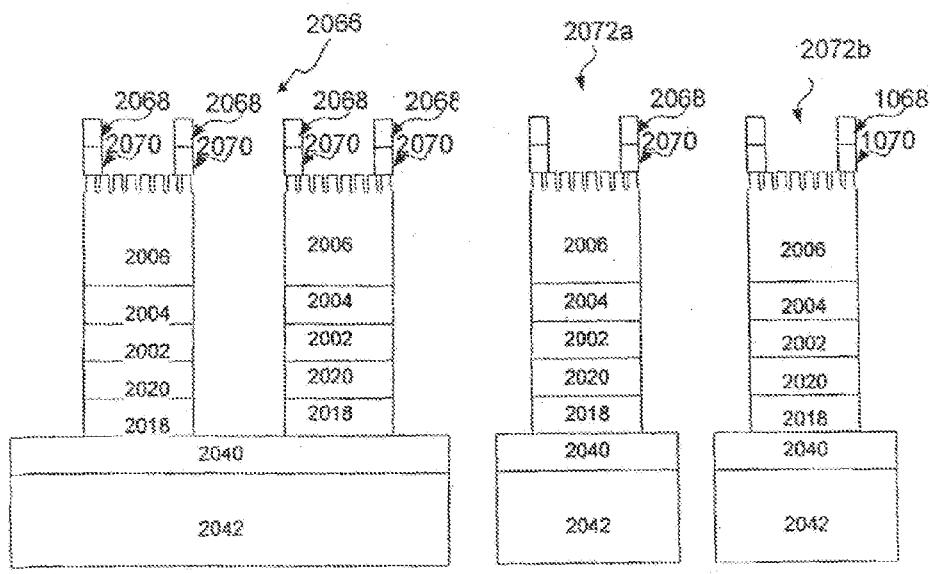
FIG. 81 is a partial cross-sectional view of a multi-layer stack.
FIG. 82 is a partial cross-sectional view of a multi-layer stack.

Remaining portions of layer 2058 and 2060 may be removed, and contact layers are subsequently deposited. FIG. 81 shows a multilayer stack 2066 including a patterned surface of layer 2006 and deposited contact layers 2068 and 2070. Contact layers 2068 and 2070 can be deposited as described above. Contact layer 2070 facilitates ohmic contact to layer 2006.

In some embodiments, contact layer 2070 conformally coats the pattern in layer 2006. Layer 2006 (e.g., a layer composed of Al, Ti, Ni, Indium-Tin-Oxide (ITO), Ag, Cu, Rh, Pt, or alloys of these) may also include one or more adhesion layers (e.g. Ti) and/or one or more diffusion barriers (e.g. Ni, Ti—N, Pt). Without wishing to be bound by theory, it is believed that contact layer 2068 (e.g. Au, Al, Ag) facilitates current spreading and reduces ohmic heating along the contact layers. Alternatively, the contact layers can be deposited prior to the patterning steps described above in relations to FIGS. 77-79. In embodiments in which the contact layers are deposited prior to patterning, the patterned regions of layer 2006 are separated from the contact regions. In some embodiments, the ohmic contact deposition and patterning steps are self-aligned.

FIG. 82 shows individual devices 2072*a* and 2072*b* that have been separated from other devices supported by submount 2042 by a scribing and cleaving process, a die saw process, a laser scribing process, or another separation technique. Individual devices 2072*a* and 2072*b* can be packaged. The packaging of the individual devices 2072*a* and 2072*b* includes forming wire bonds (e.g. Au, Al) that extend from metal contact regions on the package (e.g. Au, Al, Ag) to metal pads or tracks (e.g. Au, Al, Ag) to form an electrical contact (e.g. ball bond, wedge bond) to the LED. The packaging of the individual devices 2072*a* and 2072*b* also includes soldering (e.g., a die-attach process) the device in place inside the package. The solder used in the die-attach process may be, for example, AuSn, PbSn, Au—Ge, AgSn, of other solder materials. The package can also include an anti-reflection coated window 2068 to allow light emitted from the LED to escape the package more efficiently.

Figures 83, 84:
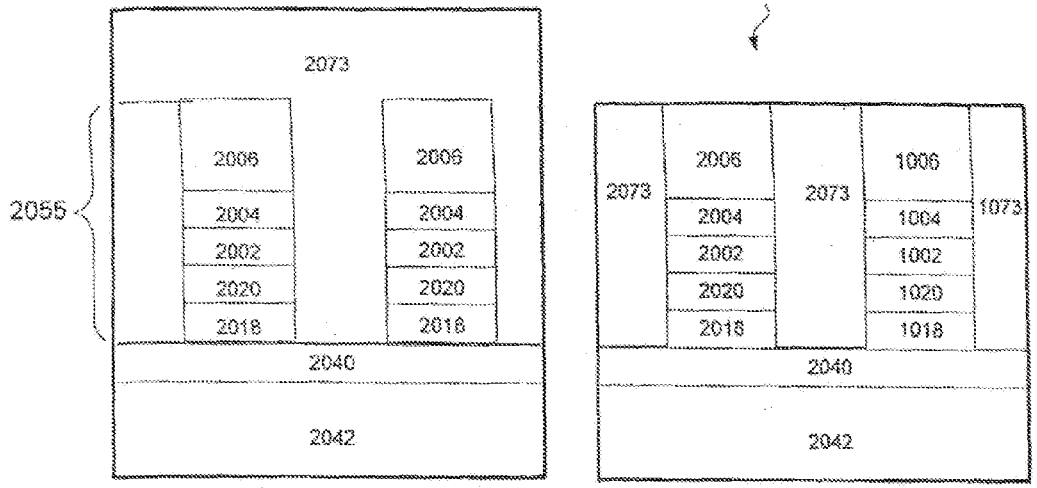
FIG. 83 is a partial cross-sectional view of a multi-layer stack.
FIG. 84 is a partial cross-sectional view of a multi-layer stack.
Figure 89:
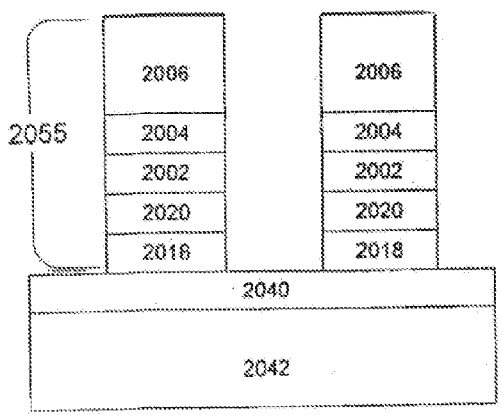
FIG. 89 is a partial cross-sectional view of a multi-layer stack.

While the process described above in FIGS. 65-82 includes exposing and patterning a surface of mesa 2063 to form an LED on a mesa-by-mesa basis, other embodiments can include concurrently patterning the surface of multiple mesas. For example, as shown in FIG. 83 a planarization layer 2073 (e.g., a resist layer, a polyimide layer, a polymer layer, or an oxide layer) can be deposited onto submount 2042 supporting mesas 2055. Planarization layer 2073 is planarized to be approximately even with mesas 2055 (e.g., even or level with a top surface of layer 2006) as shown in FIG. 84. The technique used to planarize planarization layer 2073 generally varies dependent on the material selected for layer 2073. For example, if planarization layer 2073 includes resist, the resist can be mechanically or thermal-mechanically pressed to form a planar surface. In another example, if planarization layer 2073 includes oxide, the oxide can be polished (e.g., by a CMP process) to planarize the surface and expose an upper surface of layer 2006.

Figures 85, 86, 87, 88:
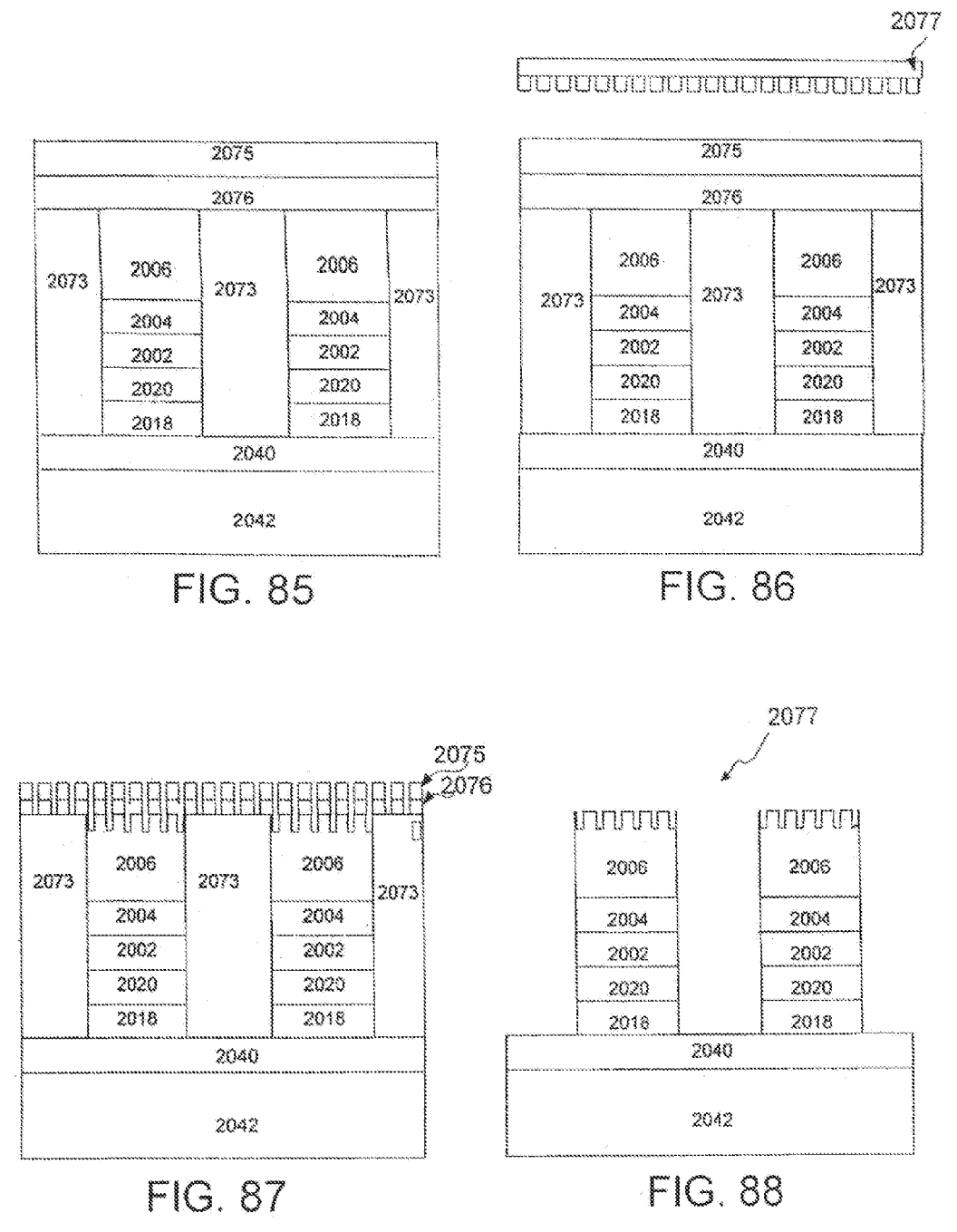

Subsequent to the formation of a substantially planar surface, a hardmask layer 2076 and a resist layer 2075 are deposited onto multilayer stack 2074. Resist layer 2075 is patterned as shown in FIGS. 86 and 87 using one of the techniques discussed above. This process transfers a pattern into a substantial portion of the wafer. For example, if a mask 2077 is larger than the wafer, the entire wafer is patterned in a single process. If mask 2077 does not cover the entire wafer, mask 2077 may be stepped across the wafer in order to transfer the pattern into resist layer 2075. The pattern exposed in resist layer 2075 is subsequently transferred to at least one hardmask layer 2076 and layer 2006 using an etching process as described above. Subsequent to the patterning of layer 2006, hardmask layer 2076 and planarization layer 2073 are removed to form multilayer stack 2077 shown in FIG. 88. For example, planarization layer 2073 can be removed using an oxygen plasma etch, a solvent rinse, or a chemical etch.

Figure 90:
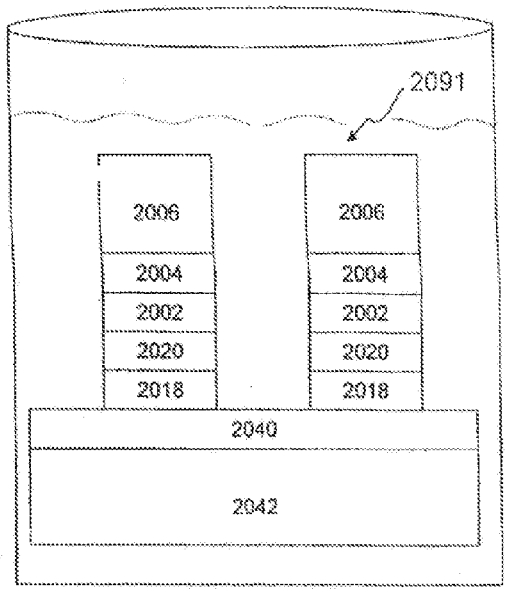
FIG. 90 is a partial cross-sectional view of a multi-layer stack.
Figure 91:
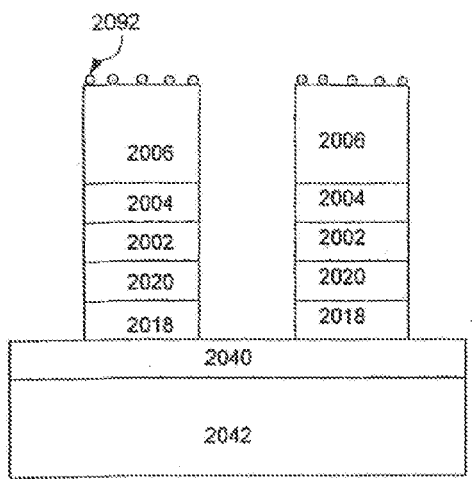
FIG. 91 is a partial cross-sectional view of a multi-layer stack.
Figure 92:
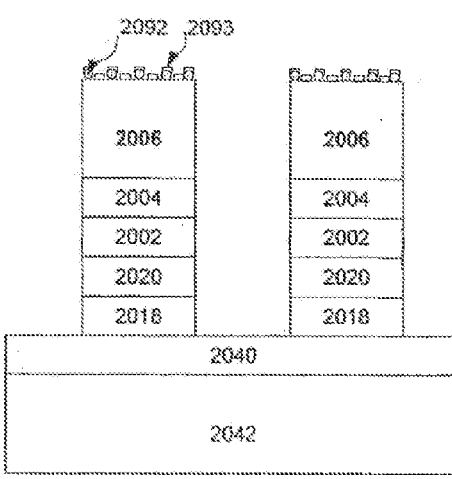
FIG. 92 is a partial cross-sectional view of a multi-layer stack.
Figure 94:
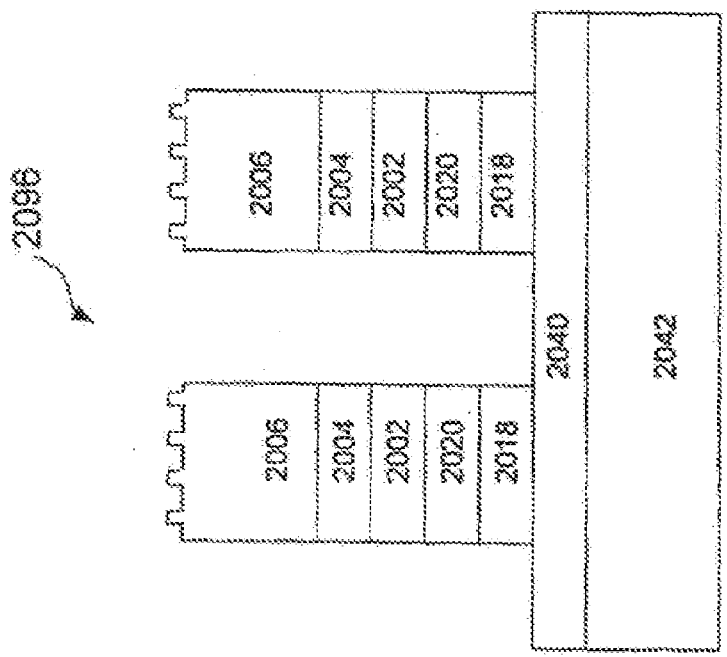
FIG. 94 is a partial cross-sectional view of a multi-layer stack.
Figure 93:
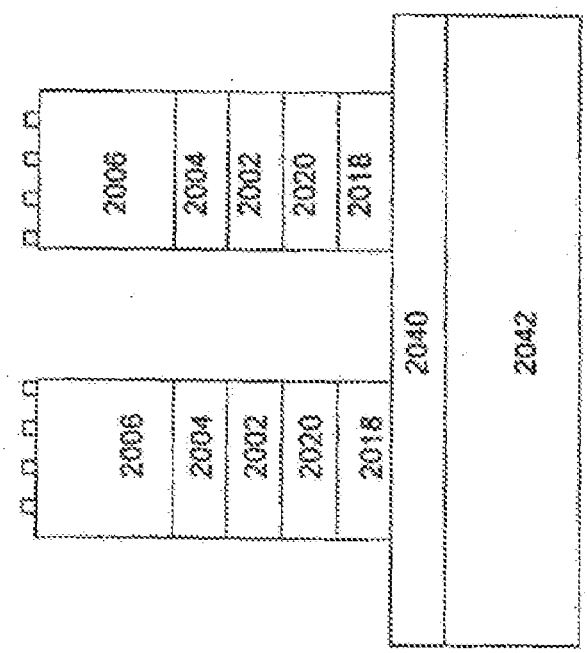
FIG. 93 is a partial cross-sectional view of a multi-layer stack.

While the processes described above in FIGS. 65-88 include exposing and patterning a surface of mesa 2063 to form an LED on a mesa-by-mesa basis using lithographic techniques, other embodiments can include patterning the surface of the mesas using other techniques. For example, as shown in FIGS. 89-94, a self-assembled monolayer of particles can be used to pattern the surface of mesa 2055. Multilayer stack 2056 (FIG. 89) is submersed in a solution 2091 including spherical shells of micron-sized colloidal particles or beads 2092 (FIG. 90). Examples of micron-sized colloidal particles include polymer beads (e.g., polystyrene beads) and dielectric beads (e.g., oxide or sapphire beads). Alternatively, the liquid can be dispensed onto the surface of multilayer stack in a spin coating process. The particles self-assemble on the surface of the droplets in order to minimize the total interfacial energy (FIG. 91). As the solution evaporates from the surface of the mesas 2055, a monolayer of beads 2092 remains on the surface of the mesa. The ordering of the self-assembled arrays of beads can differ based on multiple factors including, for example, temperature, percentage of beads 2092 in solution 2091, humidity, drying rate, and topology of the substrate or surface. Multiple size beads can also be used to give various superlattice patterns. In addition, based on the drying techniques, the self-assembly can produce ordered grains with disordered grain boundaries. In some embodiments, non-equilibrium drying conditions can cause the nano-particles to self assemble into complex periodic patterns, non-periodic patterns, quasi-crystalline patterns, or periodic patterns with slight disorder. Without wishing to be bound by theory, it is believed that such patterns can facilitate efficient light extraction. Subsequent to forming a self-assembled array of beads 2092 on the surface of mesa 2055, a thin layer of material 2093 (e.g., a metal layer such as Ni, Ti, W, or chrome) is deposited on the surface of the mesa 2055 (FIG. 92) or on another hardmask layer such as an SiO2 layer. Beads 2092 and the portions of layer 2093 supported by beads 2092 are removed, for example, using an etching process or a liftoff process. The removal of portions of layer 2093 supported by beads 2092 generates a negative image of the bead arrangement in the remaining portions of layer 2093 (FIG. 93). Layer 2093 can subsequently be used as a mask layer to etch layer 2006. Subsequent to transferring the pattern into layer 2006, layer 2093 can be removed to form multilayer stack 2096 as shown in FIG. 94. While spherical beads have been described above, more generally spherical beads can refer to any type of nano-particles used in a similar self assemble process. In general, nano-particles can be described as particles having a length of at least about 0.01 mm (e.g, at least about 0.1 mm, at least about 0.5 mm, at least about 1 mm, at least about 2 mm, at least about 5 mm, at least about 10 mm) in one dimension. While the particles described above are spherical in shape, other shapes of particles can be used.

Figure 95:
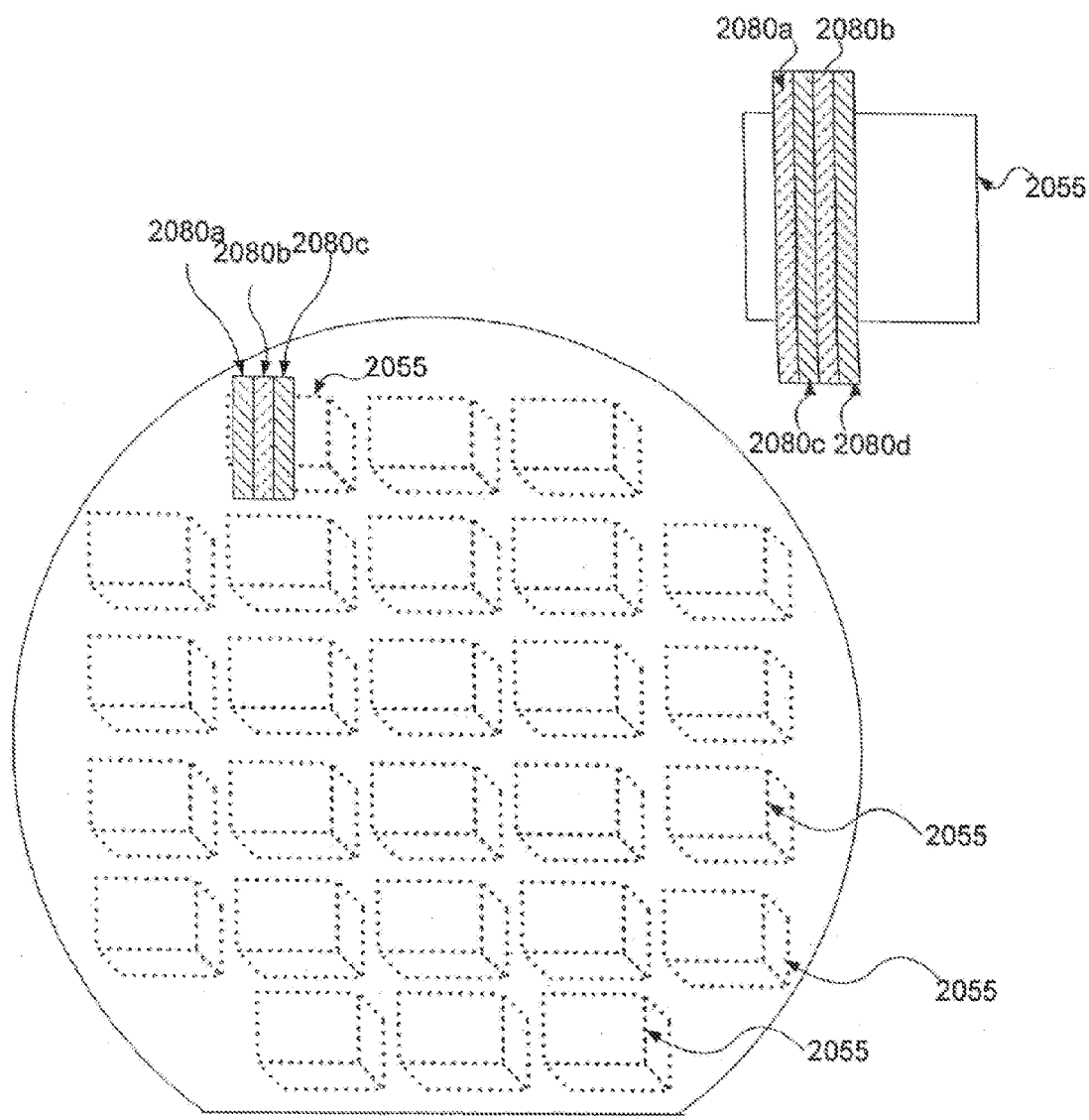
FIG. 95 is a perspective view of a wafer.
Figure 96:
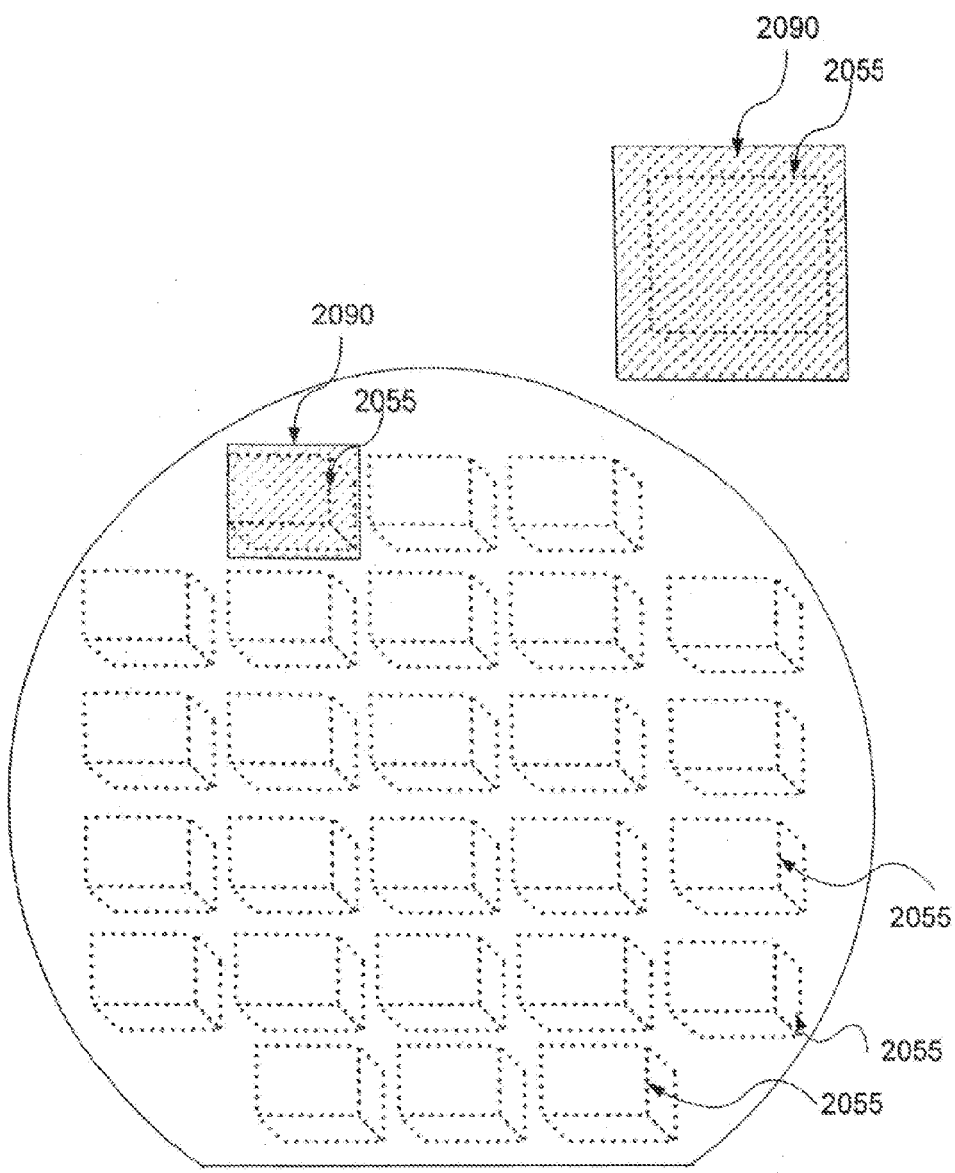
FIG. 96 is a perspective view of a wafer.

As described above, substrate 2008 can be removed from mesas 2032 by decomposing a layer in multilayer stack 2046 by exposing the layer to electromagnetic radiation. In some embodiments, the shape of the electromagnetic radiation beam is selected based on the shape of the mesas 2055. For example, as shown in FIG. 95, a beam of electromagnetic radiation 2090 can be selected to overlap at least one edge of a mesa (e.g., at least two edges of a mesa, at least one edge of a mesa and another edge of another mesa, etc). In this example, an elongated beam is stepped to sequentially expose portions of a mesa (e.g., portions 2080a-d). In another example, as shown in FIG. 96, the beam is shaped to match or approximately match the cross-sectional shape of a mesa. In this example, the beam covers a substantial portion of the mesa 2055 or overlaps the mesa and the mesas are exposed on a mesa by mesa basis.

In some embodiments, the height of mesas 2055 may vary across the surface of the wafer. For example, the height can differ due to non-uniform deposition thickness of initial multilayer stack 2000 or other deposited layers (e.g., layers 2018 and 2020). The height of mesas 2055 can also differ due to non-uniform planarization. In addition, the height and orientation of mesas 2055 can vary across the wafer due to a bow in the wafer. In some embodiments, the heights of mesas 2055 are mapped before patterning the surface of mesa 2055 to form an LED. The lithography is compensated to account for the difference in height and orientation of mesas 2055 across the wafer. For example, a system can map the total thickness variation across the wafer, warp, focal plane deviation, or the local thickness variation and adjust the lithography based on the measurements.

In some embodiments, an amount of bow present in the initial multi-layer stack 2000 can make it difficult to bond multi-layer stack 2000 to a submount. In this example, it can be advantageous to reduce the bow in the wafer to an acceptable amount before bonding the multilayer stack to a submount 2042. When the multilayer stack is etched to form mesas on the wafer, stress within the deposited layers (e.g., layers 2002, 2004 and 2006) is reduced and the flexibility of wafer 2000 increases. As the flexibility of the wafer increases, the bow of the wafer may decrease. Thus, in order to reduce the bow to an acceptable level, a number of mesas can be selected and etched into the wafer or a depth of the etch (possibly extending into substrate 2008) can be selected such that the bow is substantially reduced. The selective etching of wafer 2000 to form the mesas and reduce wafer nonplanarity can be an iterative process. For example, a portion of wafer 2000 can be dedicated to bow reduction and not used for LED formation and multiple etch channels can be iteratively etched into the dedicated portion of wafer 2000 until the bow in wafer 2000 is adequately reduced. In other embodiments, the mesa isolation etch may be different (e.g., different depth) in portions of wafer 2000 to remove warp than in other regions to remove bow.

While in some embodiments described above, an LED formed from a single mesa is packaged. Multiple mesas can be grouped and separated as a group such that a plurality of LEDs formed from different adjacent mesas are included in a packaged device. This can provide the advantage of redundancy such that if some mesas do not form functional devices or fail during use, the packaged device will still be able to produce light. In addition, this technique can be used on a smaller grid (e.g 0.5 mm) than the final LED size to construct larger LEDs of various rectangular geometries (e.g. 16 by 9, 4 by 3, and 1 by 1). In addition, multiple LEDs capable of generating differing colors (e.g., red, green, blue) or wavelengths of light can be packaged into the same package.

While in some of the embodiments described above, multiple mesas initially supported by the substrate (e.g., substrate 2008) are transferred such that the mesas are supported by single submount (e.g., submount 2042), the mesas could alternately be transferred to multiple, different submounts or placed at desired locations on another substrate or device.

In some embodiments, the shape of the mesas can be selected to match or nearly match the shape of a microdisplay. For example, the aspect ratio of the mesa can be selected to be 16 by 9 or 4 by 3 to match a similarly proportioned microdisplay, e.g., a projection microdisplay.

In some embodiments, each mesa can be individually addressed in an electrical network in such a fashion that each LED represents a pixel in a display, e.g., a projection display.

While in the embodiments described above the deposited layers supported by the substrate are etched to form the mesas, in some embodiments a portion of the substrate could also be etched. This could further increase the flexibility of the wafer.

Figure 97A:
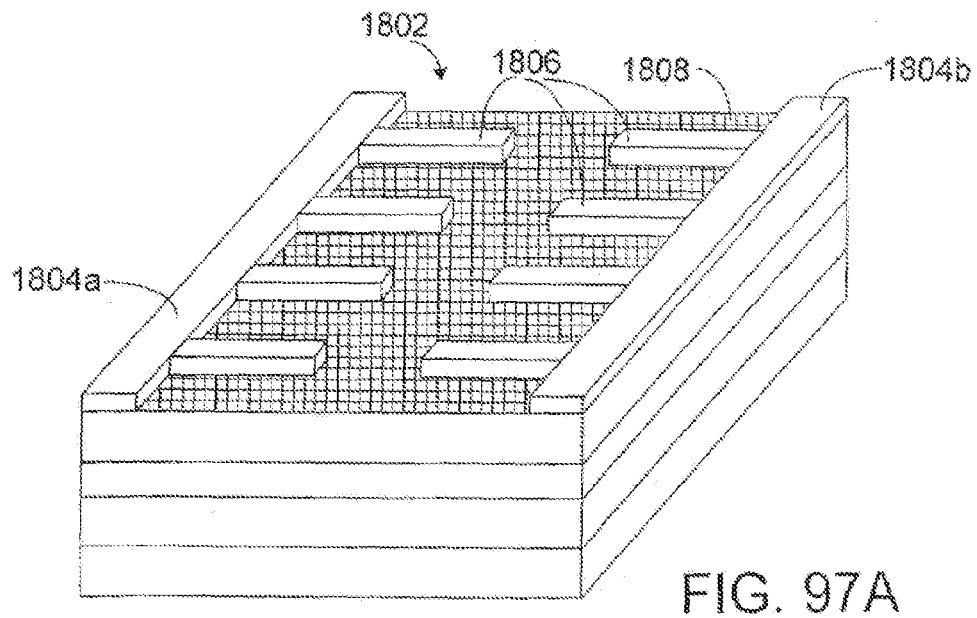
FIG. 97A is a perspective view of an LED.

In some embodiments, as shown in FIG. 97A, a contact layout for an LED 1802 includes two conductive pads 1804a and 1804b and conductive bars (or fingers) 1806 extending from conductive pads 1804a and 1804b toward a central area of LED 1802. Wire bonds (not shown) connected to conductive pads 1804a and 1804b provide current and voltage to LED 1802. Conductive bars 1806 spread the current from the conductive pads 1804a and 1804b to a top surface 1808 of LED 1802. Bars 1806 allow the current to be spread sufficiently across top surface 1808 while limiting the amount of surface 1808 covered by the contacts.

Figure 97B:
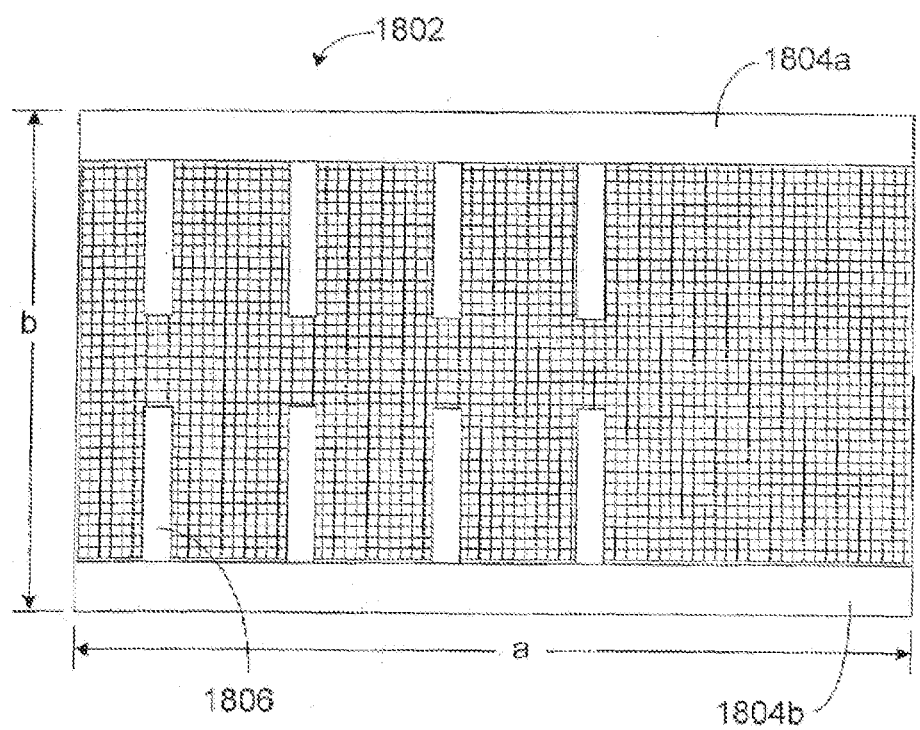
FIG. 97B is a top view of an LED.

FIG. 97B shows a top view of LED 1802 including conductive pads 1804a and 1804b and conductive bars 1806. In some embodiments, the width of conductive pads 1804a and 1804b can be larger than the width of conductive bars 1806. The larger width of pads 1804a and 1804b can allow pads 1804a and 1804b to function as power busses and spread a relatively large amount of power down the bus to bars 1806. The width of pads 1804a and 1804b and bars 1806 can be relative to the size of LED 1802 and/or can be based on other factors such as lithography and processing parameters.

For example, an LED may range in size from about 0.5 mm to about 1 cm on a side. As described above, the aspect ratio of LED 1802 can also vary. The width of conductive pads 1804a and 1804b can be, for example, about 50 um to about 500 um and the width of bars 1806 can be, for example, about 1 um to about 50 um. The height of conductive pads 1804a and 1804b and bars 1806 can vary based on, for example, current and power to be supplied to the LED or based on deposition and processing parameters. For example, conductive pads 1804a and 1804b and bars 1806 can be about 0.1 um to about 10 um in height.

In general, bars 1806 can vary as desired in both length and shape. As shown in FIG. 97B, bars 1806 can be rectangular and extend from conductive pads 1804a and 1804b toward a central region of LED 1802. Alternatively, bars 1806 could have a different shape such as square, triangular, or trapezoidal.

Figure 98A:
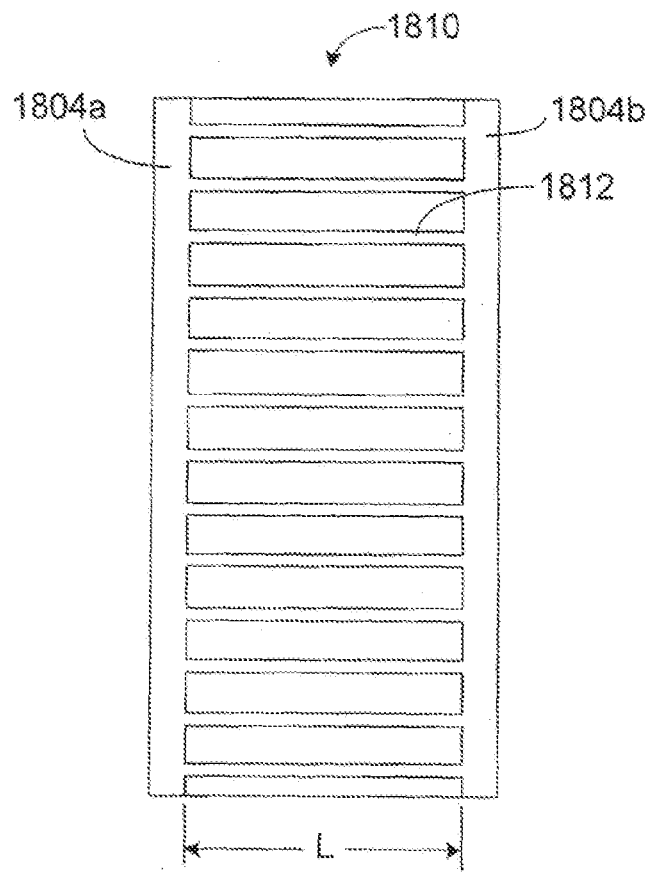
FIG. 98A is a top view of an LED.
Figure 98B:
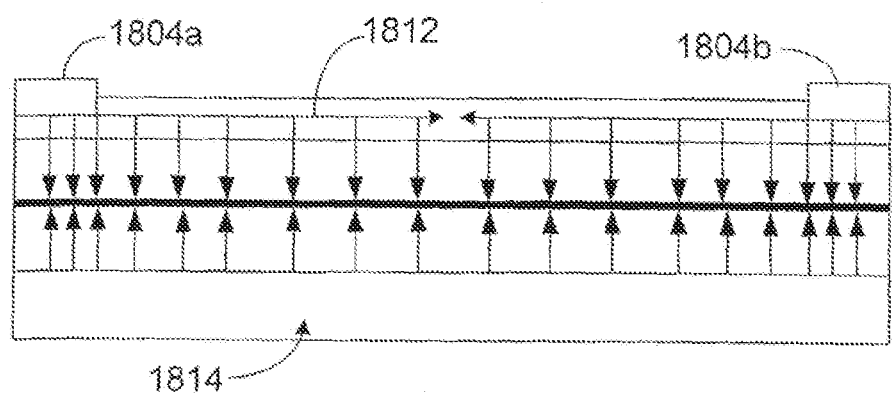
FIG. 98B is a partial cross-sectional view of an LED.
Figure 98C:
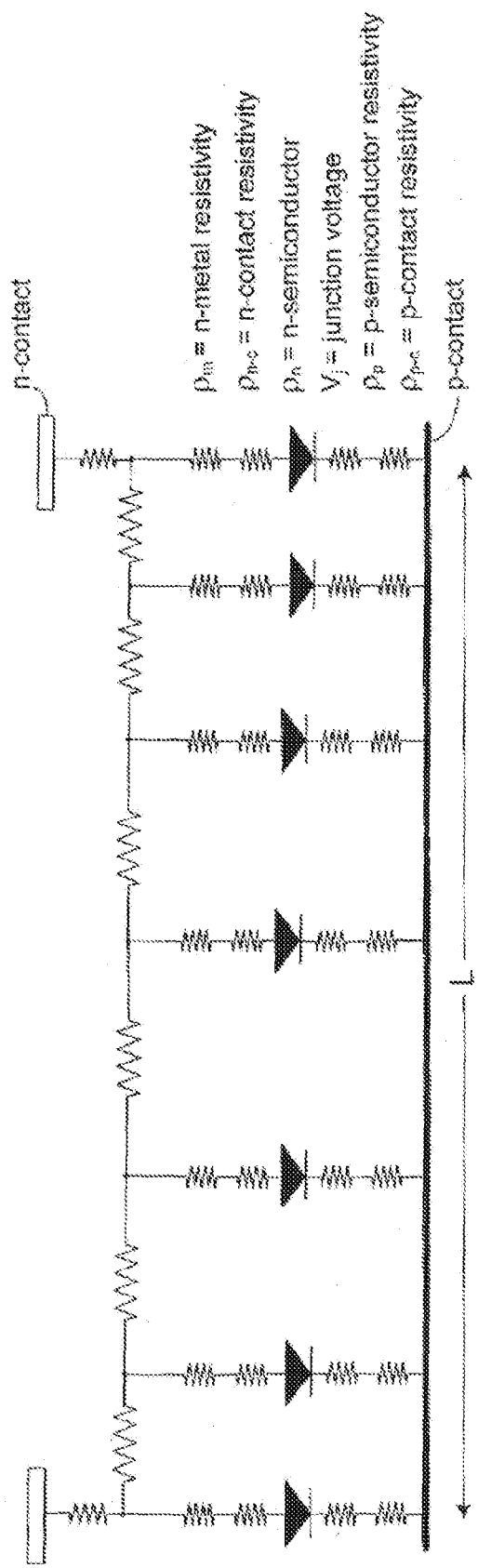
FIG. 98C is an equivalent circuit diagram.

FIGS. 98A to 98C show another example of a contact structure. In this example, multiple bars 1812 extend across the entire length of LED 1810, connecting conductive pad 1804a to conductive pad 1804b. Contact bars 1812 have an associated resistivity $r_m$, thickness $t_b$, and a length l. Current distribution properties for LED 1810 based on conductive pads 1804a and 1804b and contact bars 1812 can be estimated by simplifying the structure into an equivalent circuit model as shown in FIG. 98C.

The aspect ratio of LED 1810 can influence the current dissipation of the system. The aspect ratio 'L' of LED 1810 can be calculated according to the following equation as shown below:

$$L = \sqrt{Ab/a}$$

where A is the die's surface area (e.g., length multiplied by width) and a and b are the aspect ratios of the die. For example for an LED with a 16×9 aspect ratio, a=16 and b=9.

As described above, in order to allow light generated in the LED to be emitted through the surface, contact bars 1812 do not cover the entire surface of LED 1810. Since the contacts cover only a portion of the surface of LED 1810, the contact resistance is divided by the surface coverage ratio f, as shown in the following equation $$\rho_{n-c} \to \rho_{n-c}/f$$

The current density across the junction can be estimated according to the following equation as shown below:

$$J = J_0(e^{eV_j/KT} - 1),$$

where $J_0$ is the junction saturation current and T the absolute temperature. The above estimates neglect the contribution of the n-type material in lateral current spreading. However, in general the current spreading is predominantly occurring in the metal contact because the conductivity of the contact is much greater than the conductivity of the n-type material. For example, the ratio of the contact conductivity to the n-type material conductivity can be in the range of from about 100 to about 500.

In a similar system (but with infinite separation between the pads), if the calculation is performed in a forward bias (e.g., $V_j \gg kT/e$) and if the voltage drop across the series resistance is much larger than $kT/e$ (e.g., $(\rho_{p-c} + \rho_{n-c}/f + \rho_p t_p + \rho_n t_n) J_0 e^{eV_j/kT} \gg kT/e$), then a linear approximation of the current density distribution at the junction can be estimated according to the following equation $$J(x) = J_1(e^{-x/L_s} + e^{-(L-x)/L_s})$$

where $J_1$ is the current density beneath a pad, x is the distance from a pad, and $L_s$ is the current spreading length as shown in the following equation $$L_s = \sqrt{(\rho_{p-c} + \rho_{n-c}/f + \rho_p t_p + \rho_n t_n) t_m / \rho_m}$$

This estimation assumes an infinite separation between the pads. However, for a linear approximation with non-infinite separation, the solutions for individual pads can be added together. The procedure described above introduces an error close to the die center, but is not believed to significantly alter the physical trends.

The minimum current density can appear at the center of the device x=L/2 and can be estimated according to the following the following equation $$J_{min} = 2J_1 e^{-L/2L_s}$$

where the uniformity factor is estimated as shown in equation $$U = \frac{J(L/2)}{J(0)} = \frac{2e^{-L/2L_s}}{1 + e^{-L/L_s}}.$$

For a die with the same surface area, switching from a square shape into a rectangular shape with aspect ratios a,b where the contact bars are along the small side, the minimum current density increases and the uniformity factor is modified as shown in the following equations $$J'_{min} = 2J_1 e^{-\frac{\sqrt{Ab/a}}{2L_s}}$$

$$U' = \frac{J(L'/2)}{J(0)} = \frac{2e^{-\sqrt{Ab/a}/2L_s}}{1 + e^{-\sqrt{Ab/a}/L_s}}$$

Thus, a uniformity increase factor can be estimated as shown in equation $$S = U'/U = \frac{1 + e^{-\sqrt{A}/L_s}}{1 + e^{-\sqrt{Ab/a}/L_s}} e^{\frac{\sqrt{A}}{2L_s}(1-\sqrt{b/a})}$$

For example, the uniformity increase factor 'S' has a minimum value S=1 for the square case (e.g., a—b). For a 16×9 rectangle, assuming the following values: $\rho_m$=2.2·10$^{-6}$ Ωcm (gold), $\rho_{p-c}$=1.0·10$^{-3}$ Ωcm$^2$, $\rho_p$=5.0 Ωcm, $\rho_{n-c}$=1.0·10$^{-4}$ Ωcm$^2$, $\rho_n$=5.0·10$^{-3}$ Ωcm, n-contact surface coverage 10%, and thicknesses for p-, n-, and metal 0.3 µm, 3.0 µm and 2 µm (at a 10% coverage). Then $L_s$ equals 1.4 mm. If the die has a surface area of A=25 mm$^2$. In the square case U=0.325, while in the 16×9 case U'=0.5, or a uniformity increase factor S=1.54, i.e. a 54% increase of current uniformity.

Figure 99A:
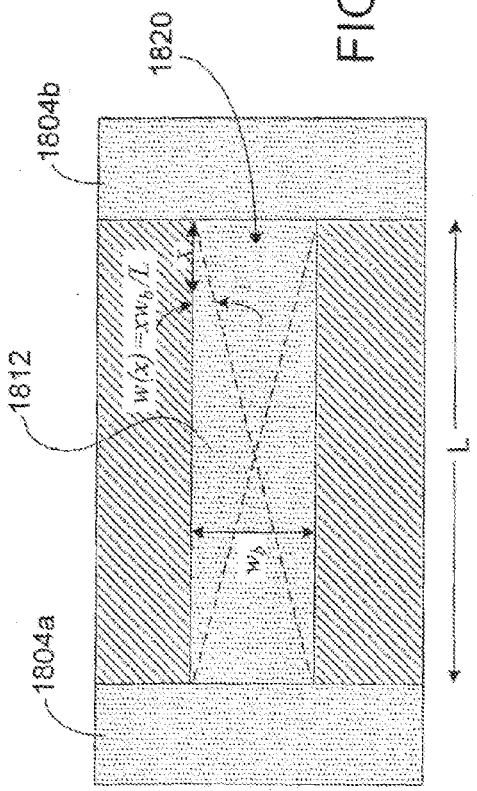
FIG. 99A is a top view of an LED.
Figure 99B:
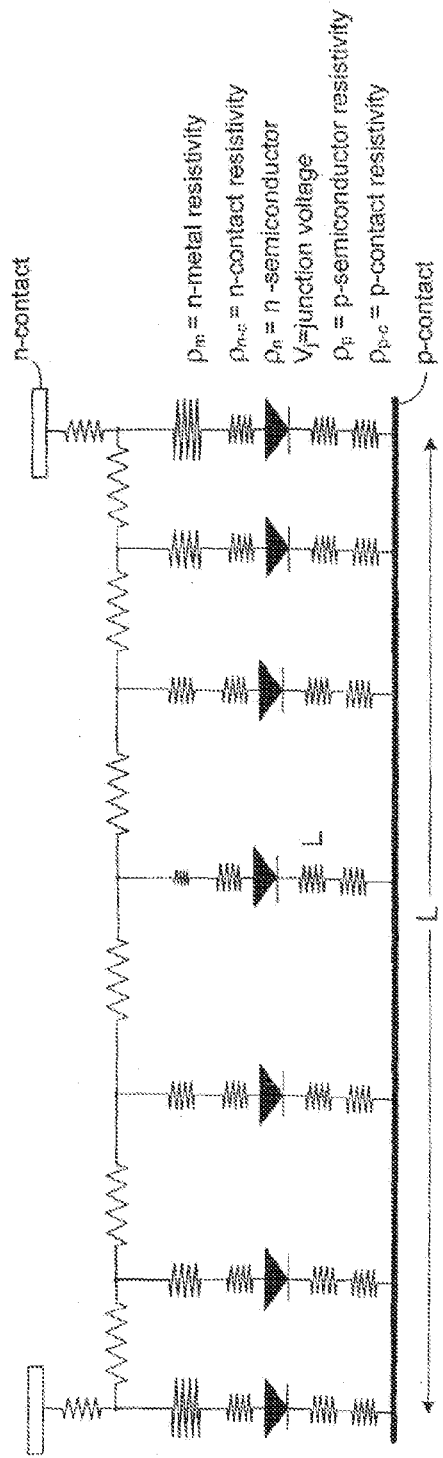
FIG. 99B is an equivalent circuit diagram.

Thus, without wishing to be bound by theory, it is believed that using a rectangular shape for an LED can provide benefits in the current spreading. The contact resistivity can alternatively or additionally be altered to enhance the current spreading by including an insulating layer 1820 (e.g., an oxide layer, FIG. 99A) underneath a portion of the contact. As shown in FIGS. 99A and 67B, insulating layer 1820 (indicated by dashed lines) is included under a portion of bar 1812. Insulating layer 1820 has a greater width at the top of the bar (e.g., close to pads 1804) and gets thinner towards the central area of the die. An equivalent circuit diagram is shown in FIG. 99B.

Contact resistivity is generally proportional to the contact area. For example, the contact resistivity increases as the contact area decreases as shown in the following equation $$\rho_{n-c}^{eff} = \frac{\rho_{n-c}}{f_{eff}} = \frac{\rho_{n-c}W}{2w} = \frac{\rho_{n-c}WL}{2xw_b} = \frac{\rho_{n-c}}{f}\frac{L}{2x}$$

where W is the repetition rate of the bars (e.g., the number of bars per unit area). Due to underlying insulating layer 1820, the area of the contact is smaller at the edge of the contact closest to pads 1804a and 1804b and increases as the distance from pads 1804a and 1804b increases. Due to the difference in contact area, the contact resistivity is higher close to pads 1804a and 1804b and decreases gradually towards the center of the LED. The difference in contact resistivity can force the current to travel further, reducing current crowding, increasing uniformity of light emission through the surface, and reducing performance degradation. The current spreading length can be estimated according to the following equation $$L_s(x) = \sqrt{(\rho_{p-c} + (\rho_{n-c}/f)(L/2x) + \rho_p t_p + \rho_n t_n)t_m/\rho_m}.$$

The junction current density along the die can be estimated by the following equation $$J(x) = J_1 e^{-\int_0^x dx/L_s(x)} + J_1 e^{-\int_x^L dx/L_s(L-x)} \text{ and}$$

the minimum current is at the center of the device (e.g., at x=L/2) can be estimated according to the following equation $$J_{min} = 2J_1 e^{-\int_0^{L/2} dx/L_s(x)}$$

The current uniformity factor for the structure shown in FIG. 99B can be estimated according to the following equation $$U = \frac{J(L/2)}{J(0)} = \frac{2e^{-\int_0^{L/2} dx/2L_s(x)}}{1 + e^{-\int_0^L dx/2L_s(x)}}.$$

As described above, oxide layer 1820 can force current towards the ends of the contacts (e.g., toward the central area of the die) increasing the current spreading. Oxide layer 1820 can also reduce the light generation underneath the light absorbing contacts allowing greater percentage of the generated light to emerge from the surface of the LED.

Figure 100A:
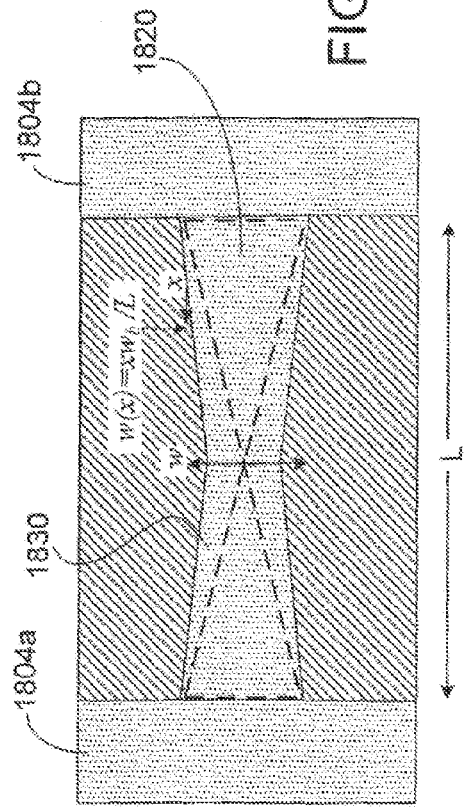
FIG. 100A is a top view of an LED.
Figure 100B:
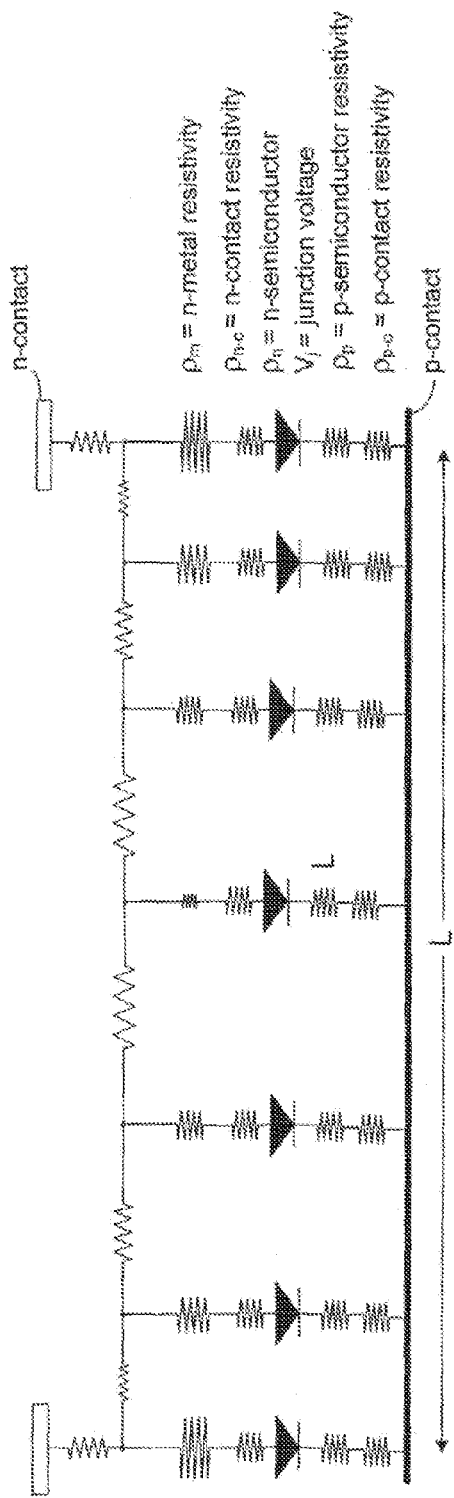
FIG. 100B is an equivalent circuit diagram.

FIGS. 1000A and 100B show a further configuration of pads 1804a and 1804b, contact 1830, and oxide layer 1820 (indicated by dashed lines and disposed under a portion of contact 1830). Here, contacts 1830 are also tapered. While shown in FIG. 1000A as being linearly tapered, other tapering could be used. The linear tapering maintains a similar total contact area to the contact area of contact 1812 shown in FIG. 99A, with the contact width at the die center being approximately half of the width of bars 1812 (FIG. 99A), while the contact width at the pads is 3 times larger than the width shown in FIG. 99A. The oxide can be tapered at higher angle so that the contact resistance is maximum at the pad and minimum at the die center. The contact resistance decreases towards the die center, and the bar resistance decreases closer to the pad. The tapering of both the contact and the insulating layer contribute to forcing the current towards the die center. The local spreading length can be estimated according to the following equation $$L_s(x) = \sqrt{(\rho_{p-c} + (\rho_{n-c}/f)(L/x) + \rho_p t_p + \rho_n t_n)t_m/(2\rho_m/(3-4x/L))}.$$

Similar integration formulas for the current distribution as described above can be used to estimate the current distribution for the structure shown in FIGS. 100A and 100B.

Figure 101A:
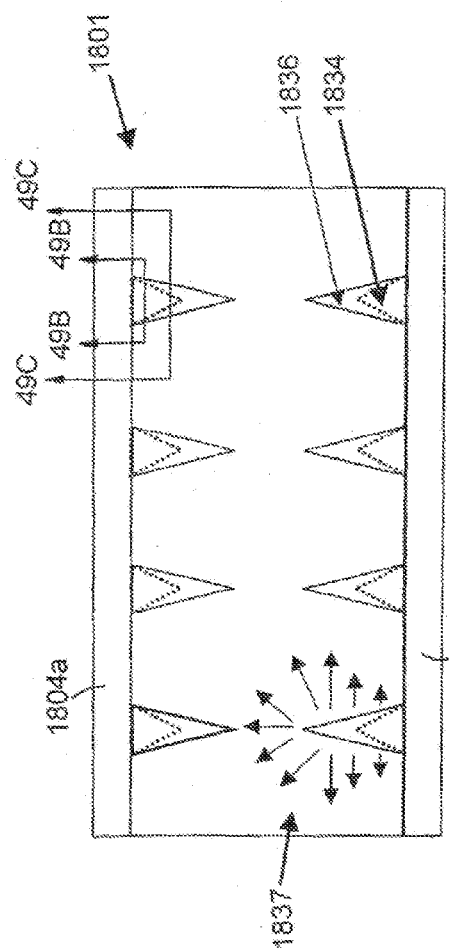
FIG. 101A is a top view of an LED.
Figure 101C:
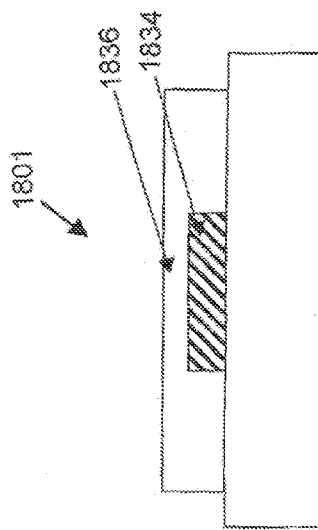
FIG. 101C is a partial cross-sectional view of an LED.
Figure 101B:
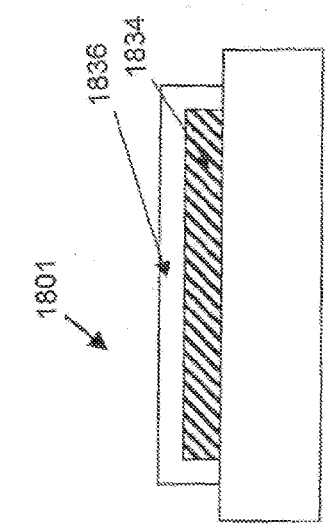
FIG. 101B is a partial cross-sectional view of an LED.

FIG. 101A shows a top view and FIGS. 101B and 101C show cross-sectional views of an additional contact structure 1801. Conductive contacts 1836 extend toward the center of the die, but do not continuously cover the upper surface of the LED between bars 1804a and 1804b. An insulating layer 1834 is located between the top of the LED and metal contact 1836 in an interior portion of the contact. Both the contact 1836 and the insulating layer 1834 are tapered. Arrows 1837 represent the current spreading from the metal contact 1836 into the surface of the die.

Figure 102:
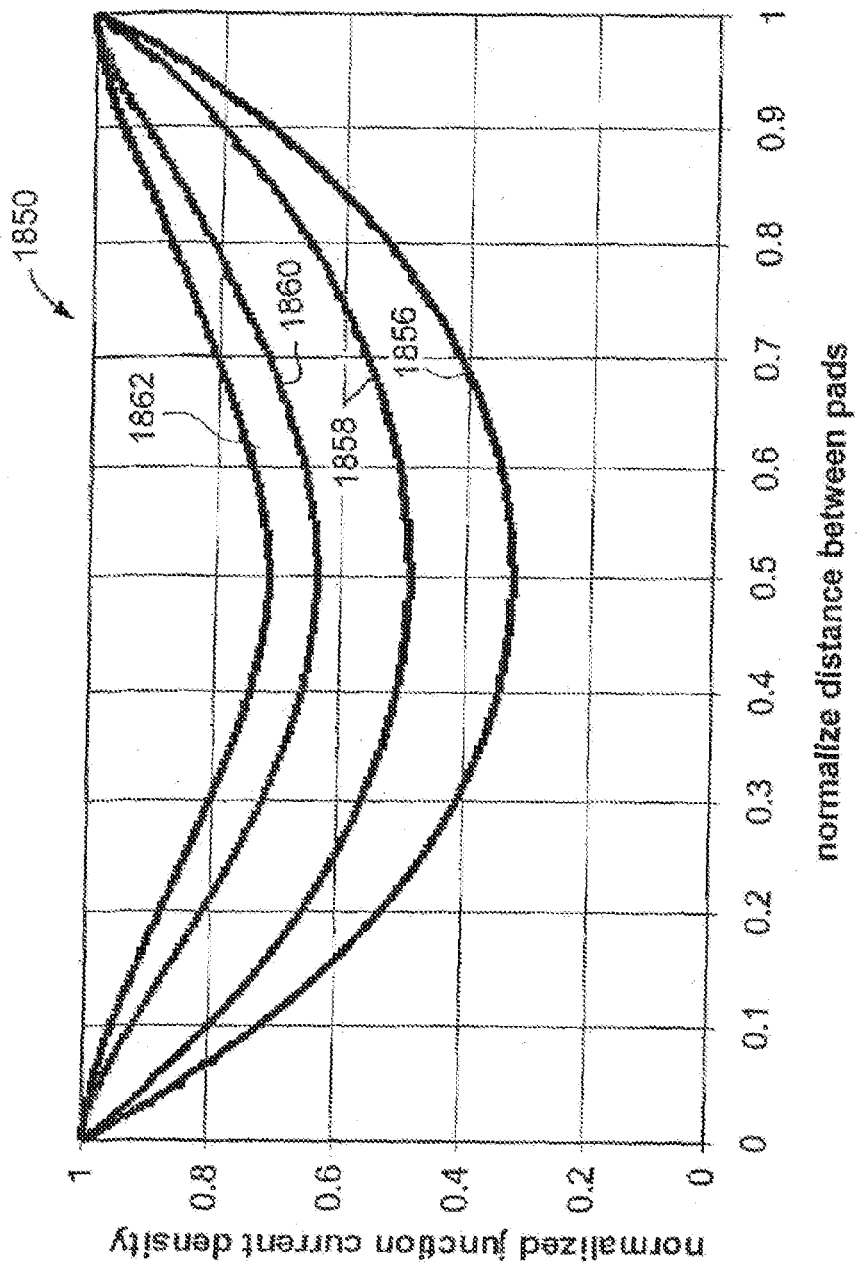
FIG. 102 is a graph of junction current density.

FIG. 102 shows a graph 1850 of estimated normalized junction current density as a function of the normalized distance between bars 1804a and 1804b for various contact and die configurations based on the forgoing equations. Line 1856 represents the current density for square die with rectangular bars and no oxide, line 1858 represents the current density for rectangular die with rectangular bars and no oxide, line 1860 represents the current density for a rectangular die with rectangular bars and tapered oxide, and line 1862 represents the current density for rectangular die with tapered bars and tapered oxide. Graph 1850 shows the improvement in the current density distribution for both a rectangular chip and an oxide layer under a portion of the contact.

Figure 103:
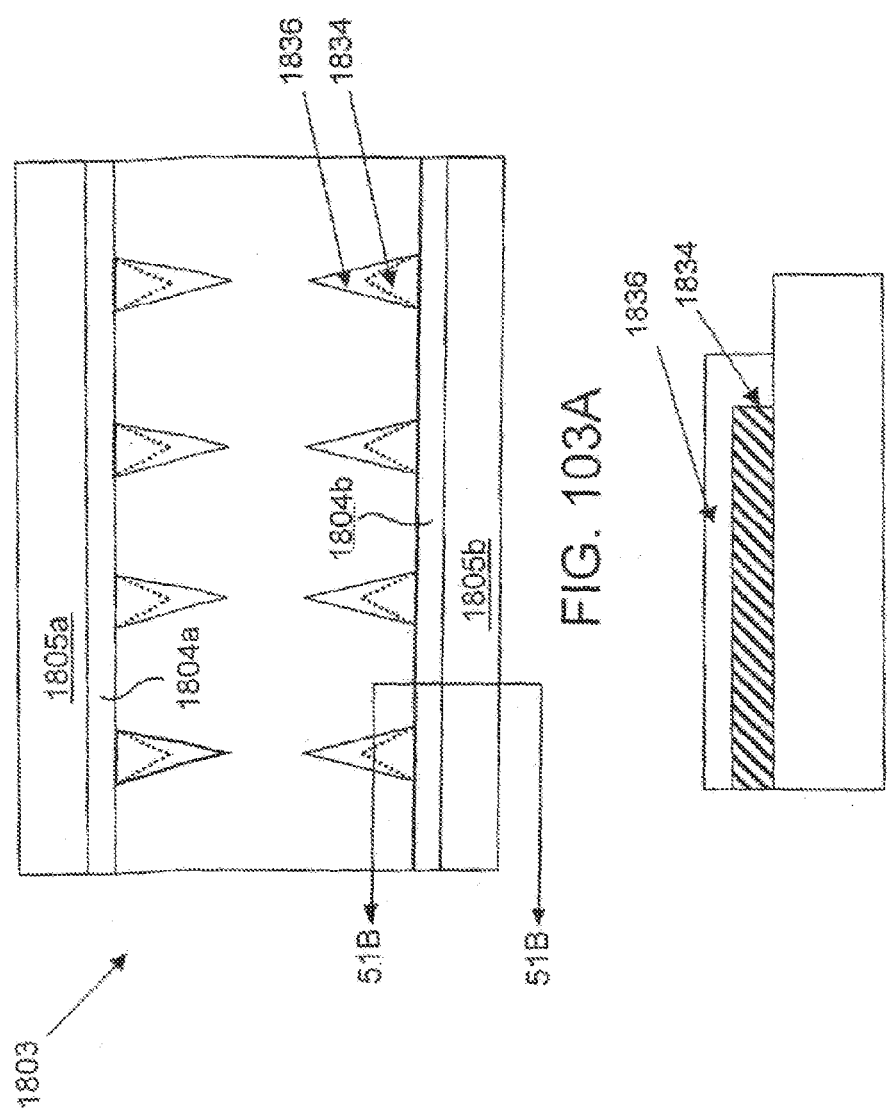
FIG. 103A is a top view of a multi-layer stack.
FIG. 103B is a partial cross-sectional view of an LED.

FIG. 103A shows a top view and FIG. 103B shows a cross-sectional view of an additional contact structure 1803. Insulating layers 1805a and 1805b are located between the top of the LED and metal pads 1804a and 1804b, respectively. Insulating layers 1805a and 1805b are located under a portion of metal pads 1804a and 1804b, respectively, toward the edge of the die such that a portion of metal pads 1804a and 1804b are supported by insulating layers 1805a and 1805b, respectively, and a portion of metal pads 1804a and 1804b are supported by the top surface of the light emitting diode. Oxide layers 1805a and 1805b reduce the light generation underneath the light absorbing metal pads 1804a and 1804b allowing greater percentage of the generated light to emerge from the surface of the LED.

While embodiments described above include a single set of contacts extending from metal pads 1804a and 1804b, multiple sets of contacts could be used. For example, a second set of contacts could extend from the set of contacts connected to metal pads 1804 and so forth. Further, while oxide layers have been described, most generally, the layers can be formed of any appropriate electronically insulating material (e.g., nitride).

Figure 104:
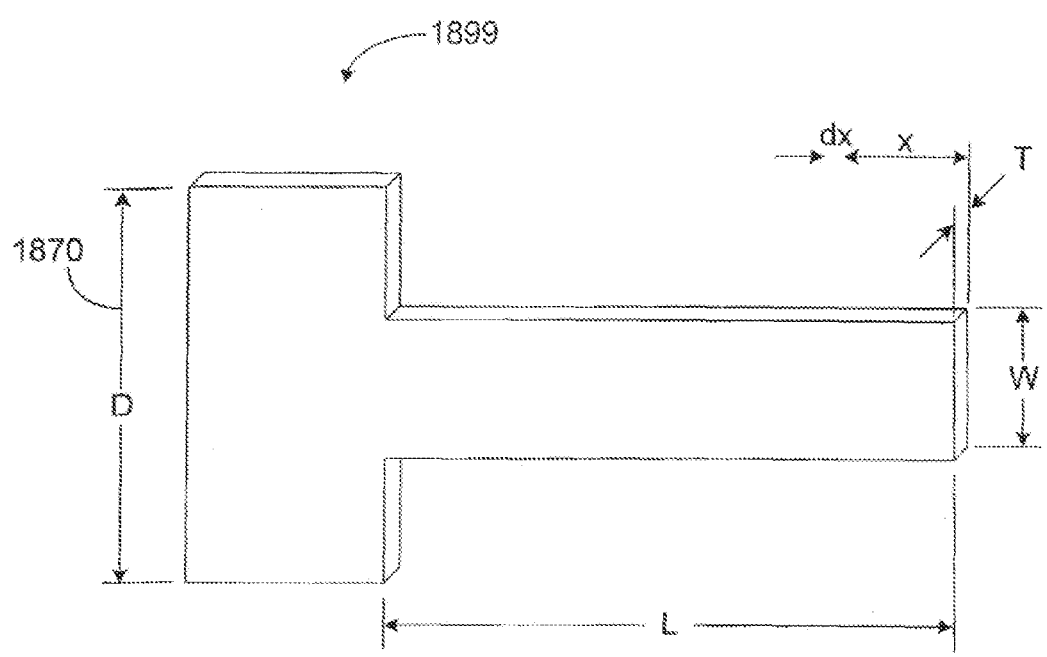
FIG. 104 is a view of a contact.

FIG. 104 shows the dimensions of an example of a contact 1899 and can be used to estimate electrical transport inside the n-contact. It is assumed contact 1899 distributes a uniform current density $J_0$ within contact period D 1870. The total current to be carried by the contact can be estimated as shown in the following equation $$I_{max} = J_0 DL.$$

This maximum current is flowing at the top of the contact (at the pad) corresponding to a current density that can be estimated as shown in the following equation $$J_{max} = \frac{J_0 D}{WT} L$$

At any distance x from the bar's end, the current density can be estimated as shown in the following equation $$J = \frac{J_0 D}{WT} x$$

The voltage drop per unit length can be estimated as shown in the following equation $$\frac{dV_c}{dx} = \frac{J_0 DRx}{WT}$$

and the heat generated per unit length can be estimated as shown in the following equation $$\frac{dQ_c}{dx} = \frac{2J_0^2 D^2 Rx^2}{WT}$$

Integrating the above equation the total voltage drop can be estimated as shown in the following equation $$V_c = \frac{J_0 DRL^2}{2WT}$$

and the total heat generated in the bar can be estimated as shown in the following equation $$Q_c = \frac{2J_0^3 D^2 RL^3}{3WT}$$

When the total heat generated becomes significant, uniform current assumption can break down, as can the device's performance (e.g., the device overheats). Therefore, it can be desirable to minimize the maximum current density (current density generally scales linearly with length), the voltage drop (voltage drop generally scales with the square length), and/or the heat generated (heat generated generally scales with the cube of the length). Based on the above relationships, a rectangular 9×16 die having more but shorter bars has a, b and c reduced by a factor of 3/4, 9/16, and 27/64 respectively. Since the number of bars is increased by a factor of 4/3, it is believed that the total heat generated can be reduced by a factor of 9/16.

Figure 105:
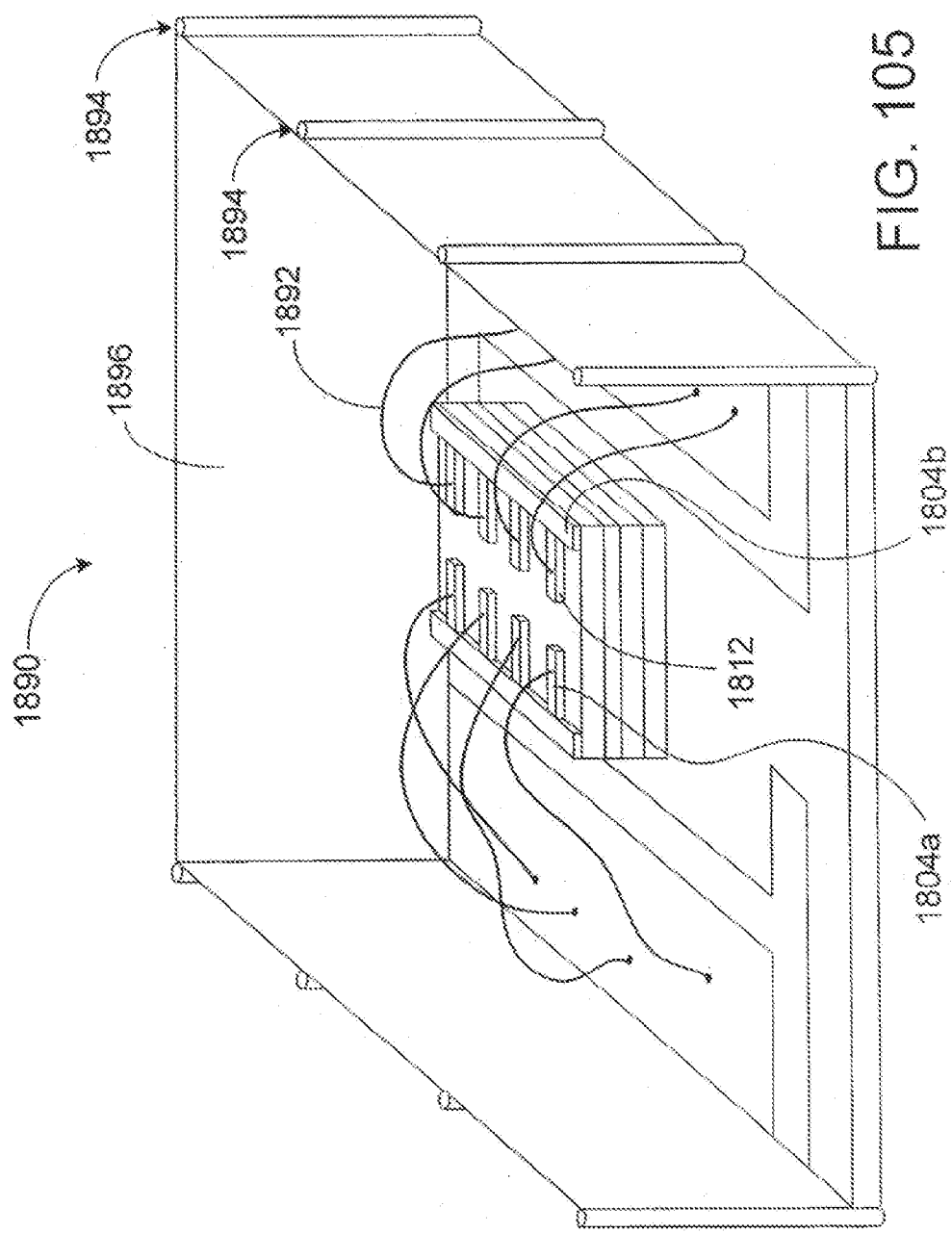
FIG. 105 is a diagram of a packaged LED.

FIG. 105 shows a packaged LED device 1890. In general, the package should be capable of facilitating light collection while also providing mechanical and environmental protection of the die and allowing heat generated in the die to be dissipated. As described above, LED 1890 includes conductive pads 1804a and 1804b that allow current to be spread to multiple contact fingers 1812 and dissipated to the LED surface. Multiple wire bonds 1892 provide an electrical current path between the LED and the package. Wire bonds 1892 can be made of various conductive materials such as gold, aluminum, silver, platinum, copper, and other metals or metal alloys. The package also includes multiple castellations 1894 to transport current from a bottom surface of the package to a top surface of the package to facilitate surface mounting on a circuit board. Castellations 1894 include a central region and a plating layer. The central region can be composed of a refractory metal, for example, tungsten and can be relatively thick (e.g., about 100 um to about 1 mm). The central region can be plated with an electrically conductive material such as gold. The plating can range in thickness from about 0.5 um to about 10 um and provides a current path that supports relatively high power levels. In addition, the package includes a transparent cover 1896 packaged on the LED die to protect the patterned surface 506 (FIG. 56) when an encapsulant is not used. The transparent cover 1896 is attached to the package, for example, using a glassy frit that is melted in a furnace. Alternatively, cover 1896 can be connected using a cap weld or an epoxy for example. The transparent cover 1896 can be further coated with one or more anti-reflection coatings to increase light transmission. Without wishing to be bound by theory, it is believed that the absence of an encapsulant layer allows higher tolerable power loads per unit area in the patterned surface LED 100. Degradation of the encapsulant can be a common failure mechanism for standard LEDs and is avoided not using an encapsulant layer. Packaged device 1890 can be mounted on a circuit board, on another device, or directly on a heat sink.

Figure 106:
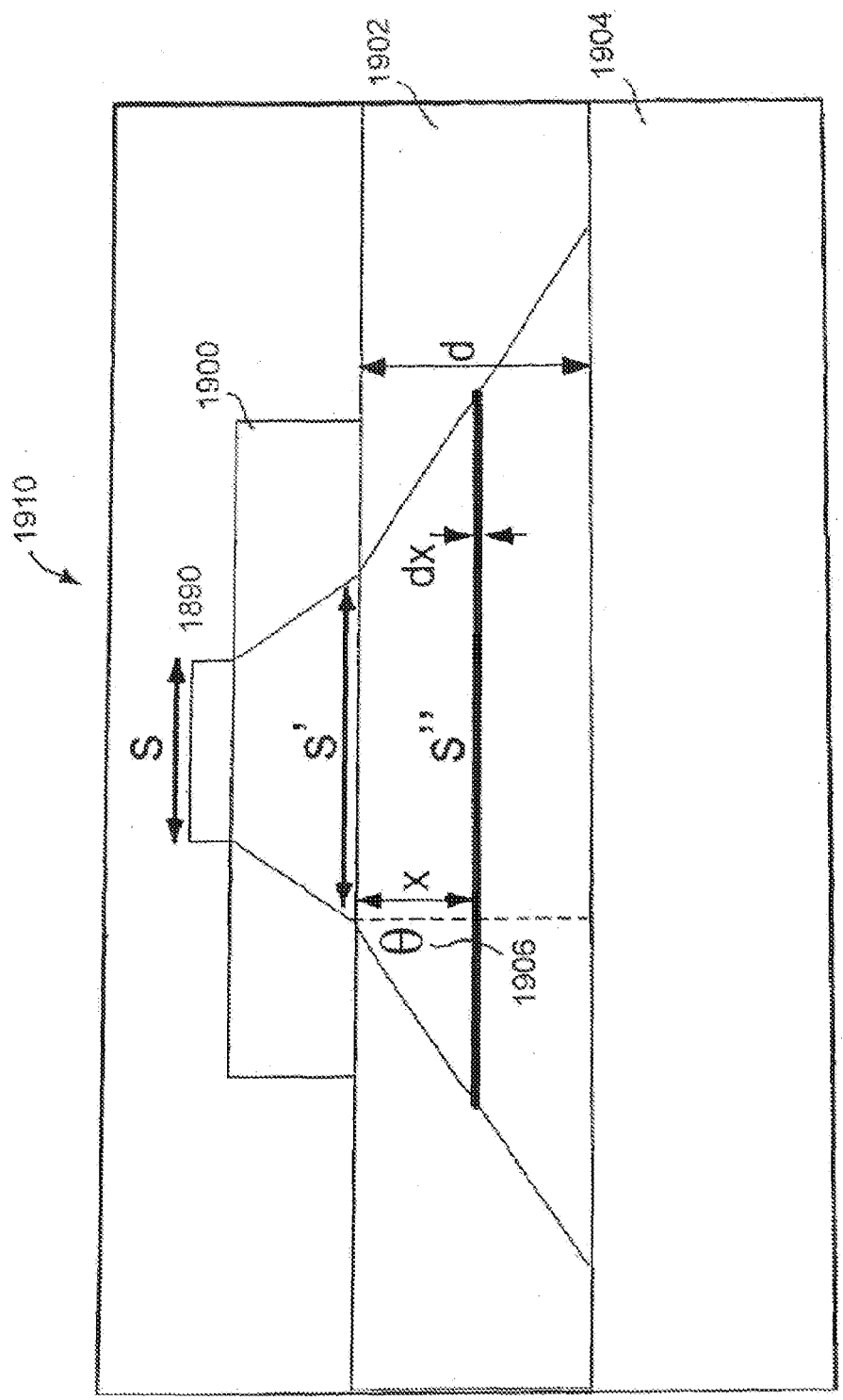
FIG. 106 is a diagram of a packaged LED and a heat sink.

FIG. 106 shows a model of the heat dissipation for a packaged device 1890 placed on a heat sink device. The packaged device 1890 is supported by a core board 1900 that includes insulating and electrically conductive regions (e.g., conductive regions using metals such as Al or Cu) attached to the heat sink. For example, packaged device 1890 can be attached to core board 1900 using solder (examples of solder include AuSn solder, PbSn solder, NiSn solder, InSn solder, InAgSn solder, and PbSnAg solder) or using an electrically conductive epoxy (e.g., silver filled epoxy). Core board 1900 is supported by a layer of heat sink metal 1902 and heat sink fins 1904. For example, core board 1900 can be attached to heat sink metal 1902 using solder (examples of solder include AuSn solder, PbSn solder, NiSn solder, InSn solder, InAgSn solder, and PbSnAg solder) or using epoxy (e.g., silver filled epoxy). In this model it is assumed that heat spreads from packaged device 1890 as the heat dissipates towards the heat sink. Spreading angle 1906 represents the angle at which heat dissipates out of packaged device 1890. Spreading angle 1906 generally varies depending on the material properties and the vertical layout of the system. Spreading angle 1906 can vary for different layers in the heat sink. The thermal resistance of a slice with thickness dx can be estimated according to the following equation $$dR_{th} = \frac{dx}{K_0} \frac{1}{S_x''^2} = \frac{dx}{K_0} \frac{1}{(S' + 2x\tan\theta)^2}$$

where K0 is the thermal conductivity and S' is the dimensions of the heat front at the top of the element. Integrating produces the following equation for resistivity $$R = \frac{d}{K_0} \frac{1}{S'(S' + 2d\tan\theta)}$$

Figure 107:
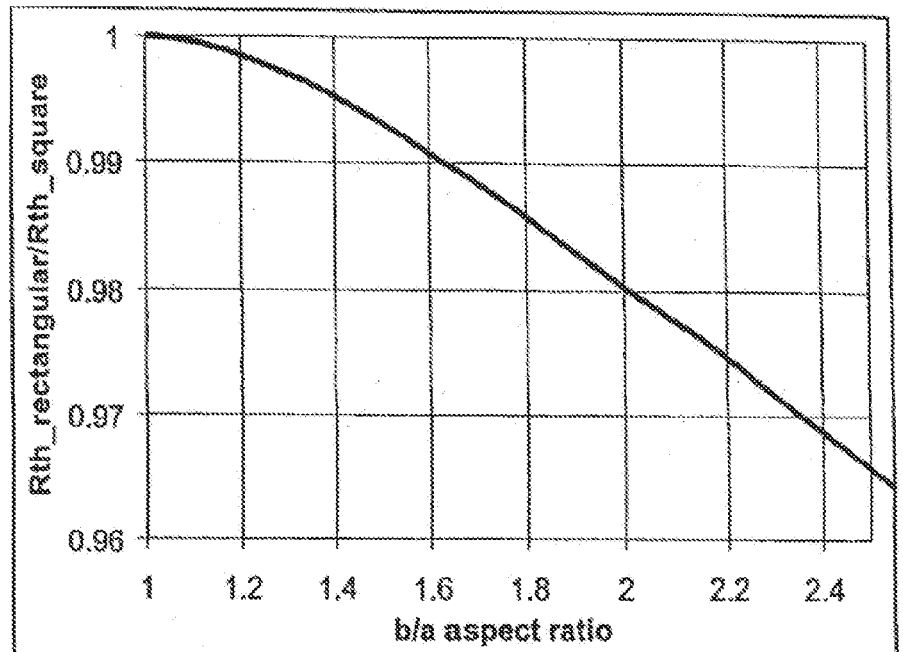
FIG. 107 is a graph of resistance.
Figure 108:
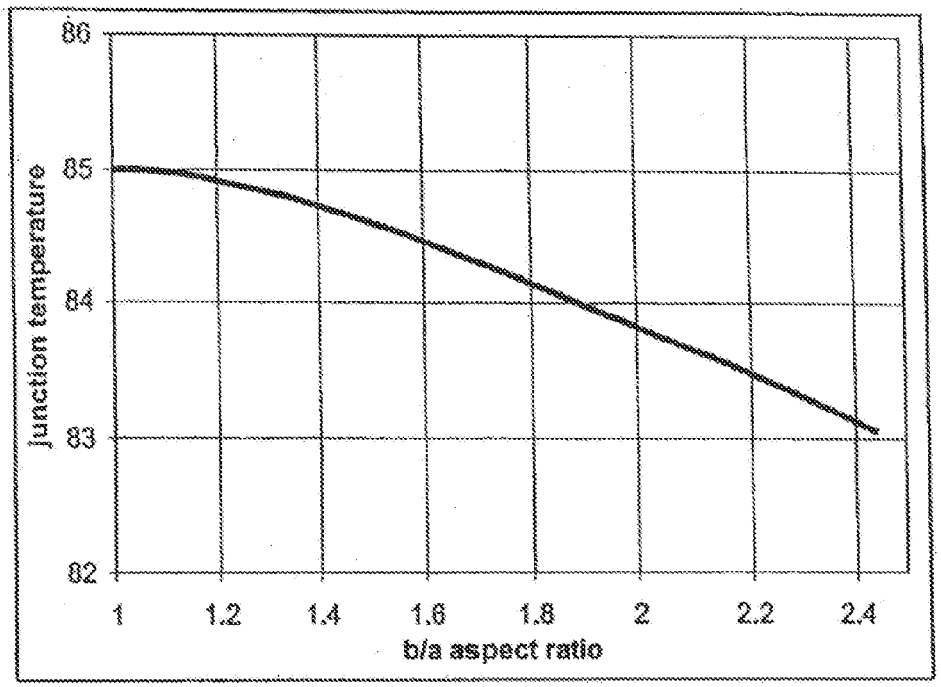
FIG. 108 is a graph of junction temperature.

In the case of a rectangle, this resistivity can be calculated generating the results shown in FIG. 107. FIG. 107 shows a calculated ratio of Rth_rectangle/Rth_square (where Rth is the thermal resistance) for a system of large thickness and spreading angle of 45°. As the aspect ratio increases, the thermal resistance can drop. For example, if a square die system has a thermal resistance of 20° C./W and it is desired to dissipate 3 W of power, then the junction temperature (assuming an ambient temperature of 25° C.) can be 25+20*3=85° C. A rectangular die of the same area and same dissipated heat, however, will typically have a lower junction temperature. FIG. 108 shows a graph of junction temperature as a function of aspect ratio. It is believed that a lower junction temperature is desirable for reduced wavelength shift and higher device efficiency.

As described above, using a rectangular shape for an LED (compared, for example, to a square) can provide certain advantages. The advantages can include one or more of the following. The rectangular LED can allow a greater number of wire bonds per unit area increasing the power that can be input into the LED. The rectangular shape can be chosen to match a particular aspect ratio of a pixel or microdisplay, thus, eliminating the need for complex beam shaping optics. The rectangular shape can also improve heat dissipation from the LED and reduce the likelihood of failure due to the device overheating.

Because the cross section of an individual LEDs cut from a wafer is only slightly larger than the light-emitting surface area of the LED, many individual, and separately addressable LEDs can be packed closely together in an array. If one LED does not function (e.g., due to a large defect), then it does not significant diminish the performance of the array because the individual devices are closely packed.

While certain embodiments have been described, other embodiments are possible.

As an example, while certain thickness for a light-emitting device and associated layers are discussed above, other thicknesses are also possible. In general, the light-emitting device can have any desired thickness, and the individual layers within the light-emitting device can have any desired thickness. Typically, the thicknesses of the layers within multilayer stack 122 are chosen so as to increase the spatial overlap of the optical modes with light-generating region 130, to increase the output from light generated in region 130. Exemplary thicknesses for certain layers in a light-emitting device include the following. In some embodiments, layer 134 can have a thickness of at least about 100 nm (e.g., at least about 200 nm, at least about 300 nm, at least about 400 nm, at least about 500 nm) and/or at most about 10 microns (e.g., at most about five microns, at most about three microns, at most about one micron). In certain embodiments, layer 128 has a thickness of at least about 10 nm (e.g., at least about 25 nm, at least about 40 nm) and/or at most about one micron (e.g., at most about 500 nm, at most about 100 mm). In some embodiments, layer 126 has a thickness of at least about 10 nm (e.g., at least about 50 nm, at least about 100 nm) and/or at most about one micron (e.g., at most about 500 nm, at most about 250 nm). In certain embodiments, light-generating region 130 has a thickness of at least about 10 nm (e.g., at least about 25 nm, at least about 50 nm, at least about 100 nm) and/or at most about 500 nm (e.g., at most about 250 nm, at most about 150 nm).

As an example, while a light-emitting diode has been described, other light-emitting devices having the above-described features (e.g., patterns, processes) can be used. Such light-emitting devices include lasers and optical amplifiers.

As another example, while current spreading layer 132 has been described as a separate layer from n-doped layer 134, in some embodiments, a current spreading layer can be integral with (e.g., a portion of) layer 134. In such embodiments, the current spreading layer can be a relatively highly n-doped portion of layer 134 or a heterojunction between (e.g. AlGaN/GaN) to form a 2D electron gas.

As a further example, while certain semiconductor materials have been described, other semiconductor materials can also be used. In general, any semiconductor materials (e.g., III-V semiconductor materials, organic semiconductor materials, silicon) can be used that can be used in a light-emitting device. Examples of other light-generating materials include InGaAsP, AlInGaN, AlGaAs, InGaAlP. Organic light-emitting materials include small molecules such as aluminum tris-8-hydroxyquinoline (Alq3) and conjugated polymers such as poly[2-methoxy-5-(2-ethylhexyloxy)-1,4-vinylenephenylene] or MEH-PPV.

As an additional example, while large area LEDs have been described, the LEDs can also be small area LEDs (e.g., LEDs smaller than the standard about 300 microns on edge).

As another example, while a dielectric function that varies spatially according to a pattern has been described in which the pattern is formed of holes, the pattern can also be formed in other ways. For example, a pattern can be formed continuous veins and/or discontinuous veins in the appropriate layer. Further, the pattern in varying dielectric function can be achieved without using holes or veins. For example, materials having different dielectric functions can be patterned in the appropriate layer. Combinations of such patterns can also be used.

As a further example, while layer 126 has been described as being formed of silver, other materials can also be used. In some embodiments, layer 126 is formed of a material that can reflect at least about 50% of light generated by the light-generating region that impinges on the layer of reflective material, the layer of reflective material being between the support and the multi-layer stack of materials. Examples of such materials include distributed Bragg reflector stacks and various metals and alloys, such as aluminum and aluminum-containing alloys.

As another example, support 120 can be formed of a variety of materials. Examples of materials from which support 120 can be formed include copper, copper-tungsten, aluminum nitride, silicon carbide, beryllium-oxide, diamonds, TEC, and aluminum.

As an additional example, while layer 126 has been described as being formed of a heat sink material, in some embodiments, a light-emitting device can include a separate layer (e.g., disposed between layer 126 and submount 120) that serves as a heat sink. In such embodiments, layer 126 may or may not be formed of a material that can serve as a heat sink.

As a further example, while the varying pattern in dielectric function has been described as extending into n-doped layer 134 only (which can substantially reduce the likelihood of surface recombination carrier losses) in addition to making use of the entire light-generating region, in some embodiments, the varying pattern in dielectric function can extend beyond n-doped layer (e.g., into current spreading layer 132, light-generating region 130, and/or p-doped layer 128).

As another example, while embodiments have been described in which air can be disposed between surface 110 can cover slip 140, in some embodiments materials other than, or in an addition to, air can be disposed between surface 110 and cover slip 140. Generally, such materials have an index of refraction of at least about one and less than about 1.5 (e.g., less than about 1.4, less than about 1.3, less than about 1.2, less than about 1.1). Examples of such materials include nitrogen, air, or some higher thermal conductivity gas. In such embodiments, surface 110 may or may not be patterned. For example, surface 110 may be non-patterned but may be roughened (i.e., having randomly distributed features of various sizes and shapes less than $\lambda/5$).

As another example, while embodiments involving the deposition and etching of planarization and lithography layers have been described, in some embodiments, a pre-patterned etch mask can be laid down on the surface of the n-doped semiconductor layer.

As a further example, in some embodiments, an etch mask layer can be disposed between the n-doped semiconductor layer and the planarization layer. In such embodiments, the method can include removing at least a portion of the etch mask layer (e.g., to form a pattern in the etch stop layer corresponding to the pattern in the n-doped semiconductor layer).

As an additional example, while embodiments, have been disclosed in which surface 110 is patterned and smooth, in some embodiments, surface 110 may be patterned and rough (i.e., having randomly distributed features of various sizes and shapes less than $\lambda/5$, less than $\lambda/2$, less than $\lambda$). Further, in certain embodiments, the sidewalls of openings 150 can be rough (i.e., having randomly distributed features of various sizes and shapes less than $\lambda/5$, less than $\lambda/2$, less than $\lambda$), with or without surface 110 being rough. Moreover, in some embodiments, the bottom surface of openings 150 can be rough (i.e., having randomly distributed features of various sizes and shapes less than $\lambda/5$, less than $\lambda/2$, less than $\lambda$). Surface 110, the sidewalls of openings 150, and/or the bottom surfaces of openings 150 can be roughened, for example, by etching (e.g., wet etching, dry etching, reactive ion etching). Without wishing to be bound by theory, it is believed that roughening surface 10 and/or the sidewalls of openings 150 may increase the probability, with respect to a atomically smooth surface, that a light ray will eventually strike at an angle that less than the critical angle given by Snell's law and will be extracted.

As another example, in some embodiments, the submount can be machined to include spring-like structures. Without wishing to be bound by theory, it is believed that such spring-like structures may reduce cracking during removal of the substrate.

As a further example, in some embodiments, the submount can be supported by an acoustically absorbing platform (e.g., a polymer, a metallic foam). Without wishing to be bound by theory, it is believed that such acoustically absorbing structures may reduce cracking during removal of the substrate.

As an additional example, in some embodiments, the substrate is treated (e.g., etched, ground, sandblasted) before being removed. In certain embodiments, the substrate may be patterned before it is removed. In some embodiments, the thickness of the layers is selected so that, before removing the substrate and buffer layers, the neutral mechanical axis of the multi-layer stack is located substantially close (e.g., less than about 500 microns, less than about 100 microns, less than about 10 microns, less than about five microns) to the interface between the p-doped semiconductor layer and a bonding layer. In certain embodiments, portions of the substrate are separately removed (e.g., to reduce the likelihood of cracking).

As another example, while embodiments have been described in which a buffer layer is separate from an n-doped semiconductor layer (e.g., a buffer layer grown on the substrate, with an n-doped semiconductor layer separately grown on the buffer), in some embodiments, there can be a single layer instead. For example, the single layer can be formed by first depositing a relatively low doped (e.g., undoped) semiconductor material on the substrate, followed by (in one process) depositing a relatively high doped (n-doped) semiconductor material.

As a further example, while embodiments have been described in which a substrate is removed by a process that includes exposing a surface of the substrate to electromagnetic radiation (e.g., laser light), in some embodiments other methods can be used to remove the substrate. For example, removal of the substrate can involve etching and/or lapping the substrate. In certain embodiments, the substrate can be etched and/or lapped, and then subsequently exposed to electromagnetic radiation (e.g., laser light).

As an additional example, in some embodiments, after depositing the planarization layer but before depositing the lithography layer, the upper surface of the planarization layer can be flattened. For example, a flat object, such as an optical flat, can be placed on the upper surface of the planarization layer while heating the planarization layer (e.g., with a hot plate). In some embodiments, a pressure can be applied (e.g., using a physical weight or press) to assist with the flattening process.

As another example, in some embodiments the substrate can be treated before being removed. For example, the substrate can be exposed to one or more processes selected from etching, polishing, grinding, and sandblasting. In certain embodiments, treating the substrate can include patterning the substrate. In some embodiments, treating the substrate includes depositing an antireflective coating on the substrate. Such an antireflective coating can, for example, allow relatively large regions of the substrate to be removed when using a substrate removal process that involves exposing the substrate to electromagnetic radiation because the coating can reduce reflection of the electromagnetic radiation. In certain embodiments, a pattern on the surface of the substrate can also be used to achieve an anti-reflection effect.

In some embodiments, it may be desirable for a light emitting device or system to provide linearly polarized light. As referred to herein, polarized light refers to light having about 60% of the total light in a linear polarization and about 40% of the total light in an orthogonal polarization (e.g., about 65% of the total light in a linear polarization and about 35% of the total light in an orthogonal polarization, about 70% of the total light in a linear polarization and about 30% of the total light in an orthogonal polarization, about 75% of the total light in a linear polarization and about 25% of the total light in an orthogonal polarization, about 80% of the total light in a linear polarization and about 20% of the total light in an orthogonal polarization, about 90% of the total light in a linear polarization and about 10% of the total light in an orthogonal polarization)

As referred to herein, unpolarized light refers to light that is not polarized.

In general, a light generating region (e.g., light generating regions as described above) generates unpolarized light. As described below, in order to generate polarized light, a material can be configured to transmit one polarization and reflect (and possibly recycle) other polarizations. Alternatively, the generation of light of one polarization may be suppressed.

Figure 109:
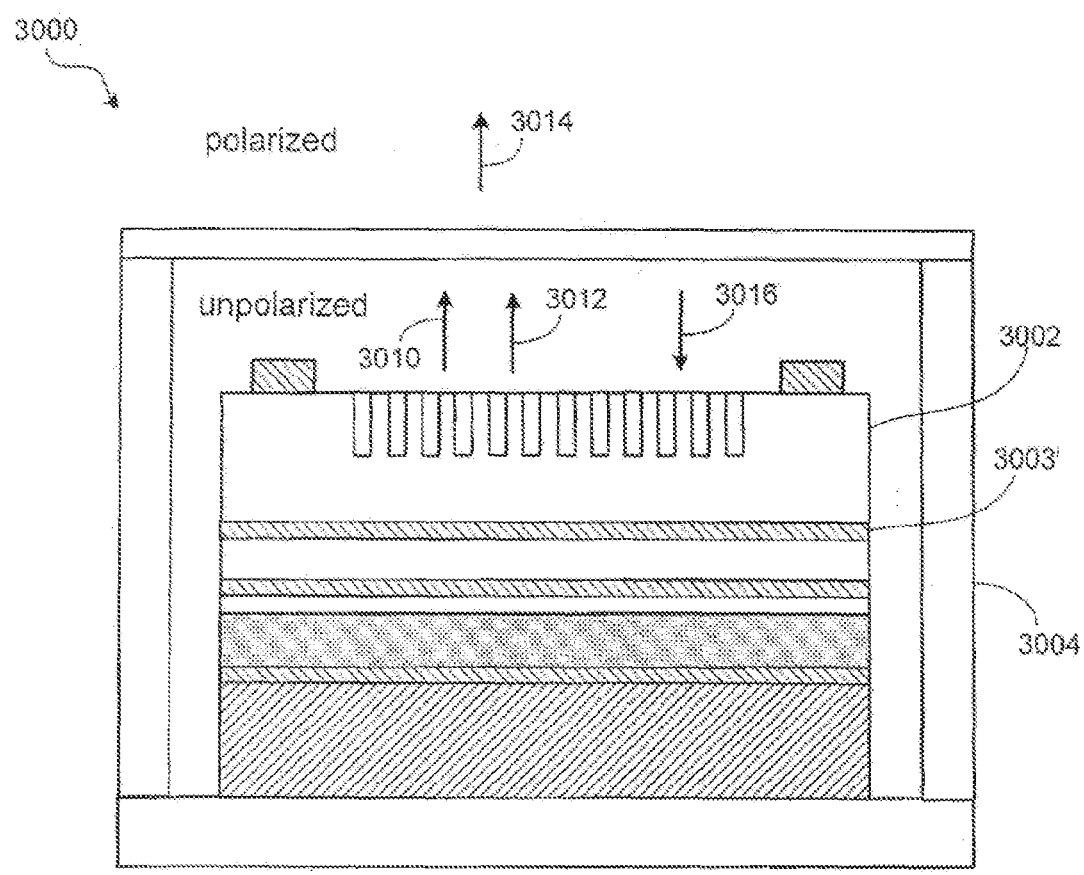
FIG. 109 is a diagram of a packaged LED.

FIG. 109 shows a system 3000 that includes an LED 3002 contained in a package 3004. In general, package 3004 should be capable of facilitating light collection while also providing mechanical and environmental protection of the die. Package 3006 includes a transparent cover 3006 disposed between a display and LED 3002. In use light generated by LED 3002 (in light-generating region 3003) that emerges from package 3004 is transmitted through cover 3006, which selectively transmits polarized light. For example, cover 3006 can transmit one or more polarizations while reflecting one or more different polarizations (e.g. one or more orthogonal polarizations).

In some embodiments, cover 3006 can include one or more coatings that filter the light. For example, the coating can include slots forming a filter such that the part of the light wave that is not aligned with the slots in the filter passes through the filter while other orientations are absorbed or reflected. This selective transmission generates a polarized light emission from packaged LED device 3000. For example, a chemical film can be applied to a transparent plastic or glass surface of cover 3006. The chemical compound can be composed of molecules that naturally align in parallel relation to one another generating a microscopic filter that absorbs any light matching their alignment. In another example, a material is patterned to form a liner grating on cover 3006. Other examples of polarization selective materials include polarization selective mirrors, polarizing materials, and multilayer films of birefringent materials.

In some embodiments, in addition to cover 3006 filtering the light, cover 3006 also reflects the light not transmitted through cover 3006. As shown in FIG. 109, light can be emitted from the surface of LED 3002 in multiple orientations or polarizations (represented by arrows 3010 and 3012). Cover 3006 selectively filters some polarizations such that a first portion of the light (represented by arrow 3014) passes through cover 3006. The light that is not transmitted through cover 3006 is reflected by cover 3006 (represented by arrow 3016). A portion of the reflected light is absorbed in the quantum well containing regions of light emitting device 3002 (represented by arrow 3018). The absorbed photons can be subsequently reemitted (e.g., recycled by) LED 3002. The reemitted photons have the same probability of either polarization and may be transmitted through the cover or subsequently re-reflected into LED 3002. In some embodiments, LED 3002 has a pattern of openings 150 in its upper surface 3015. Without wishing to be bound by theory, it is believed that such patterns can facilitate in coupling the reflected light into LED 3002 such that the reflected light can be absorbed in the quantum well containing regions of light emitting device 3002.

In some embodiments, integrating a polarization selective mirror or other polarization selective device or material into cover 3006 of the package (e.g., instead of locating a polarization selective mirror outside of the package), enables recycling of the reflected polarizations and increases the efficiency and/or the effective illuminance of the selective polarization of packaged LED device 3000. The efficiency can be dependent on the internal quantum efficiency of the materials used in light emitting device 3002. In some embodiments, transparent cover 3006 can be further coated with one or more anti-reflection coatings to increase light transmission.

FIG. 110.A shows an LED 3030 that includes a patterned layer 3031 that is designed to reflect/transmit light based on the polarization of the light. Light generated in a light generating region 3040 is either reflected or transmitted by patterned layer 3031 based on the polarization of the light. Exemplary patterns are shown in FIGS. 110B, 110C, and 110D. The patterns include an arrangement of holes etched into the surface of layer 3031. At least some of the holes can be elongated in a direction coplanar with layer 3031 (e.g., a direction approximately perpendicular to a normal of surface of layer 3031). Without wishing to be bound by theory, it is believed that the elongation of the holes separates or filters polarizations of light such that some polarizations are transmitted through the surface of LED 3030 and other polarizations are reflected and not transmitted from LED 3030. As described above, at least a portion of the reflected light can be recycled and reemitted from LED 3030.

Figure 110A:
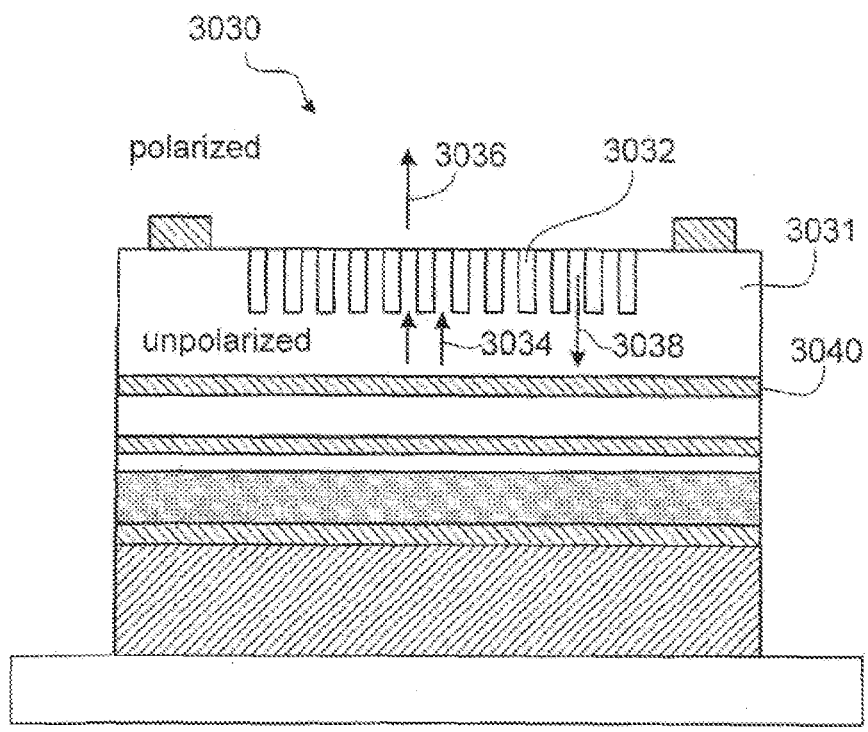
FIG. 110A is a partial cross-sectional view of an LED.
Figure 110B:
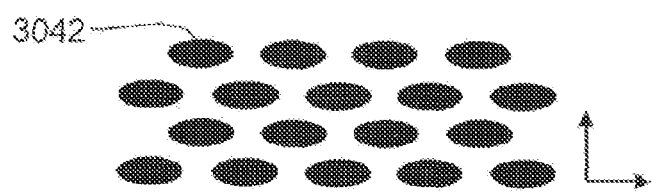
FIG. 110B is a top view a patterned surface of an LED.
Figure 110C:
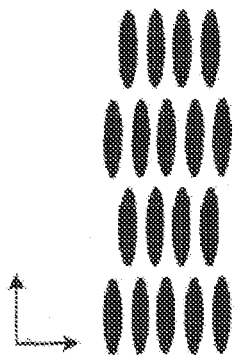
FIG. 110C is a top view a patterned surface of an LED.
Figure 110D:
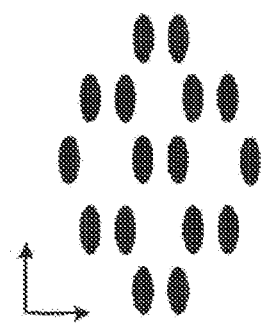
FIG. 110D is a top view a patterned surface of an LED.

While the patterns shown in FIGS. 110B, 110C, and 110D include elongated ellipses, other elongated shapes such as rectangles can be used. In some embodiments, gratings and other linear patterns can be used. In addition to polarizing light emitted by LED 3030, pattern 3032 can also facilitate light extraction and collimation (e.g., according to one or more of the methods described above). In addition, pattern 3032 can consist of multiple patterns each responsible for facilitating collimation, extraction, polarization, or a combination thereof.

While embodiments shown in FIGS. 109 and 110 generate a polarized light beam by filtering light generated by the light generating region of the LED, the light can also be polarized by suppressing the light generation of a particular polarization relative to another polarization. For example, the light emitting device can generate light with at least about 60% (e.g., at least about 65%, at least about 70%, at least about 80%, at least about 90%) of the light having a particular polarization.

In some embodiments, strain induced in at least one material layer in the light emitting device changes the electronic band structure of the material so that different energy transitions occur in the material. The strain can be used to isolate an energy transition that generates light of a preferred polarization. Strain can be introduced into one or more of the layers in a variety of ways. For example, strain can be introduced during growth based on a lattice mismatch of two materials or based on processing parameters such as temperature and deposition rate. In another example, bonding parameters such as substrate orientation, temperature cycling, material selection, or other process parameters introduce strain into one or more of the layers. In another example, strain is introduced into the material subsequent to the fabrication of the LED by flexing the device to generate a physical stress in one or more layers. In another example, strain is introduced by etching, polishing, or chemical mechanical polishing. In still another example, previously introduced strain is tuned (e.g. more or less tensile, more or less compressive, along various crystallographic axes in the semiconductor layers). For example, it is believed that such techniques can be useful in post-processing wafers containing strain introduced during growth.

Figure 111:
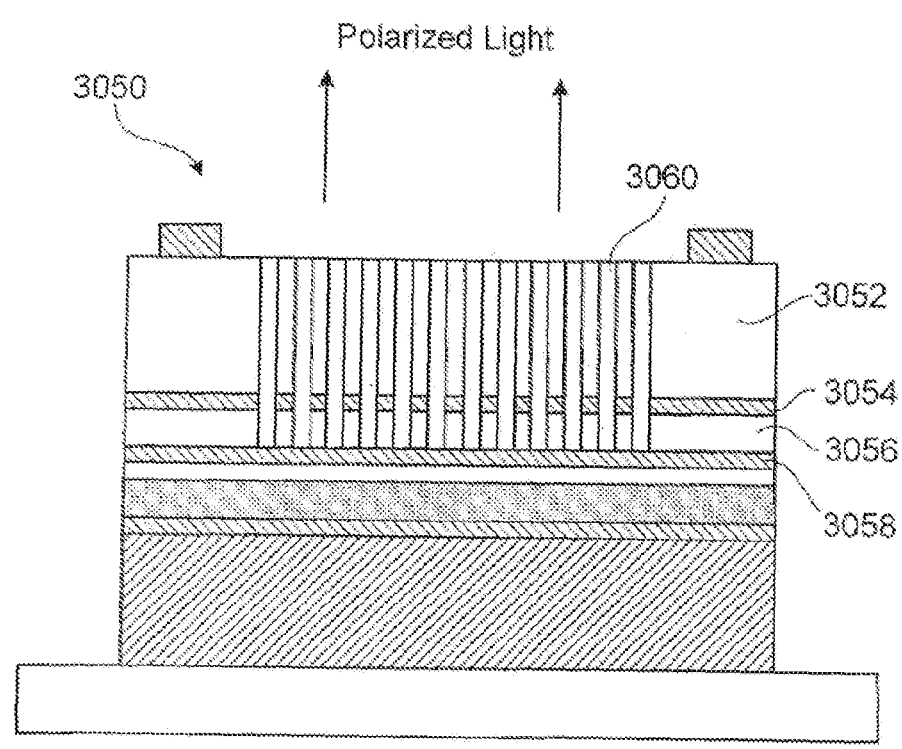
FIG. 111 is a partial cross-sectional view of an LED.

FIG. 111 shows an LED 3050 that includes an n-doped layer 3052, quantum well containing region 3054, p-doped layer 3056, and contact layer 3058. Multiple holes 3060 etched in n-doped layer 3052, quantum well containing region 3054, p-doped layer 3056 form a photonic lattice with an etched pattern. Without wishing to be bound by theory, it is believed that holes 3060 etched through quantum well containing region 3054 generate a photonic band gap (e.g., a complete photonic bandgap, a partial photonic bandgap) around particular polarization modes. The gap in allowed modes allows LED 3050 to emit a particular polarization while suppressing another polarization. Holes 3060 may be elongated along an axis (e.g., forming an elliptical or rectangular shape). The elongation of the holes separates the modes of light generation (e.g., degenerate modes of light generation) such that one mode shifts at least partially out of the bandgap for light generation while the other mode remains at least partially in the bandgap for light generation. Since the light generation region generates light having a particular mode and suppresses light having another mode, LED 3050 emits polarized light. Additional linear patterns that break the symmetry of the degenerate modes of light generation are possible. Since the desired polarization is generated (undesired polarizations are at least partially suppressed) a polarizing film or surface as described above is not necessary to generate polarized light. However, in some embodiments a polarizing film or surface as described above can be used to further enhance the degree of polarization.

While holes 3062 can generate a photonic band gap around particular polarization modes, holes 3062 can also introduce non-radiative surface states that allow carriers to recombine potentially reducing the efficiency and generating heat. The holes may be passivated to reduce the surface recombination velocity (e.g. chemical passivation by exposure to a chemical vapor). Holes 3062 may be filled with air, a dielectric, or another material (e.g., to facilitate passivation).

While in the embodiment described above, holes 3062 etched though n-doped layer 3052, quantum well containing region 3054, p-doped layer 3056 provide suppression of undesired polarizations, other methods of polarization suppression can be used. In some embodiments, as shown in FIG. 112 backside patterning allows light to be generated with some polarizations suppressed relative to other polarizations.

Figure 112:
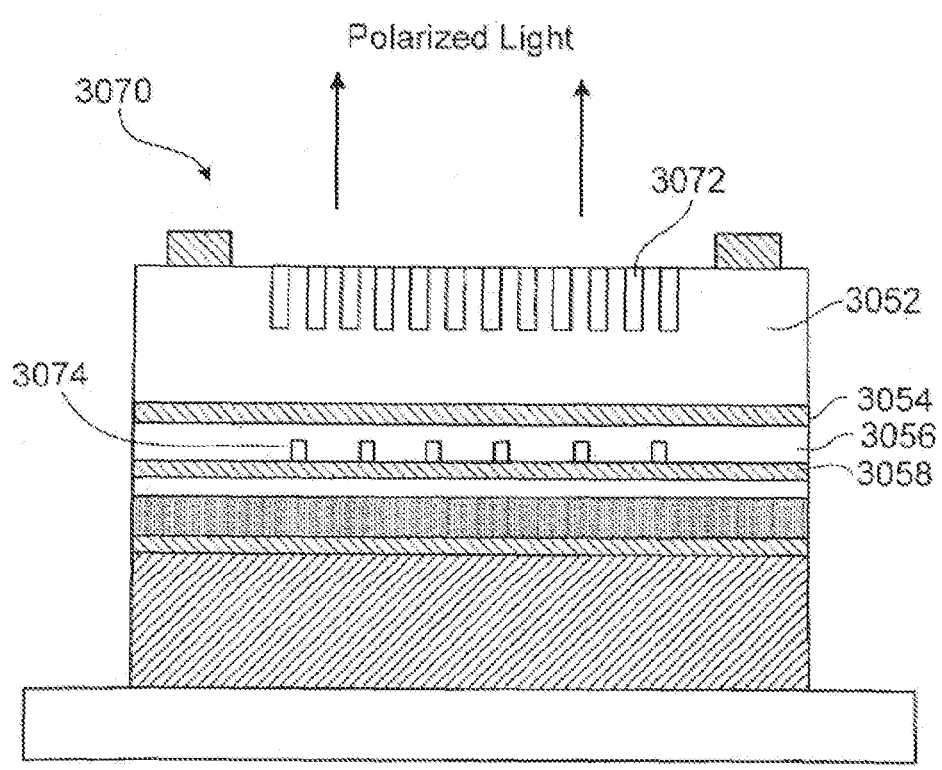
FIG. 112 is a partial cross-sectional view of an LED.

FIG. 112 shows an LED 3070 that includes an n-doped layer 3052, a quantum well containing region 3054, and a p-doped layer 3056. A set of holes 3074 etched in p-doped layer 3074 creates a photonic band gap around undesired polarization modes. Holes 3074 can extend partially into or completely through p-doped layer 3056. In some embodiments, holes 3074 may extend into quantum well containing region 3054 or into n-doped layer 3052. Holes 3074 can be filled with air or other dielectric materials. Holes 3074 can additionally be arranged in a pattern that collimates the light. LED 3070 can additionally have a pattern etched into n-doped layer 3052 to further enhance collimation, light extraction, or polarization selectivity using one or more of the methods or configurations described above. Other embodiments are expected where the n and p doped layers are reversed.

Figure 113:
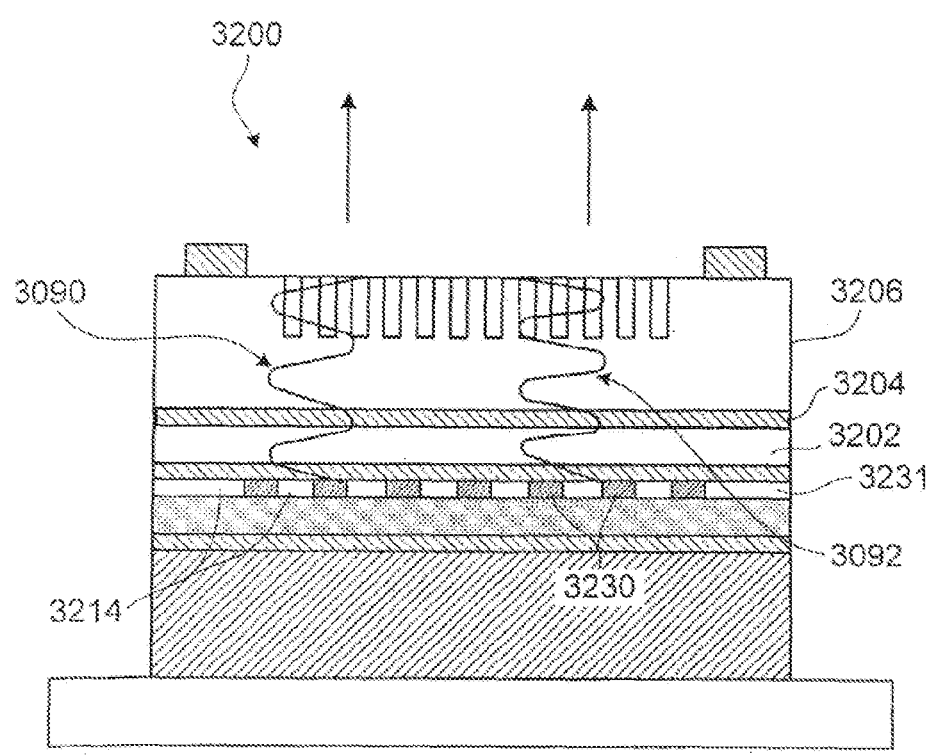
FIG. 113 is a partial cross-sectional view of an LED.

FIG. 113 shows an LED 3200 that includes an n-doped layer 3206, a quantum well containing region 3204, a p-doped layer 3202, and a patterned reflective layer 3231. Patterned reflective layer 3231 includes passivation regions 3230 and reflective regions 3214. For example, reflective regions 3214 (e.g., the patterned areas) can be etched and filled with an insulating material. Without wishing to be bound by theory, it is believed that the periodicity of the passivation regions 3230 and reflective regions 3214 affects the reflectance of the mirror. It is believed that the change in reflectance causes the mirror to be polarization sensitive and allows multiple standing waves to form between the top surface of layer 3206 and patterned contact layer 3231. The pattern can be designed such that a node forms at the quantum well containing region 3204 for one polarization (e.g., wave 3090) and a peak forms at quantum well containing region 3204 for another polarization (e.g., wave 3092).

In general, LED 3200 can be fabricated as desired. Typically, fabrication of LED 3200 involves various deposition, laser processing, lithography, and etching steps.

In some embodiments, LED 3200 is fabricated by the methods shown in FIGS. 114-102. FIG. 114 shows an LED wafer 3201 formed of a multilayer stack including a substrate 3208, a layer 3206, a layer 3204, and a layer 3202. Substrate 3208 can be generally as described above regarding substrate 500, and layers 3206, 3204 and 3202 can be generally as described above with respect to layers 506, 510 and 512, respectively.

FIG. 115 shows a multilayer stack 3210 including layers 3206, 3204 and 3202, and substrate 3208 as described above. Multilayer stack 3210 also includes a metal layer 3212. Metal layer 3212 can be composed of a single layer of reflecting material (e.g., a layer composed of Ag, Al, Cu, W, Pt, Ti, or alloys of these) or layer 3212 can include multiple layers. For example, layer 3212 can include an ohmic contact layer supported by layer 3202 (e.g., a layer composed of Ni, Indium-Tin-Oxide (ITO), Ag, Al, Ti, Cu, Rh, Pt or alloys of these) and a reflective layer supported by the ohmic contact layer (e.g, a layer composed of Ag). In addition, a diffusion-barrier (e.g., a layer composed of Pt or Ti—N) can also be included (e.g., supported by the reflective layer) to prevent or limit diffusion or chemical reactions between any of the metals in the layered stack. In addition, various adhesion layers (e.g., a layer composed of Ti) can be deposited to assist with adhesion between different layers of multilayer stack 3210.

As shown in FIG. 116, layer 3212 is patterned (e.g., using nano-imprint, deep-UV, e-beam, and holographic lithography) and etched (e.g., using reactive ion etching, wet etching) to form a reflective regions 3214 thereby exposing portions of surface 3216 of layer 3202.

As shown in FIG. 117, a layer 3226 is deposited onto reflective regions 3214. Layer 3226 can be transparent to light emitted from the light emitting layer (e.g., a layer composed of $Si_3N_4$, $SiO_2$, $TiO_2$, ITO, or $Ru_2O_3$). Layer 3226 can be deposited in a variety of ways. For example, layer 3226 can be deposited using CVD atomic layer deposition (ALD), or sputtering.

As shown in FIG. 118, layer 3226 is etched (e.g., using dry etching or CMP) exposing the surface of reflective regions 3214 while maintaining the transparent material in the indents between reflective regions 3214, thereby forming regions 3230 transparent to the light emitted from the light emitting layer. The transparent regions 3230 and reflective regions 3214 together form a patterned reflective layer 3231.

Figure 120:
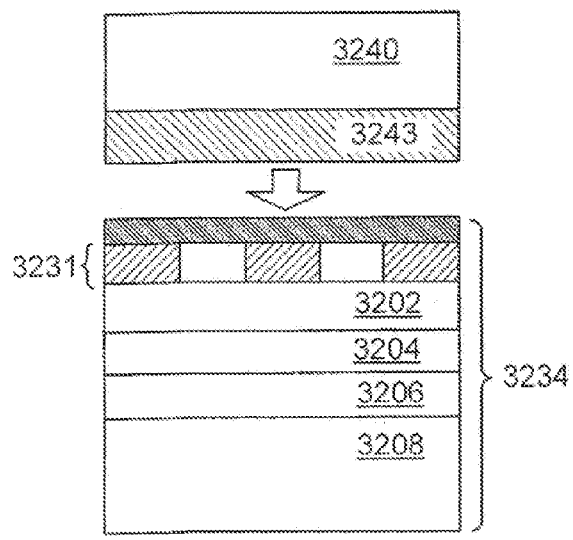
FIG. 120 is a partial cross-sectional view of a multi-layer stack.
Figure 121:
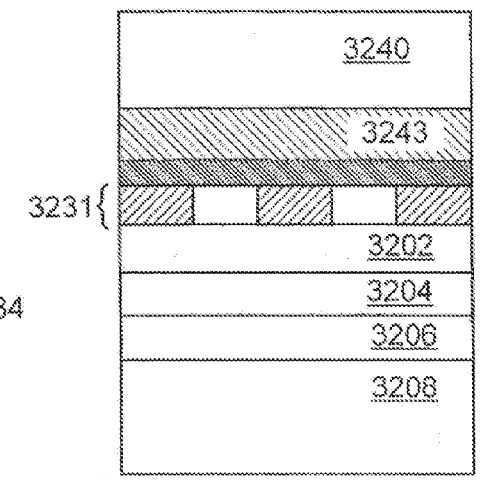
FIG. 121 is a partial cross-sectional view of a multi-layer stack.
Figure 122:
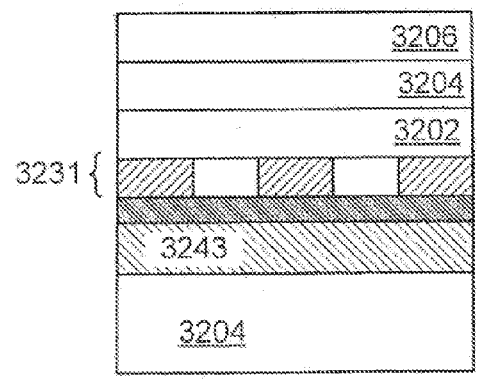
FIG. 122 is a partial cross-sectional view of a multi-layer stack.

As shown in FIG. 119, in some embodiments, a metal layer 3232 (e.g., a layer composed of Ag/Pt/Ti/Ni/Au) is deposited onto patterned reflective layer 3231. Layer 3232 can promote adhesion of the multilayer stack 3234 to a bonding submount. In some embodiments, 3232 is reflecting (e.g., layer 3232 can form a reflective surface at the boundary between layer 3232 and layer 3230). As shown in FIG. 120, multilayer stack 3234 is subsequently bonded to a submount 3240 including a metal layer 3242 (e.g., a layer composed of AuSn/Au/Ti) to form a bonded multilayer stack 3244 (FIG. 121). After bonding multilayer stack 3234 to the submount 3240, substrate 3208 is removed (e.g., using etching, LLO, polishing, or epitaxial liftoff) to form multilayer stack 3250 as shown in FIG. 122.

Figure 123:
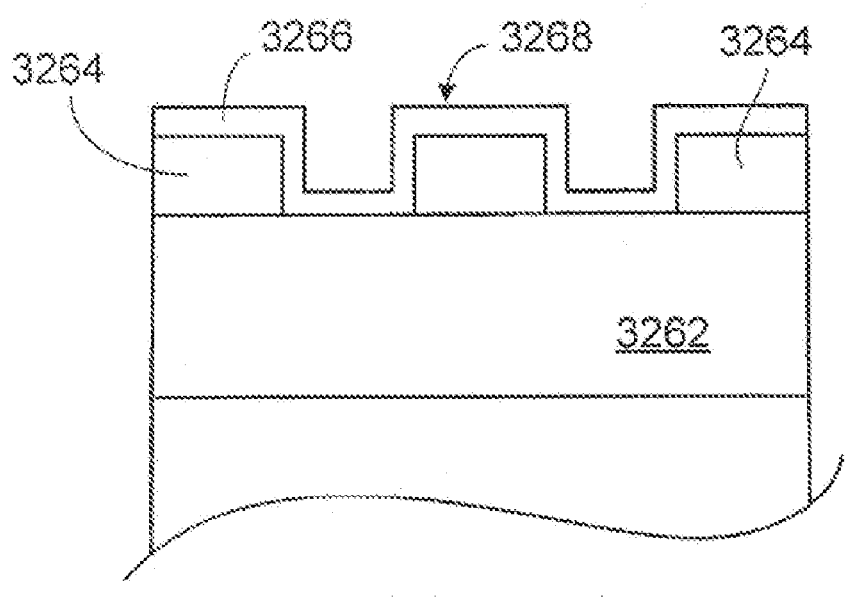
FIG. 123 is a partial cross-sectional view of an LED

In another embodiment, as shown in FIG. 123, the layer of material transparent to light emitted from the light emitting region is deposited on a p-doped semiconductor layer 3262 and etched to form transparent regions 3264. A reflective layer 3266 is deposited over the etched surface thereby forming a modulated reflecting surface 3268. Additional metal layers can be deposited (e.g., diffusion barriers and adhesion layers). Bonding and substrate removal can take place as described above. In additional embodiments, a current spreading layer (e.g., a layer composed of Ni, ITO, Au, or $RuO_2$) is deposited on the p-doped layer prior to the deposition of the transparent layer. In some embodiments, the current spreading layer can be used as an etch stop while etching transparent layer. Without wishing to be bound by theory it is believed that the use of the current spreading layer as an etch stop can help to preserve the integrity of the p-surface ohmic contact. In addition, the mesa thickness can be controlled depending on the deposition method used for the transparent material. In some embodiments, an adhesion layer may be incorporated prior to the reflective layer.

Figure 124:
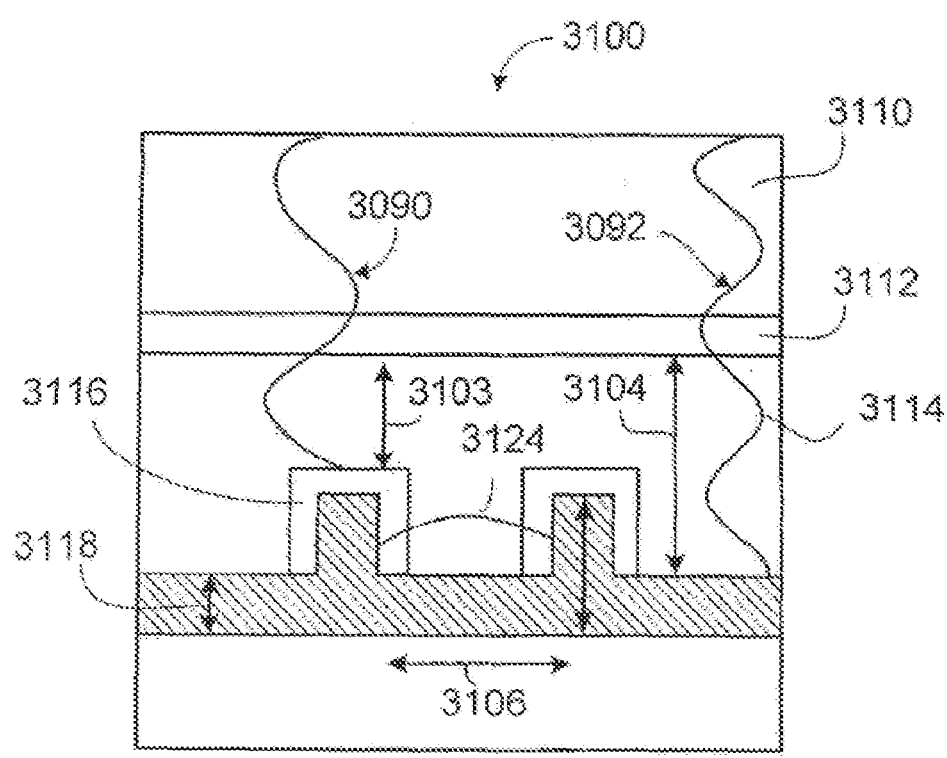
FIG. 124 is a partial cross-sectional view of an LED.

FIG. 124 shows an LED 3100 that includes an n-doped layer 3110, a quantum well containing region 3112, a p-doped layer 3114, and a reflective layer 3118. Reflective layer 3118 is patterned to form regions of a lesser thickness as indicted by arrow 3120 and regions of a greater thickness as indicated by arrow 3122. Without wishing to be bound by theory, it is believed that the periodicity of the patterning of layer 3118 can affect the reflectance of the layer. It is believed that the distance between quantum well containing region 3112 and the reflective layer 3118 varies due to the pattern in layer 3118 as indicated by distances 3102 and 3104.

Distances 3102 and 3104 can be chosen to optimize or enhance the formation of standing waves in LED 3100 in regions having a greater distance between layer 3118 and quantum well containing region 3112 and minimize or reduce the formation of standing waves in LED 3100 for the regions 3102 that have a lesser distance between layer 3118 and quantum well containing region 3112 (or vice versa).

Figure 125:
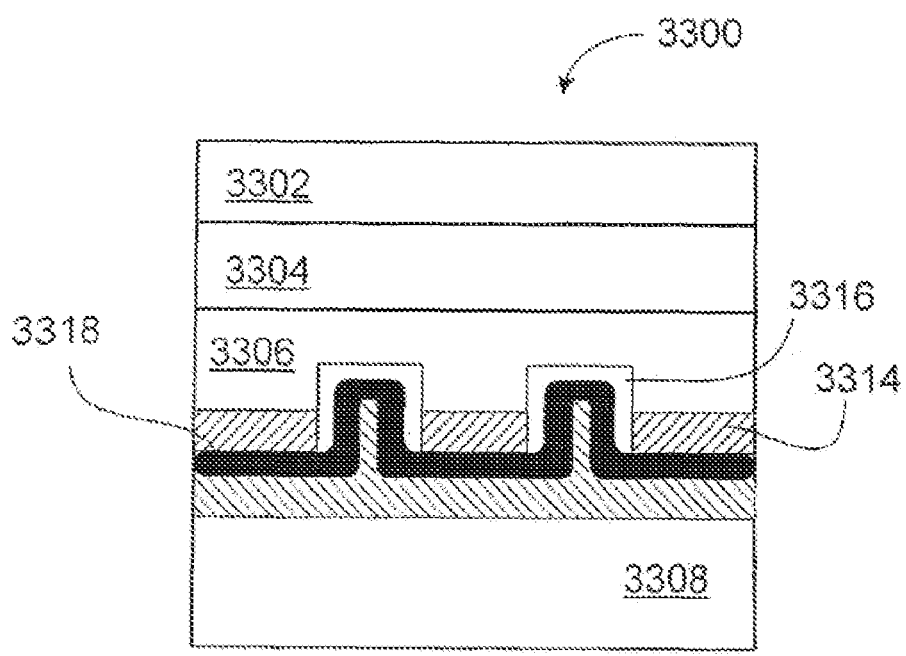
FIG. 125 is a partial cross-sectional view of an LED.

FIG. 125 shows an LED 3300 that includes an n-doped layer 3302, a quantum well containing region 3304, a p-doped layer 3306, and a patterned reflective layer 3314. LED 3300 also includes a plurality of insulating layers 3316 disposed in the patterned regions of patterned reflective layer 3314. Without wishing to be bound by theory, it is believed that the patterning affects the reflectance of reflective layer 3314 causing the patterned reflective layer to be polarization sensitive.

In general, LED 3300 can be fabricated as desired. Typically, fabrication of LED 3300 involves various deposition, laser processing, lithography, and etching steps.

In some embodiments, LED 3300 is fabricated by the methods shown in FIGS. 126-113. FIG. 125 shows an LED wafer 3301 containing a multilayer stack including a substrate 3308, a layer 3306, a layer 3304, and a layer 3302. Substrate 3308 can be generally as described above regarding substrate 500, and layers 3306, 3304 and 3302 can be generally as described above with respect to layers 506, 510 and 512, respectively.

FIG. 127 shows a multilayer stack 3310 including layers 3306, 3304 and 3302, and substrate 3308 as described above. Multilayer stack 3310 also includes a metal layer 3312. Metal layer 3312 can be generally as described above regarding metal layer 3212. As shown in FIG. 128, layer 3312 is patterned (e.g., using nano-imprint, deep-UV, e-beam, and holographic lithography) and etched (e.g., using reactive ion etching, wet etching) to form a patterned layer 3314. The etching extends into layer 3302 such that a pattern is formed in layer 3302.

Figure 132:
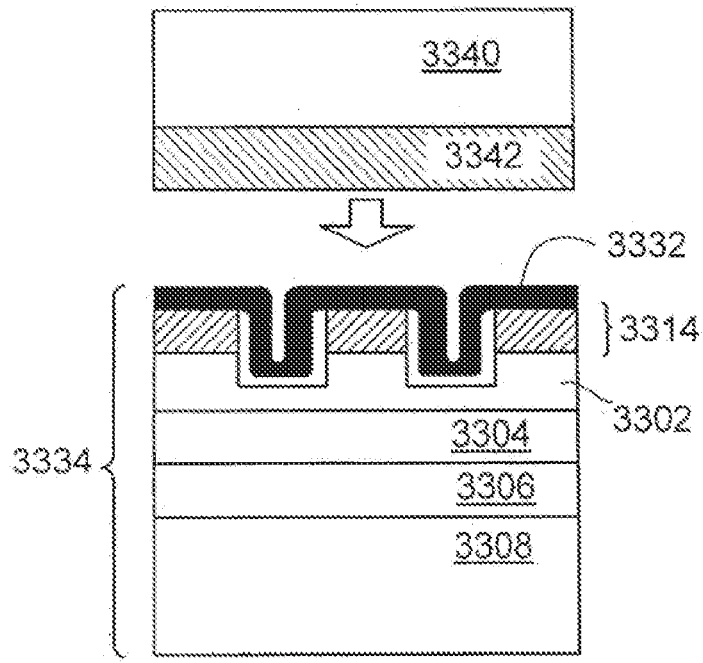
FIG. 132 is a partial cross-sectional view of a multi-layer stack.
Figure 133:
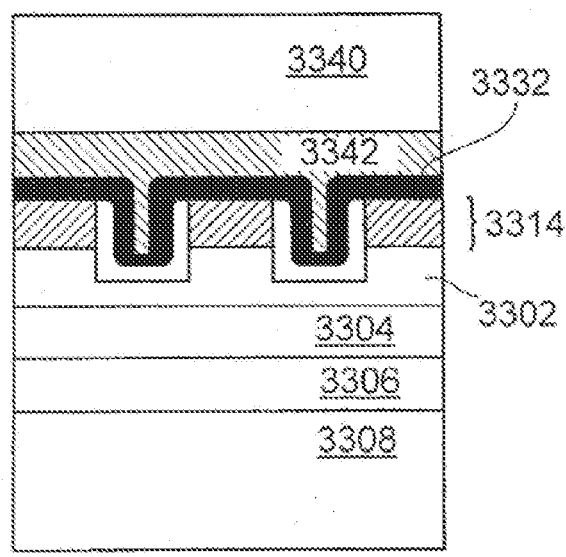
FIG. 133 is a partial cross-sectional view of a multi-layer stack.

As shown in FIG. 129, a passivation layer 3326 (e.g., a layer composed $Si_3N_4$, $SiO_2$, $TiO_2$, ITO) is deposited onto patterned layer 3314. Layer 3326 can be a conformal layer such that layer 3326 is deposited onto the sidewalls and bottom of etched regions 3325. As shown in FIG. 130, layer 3326 is etched to form a patterned passivation layer 3328 on the bottoms and sidewalls of etched regions 3325 while the upper surface of layer 3314 is exposed. As shown in FIG. 131, a metal layer 3332 is deposited onto the patterned passivation layer 3328 and the upper surface of patterned reflective layer 3314. Metal layer 3332 can at least partially planarize the surface of multilayer stack 3334. As shown in FIG. 132, multilayer stack 3334 is bonded to a submount 3340 including metal layer 3342 (e.g., a layer composed of AuSn/Au/Ti) to form a bonded multilayer stack 3344 (FIG. 133). After bonding multilayer stack 3334 to the submount 3340, substrate 3308 is removed to form multilayer stack 3300 as shown in FIG. 125.

In the embodiments shown in FIGS. 125-133, the etched region extends into layer 3302 (FIG. 128), however, in some embodiments, the etched region can further extend into layer 3304 or through layer 3304 and into layer 3302.

Figure 135:
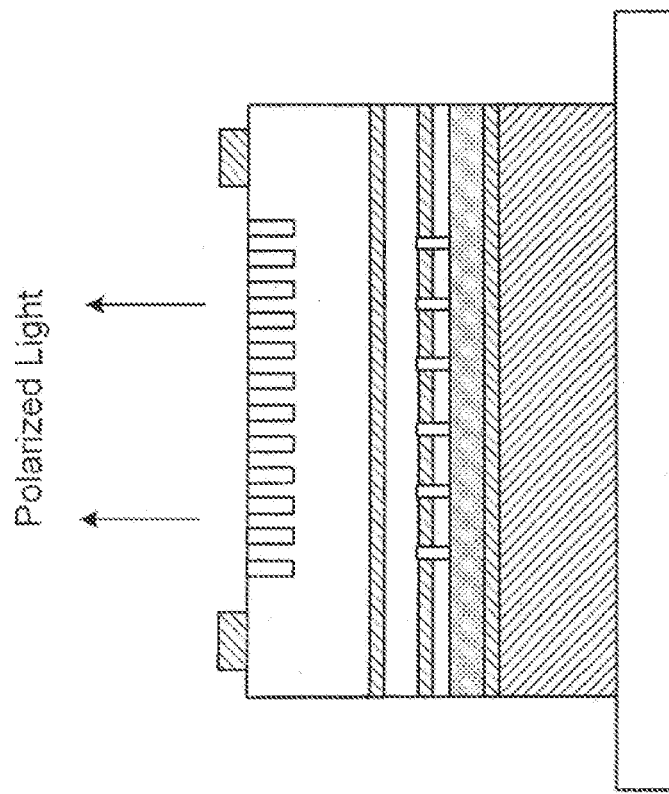
FIG. 135 is a partial cross-sectional view of an LED.
Figure 134:
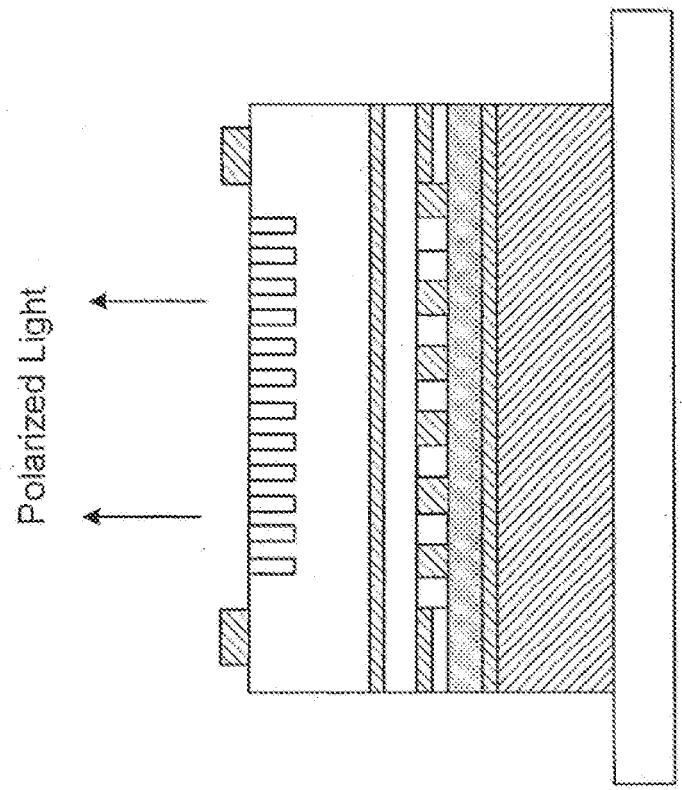
FIG. 134 is a partial cross-sectional view of an LED.

FIGS. 134 and 135 show additional embodiments in which a backside pattern suppresses light emission of one polarization relative to another polarization. More specifically, FIG. 134 shows an embodiment in which a mirror (e.g., a metal mirror) is patterned with a set of air holes. Without wishing to be bound by theory, it is believed that the pattern of air holes can generate a stronger perturbation due to the difference in material properties resulting in a greater suppression of one polarization relative to another. FIG. 135, shows an embodiment in which the backside pattern extends past the mirror or contact layer. In general, the holes can extend with varying depths. For example, the holes may not extend past the contact layer, the holes may extend to both a contact layer and a mirror layer, or the holes may extend to the bonding layer. The holes can be air or other materials including, for example, a material from the other layers. In some embodiments, a Ni containing material is used to form the contact and a Ag containing material is used to backfill the holes in the Ni layer. It may be beneficial due to fabrication processes to fabricate a device with the pattern extending to the bonding layer.

Without wishing to be bound by theory, it is believed that breaking the uniformity of space, e.g., using a reflective layer such as a metallic mirror, can alter the density of states. In general, during use electrons and holes in an LED are captured in an excited state. The electrons and holes can relax from the exited state through a radiative process (e.g., by light emission) or a non-radiative process (e.g., by heat dissipation). Without wishing to be bound by theory, it is believed that changing the relative density of states can change the relative strength of the two relaxation processes. If there are multiple radiative processes present (e.g., radiation of light having different polarizations), the emission in each polarization can be proportional to the corresponding density of states. In some embodiments, it can be beneficial to change the density of states thereby increasing or maximizing emission of light having a first polarization and decreasing or minimizing emission of light having a different polarization (e.g., an orthogonal polarization).

As described above, without wishing to be bound by theory, it is believed that one way to alter the density of states is to break the uniformity of space as described in the calculations to follow. For the following calculations, a horizontal emitting plane source is positioned at a distance d from a horizontal mirror. A boundary condition of setting the parallel electric field to be zero at the mirror surface is used. In addition, it is assumed that upon reflection, the light undergoes a π phase shift. Based on these boundary conditions, a source at a distance of a quarter wavelength from the mirror will undergo constructive interference with the reflected wave, while a source at a distance of a half wavelength will undergo destructive interference with the reflected wave. Assuming the total number of states must be conserved, the density of states for the wave undergoing constructive interference will be approximately doubled and the density of states for the wave undergoing destructive interference will be approximately zero. Based on the constructive and destructive interference, given a certain distance from the reflective surface there exists a wavelength for which emission is suppressed, or equivalently, for a given wavelength there exists a distance for which emission is suppressed.

Figures 136A, 136B:
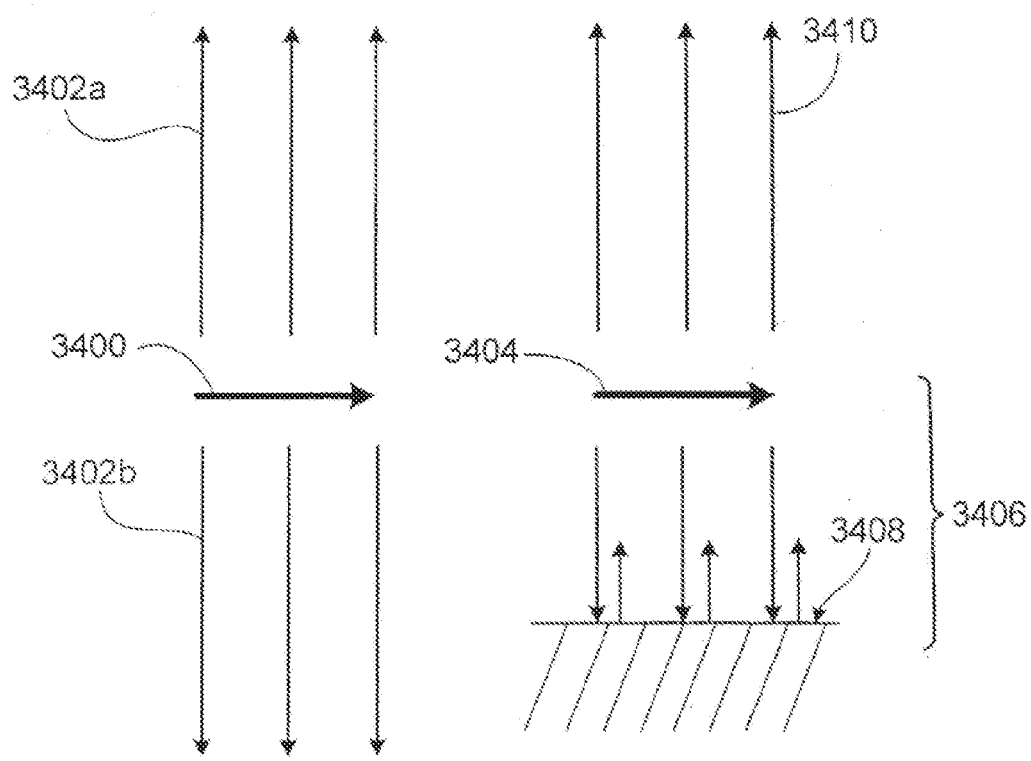
FIGS. 136A and 136B are schematic representations of a reflective surface.
Figure 137:
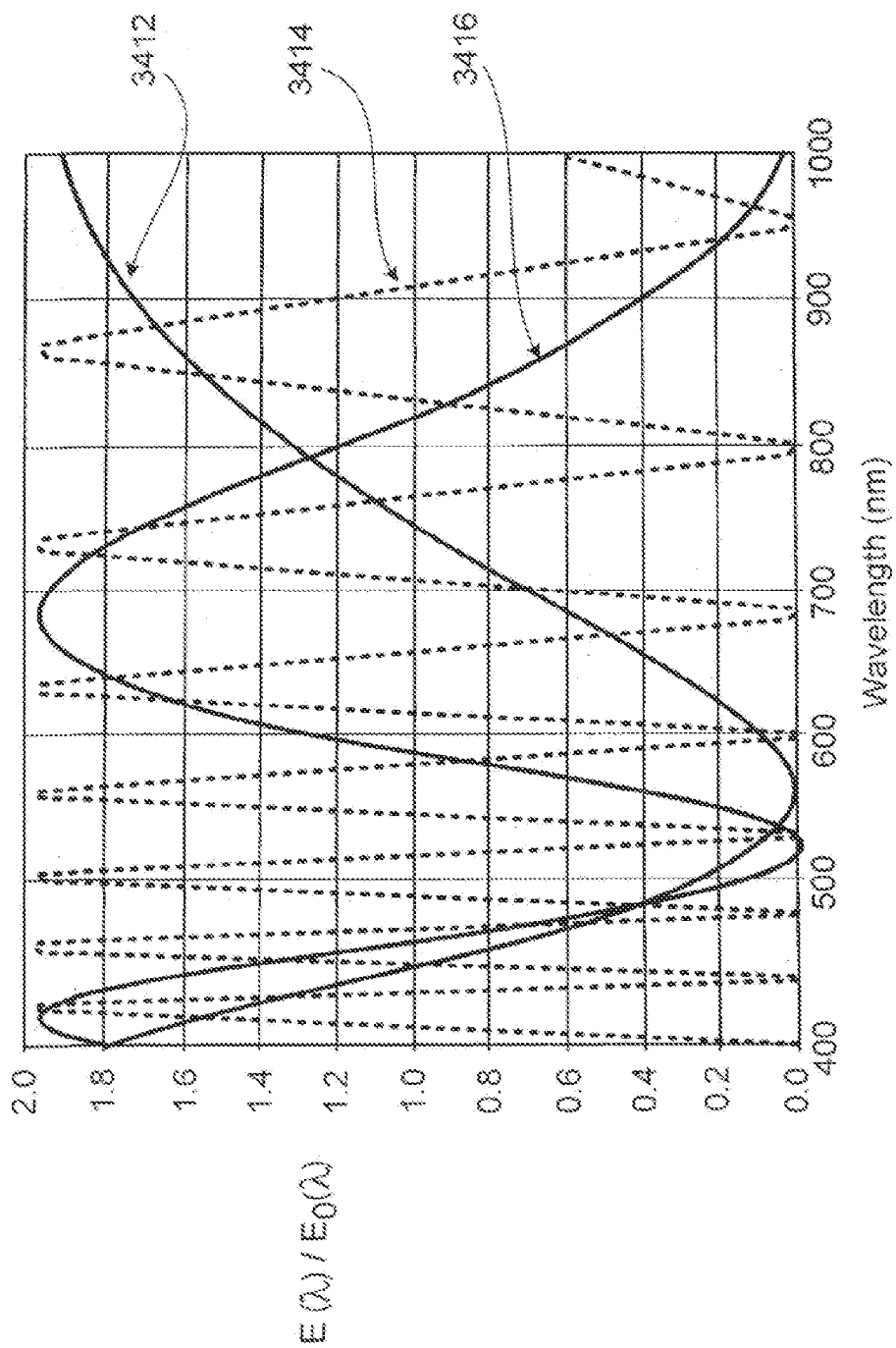
FIG. 137 is a graph of light emission versus wavelength.

The data shown in FIG. 137 was calculated by using a plane source emitting a wide frequency range white light. The calculation, using Finite Difference Time Domain (FDTD), assumes that the energy emitted by the source is directly proportional to the local density of states. As shown in FIG. 136A a source 3400 positioned in free space can be used to calculate a spectral energy $E_0(\lambda)$ 3402a and 3402b emitted from the source in both directions. As shown in FIG. 136B, a source 3404 positioned a distance 3406 away from a reflective surface 3408 (e.g., a Ag mirror) can be used to calculate a spectral energy $E(\lambda)$ 3410 emitted from the source in a direction away from the mirror (e.g., assuming that the mirror is optically thick). The data shown in FIG. 137, corresponds to calculations of a ratio of spectral energy 3410 divided by the spectral energy of the source in free space 3402a for differing wavelengths of light when the source is positioned at differing distances from the reflective surface. Line 3414 represents $E(\lambda)/E_0(\lambda)$ when the source is positioned at a distance of 100 nm from the reflective surface. Line 3416 represents $E(\lambda)/E_0(\lambda)$ when the source is positioned at a distance of 200 nm from the reflective surface. Line 3418 represents $E(\lambda)/E_0(\lambda)$ when the source is positioned at a distance of 1000 nm from the reflective surface.

In the data shown in FIG. 137, there is no distinction between the two equivalent polarizations. Without wishing to be bound by theory, it is believed that a polarized source can be generated by breaking the symmetry of the reflective surface. For example, the symmetry can be broken by introducing a pattern of raised portions 3420 and grooves 3424 in the reflective surface 3422 as shown in FIGS. 138A and 138B. Reflective surface 3422 has a pattern with a width 3426 between raised portions 3420 and a height 3428 between the surface of grooves 3424 and raised portions 3420. Due to patterned reflective surface 3422, the two polarizations now see a different effective mirror, therefore, will acquire a different phase after interacting with reflective surface 3422.

Figure 139B:
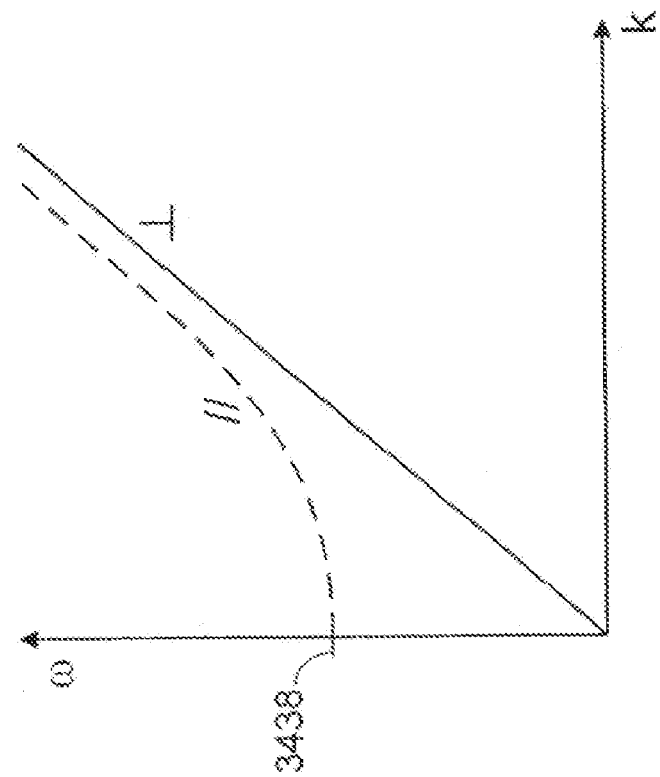
FIG. 139B is a graph of a cut-off frequency.
Figure 139A:
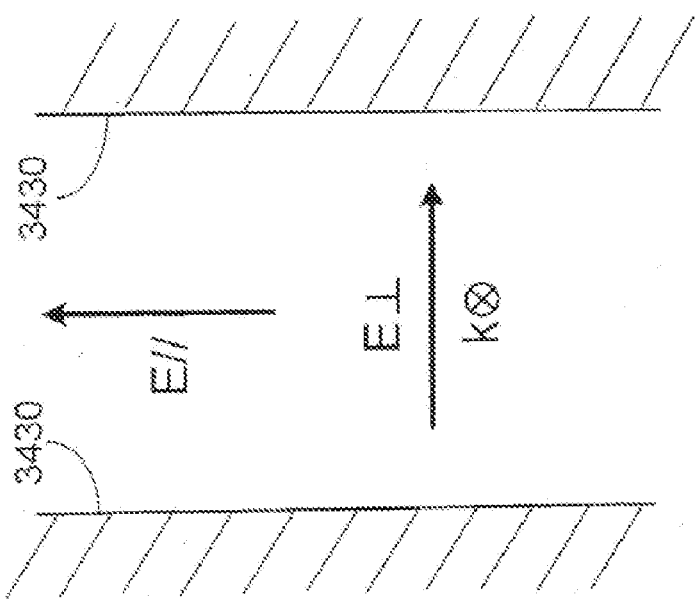
FIG. 139A is a schematic representation of a boundary condition.
Figure 141:
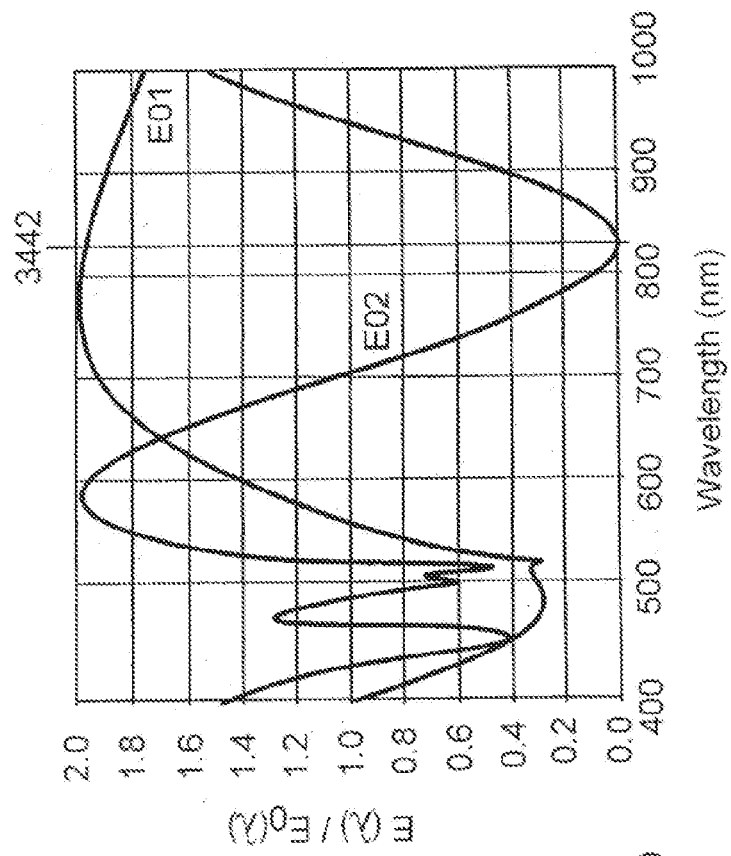
FIG. 141 is a graph of light emission versus wavelength.
Figure 140:
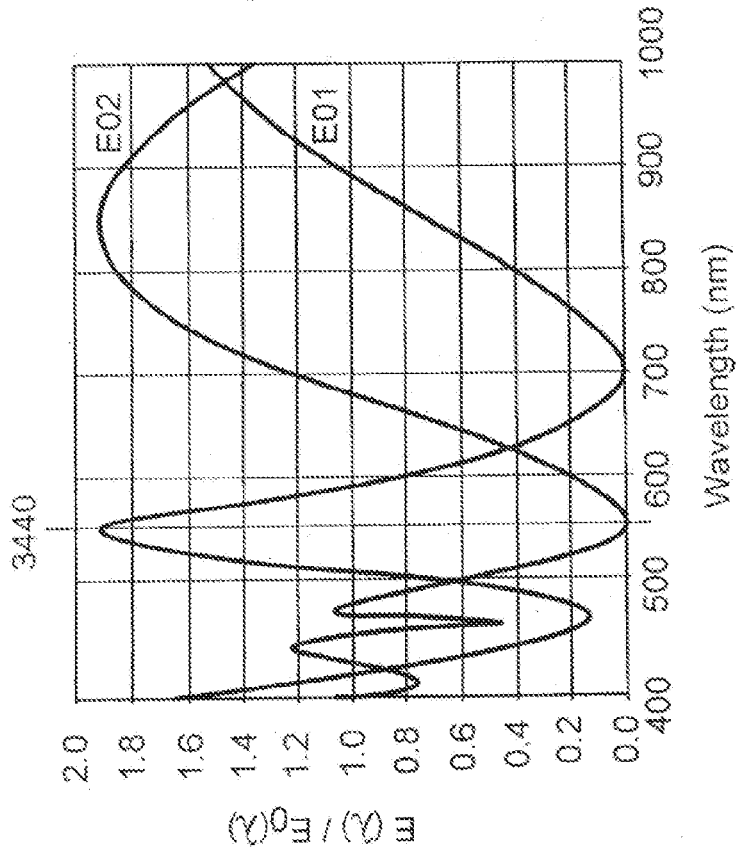
FIG. 140 is a graph of light emission versus wavelength.

The data shown in FIGS. 140 and 141 was calculated by using a source positioned a distance away from reflective surface 3422. The calculations shown in FIGS. 140 and 141 assume boundary conditions of continuity of the parallel electric field and of the normal displacement field at metallic side-walls 3430 (FIG. 139A). These boundary conditions introduce a frequency cut-off for the parallel polarization 3432, below which there are no allowed propagating states. In addition, these boundary conditions do not impose restrictions on the perpendicular polarization 3434, and thus a propagating solution exists for multiple frequencies (as shown in FIG. 139B). Without wishing to be bound by theory, it is believed that above a cut-off 3438, both polarizations can penetrate grooves 3424 but the polarizations will have different propagating constants and acquire a different phase. Below cut-off 3438 only one polarization of the two polarizations can penetrate grooves 3424. Therefore, perpendicular 3434 will reflect at the bottom of the mirrors (e.g., grooves 3424) while parallel 3432 will reflect at the top of the mirrors (e.g., raised portions 3420). In some embodiments, it is believed that a mirror is not necessary on the top side because the parallel polarization 3432 cannot penetrate into grooves 3424 and will be reflected. For some embodiments, it may be beneficial to use a more suitable ohmic contact that may not be as reflective.

The data shown in FIGS. 140 and 141 was calculated for both polarizations keeping the pitch or distance between the source and the bottom of the mirror (e.g., grooves 3424) at 200 nm. FIG. 140 shows a plot of $E(\lambda)/E_0(\lambda)$ for a reflective surface having a pattern with a pitch of 220 nm, a width 3426 of 110 nm, and a height 3428 of 100 nm. FIG. 141 shows a plot of $E(\lambda)/E_0(\lambda)$ for a reflective surface having a pattern with a pitch of 220 nm, a width 3426 of 110 nm, and a height 3428 of 50 nm. In both cases, the calculations show a wavelength at which one polarization is completely suppressed while the other has the maximum enhancement (e.g., as indicated by arrows 3440 and 3442). In addition, for a particular wavelength there are multiple geometries and wavelengths that enhance the light emission in one polarization while suppressing the light emission in another polarization.

While the calculations shown in FIGS. 140 and 141 are based on a plane wave source other sources can be used. For example, a dipole source can introduce emission in all directions. The interference conditions will change for different incident directions, however, without wishing to be bound by theory, it is believed that that a patterned layer can be used to at least partially suppress the light emission in one polarization in comparison to another polarization.

Without wishing to be bound by theory, it is believed that patterning a top surface through which light is emitted can enhance extraction of one desired polarization and enhance reflection of a different polarization. For example, light polarized parallel to the top surface pattern (but in any direction in the plane of the pattern) will be predominantly propagating in a direction perpendicular to the pattern and will thus be extracted, while light polarized perpendicular to the pattern will be predominantly propagating in a direction parallel to the top surface patterns, and thus will be predominantly guided.

In some embodiments, light emitting device can contain combinations of a polarizing reflective layer pattern, polarizing surface pattern, and/or polarizing window. Alternately or additionally, the window or LED surface can also contain layer(s) of birefringent material that acts as a quarter-wave plate and will turn the linearly polarized light into circularly polarized light.

In some embodiments, the LED can include multiple patterned layers. The patterns in the multiple patterned layers can be chosen to enhance or achieve a desired effect (e.g., extraction, collimation, polarization). For example, an LED can include a first patterned layer having a pattern to increase the collimation of the light emerging from the surface of the LED and a second pattern enhance or suppress the emission of light having a particular polarization.

In some embodiments, a light-emitting device can include a layer of a phosphor material coated on surface 110, cover layer 140 and supports 142.

In certain embodiments, a light-emitting device can include a cover layer 140 that has a phosphor material disposed therein. In such embodiments, surface 110 may or may not be patterned.

While in some embodiments, a pattern in the reflective layer is used to introduce anisotropy in the propagation constant between two polarizations, other methods for introducing anisotropy can be used (e.g., using anisotropic materials). These materials can be additionally combined with a reflecting layer.

In an alternative implementation, the light emitted by the light-generating region 130 is UV (or violet, or blue) and the phosphor layer 180 includes a mixture of a red phosphor material (e.g., $L_2O_2S:Eu^{3+}$), a green phosphor material (e.g, ZnS:Cu,Al,Mn), and blue phosphor material (e.g, $(Sr,Ca,Ba,Mg)_{10}(PO_4)_6Cl:Eu^{2+}$).

Other embodiments are in the claims.

What is claimed is:

1. A system comprising:
a panel having an edge; and
an array of light emitting devices, the array of light emitting devices having a combined surface area defined by an outer perimeter of the array of light emitting devices; and
an optical component disposed in an optical path from the light emitting devices to the edge of the panel, the optical component including an aperture having an area defined by a perimeter of the aperture;
wherein the combined surface area of the array of light emitting devices substantially matches the area of the aperture and an aspect ratio of the aperture substantially matches an aspect ratio of the array of light emitting devices, wherein the perimeter of the aperture is circular, and the perimeter of the array of light emitting devices is circular and the array of light emitting devices comprises four light emitting devices and each light emitting device in the array of light emitting devices has a perimeter defining a shape of about ¼ of a circle.

2. A system comprising:
a panel having an edge; and
an array of light emitting devices, the array of light emitting devices having a combined surface area defined by an outer perimeter of the array of light emitting devices; and
an optical component disposed in an optical path from the light emitting device to the edge of the panel, the optical component including an aperture having an area defined by a perimeter of the aperture;
wherein the combined surface area of the array of light emitting devices substantially matches the area of the aperture and an aspect ratio of the aperture substantially matches an aspect ratio of the array of light emitting devices, wherein the perimeter of the aperture is circular, and the perimeter of the array of light emitting devices is circular, and
wherein the array of light emitting devices comprises two light emitting devices and each light emitting device in the array of light emitting devices has a perimeter defining a shape of about ½ of a circle.

3. A system comprising:
a panel having an edge; and
an array of light emitting devices, the array of light emitting devices having a combined surface area defined by an outer perimeter of the array of light emitting devices; and
an optical component disposed in an optical path from the light emitting device to the edge of the panel, the optical component including an aperture having an area defined by a perimeter of the aperture;
wherein a ratio of the combined surface area of the light emitting devices to the area of the aperture is from about 0.5 to about 1.1, and
wherein at least one of the light emitting devices in the array of light emitting devices comprises a first layer supported by a light generating region, a surface of the first layer being configured so that light generated by the light generating region can emerge from the light emitting device via a surface of the first layer, and
the surface of the first layer has a dielectric function that varies spatially according to a nonperiodic pattern.

4. The system of claim 3, wherein the panel comprises liquid crystal display (LCD).

5. The system of claim 3, wherein the perimeter of the aperture is rectangular and the perimeter of the array of light emitting devices is rectangular.

6. The system of claim 3, wherein the perimeter of the aperture is hexagonal and the perimeter of the array of light emitting devices is hexagonal.

7. The system of claim 6, wherein the array of light emitting devices comprises six light emitting devices and each light emitting device in the array of light emitting devices has a perimeter defining a triangular shape.

8. The system of claim 3, wherein the perimeter of the aperture is octagonal and the perimeter of the array of light emitting devices is octagonal.

9. The system of claim 6, wherein the array of light emitting devices comprises eight light emitting devices and each light emitting device in the array of light emitting devices has a perimeter defining a triangular shape.

10. The system of claim 3, wherein the perimeter of the aperture is circular, and the perimeter of the array of light emitting devices is circular.

11. The system of claim 10, wherein the array of light emitting devices comprises six light emitting devices and each light emitting device in the array of light emitting devices has a perimeter defining a shape of about ⅙ of a circle.

12. The system of claim 10, wherein the array of light emitting devices comprises eight light emitting devices and each light emitting device in the array of light emitting devices has a perimeter defining a shape of about ⅛ of a circle.

13. The system of claim 3, wherein the perimeter of the aperture is trapezoidal and perimeter of the array of light emitting devices is trapezoidal.

14. The system of claim 3, wherein the perimeter of the aperture is triangular and the perimeter of the array of light emitting devices is triangular.

15. The system of claim 3, wherein the perimeter of the aperture is square and the perimeter of the array of light emitting devices is square.

16. The system of claim 3, wherein at least one light emitting device is a non-lambertian light emitting device.

17. The system of claim 3, wherein at least one light emitting device is a photonic lattice light emitting device.

18. The system of claim 3, wherein at least one of the light emitting devices in the array of light emitting devices comprises a first layer supported by a light generating region, a surface of the first layer being configured so that light generated by the light generating region can emerge from the light emitting device via a surface of the first layer.

19. The system of claim 18, wherein the surface of the first layer has a dielectric function that varies spatially according to a pattern, and the pattern has an ideal lattice constant and a detuning parameter with a value greater than zero.

20. The system of claim 3, wherein at least one light emitting device comprises a light emitting diode.

21. The system of claim 3, wherein the array of light emitting diodes includes at least one light emitting diode selected from the group consisting of red light emitting diodes, blue light emitting diodes, and green light emitting diodes.

22. The system of claim 3, wherein the array of light emitting diodes includes at least one red light emitting diode, at least one blue light emitting diode, and at least one green light emitting diode.

23. The system of claim 3, wherein the optical component is configured to homogenize light emitted from the LED.

24. The system of claim 3, wherein the optical component is configured to disperse light from the LEDs along the edge of the panel.

25. The system of claim 3, further comprising a cooling system configured so that, during use, the cooling system regulates a temperature of the light emitting diode.

26. The system of claim 3, wherein the array of light emitting devices is mounted on a heat sink device.

27. A system comprising:
a panel having an edge; and
an array of light emitting devices, the array of light emitting devices having a combined surface area defined by an outer perimeter of the array of light emitting devices; and
an optical component disposed in an optical path from the light emitting device to the edge of the panel, the optical component including an aperture having an area defined by a perimeter of the aperture;
wherein a ratio of the combined surface area of the light emitting devices to the area of the aperture is from about 0.5 to about 1.1,
wherein at least one of the light emitting devices in the array of light emitting devices comprises a first layer supported by a light generating region, a surface of the first layer being configured so that light generated by the light generating region can emerge from the light emitting device via a surface of the first layer, and
the surface of the first layer has a dielectric function that varies spatially according to a periodic pattern.

28. The system of claim 27, wherein the surface of the first layer has a dielectric function that varies spatially according to a complex periodic pattern.

* * * * *

UNITED STATES PATENT AND TRADEMARK OFFICE
CERTIFICATE OF CORRECTION

PATENT NO. : 7,667,238 B2
APPLICATION NO. : 11/210261
DATED : February 23, 2010
INVENTOR(S) : Alexei A. Erchak et al.

It is certified that error appears in the above-identified patent and that said Letters Patent is hereby corrected as shown below:

Column 14, line 16, "LED 110" should be "LED 1110"

Column 24, line 4, "120 m" should be "120 nm"

Column 52, line 39, "100 mm" should be "100 nm"

Column 54, line 21, "surface 10" should be "surface 110"

Signed and Sealed this

Twentieth Day of April, 2010

David J. Kappos
*Director of the United States Patent and Trademark Office*